US012302744B2

(12) United States Patent
Ko et al.

(10) Patent No.: US 12,302,744 B2
(45) Date of Patent: May 13, 2025

(54) ORGANOMETALLIC COMPOUND, LIGHT-EMITTING DEVICE INCLUDING ORGANOMETALLIC COMPOUND, AND ELECTRONIC APPARATUS INCLUDING LIGHT-EMITTING DEVICE

(71) Applicant: Samsung Display Co., Ltd., Yongin-si (KR)

(72) Inventors: Soobyung Ko, Yongin-si (KR); Junghoon Han, Yongin-si (KR); Hyunjung Lee, Yongin-si (KR); Iljoon Kang, Yongin-si (KR); Dahye Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 870 days.

(21) Appl. No.: 17/443,933

(22) Filed: Jul. 28, 2021

(65) Prior Publication Data

US 2022/0173338 A1 Jun. 2, 2022

(30) Foreign Application Priority Data

Dec. 2, 2020 (KR) ........................ 10-2020-0166929

(51) Int. Cl.
*H01L 51/00* (2006.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
None
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 104370974 A 2/2015
EP 2711999 A2 3/2014
(Continued)

OTHER PUBLICATIONS

Feiye Sun et al., "4a,8a-Azaboranaphthalene-4-yl Phosphine Ligands: Synthesis and Electronic Modulation in Suzuki-Miyaura Coupling Reactions", RSC Advances, 2015, pp. 75607-75611, vol. 5, Royal Society of Chemistry; DOI: 10.1039/C5RA15929F.
(Continued)

*Primary Examiner* — Tae H Yoon
(74) *Attorney, Agent, or Firm* — Womble Bond Dickinson (US) LLP

(57) ABSTRACT

A light-emitting device includes: a first electrode; a second electrode facing the first electrode; and an interlayer
(Continued)

between the first electrode and the second electrode, the interlayer including an emission layer, wherein the light-emitting device includes an organometallic compound represented by Formula 1:

Formula 1

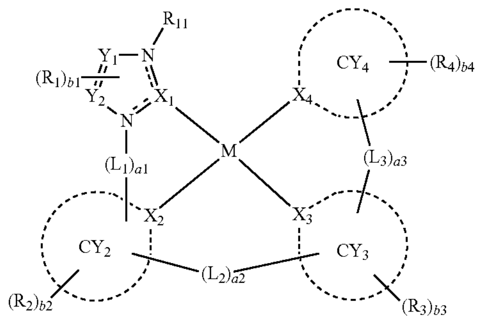

Formula 1A

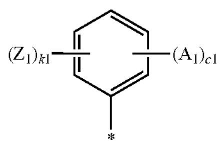

Formula 1B

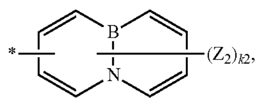

wherein at least one of $R_{11}$, $R_1$ in a number of b1, $R_2$ in a number of b2, $R_3$ in a number of b3, or $R_4$ in a number of b4 is a group represented by Formula 1A, and $A_1$ is a group represented by Formula 1B.

20 Claims, 3 Drawing Sheets

(51) Int. Cl.

| | |
|---|---|
| ***C09K 11/06*** | (2006.01) |
| ***H10K 85/30*** | (2023.01) |
| ***H10K 85/40*** | (2023.01) |
| *H10K 50/11* | (2023.01) |
| *H10K 101/10* | (2023.01) |

(52) U.S. Cl.

CPC ...... *H10K 85/40* (2023.02); *C09K 2211/1029* (2013.01); *C09K 2211/1044* (2013.01); *C09K 2211/185* (2013.01); *H10K 50/11* (2023.02); *H10K 2101/10* (2023.02)

(56) References Cited

U.S. PATENT DOCUMENTS

| | | | | |
|---|---|---|---|---|
| 7,585,573 | B2 | 9/2009 | Lee et al. | |
| 7,776,458 | B2 | 8/2010 | Ragini et al. | |
| 8,106,199 | B2 | 1/2012 | Jabbour et al. | |
| 8,389,725 | B2 | 3/2013 | Li et al. | |
| 8,669,364 | B2 | 3/2014 | Li et al. | |
| 8,680,760 | B2 | 3/2014 | Cheng et al. | |
| 8,816,080 | B2 | 8/2014 | Li et al. | |
| 8,846,940 | B2 | 9/2014 | Li et al. | |
| 8,946,417 | B2 | 2/2015 | Jian et al. | |
| 9,051,344 | B2 | 6/2015 | Lin et al. | |
| 9,076,974 | B2 | 7/2015 | Li et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,231,218 | B2 * | 1/2016 | Lin | H10K 85/342 |
| 9,238,668 | B2 | 1/2016 | Li et al. | |
| 9,312,502 | B2 | 4/2016 | Li et al. | |
| 9,324,957 | B2 | 4/2016 | Li et al. | |
| 9,382,273 | B2 | 7/2016 | Li et al. | |
| 9,425,415 | B2 | 8/2016 | Li et al. | |
| 9,673,406 | B2 | 6/2017 | Kwong et al. | |
| 9,698,359 | B2 | 7/2017 | Li et al. | |
| 9,871,212 | B2 * | 1/2018 | Kwong | H10K 85/40 |
| 9,899,614 | B2 | 2/2018 | Li et al. | |
| 10,873,038 | B2 | 12/2020 | Wu et al. | |
| 2005/0287394 | A1 | 12/2005 | Yang et al. | |
| 2008/0018221 | A1 | 1/2008 | Egen et al. | |
| 2014/0309428 | A1 | 10/2014 | Egen et al. | |
| 2018/0375036 | A1 | 12/2018 | Chen et al. | |
| 2019/0119312 | A1 | 4/2019 | Chen et al. | |
| 2020/0119289 | A1 | 4/2020 | Lin et al. | |
| 2020/0140471 | A1 | 5/2020 | Chen et al. | |

FOREIGN PATENT DOCUMENTS

| | | | |
|---|---|---|---|
| EP | 3508491 | A1 | 7/2019 |
| JP | 2007-045742 | A | 2/2007 |
| KR | 10-0730115 | B1 | 6/2007 |
| KR | 10-2017-0024162 | A | 3/2017 |
| KR | 10-2019-0000812 | A | 1/2019 |
| WO | WO 2012/121936 | A2 | 9/2012 |

OTHER PUBLICATIONS

Akkurt, Methmet et al., "Chlorido[I-phenyl-3-(2,3,5,6-tetramethylbenzyl)benzimidazol-2-ylidene]-silver(I)", Acta Cryst. (2012). E68(5), May 15, 2012, m590-m591; doi:10.1107/S1600536812012998 (10 pages).

* cited by examiner

ORGANOMETALLIC COMPOUND, LIGHT-EMITTING DEVICE INCLUDING ORGANOMETALLIC COMPOUND, AND ELECTRONIC APPARATUS INCLUDING LIGHT-EMITTING DEVICE

CROSS-REFERENCE TO RELATED APPLICATION

This application claims priority to and the benefit of Korean Patent Application No. 10-2020-0166929, filed on Dec. 2, 2020, in the Korean Intellectual Property Office, the entire content of which is incorporated herein by reference.

BACKGROUND

1. Field

One or more embodiments of the present disclosure are directed toward an organometallic compound, a light-emitting device including the organometallic compound, and an electronic apparatus including the light-emitting device.

2. Description of the Related Art

Light-emitting devices are self-emission devices that have wide viewing angles, high contrast ratios, short response times, and excellent characteristics in terms of brightness, driving voltage, and/or response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons transition from an excited state to a ground state to thereby generate light.

SUMMARY

One or more aspects of embodiments of the present disclosure are directed toward a novel organometallic compound, a light-emitting device including the organometallic compound, and an electronic apparatus including the light-emitting device.

Additional aspects will be set forth in part in the description which follows and, in part, will be apparent from the description, or may be learned by practice of the presented embodiments of the disclosure.

According to one or more embodiments, an organometallic compound may be represented by Formula 1.

Formula 1

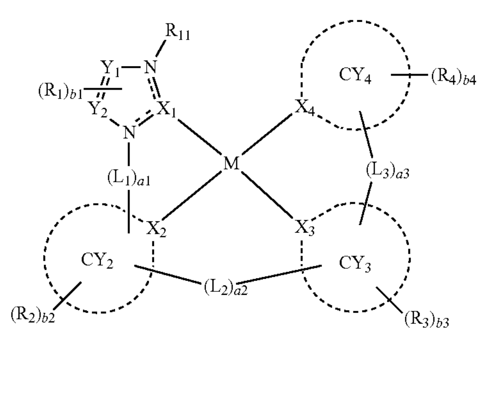

-continued

Formula 1A

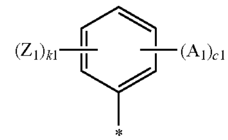

Formula 1B

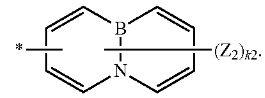

In Formulae 1, 1A, and 1B,

M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ may be C, and a bond between $X_1$ and M may be a coordinate bond, $X_2$ to $X_4$, $Y_1$, and $Y_2$ may each independently be C or N, one of a bond between $X_2$ and M, a bond between $X_3$ and M, and a bond between $X_4$ and M may be a coordinate bond, and other two bonds may each be a covalent bond, $CY_2$ to $CY_4$ may each independently be a $C_3$-$C_{60}$ carbocyclic group or a $C_1$-$C_{60}$ heterocyclic group, $L_1$ to $L_3$ may each independently be a single bond, *—O—*', *—S—*', *—Se—*', *—S(═O)$_2$—*', *—C($R_5$)($R_6$)—*', *—C($R_5$)═*', *═C($R_5$)—*', *—C($R_5$)═C($R_6$)—*', *—C(═O)—*', *—C(═S)—*', *—C≡C—*', *—B($R_5$)—*', *—N($R_5$)*', *—P($R_5$)—*', *—Si($R_5$)($R_6$)—*', *—P(═O)($R_5$)—*', or *—Ge($R_5$)($R_6$)—*', a1 to a3 may each independently be an integer from 1 to 3, $R_1$ to $R_6$ and $R_{11}$ may each independently be a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), at least two groups of $R_1$ in a number of b1, $R_2$ in a number of b2, $R_3$ in a number of b3, $R_4$ in a number of b4, $R_5$, or $R_6$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{11}$, $R_1$ in a number of b1, $R_2$ in a number of b2, $R_3$ in a number of b3, or $R_4$ in a number of b4 may be a group represented by Formula 1A, b1 may be 1 or 2, b2 to b4 may each independently be an integer from 1 to 10, $A_1$ may be a group represented by Formula 1B, c1 may be an integer from 1 to 5, $Z_1$ and $Z_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), k1 may be an integer from 0 to 4, k2 may be an integer from 1 to 7, and *' each indicate a binding site to an adjacent atom, and $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_6$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to one or more embodiments, a light-emitting device may include a first electrode, a second electrode facing the first electrode, and an interlayer between the first electrode and the second electrode, the interlayer including an emission layer, wherein the light-emitting device may include the organometallic compound represented by Formula 1.

According to one or more embodiments, an electronic apparatus may include the light-emitting device.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
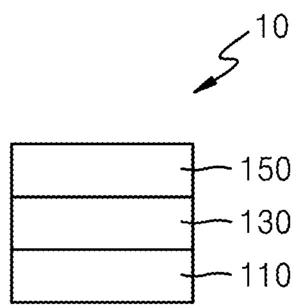
FIG. 1 is a schematic cross-sectional view of a light-emitting device according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof. Further, the use of "may" when describing embodiments of the present disclosure refers to "one or more embodiments of the present disclosure".

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present. As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

An organometallic compound may be represented by Formula 1:

Formula 1

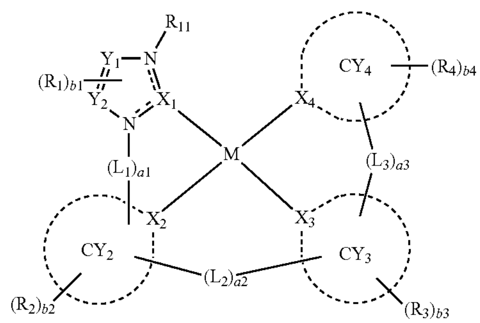

Formula 1A

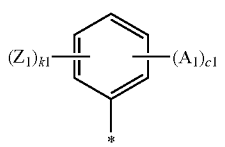

Formula 1B

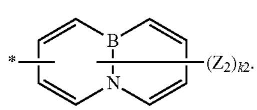

In Formula 1, M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In one or more embodiments, in Formula 1, M may be Pt, Pd, Ni, Au, Ag, or Cu, but embodiments are not limited thereto. For example, M may be Pt, Pd, or Au.

In Formula 1, $X_1$ may be C, and a bond between $X_1$ and M may be a coordinate bond.

In Formula 1, $X_2$ to $X_4$ may each independently be C or N, one of a bond between $X_2$ and M, a bond between $X_3$ and M, and a bond between $X_4$ and M may be a coordinate bond, and other two bonds may each be a covalent bond.

For example, in Formula 1, $X_2$ may be C, $X_3$ may be C, $X_4$ may be N; $X_2$ may be C, $X_3$ may be N, and $X_4$ may be C; or $X_2$ may be N, $X_3$ may be C, and $X_4$ may be C, but embodiments are not limited thereto.

In one or more embodiments, in Formula 1, $X_2$ may be C, $X_3$ may be C, $X_4$ may be N, a bond between $X_2$ and M, a bond between $X_3$, and M may each be a covalent bond, and a bond between $X_4$ and M may be a coordinate bond.

In Formula 1, $Y_1$ and $Y_2$ may each independently be C or N.

In one or more embodiments, $Y_1$ and $Y_2$ may each be C.

In Formula 1, $CY_2$ to $CY_4$ may each independently be a $C_3$-$C_{60}$ carbocyclic group or a $C_1$-$C_{60}$ heterocyclic group.

In one or more embodiments, $CY_2$ to $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene-group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a tetrazole group, a benzopyrazole group, a benzimidazole group, a benzotriazole, a benzoxazole group, a benzothiazole group, a benzoxadiazole group, a benzothiadiazole group, an indazole group, an imidazopyridine group, an imidazopyrimidine group, an imidazopyrazine group, an imidazopyridazine group, a pyrazolopyridine group, a pyrazolopyrimidine group, a pyrazolopyrazine group, a pyrazolopyridazine group, a 5,6,7,8-tetrahydroisoquinoline group, or a 5,6,7,8-tetrahydroquinoline group.

In one or more embodiments, in Formula 1, $CY_2$ may be a group represented by one of Formulae CY2-1 to CY2-9, $CY_3$ may be a group represented by one of Formulae CY3-1 to CY3-10, $CY_4$ may be a group represented by one of Formulae CY4-1 to CY4-9, or any combination thereof:

CY2-1

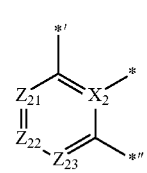

CY2-2
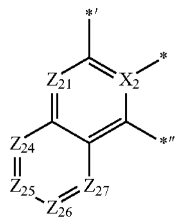
CY2-3
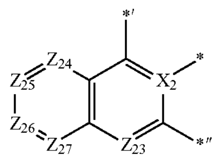
CY2-4
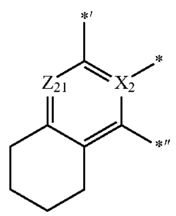
CY2-5
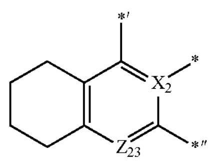
CY2-6
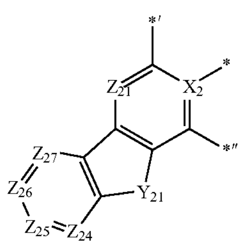
CY2-7
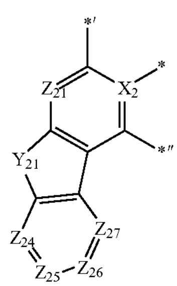
CY2-8
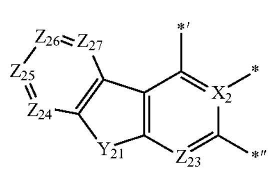
CY2-9
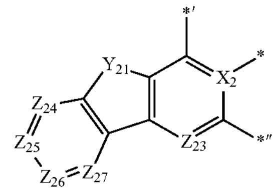
CY3-1
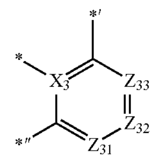
CY3-2
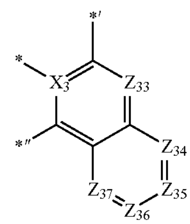
CY3-3
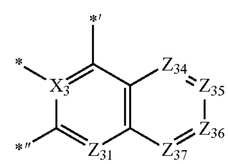
CY3-4
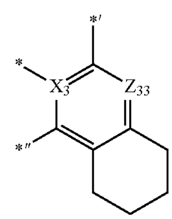
CY3-5
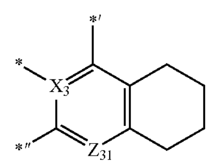
CY3-6
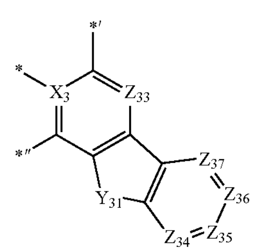

-continued

CY3-7

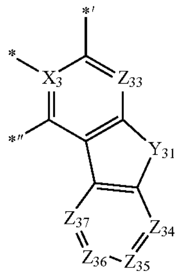

CY3-8

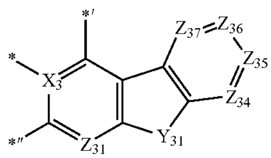

CY3-9

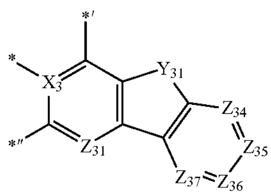

CY3-10

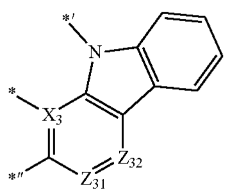

CY4-1

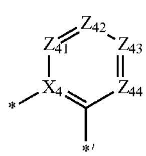

CY4-2

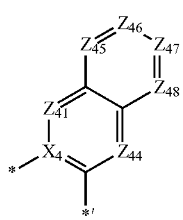

CY4-3

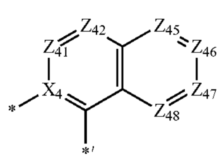

CY4-4

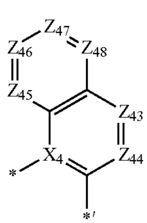

-continued

CY4-5

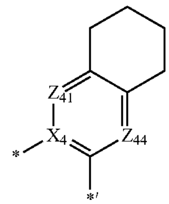

CY4-6

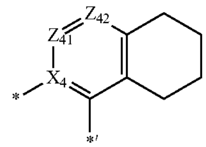

CY4-7

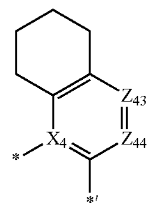

CY4-8

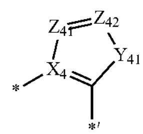

CY4-9

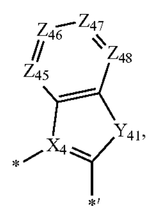

wherein, in Formulae CY2-1 to CY2-9, CY3-1 to CY3-10, and CY4-1 to CY4-9, $Z_{21}$ to $Z_{27}$, $Z_{31}$ to $Z_{37}$, and $Z_{41}$ to $Z_{48}$ may each independently be C or N, $Y_{21}$, $Y_{31}$, and $Y_{41}$ may each independently be N, O, S, C, or Si, $X_2$ to $X_4$ may respectively be understood by referring to the descriptions of $X_2$ to $X_4$ provided herein,

* indicates a binding site to M, and

' and *" each indicate a binding site to an adjacent atom.

In Formula 1, $L_1$ to $L_3$ may each independently be a single bond, *—O—*', *—S—*', *Se—*', *—S(=O)$_2$—*' *—C(R$_5$)(R$_6$)—*', *—C(R$_5$)=*', *=C(R$_5$)—*', *—C(R$_5$)=C(R$_6$)—*', *—C(=O)*', *—C(=S)—*', *—C≡C—*', *—B(R$_5$)—*', *—N(R$_5$)—*', *—P(R$_5$)—*', *—Si(R$_5$)(R$_6$)—*', *—P(=O)(R$_5$)—*', or *—Ge(R$_5$)(R$_6$)*', a1 to a3 may each independently be an integer from 1 to 3.

In one or more embodiments, in Formula 1, $L_1$ may be a single bond, $L_2$ may be *—O—*' or *—S*', and $L_3$ may be *—N(R$_5$)*'.

For example, $L_1$ may be a single bond, $L_2$ may be *—O—*' or *—S—*', $L_3$ may be *—N(R$_5$)—*', and a1 to a3 may each be 1.

In Formula 1, $R_1$ to $R_6$ and $R_{11}$ may each independently be a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), at least two groups of $R_1$ in a number of b1, $R_2$ in a number of b2, $R_3$ in a number of b3, $R_4$ in a number of b4, $R_5$, or $R_6$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{11}$, $R_1$ in a number of b1, $R_2$ in a number of b2, $R_3$ in a number of b3, or $R_4$ in a number of b4 may be a group represented by Formula 1A, In one or more embodiments, in Formula 1, $R_1$ to $R_6$ and $R_{11}$ may each independently be:

a group represented by Formula 1A, hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, or a nitro group;

a $C_1$-$C_{60}$ alkyl group or a $C_1$-$C_6$ alkoxy group, each unsubstituted or substituted with deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, or an indolocarbazolyl group, each unsubstituted or substituted with deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, $-P(=O)(Q_{31})(Q_{32})$, or any combination thereof; or $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$, wherein $Q_1$ to $Q_3$ and $Q_{31}$ to $Q_{33}$ may respectively be understood by referring to the descriptions of $Q_1$ to $Q_3$ and $Q_{31}$ to $Q_{33}$ provided herein.

In one or more embodiments, in Formula 1, $R_1$ to $R_6$ and $R_{11}$ may each independently be:

a group represented by Formula 1A, hydrogen, deuterium, —F, —Cl, —Br, —I, $-CH_2D$, $-CHD_2$, $-CD_3$, $-CH_2F$, $-CHF_2$, $-CF_3$, a hydroxyl group, a cyano group, a nitro group, a methyl group, an ethyl group, a propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, a tert-hexyl group, or a group represented by one selected from the group consisting of Formulae 9-1 to 9-31 and 10-1 to 10-7:

9-1

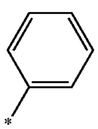

9-2

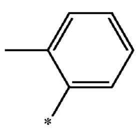

9-3

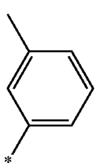

9-4

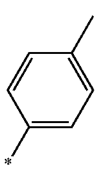

9-5

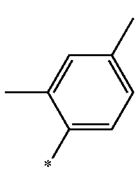

9-6

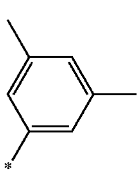

-continued 9-7

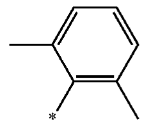

9-8

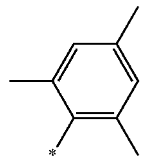

9-9

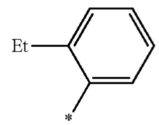

9-10

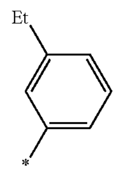

9-11

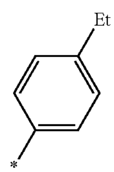

9-12

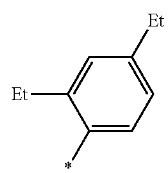

9-13

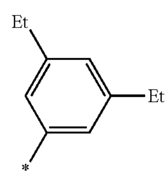

9-14

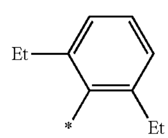

9-15

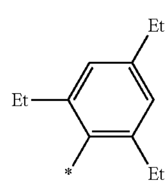

9-16

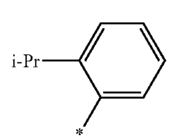

-continued
9-17
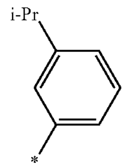
9-18
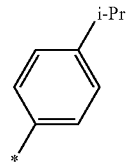
9-19
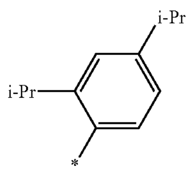
9-20
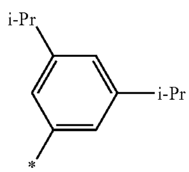
9-21
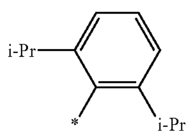
9-22
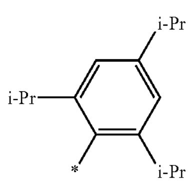
9-23
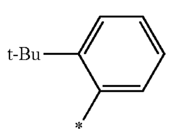
9-24
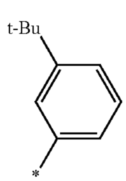
9-25
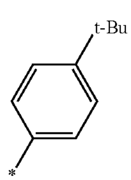
-continued
9-26
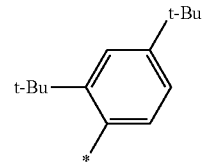
9-27
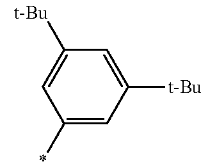
9-28
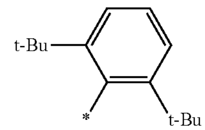
9-29
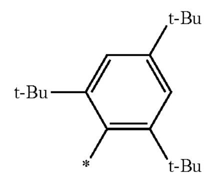
9-30
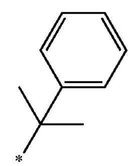
9-31
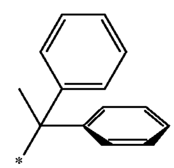
10-1
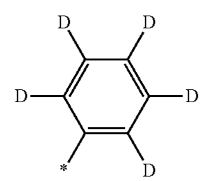
10-2
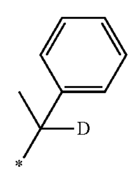
10-3
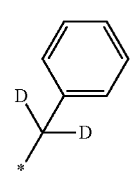

-continued 10-4

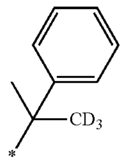

10-5

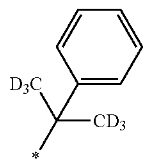

10-6

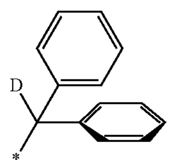

10-7

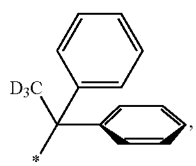

wherein, in Formulae 9-1 to 9-31 and 10-1 to 10-7,

"Et" represents an ethyl group,

"i-Pr" represents an iso-propyl group,

"t-Bu" represents a tert-butyl group,

"D" represents deuterium, and

* indicates a binding site to an adjacent atom.

In one or more embodiments, in Formula 1, $R_{11}$ may be a group represented by Formula 1A.

In Formulae 1A and 1B, $Z_1$ and $Z_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, k1 may be an integer from 0 to 4, and k2 may be an integer from 1 to 7.

In Formula 1A, $A_1$ may be a group represented by Formula 1B.

In Formula 1A, c1 indicates the number of $A_1$(s), and c1 may be an integer from 1 to 5.

In some embodiments, the group represented by Formula 1A may be represented by one of Formulae 1A-1 to 1A-14:

1A-1

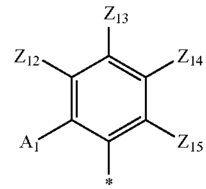

1A-2

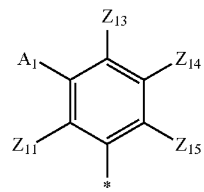

1A-3

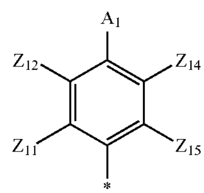

1A-4

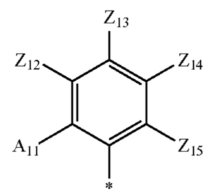

1A-5

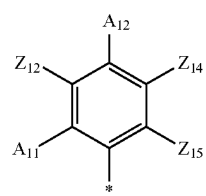

1A-6

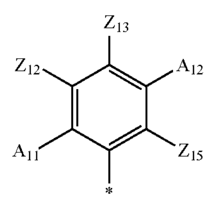

1A-7

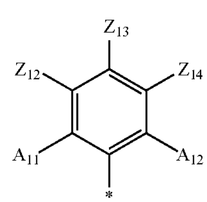

1A-8

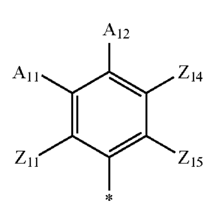

-continued 1A-9

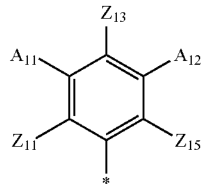

1A-10

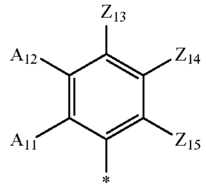

1A-11

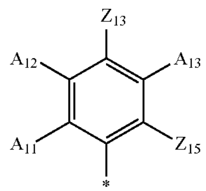

1A-12

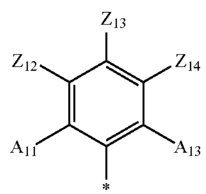

1A-13

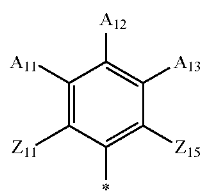

1A-14

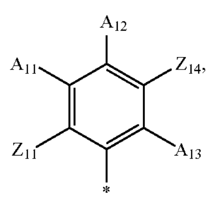

wherein, in Formulae 1A-1 to 1A-14, $Z_{11}$ to $Z_{15}$ may each independently be understood by referring to the description of $Z_1$ provided herein, $A_{11}$ to $A_{13}$ may each independently be substantially the same as described herein with reference to $A_1$, $A_1$ may be understood by referring to the description of $A_1$ in Formula 1A, and

* indicates a binding site to an adjacent atom.

In one or more embodiments, in Formulae 1A-1 to 1A-14, $Z_{11}$ to $Z_{15}$ may each independently be hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a methyl group, an ethyl group, a propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group.

In one or more embodiments, the group represented by Formula 1A may be a group represented by Formula 1A-7-1:

1A-7-1

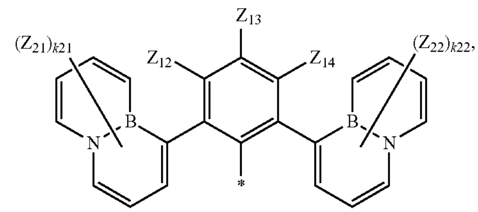

wherein, in Formula 1A-7-1, $Z_{12}$ to $Z_{14}$ may each independently be understood by referring to the description of $Z_1$ provided herein, $Z_{21}$ and $Z_{22}$ may each independently be understood by referring to the description of $Z_2$ provided herein, k21 and k22 may each independently be an integer from 1 to 7, and

* indicates a binding site to an adjacent atom.

In one or more embodiments, in Formula 1A-7-1, $Z_{12}$ to $Z_{14}$ may each independently be hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a methyl group, an ethyl group, a propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, or a tert-hexyl group, and $Z_{21}$ and $Z_{22}$ may each be hydrogen.

In one or more embodiments, in Formula 1, at least one of $R_1$ in a number of b1, $R_2$ in a number of b2, $R_3$ in a number of b3, $R_4$ in a number of b4, $R_5$, $R_6$, or $R_{11}$ may be deuterium, —$CH_2D$, —$CHD_2$, —$CD_3$, a phenyl group substituted with at least one deuterium, or a group represented by one of Formulae 10-2 to 10-7:

10-2

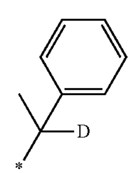

10-3

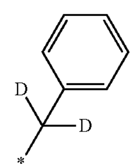

10-4

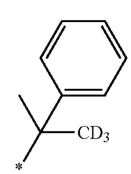

-continued 10-5

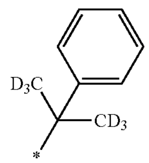

10-6

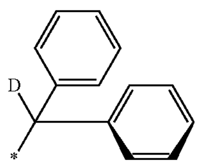

10-7

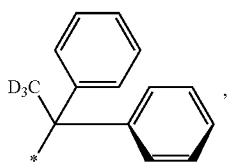

wherein, in Formulae 10-2 to 10-7,

"D" represents deuterium, and

* indicates a binding site to an adjacent atom.

In one or more embodiments, a moiety represented by

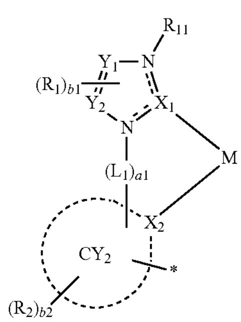

in Formula 1 may be a group represented by Formula $L_1$-1 or Formula $L_1$-2:

L1-1

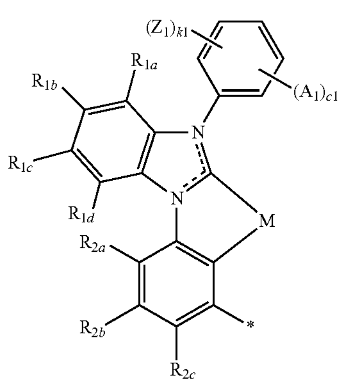

-continued

L1-2

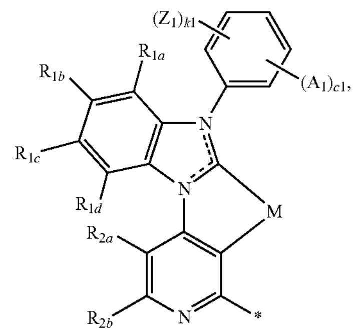

wherein, in Formulae 1-1 and $L_1$-2, $R_{1a}$ to $R_{1d}$ may each independently be understood by referring to the description of $R_1$ provided herein, $R_{2a}$ to $R_{2c}$ may each independently be understood by referring to the description of $R_2$ provided herein, M, $A_1$, c1, $Z_1$, and k1 may respectively be understood by referring to the descriptions of M, $A_1$, c1, $Z_1$, and k1 provided herein, and

* indicates a binding site to $L_2$.

In one or more embodiments, a moiety represented by

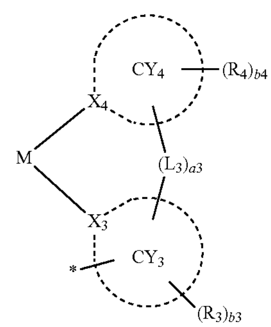

in Formula 1 may be a group represented by Formula $L_2$-1 or Formula $L_2$-2:

L2-1

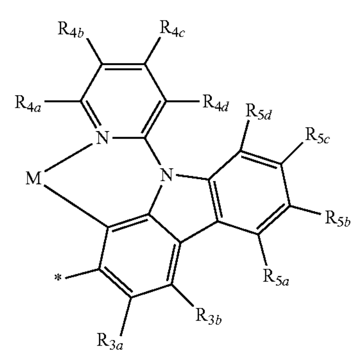

-continued

L2-2

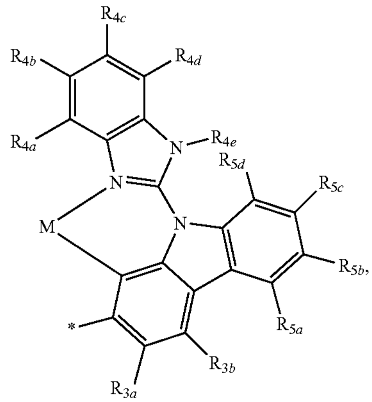

wherein, in Formulae L-2-1 and L-2-2, $R_{3a}$ and $R_{3b}$ may each independently be understood by referring to the description of $R_3$ provided herein, $R_{4a}$ to $R_{4e}$ may each independently be understood by referring to the description of $R_4$ provided herein, $R_{5a}$ to $R_{5d}$ may each independently be understood by referring to the description of $R_{10a}$ provided herein, M may be understood by referring to the description of M in Formula 1, and

* indicates a binding site to $L_2$.

In one embodiment, the organometallic compound may be represented by any one of Formulae 1-1 to 1-4:

1-1

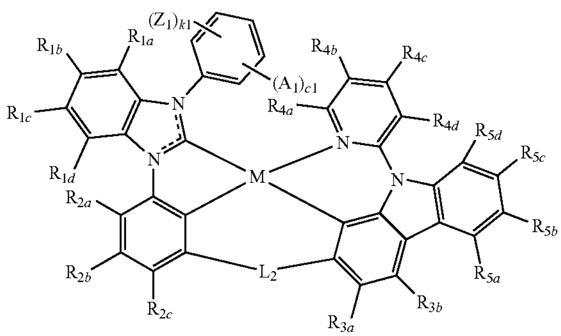

1-2

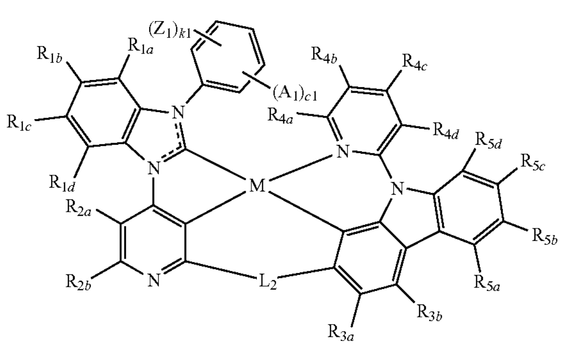

-continued 1-3

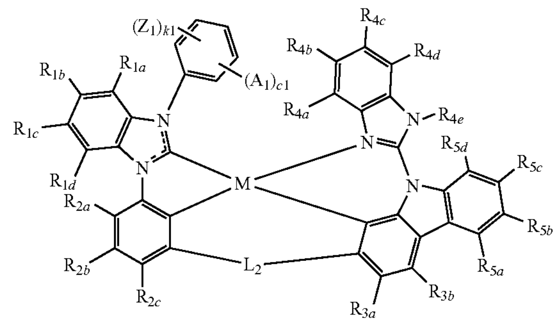

1-4

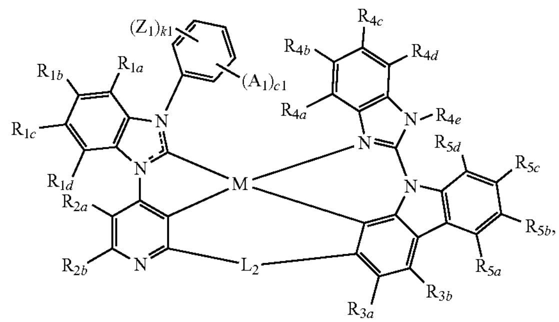

wherein, in Formulae 1-1 to 1-4,

M, $L_2$, $A_1$, c1, $Z_1$, and k1 may respectively be understood by referring to the descriptions of M, $L_2$, $A_1$, c1, $Z_1$, and k1 provided herein, $R_{1a}$ to $R_{1d}$ may each independently be understood by referring to the description of $R_1$ provided herein, $R_{2a}$ to $R_{2c}$ may each independently be understood by referring to the description of $R_2$ provided herein, $R_{3a}$ and $R_{3b}$ may each independently be understood by referring to the description of $R_3$ provided herein, $R_{4a}$ to $R_{4e}$ may each independently be understood by referring to the description of $R_4$ provided herein, and $R_{5a}$ to $R_{5d}$ may each independently be understood by referring to the description of $R_{10a}$ provided herein.

In one or more embodiments, in Formulae 1-1 to 1-4, $R_{1a}$ to $R_{1d}$, $R_{2a}$ to $R_{2c}$, $R_{3a}$, $R_{3b}$, $R_{4a}$ to $R_{4e}$, and Ra to $R_{5d}$ may each independently be hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a methyl group, an ethyl group, a propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, a tert-hexyl group, or a group represented by one selected from the group consisting of Formulae 9-1 to 9-31 and 10-1 to 10-7:

9-1

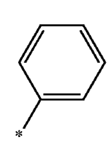

-continued
9-2
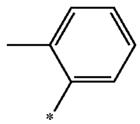
9-3
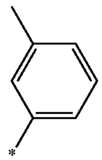
9-4
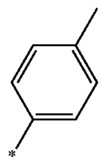
9-5
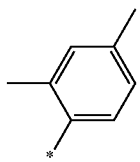
9-6
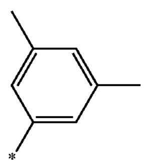
9-7
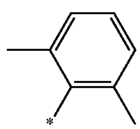
9-8
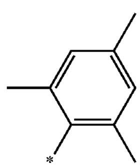
9-9
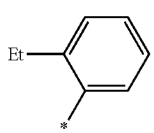
9-10
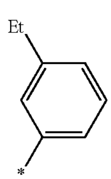
9-11
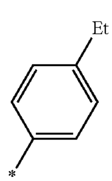
-continued
9-12
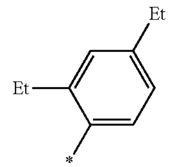
9-13
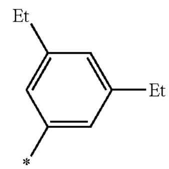
9-14
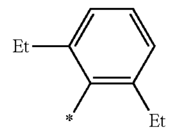
9-15
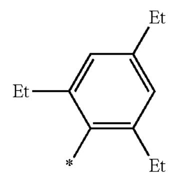
9-16
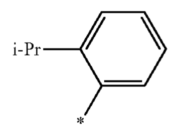
9-17
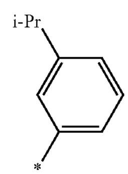
9-18
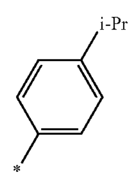
9-19
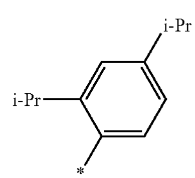
9-20
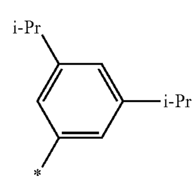

-continued
9-21
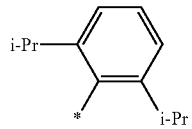
9-22
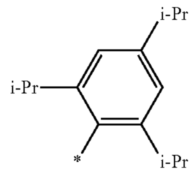
9-23
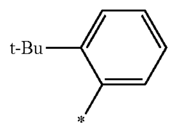
9-24
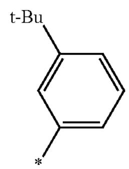
9-25
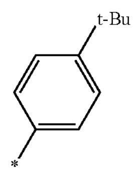
9-26
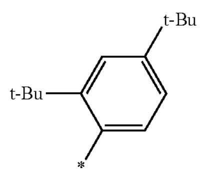
9-27
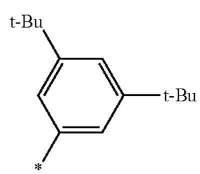
9-28
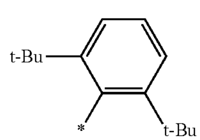
9-29
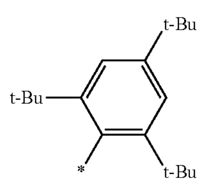
-continued
9-30
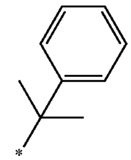
9-31
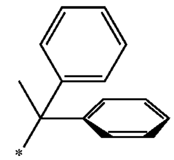
10-1
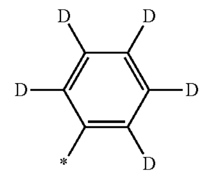
10-2
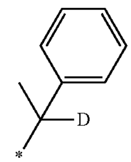
10-3
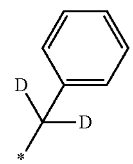
10-4
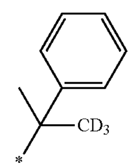
10-5
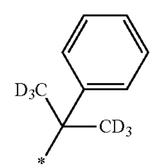
10-6
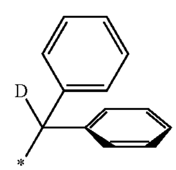
10-7
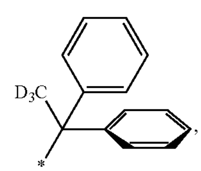
wherein, in Formulae 9-1 to 9-31 and 10-1 to 10-7,
"Et" represents an ethyl group,
"i-Pr" represents an iso-propyl group, "t-Bu" represents a tert-butyl group, "D" represents deuterium, and

* indicates a binding site to an adjacent atom.

In some embodiments, in Formula 1-1 to 1-4, at least one of $R_{1a}$ to $R_{1d}$, $R_{2a}$ to $R_{2c}$, $R_{3a}$, $R_{3b}$, $R_{4a}$ to $R_{4e}$, or $R_{5a}$ to $R_{5d}$ may be represented by deuterium, —$CH_2D$, —$CHD_2$, —$CD_3$, or a group represented by one of Formulae 10-1 to 10-7:

10-1

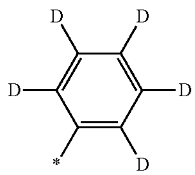

10-2

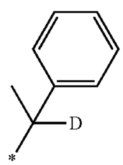

10-3

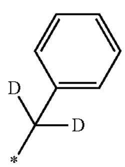

10-4

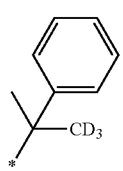

10-5

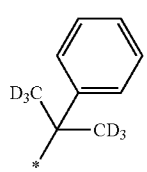

10-6

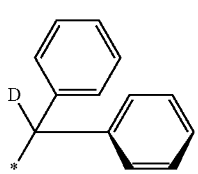

10-7

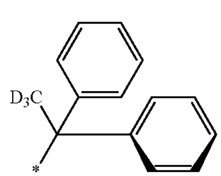

, wherein, in Formulae 10-1 to 10-7,

"D" represents deuterium, and

* indicates a binding site to an adjacent atom.

In one or more embodiments, the organometallic compound may be one of Compounds BD01 to BD210:

BD01

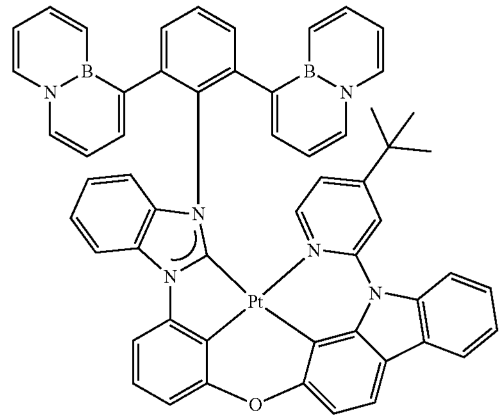

BD02

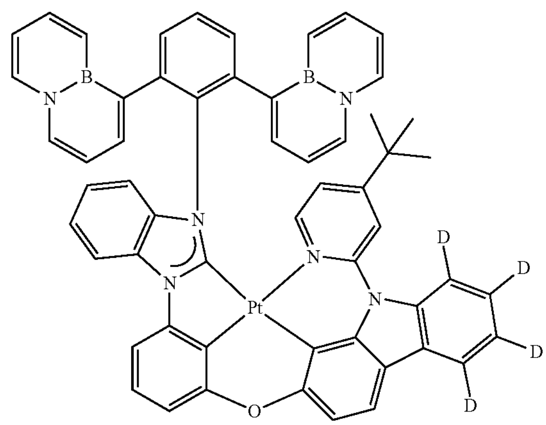

BD03

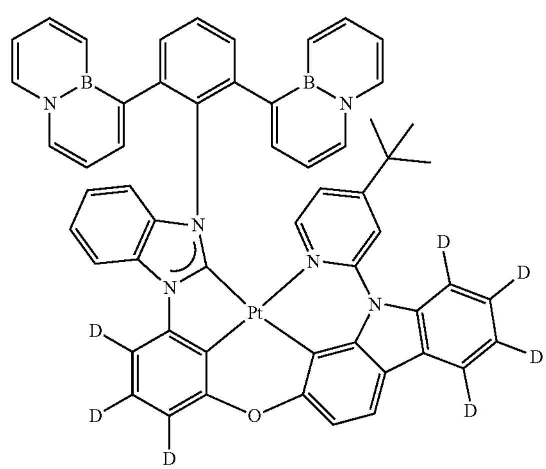

-continued
BD04
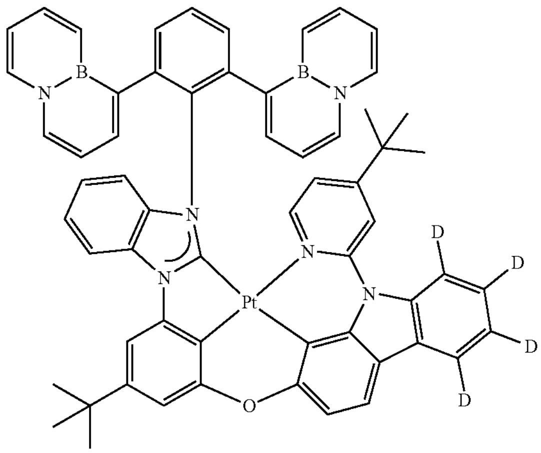
BD05
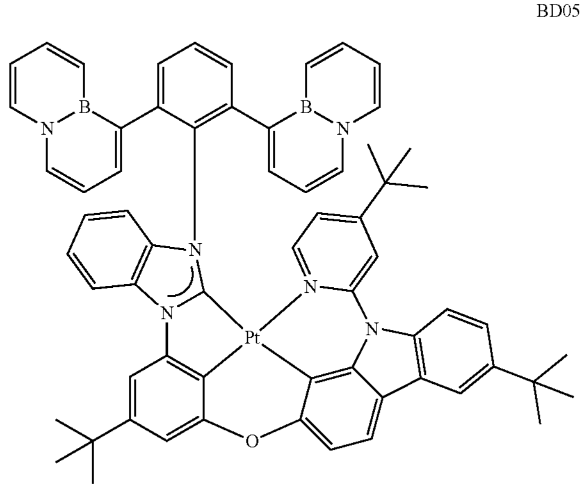
BD06
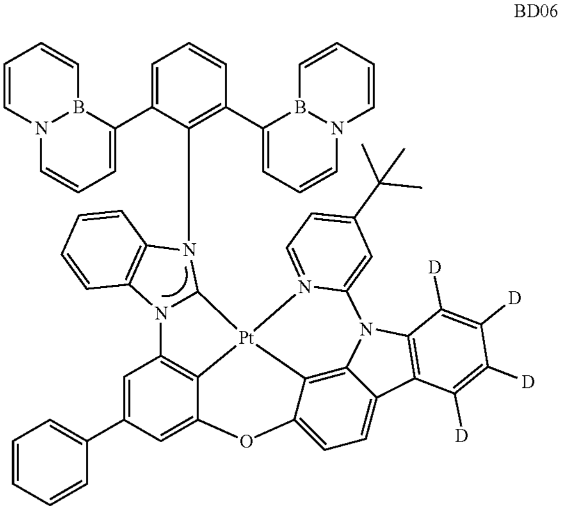
-continued
BD07
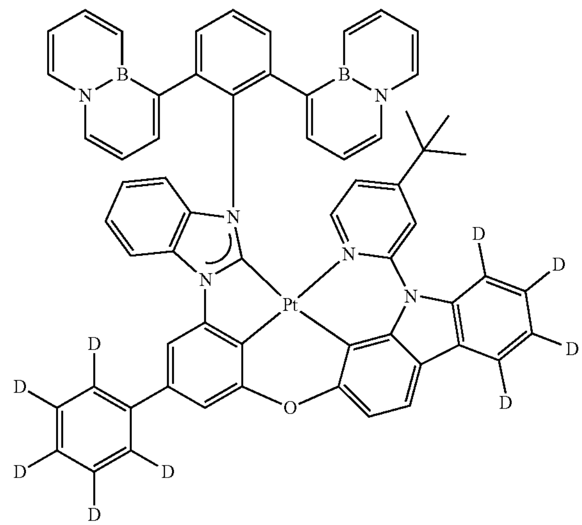
BD08
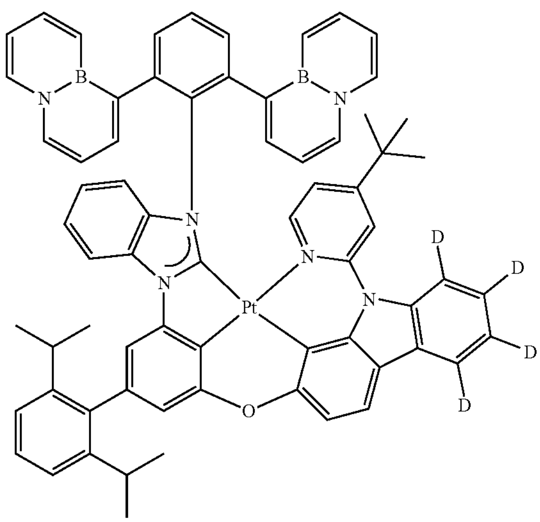
BD09
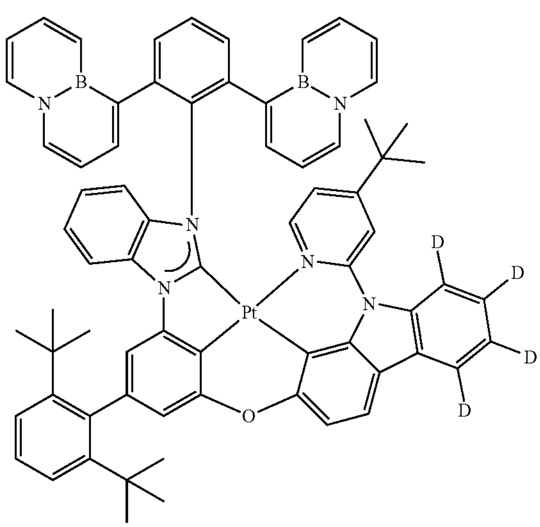

-continued
BD10
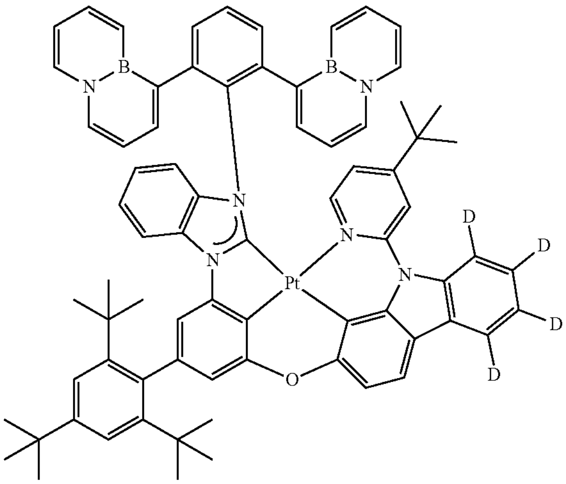
BD11
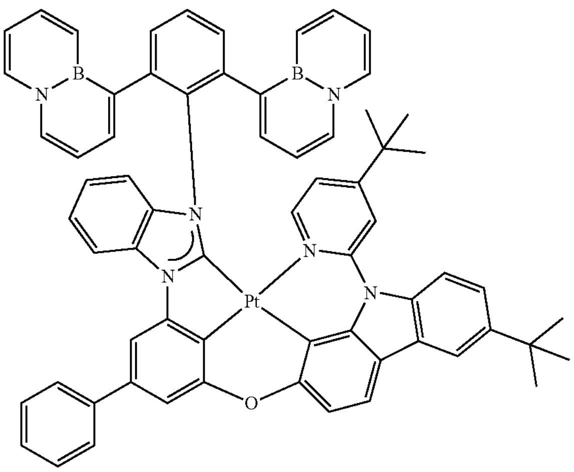
BD12
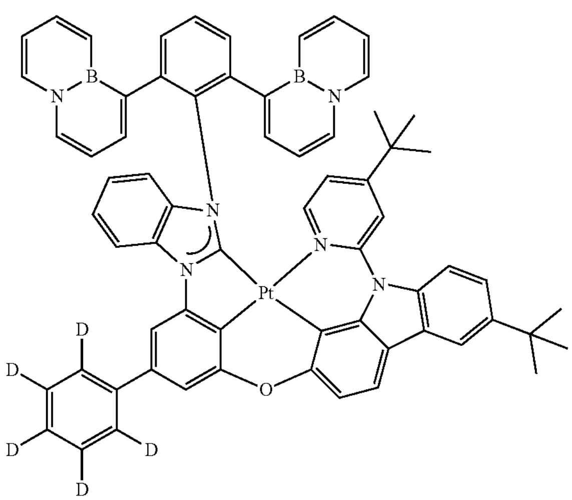
-continued
BD13
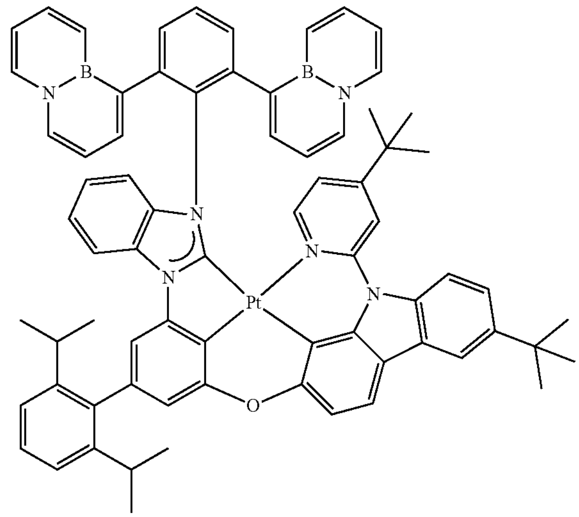
BD14
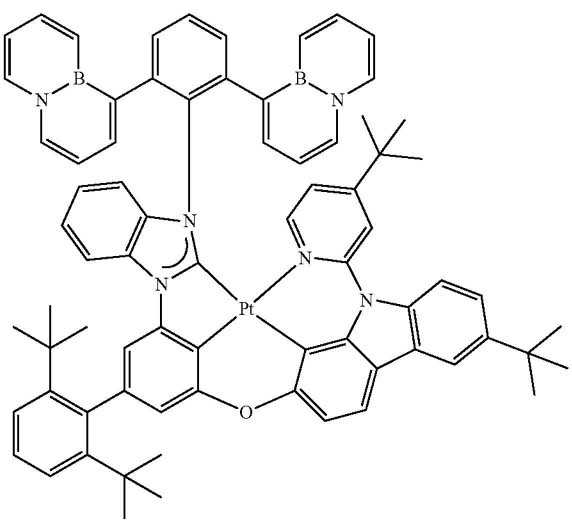
BD15
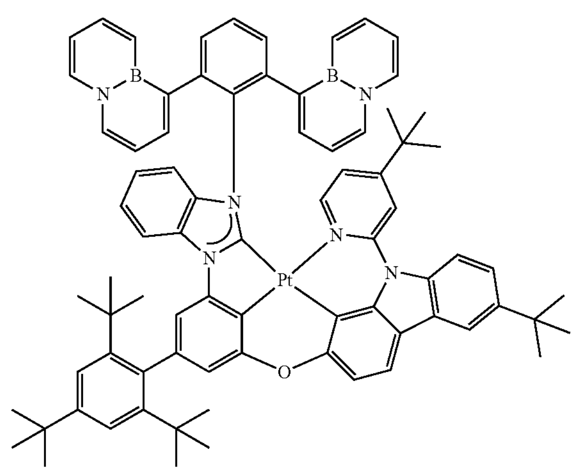

BD16
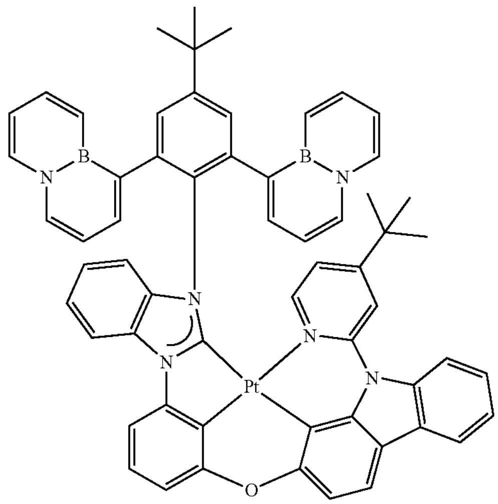
BD17
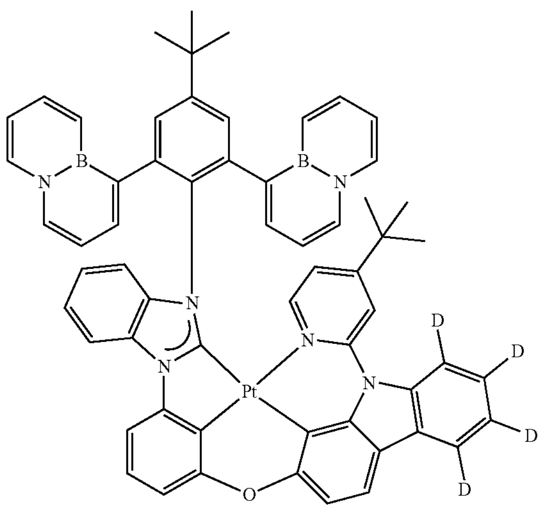
BD18
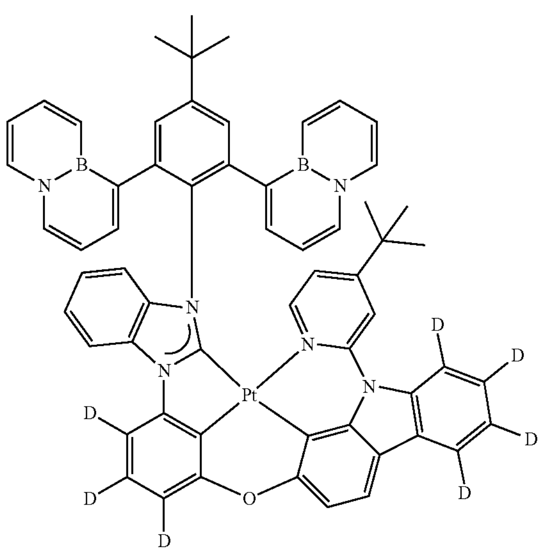
BD19
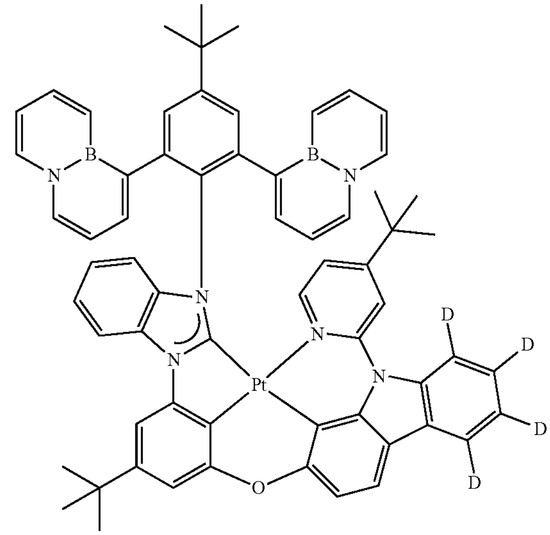
BD20
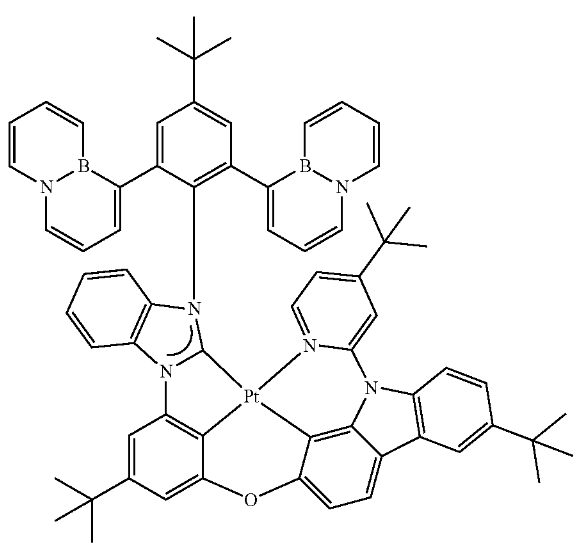

-continued
BD21
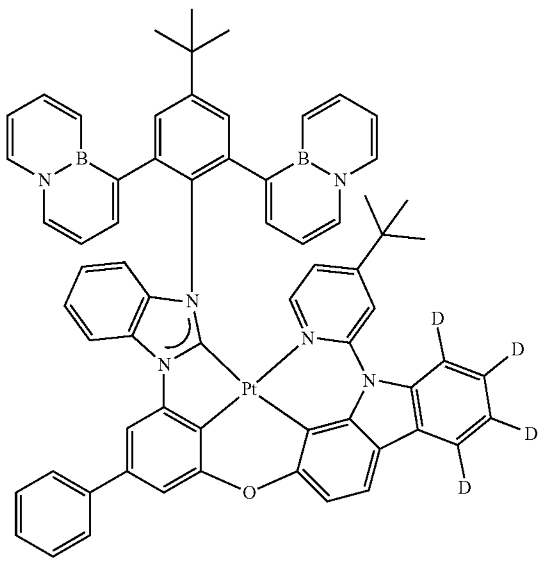
BD22
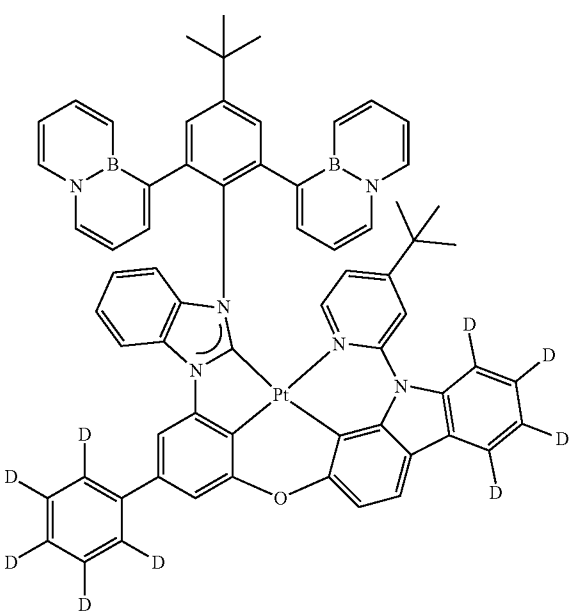
-continued
BD23
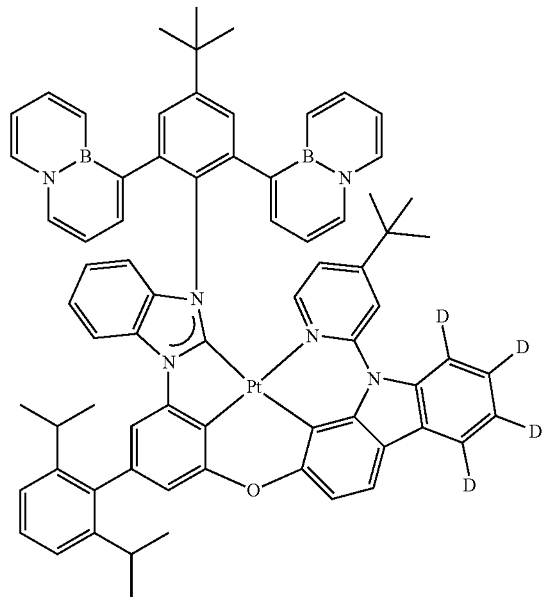
BD24
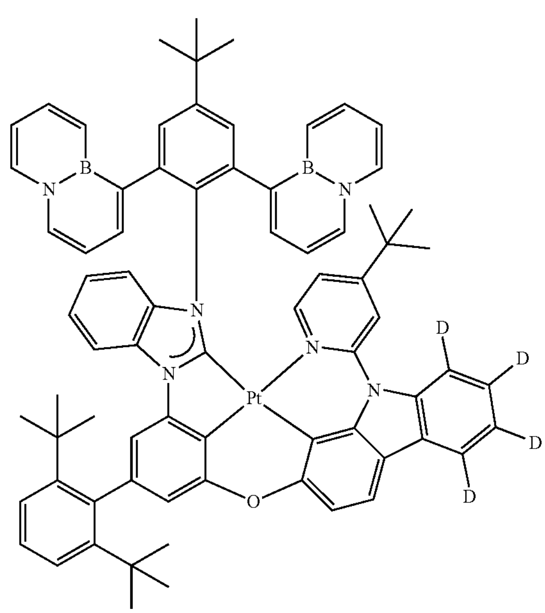

-continued
BD25
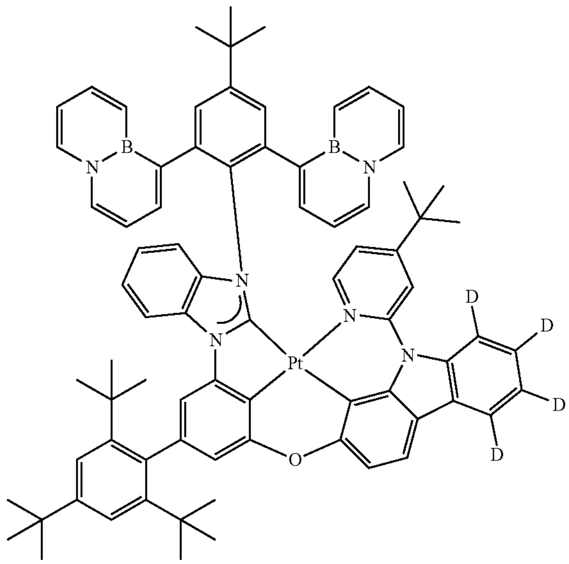
BD26
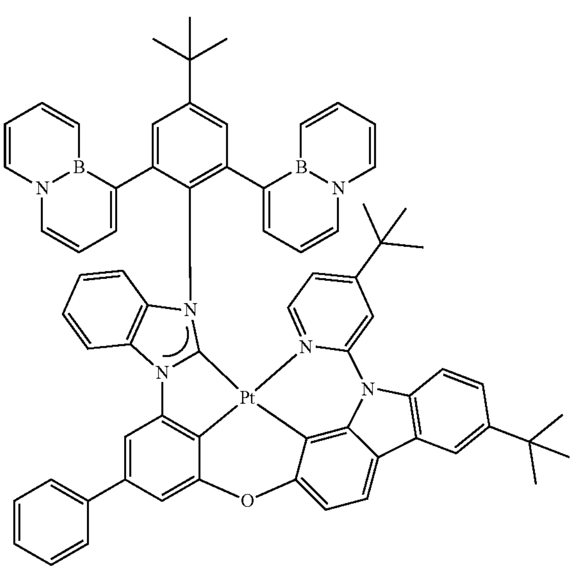
-continued
BD27
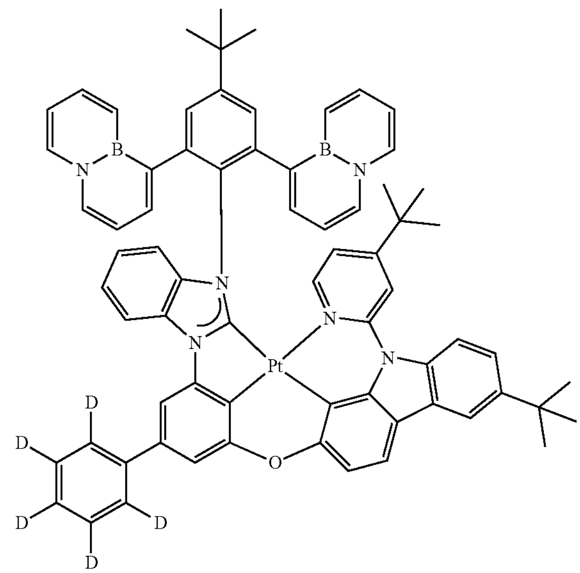
BD28
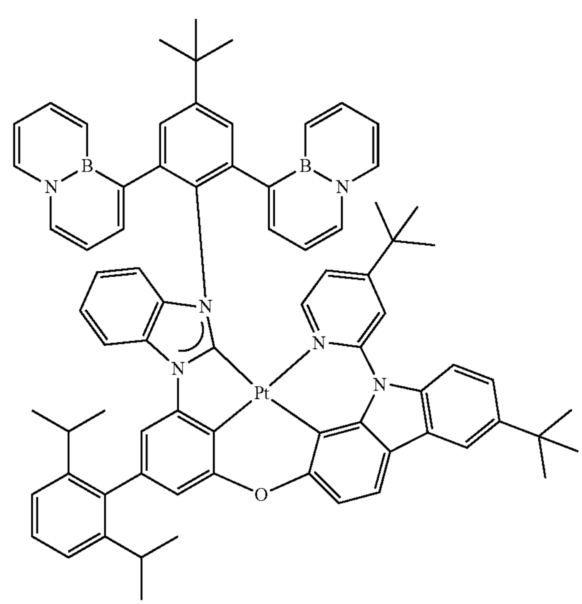

BD29
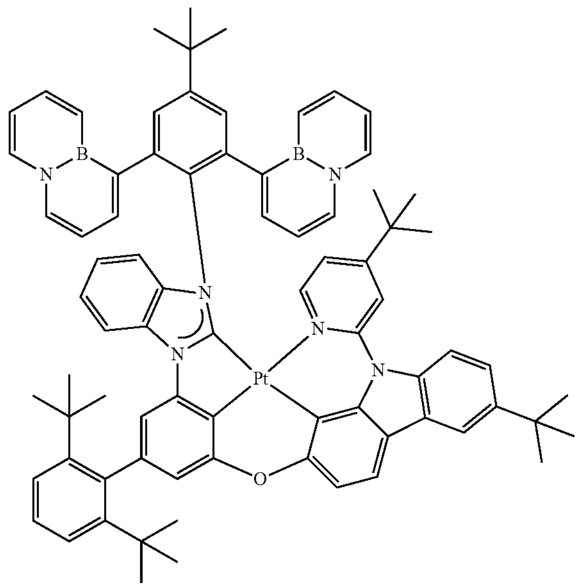
BD30
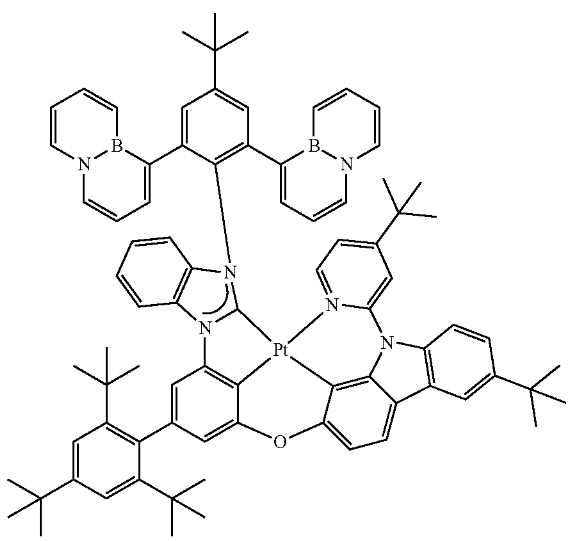
BD31
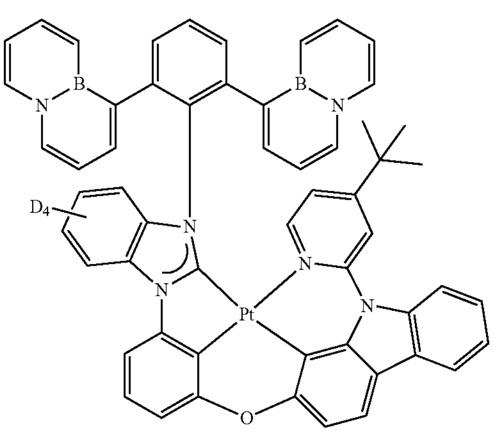
BD32
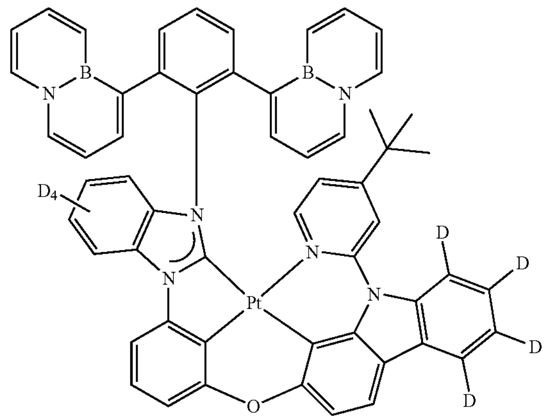
BD33
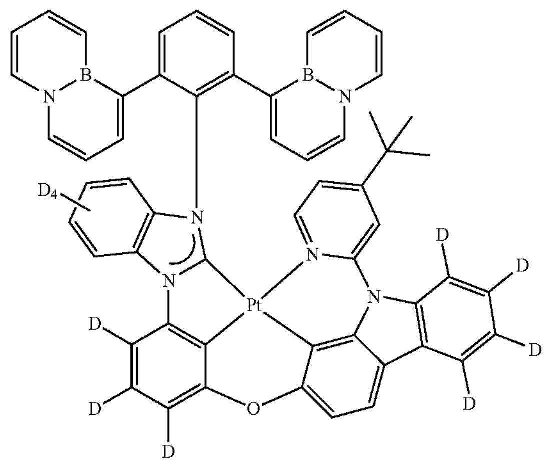
BD34
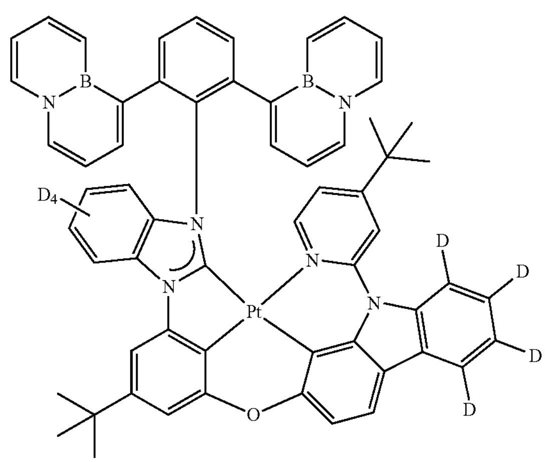

-continued
BD35
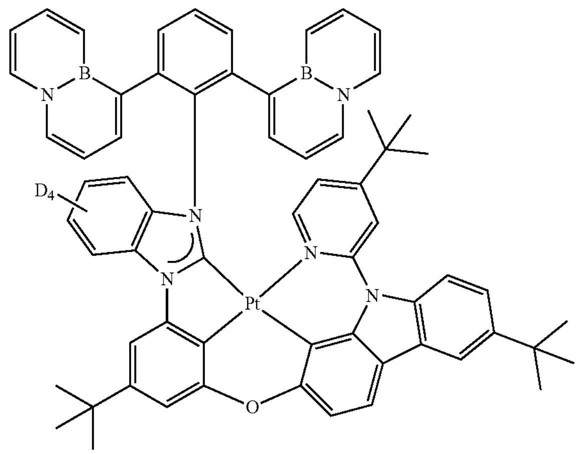
BD36
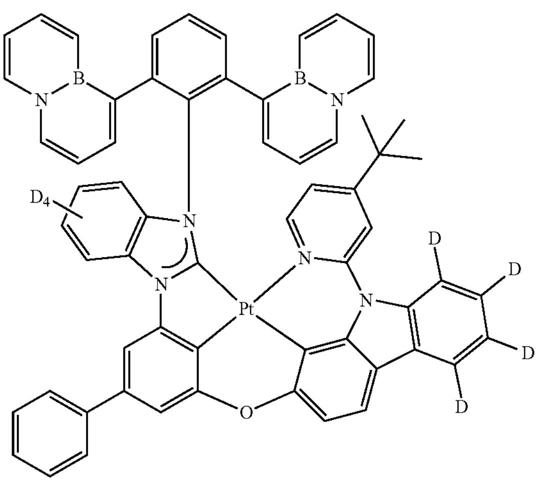
BD37
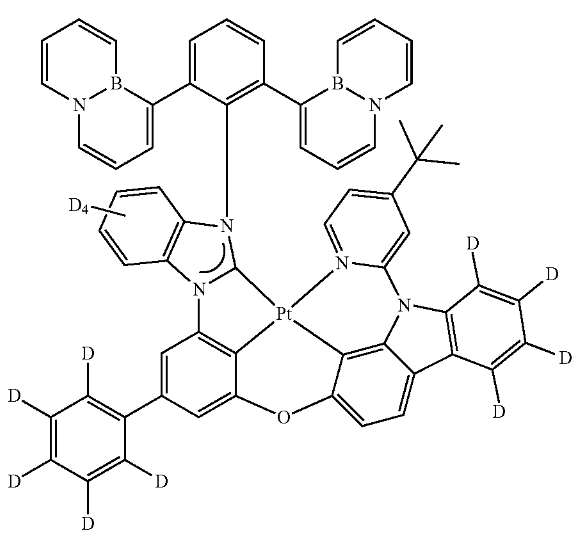
-continued
BD38
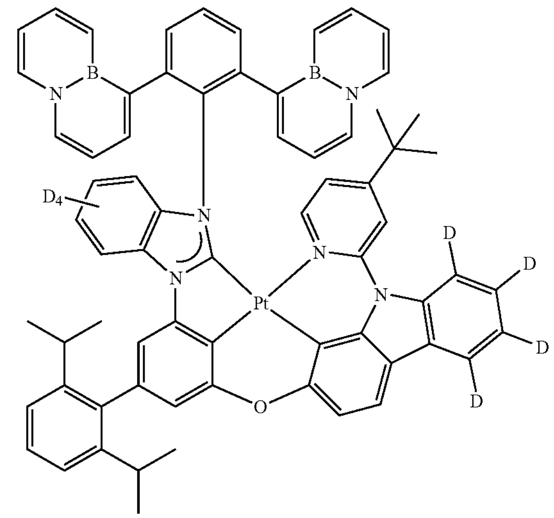
BD39
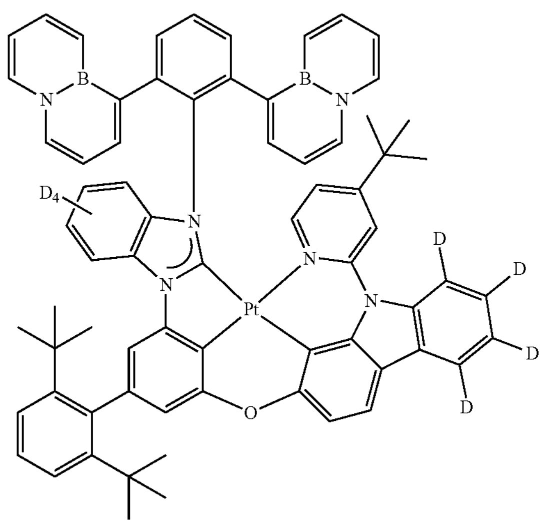
BD40
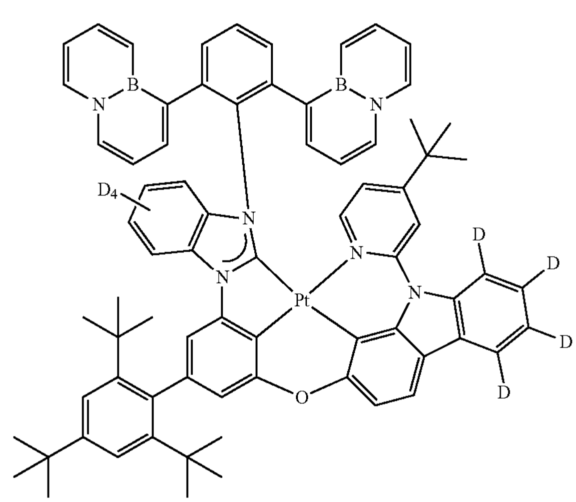

-continued
BD41
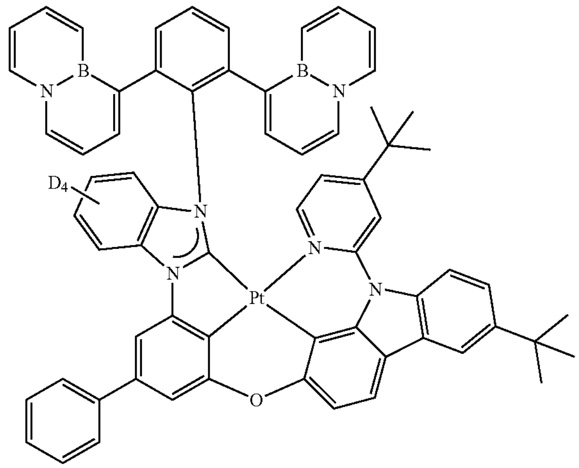
BD42
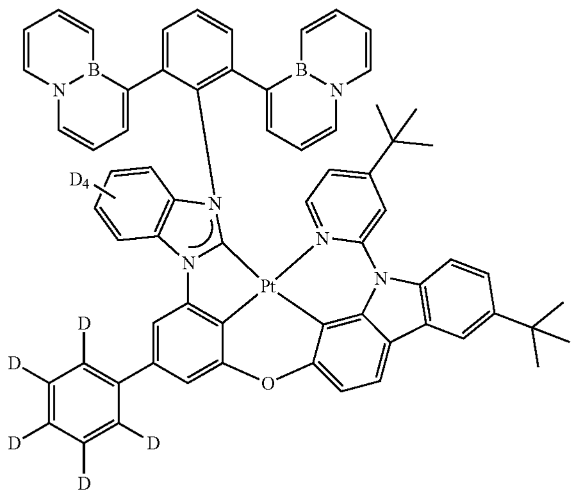
BD43
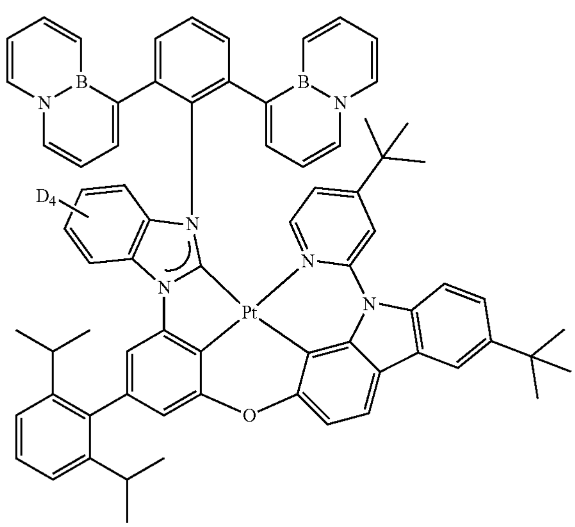
-continued
BD44
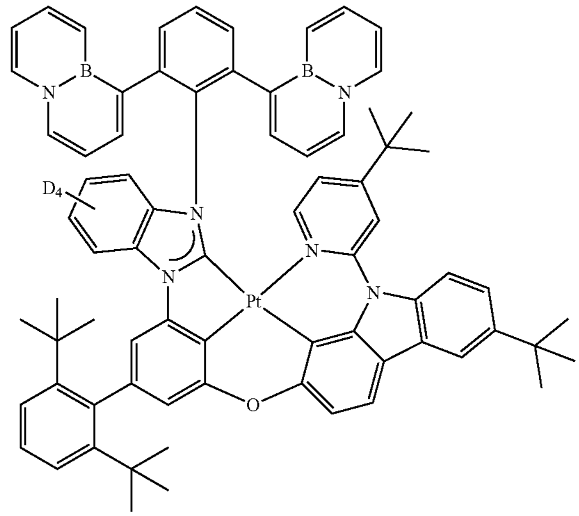
BD45
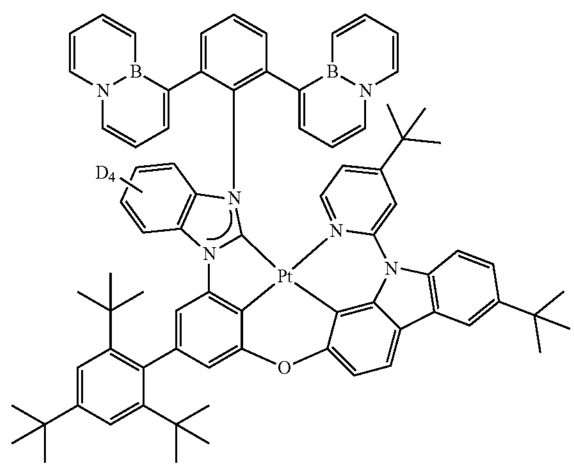
BD46
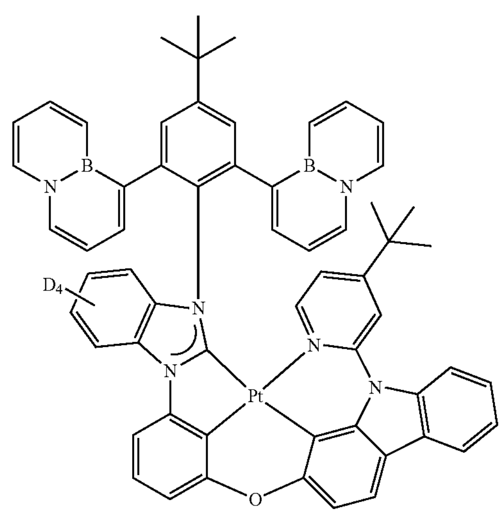

-continued
BD47
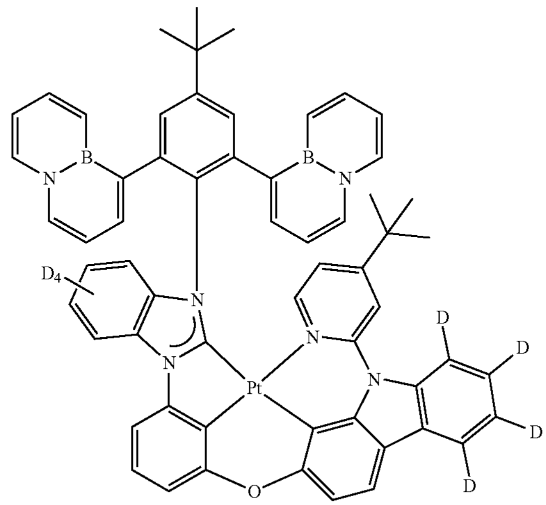
BD48
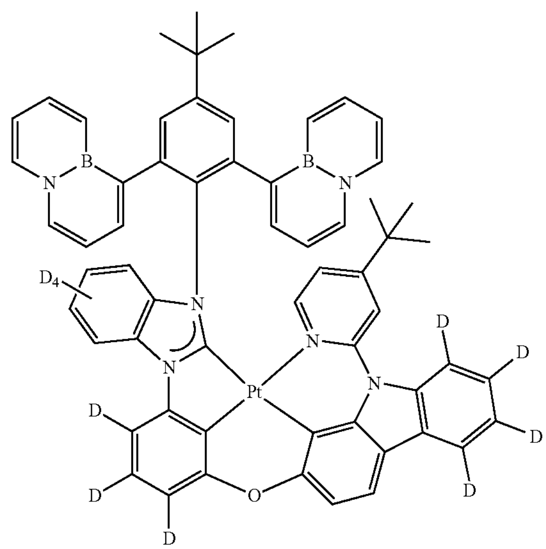
BD49
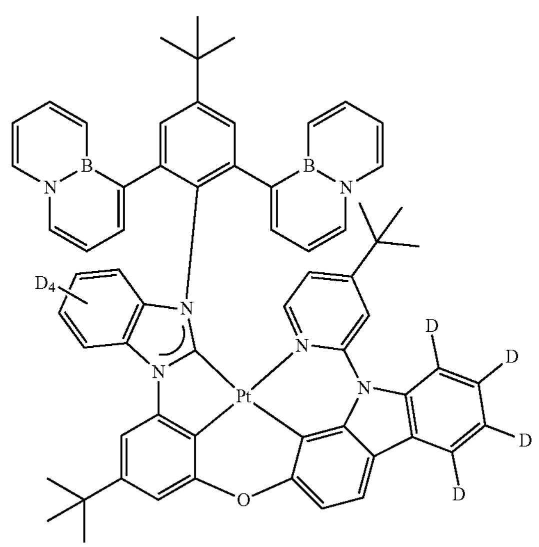
-continued
BD50
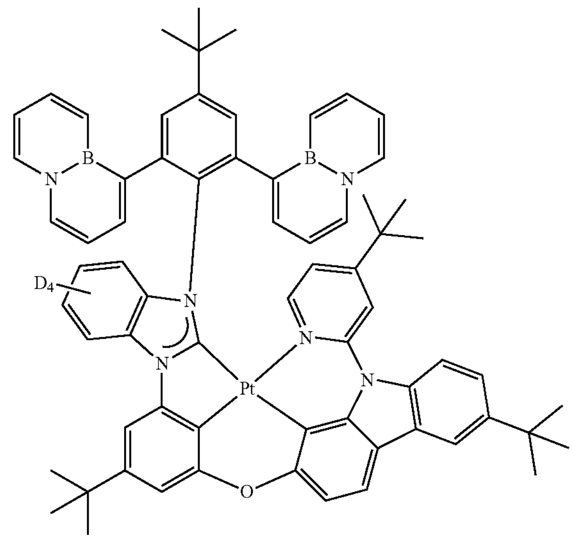
BD51
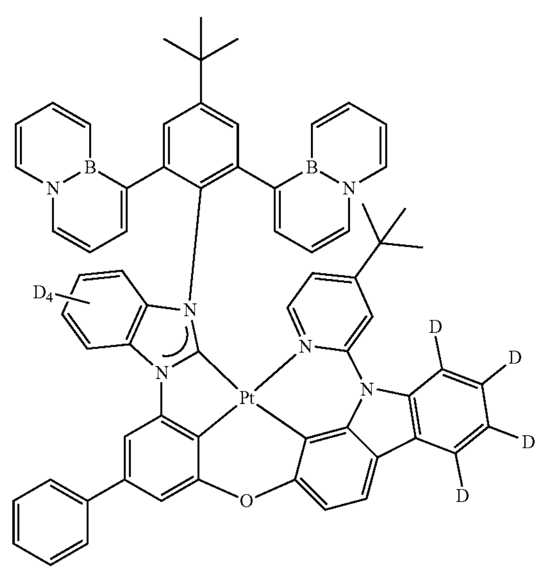

BD52
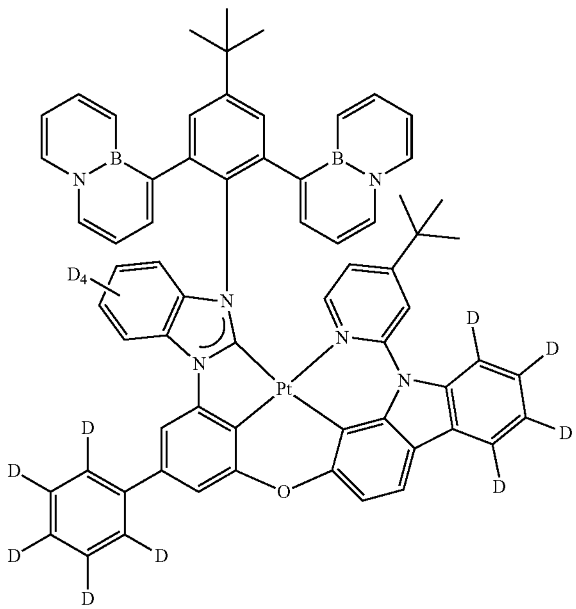
BD53
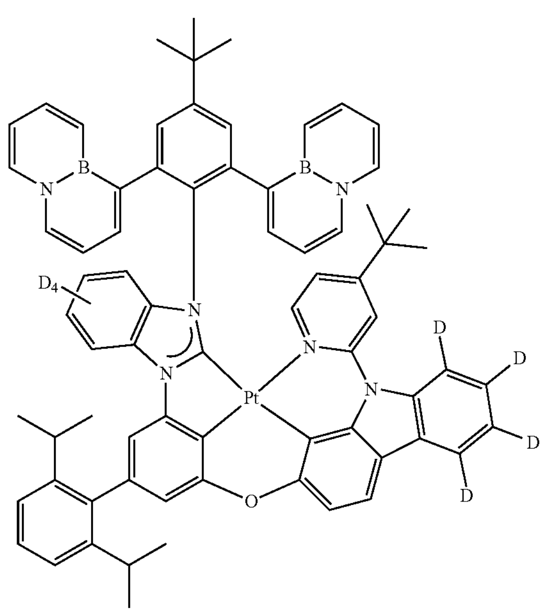
BD54
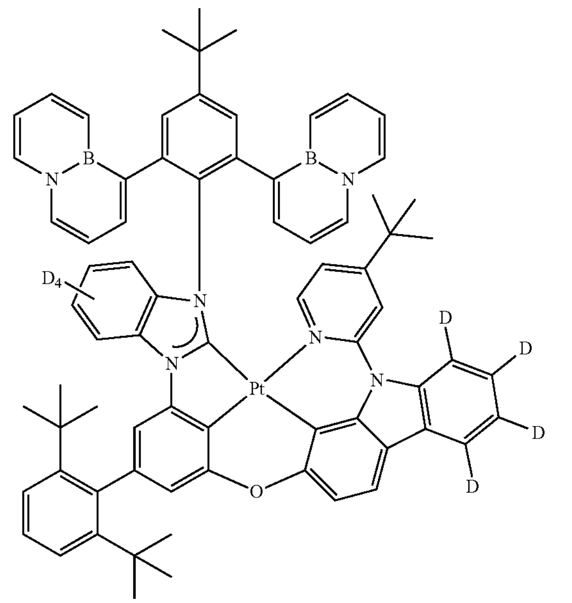
BD55
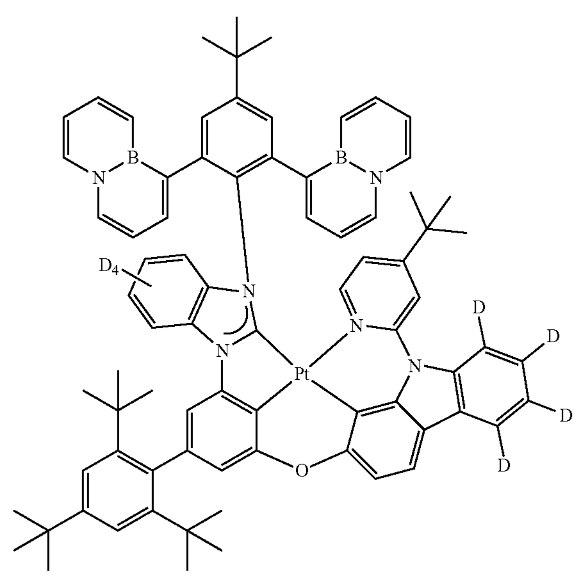

-continued
BD56
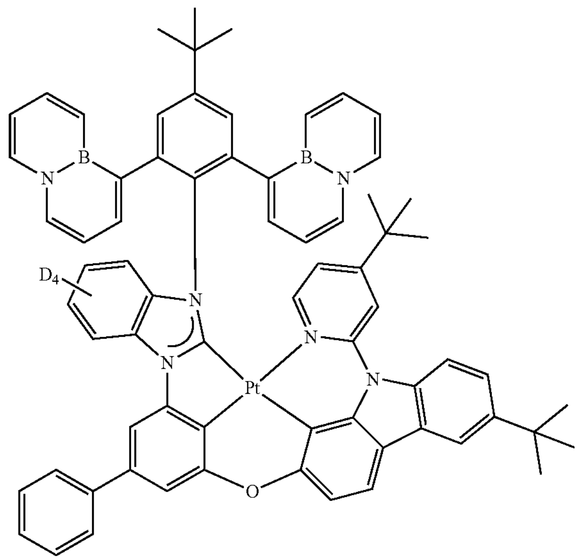
BD57
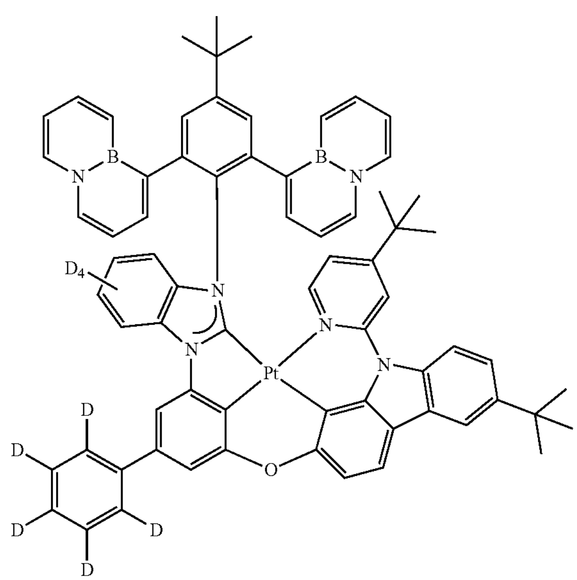
-continued
BD58
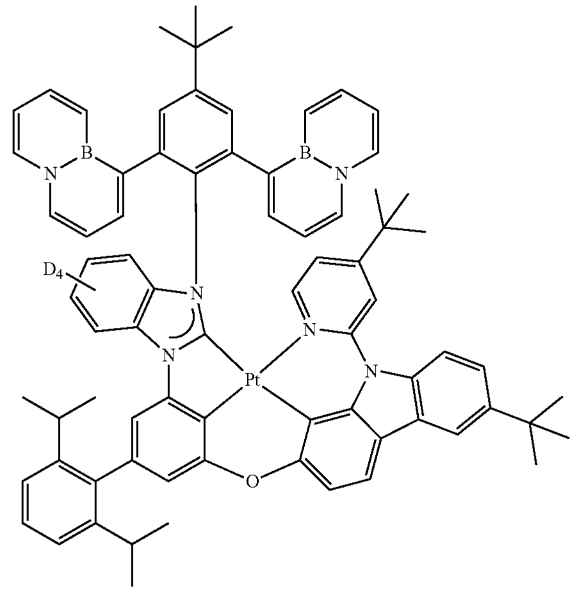
BD59
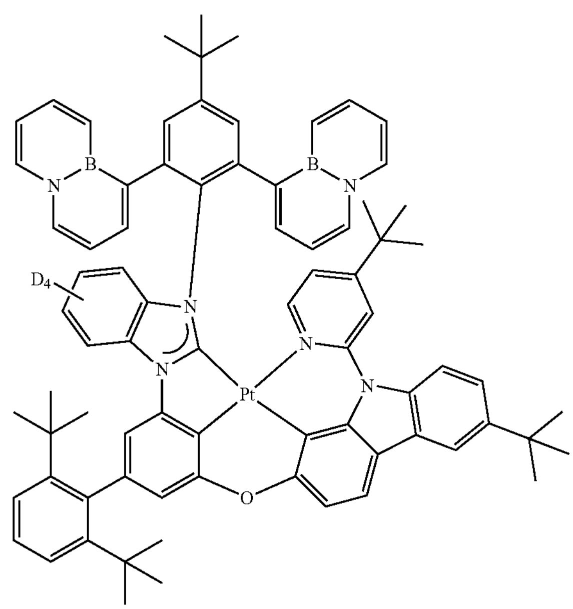

BD60
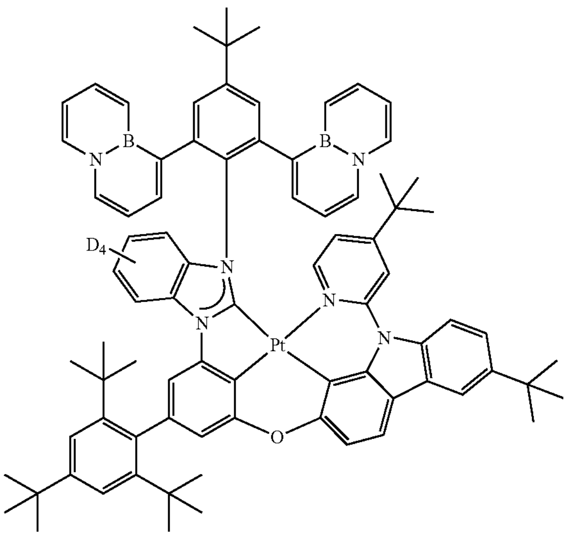
BD61
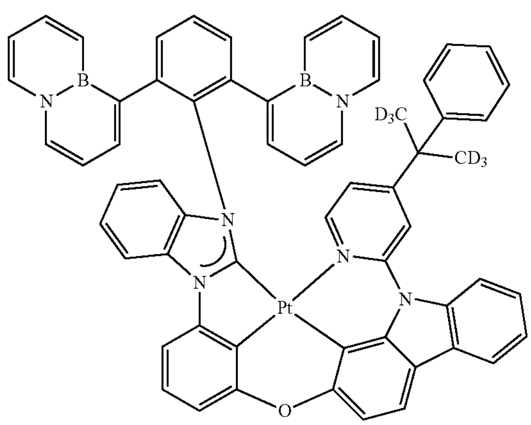
BD62
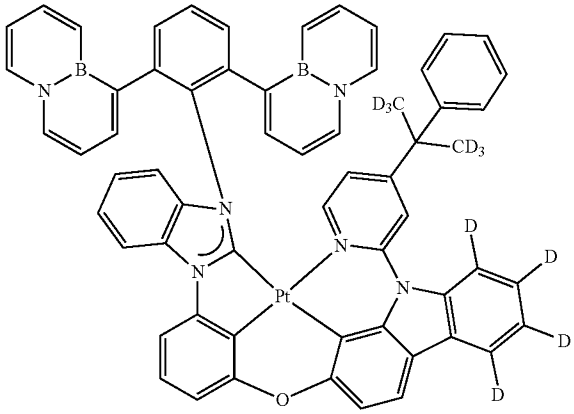
BD63
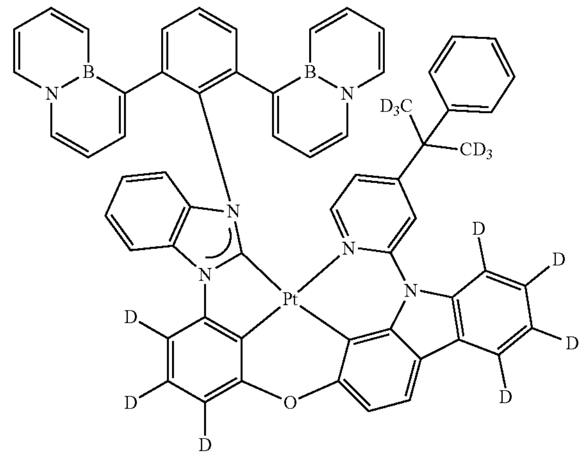
BD64
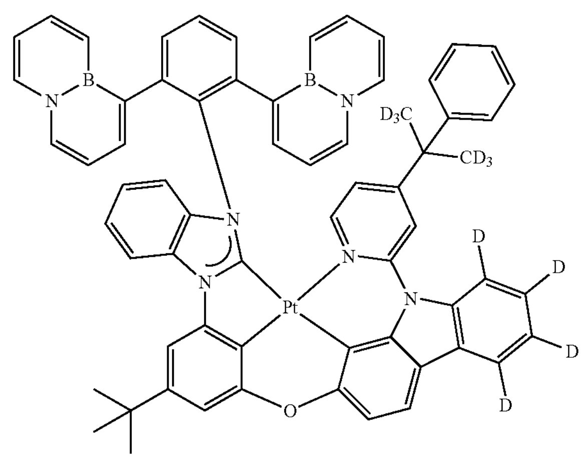
BD65
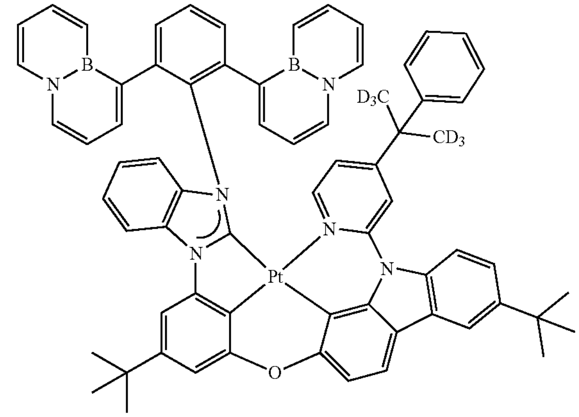

-continued
BD66
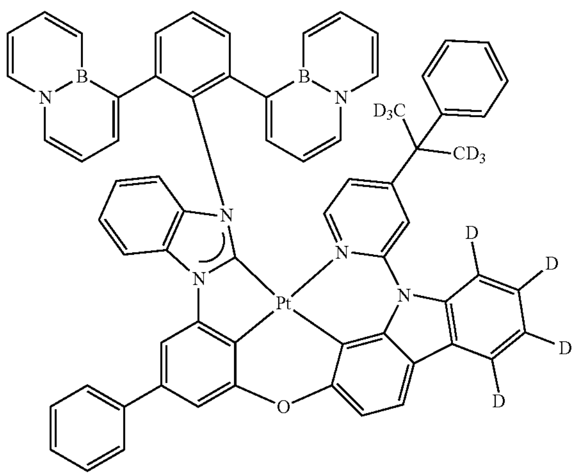
BD67
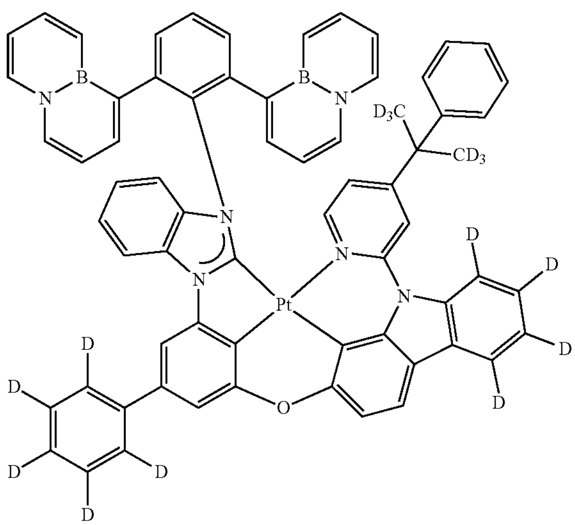
BD68
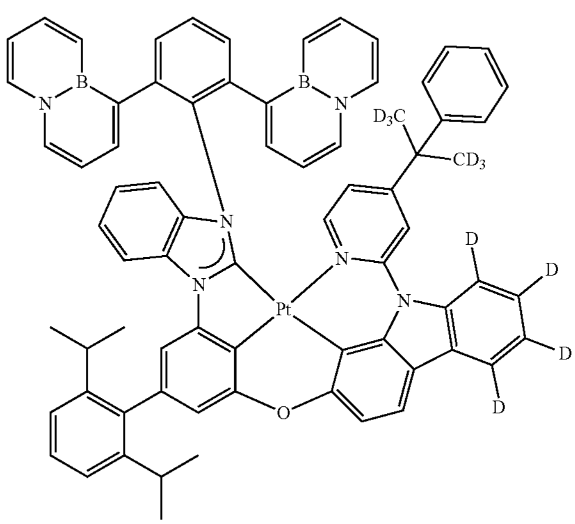
-continued
BD69
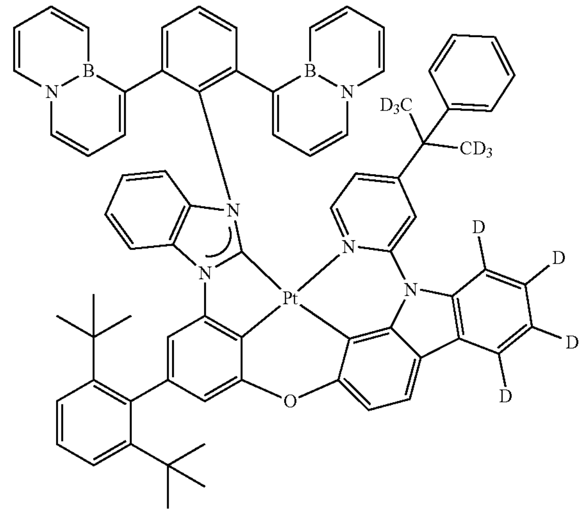
BD70
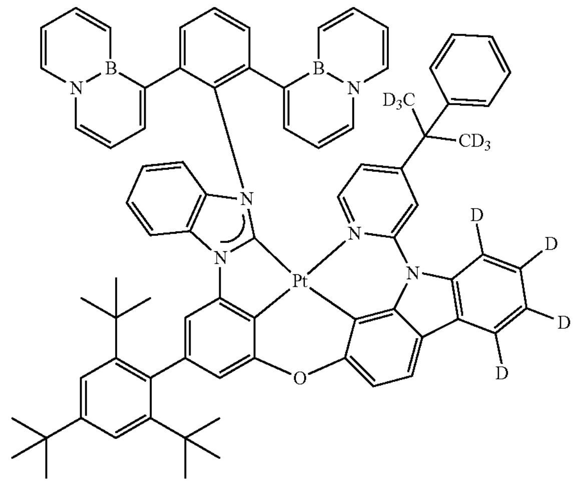
BD71
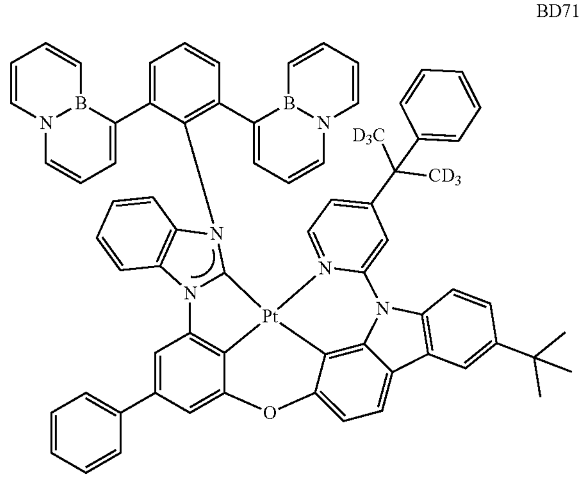

-continued
BD72
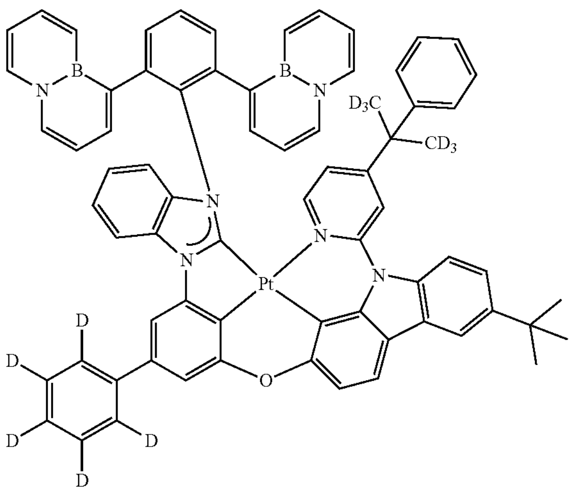
BD73
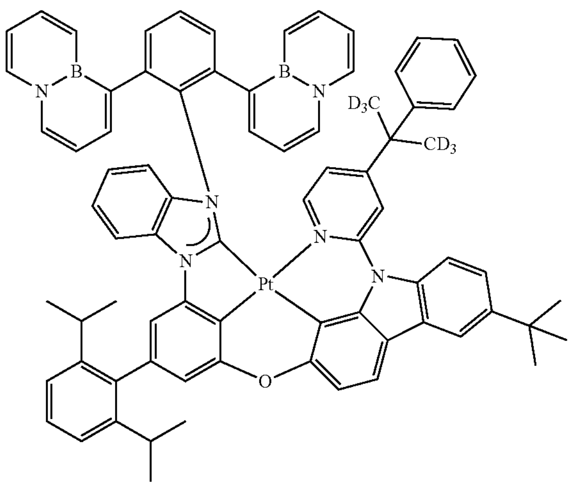
BD74
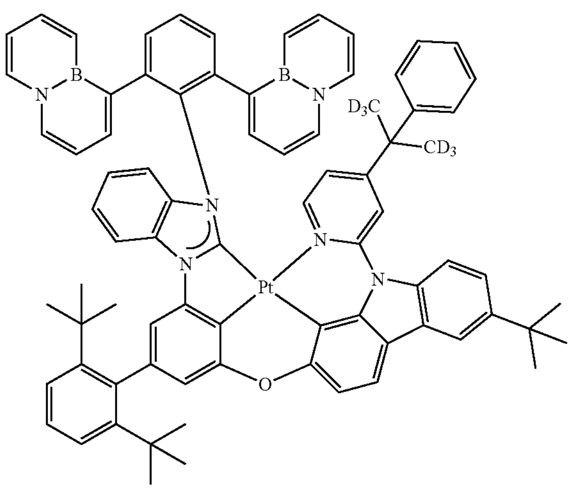
-continued
BD75
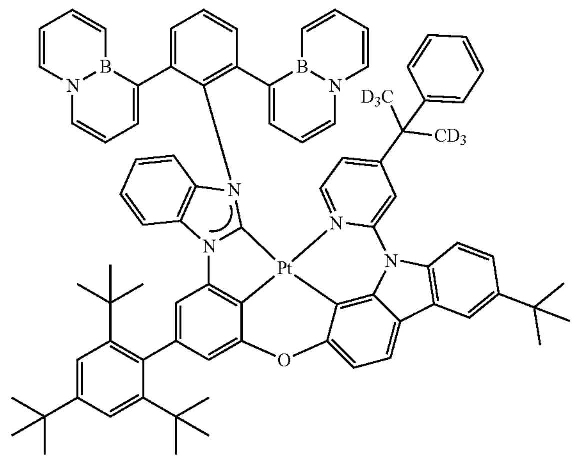
BD76
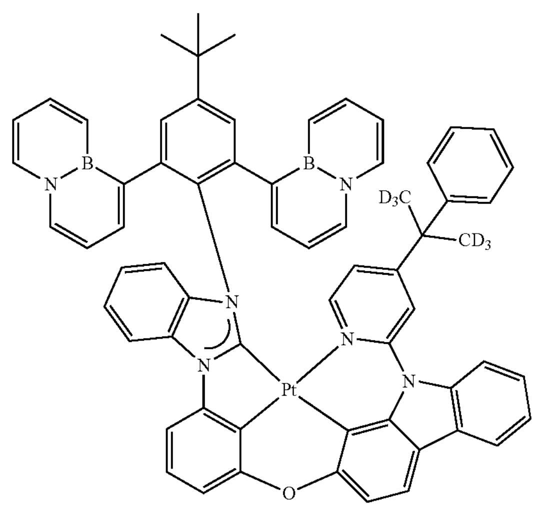
BD77
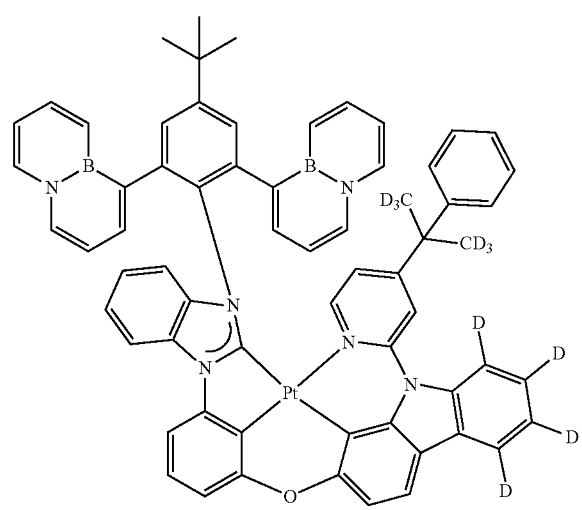

-continued
BD78
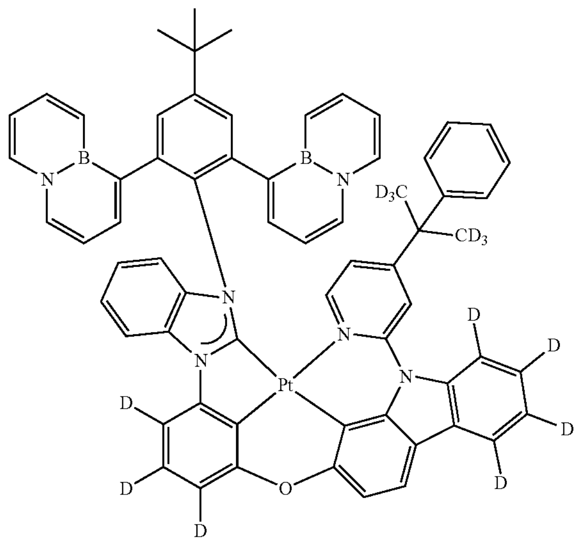
BD79
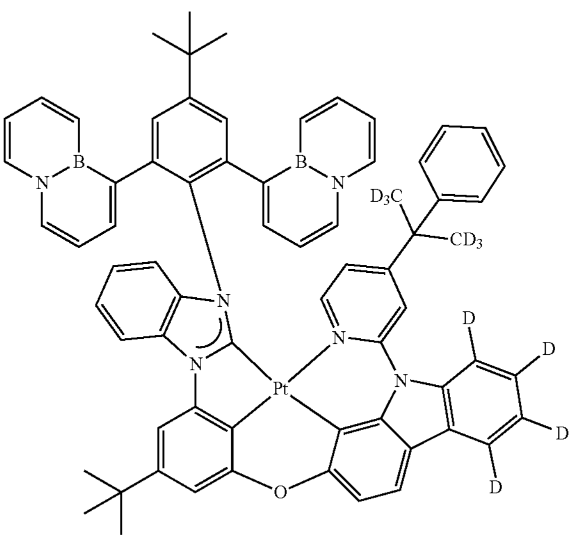
BD80
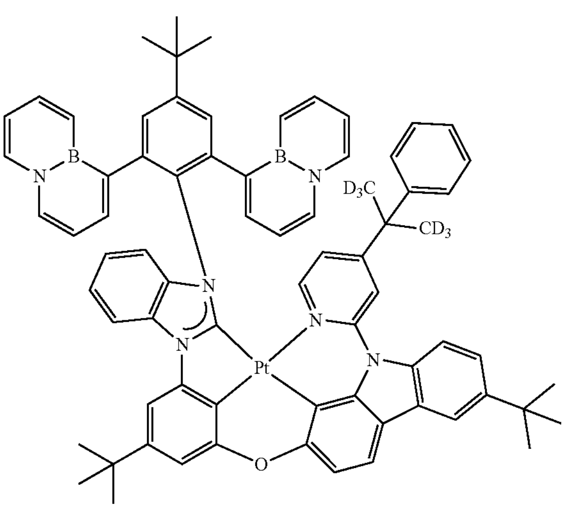
-continued
BD81
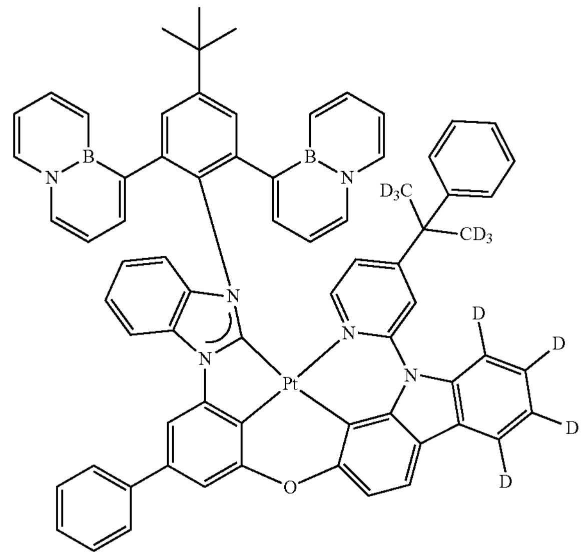
BD82
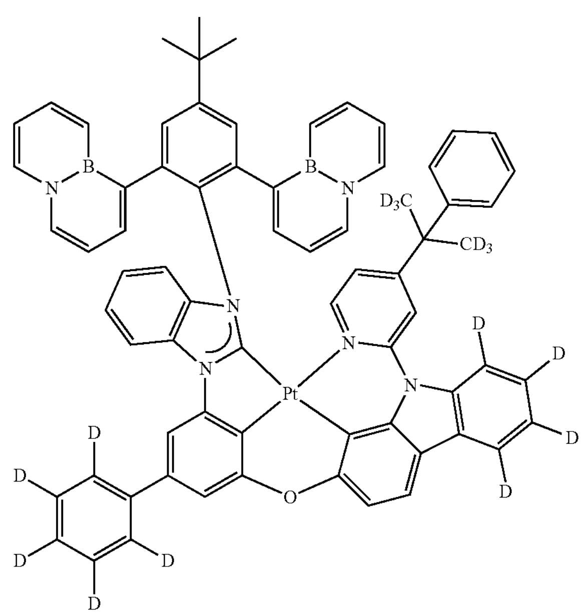

BD83
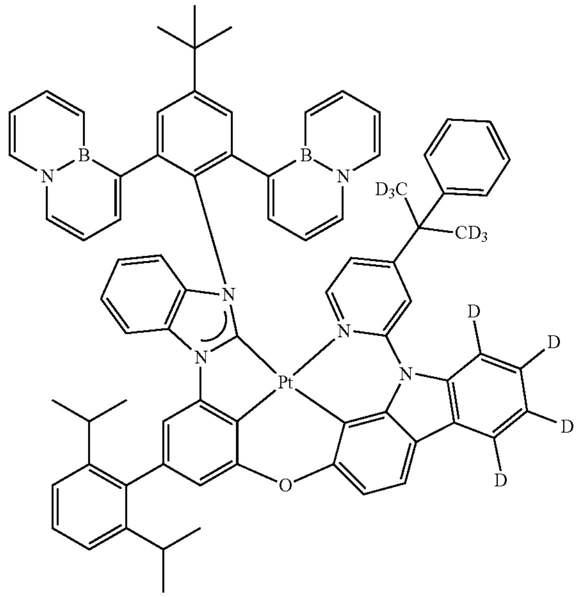
BD84
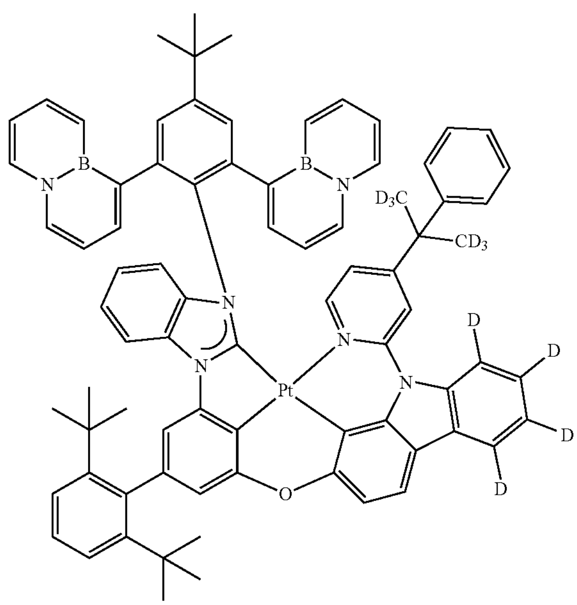
BD85
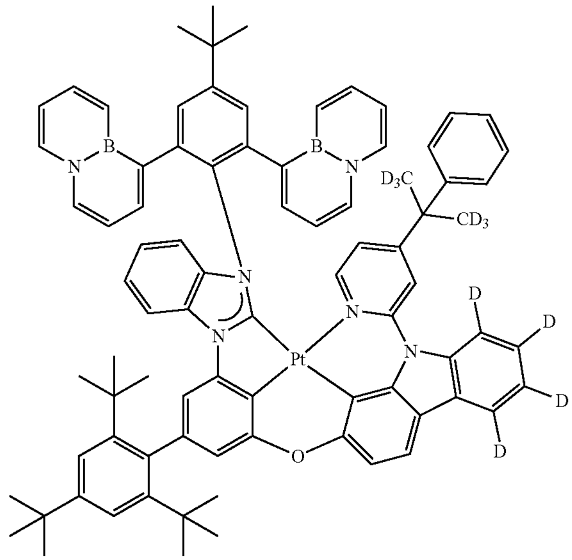
BD86
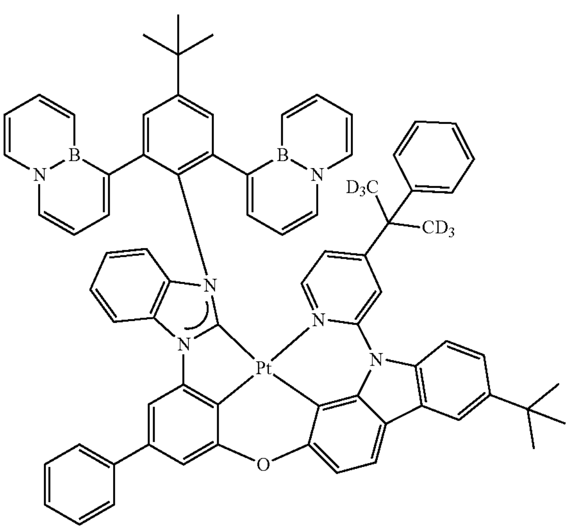

BD87
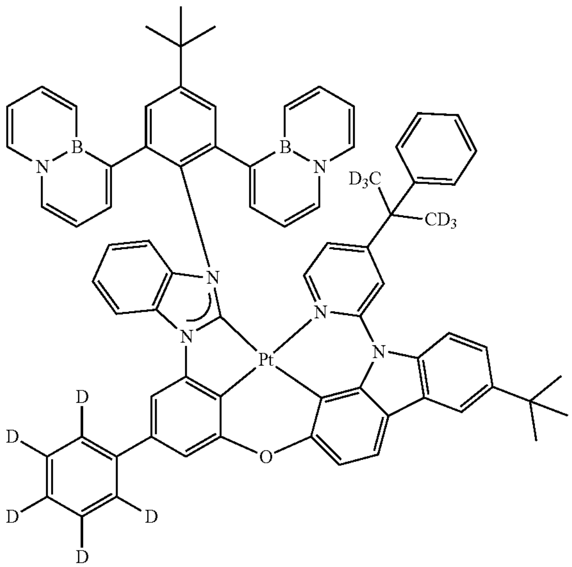
BD89
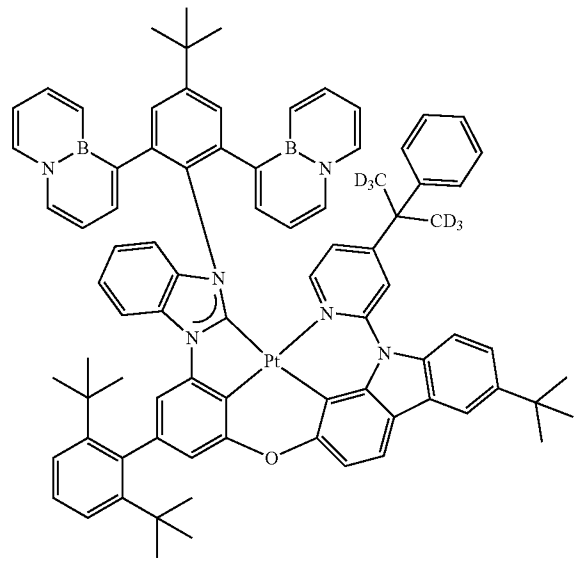
BD88
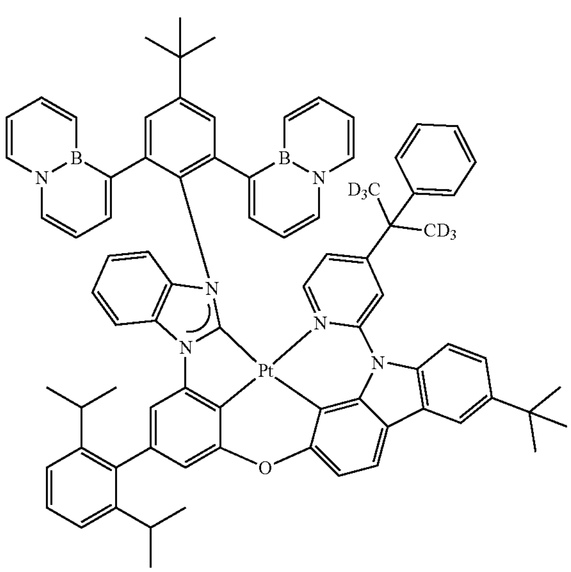
BD90
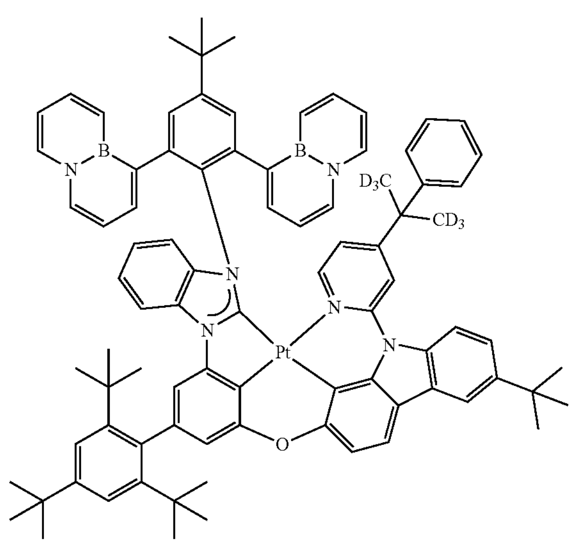

BD91
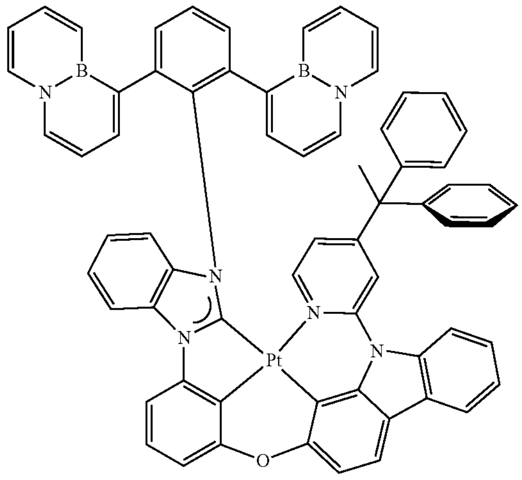
BD92
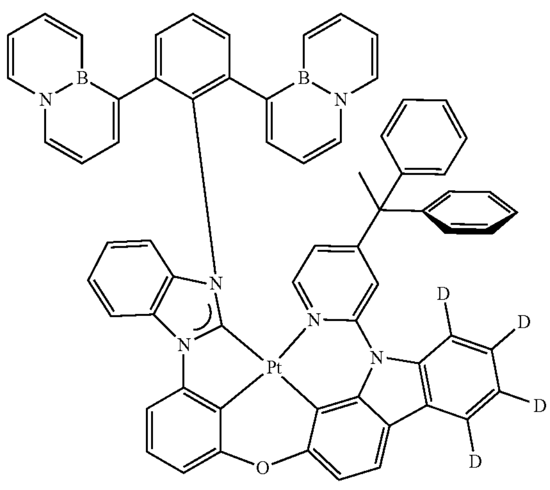
BD93
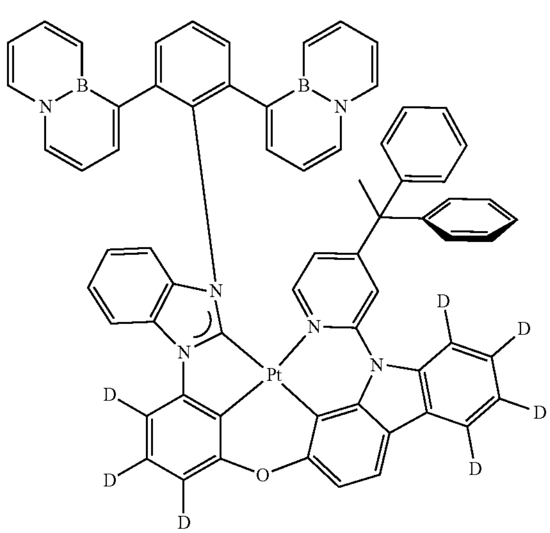
-continued
BD94
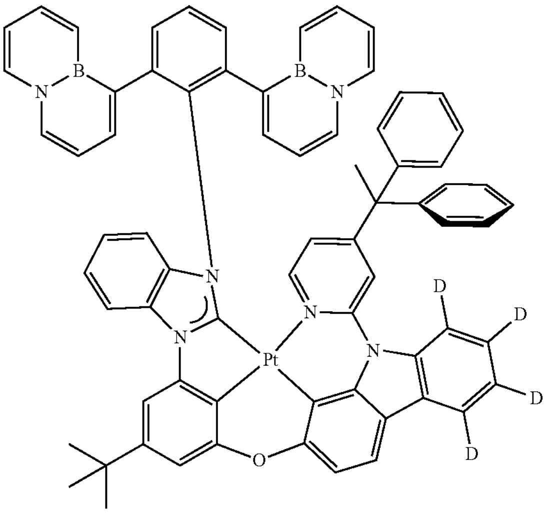
BD95
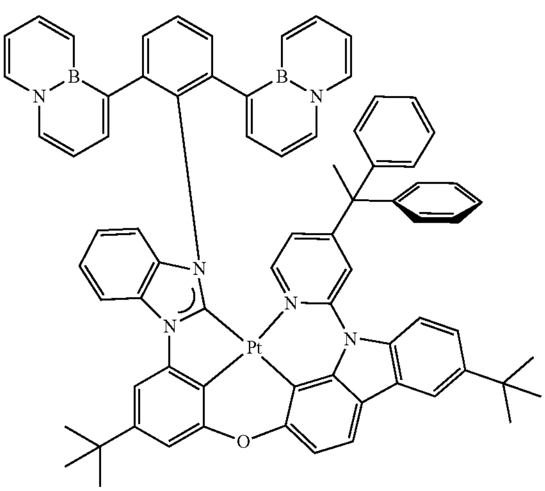
BD96
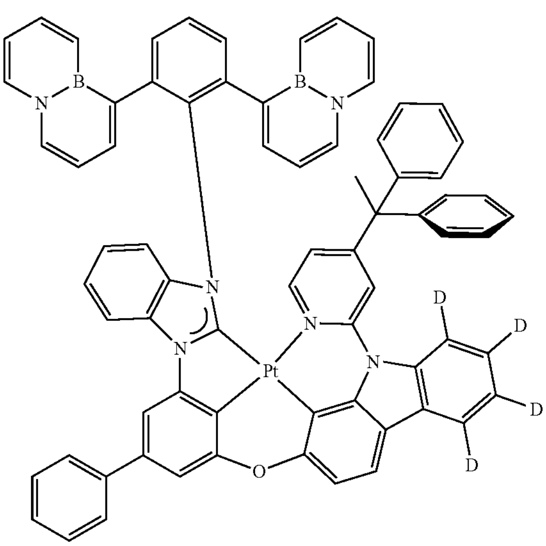

BD97
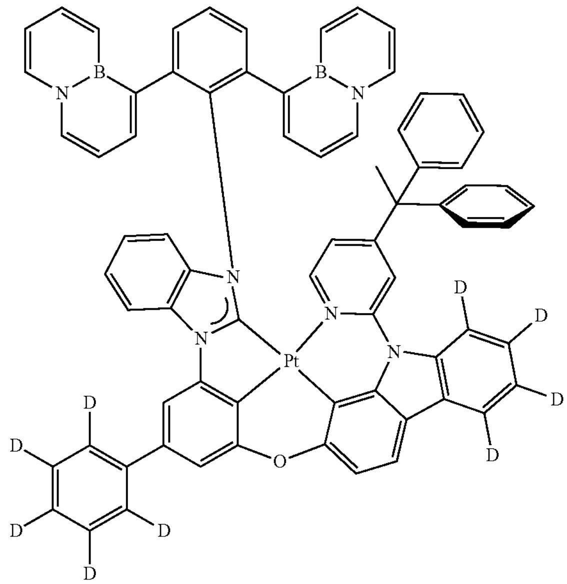
BD98
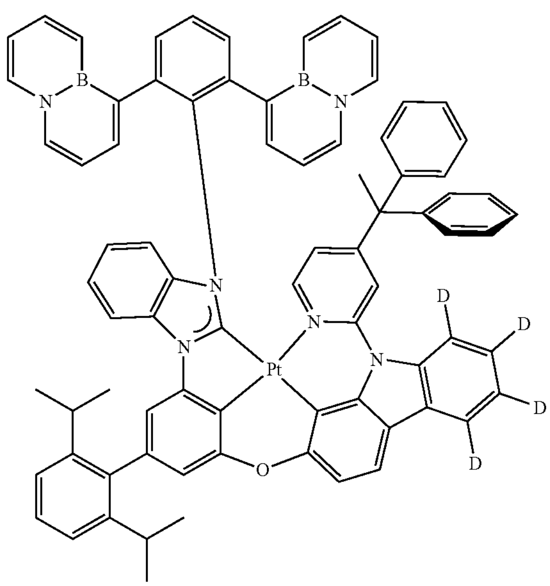
BD99
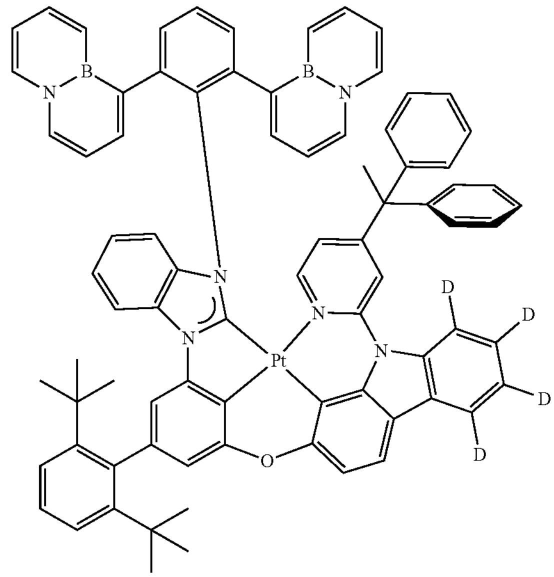
BD100
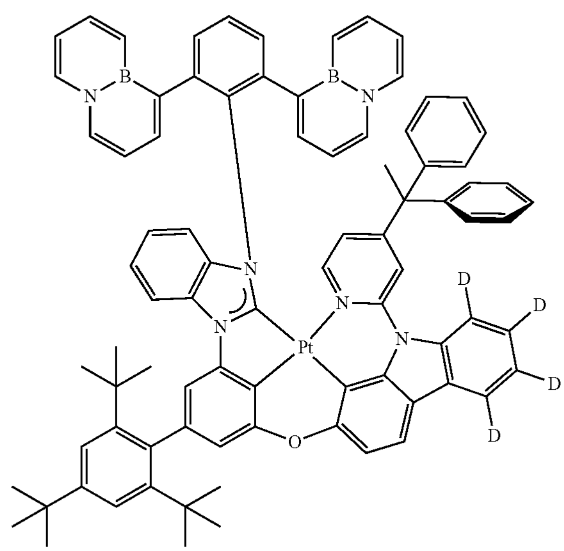

-continued
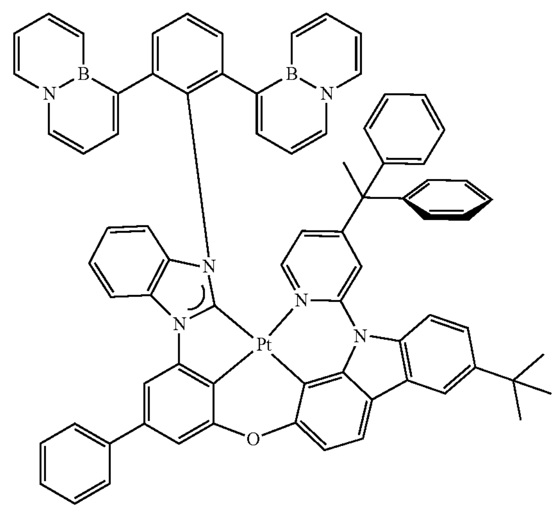
BD101
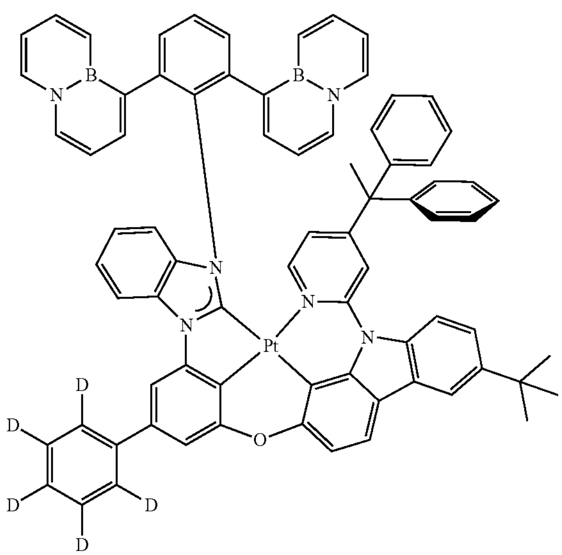
BD102
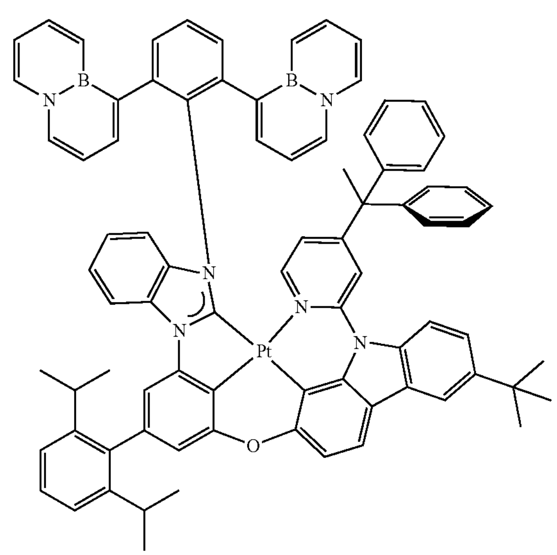
BD103
-continued
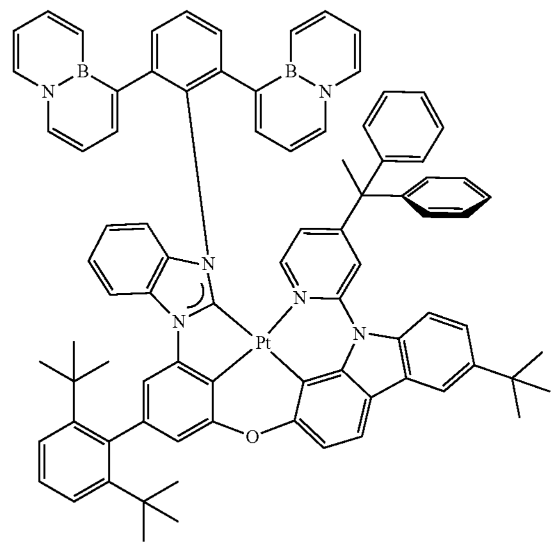
BD104
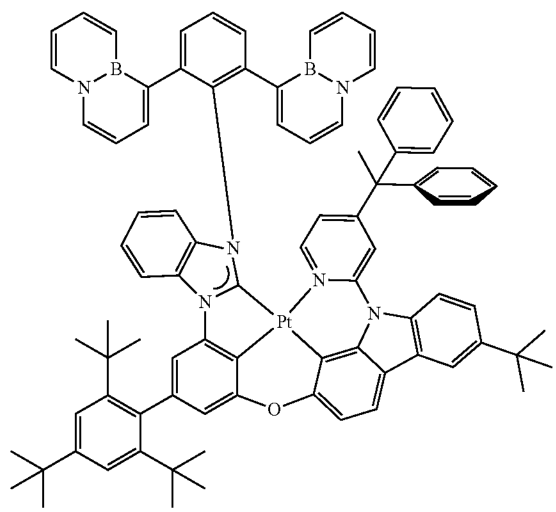
BD105
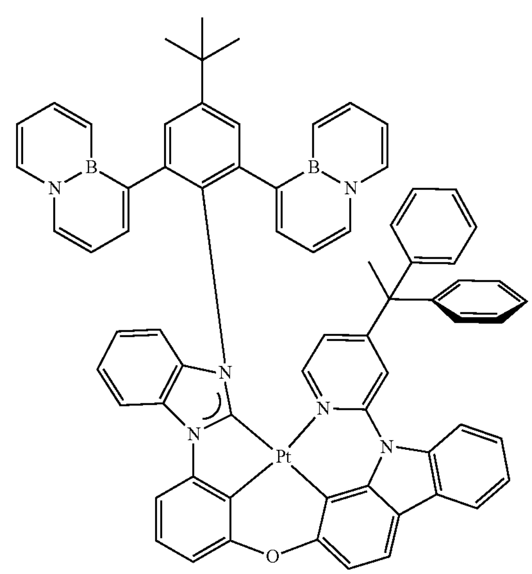
BD106

-continued
BD107
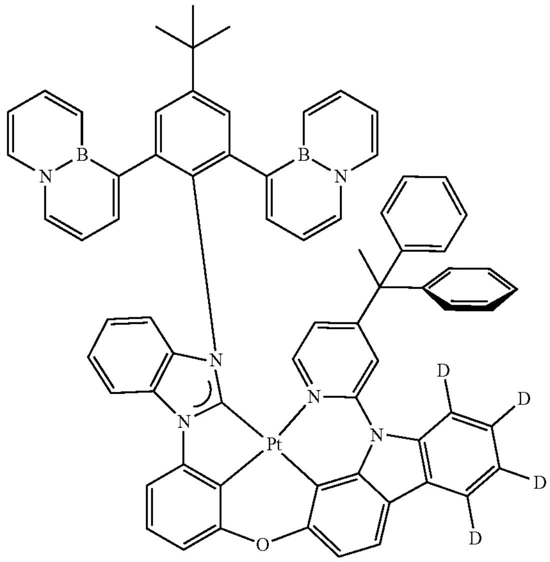
BD108
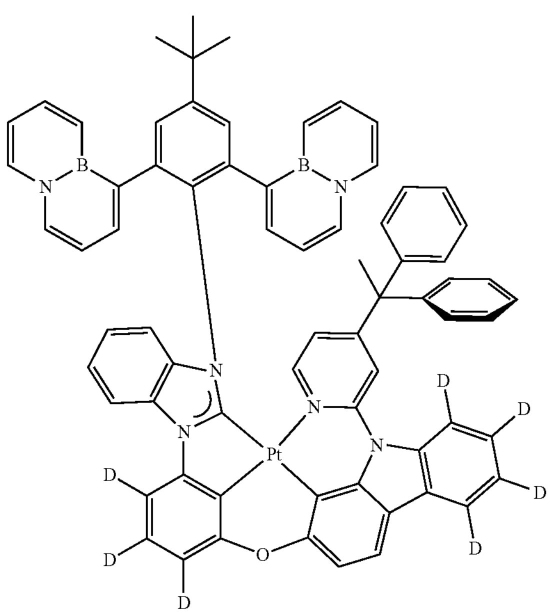
-continued
BD109
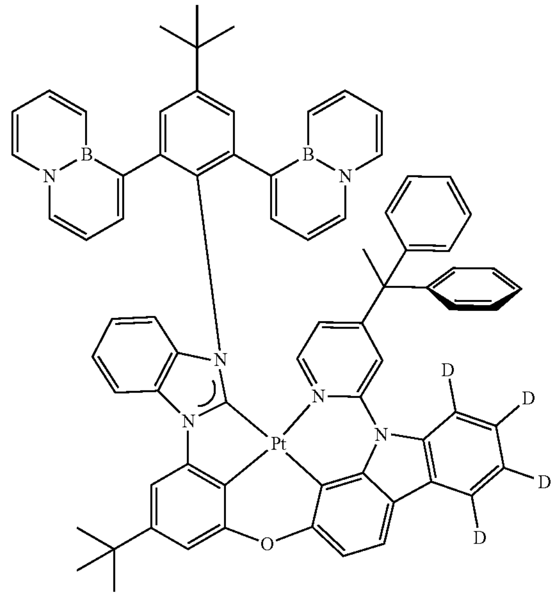
BD110
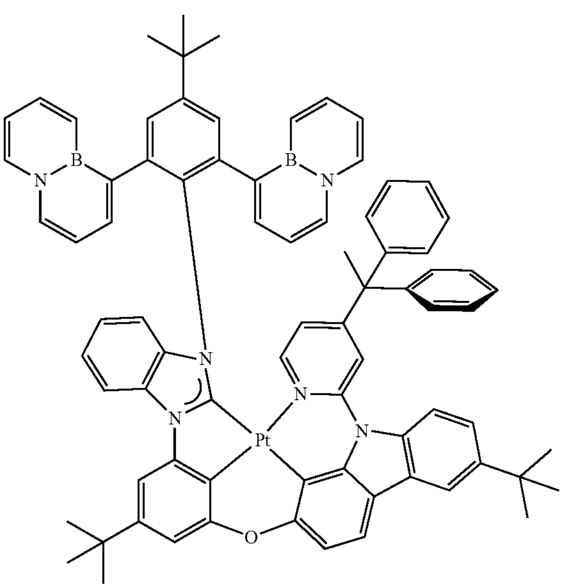

-continued
BD111
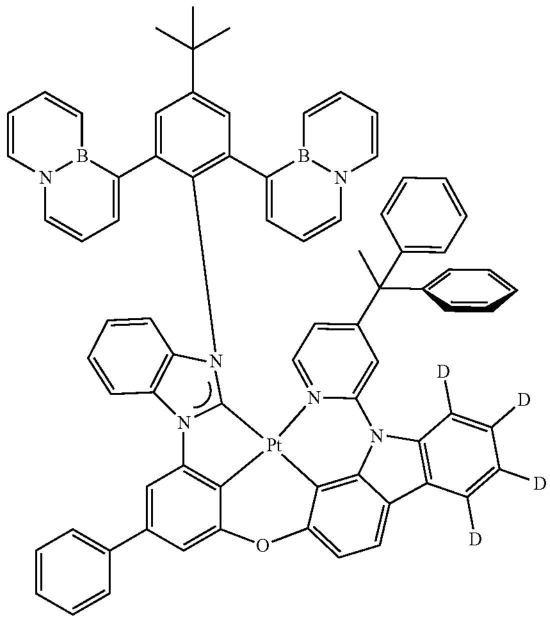
BD112
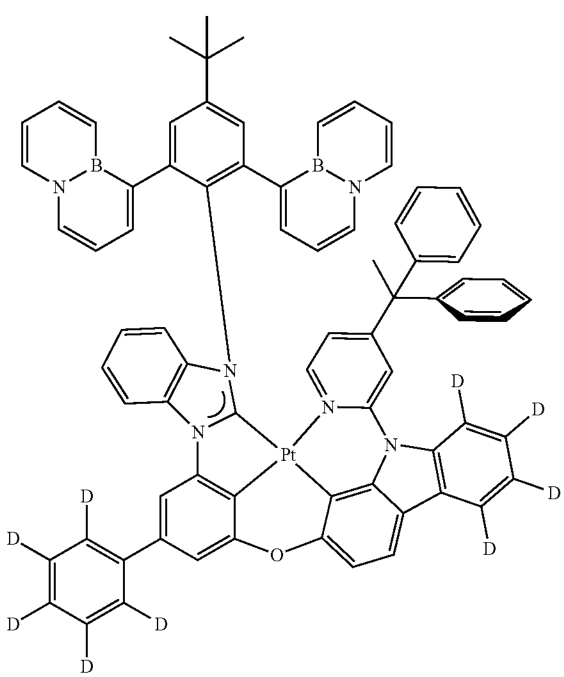
-continued
BD113
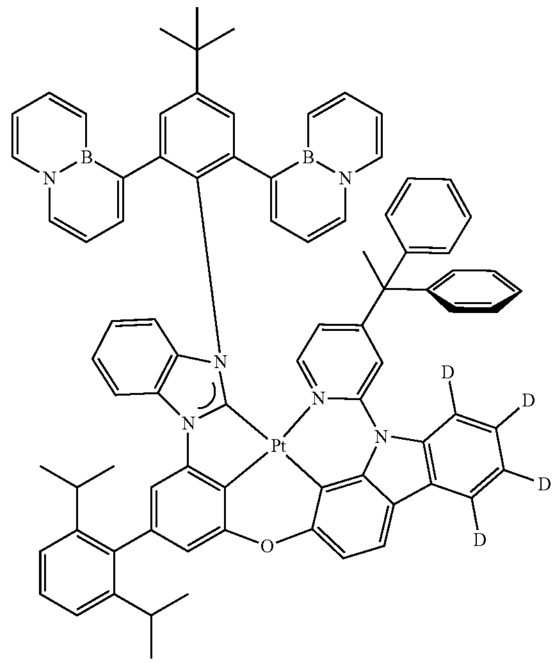
BD114
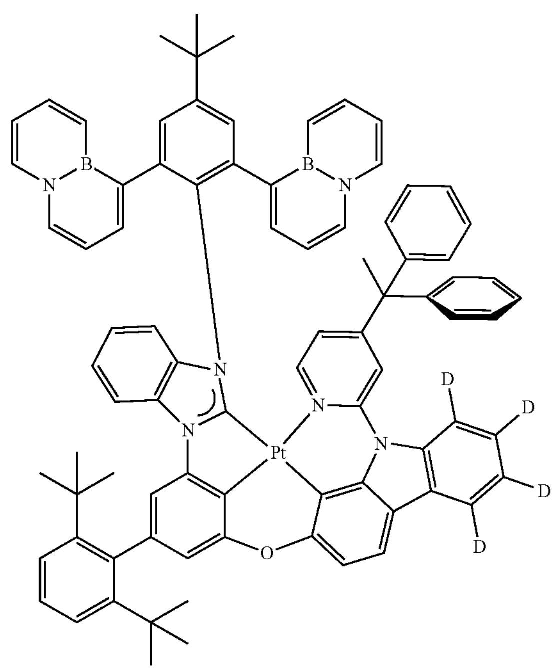

BD115
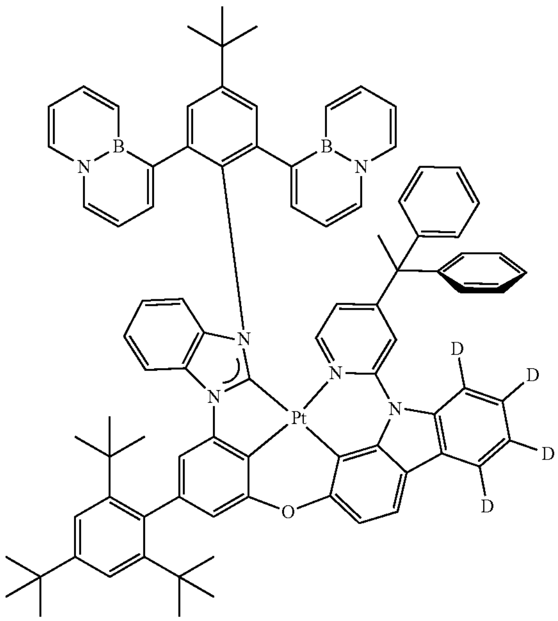
BD117
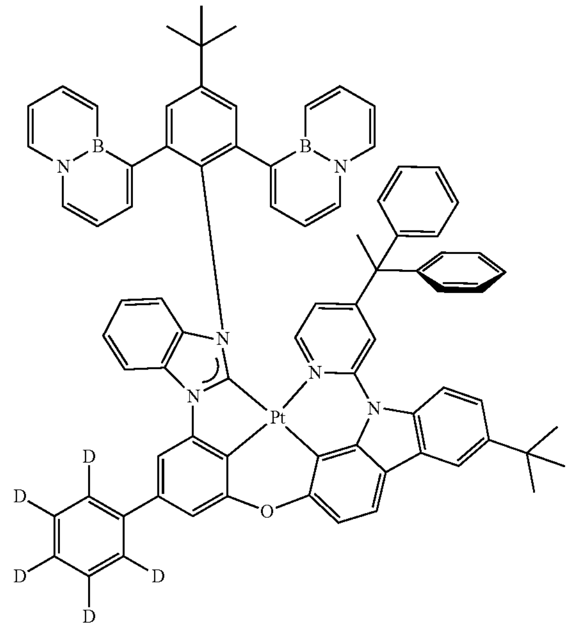
BD116
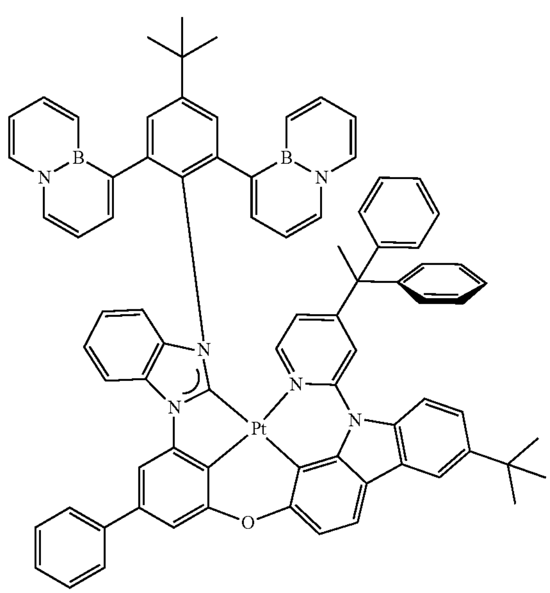
BD118
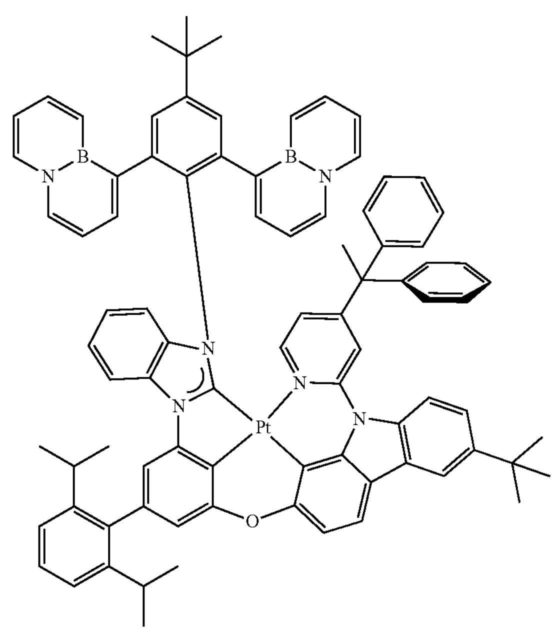

-continued
BD119
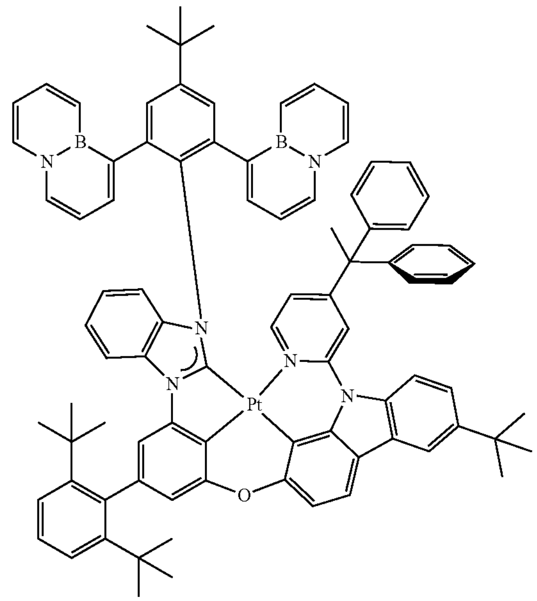
BD120
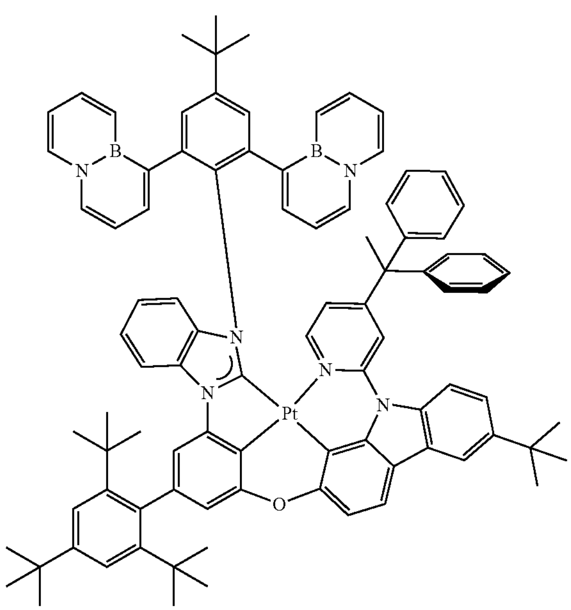
-continued
BD0121
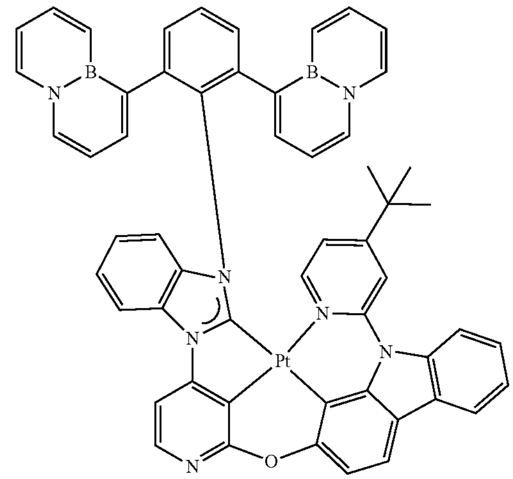
BD122
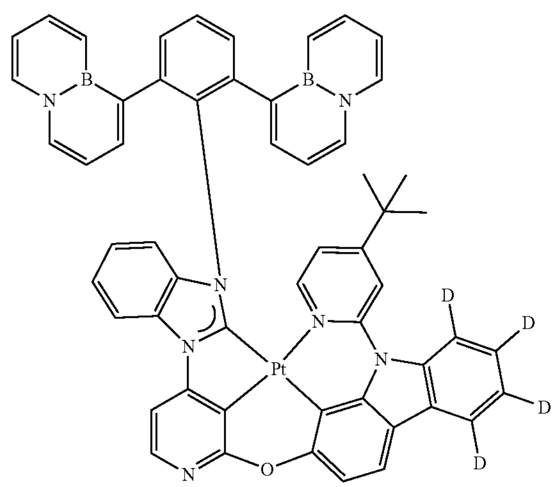
BD123
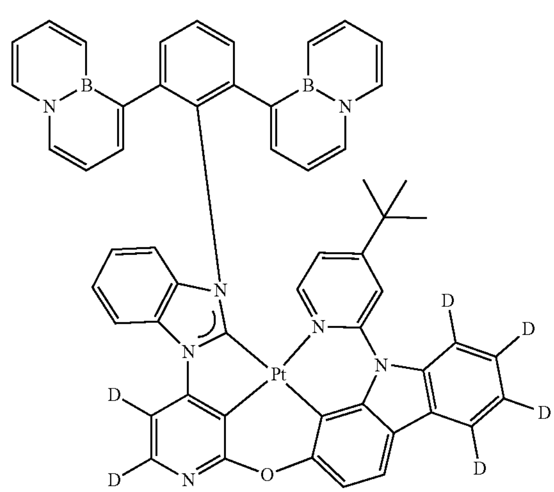

-continued
BD124
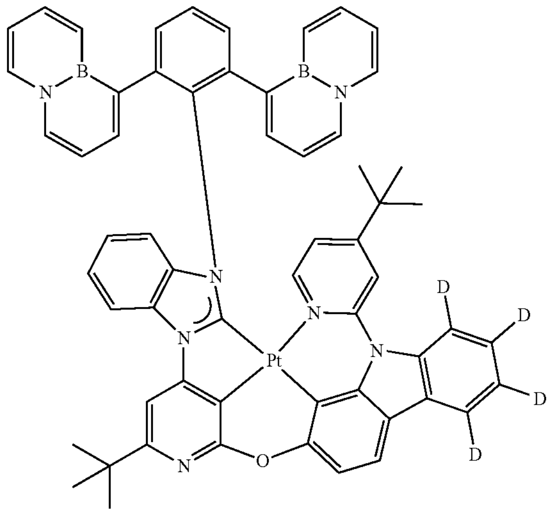
BD125
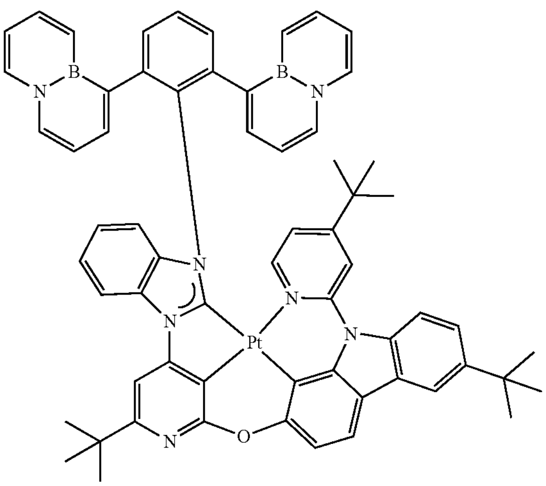
BD126
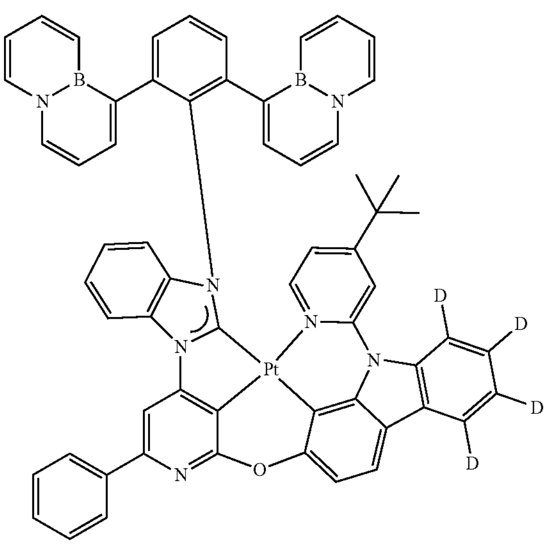
-continued
BD127
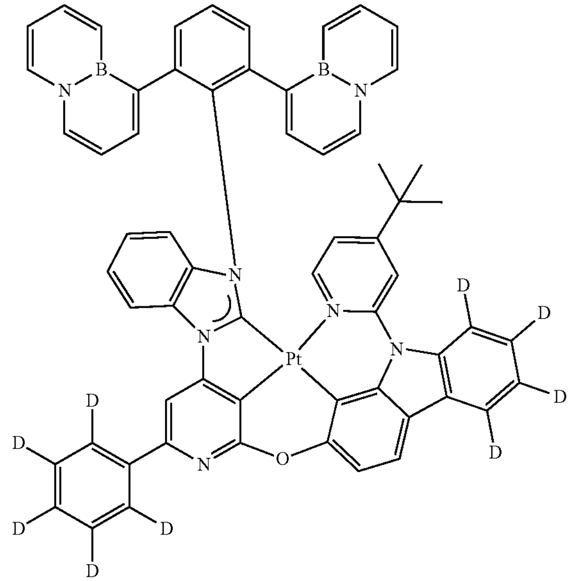
BD128
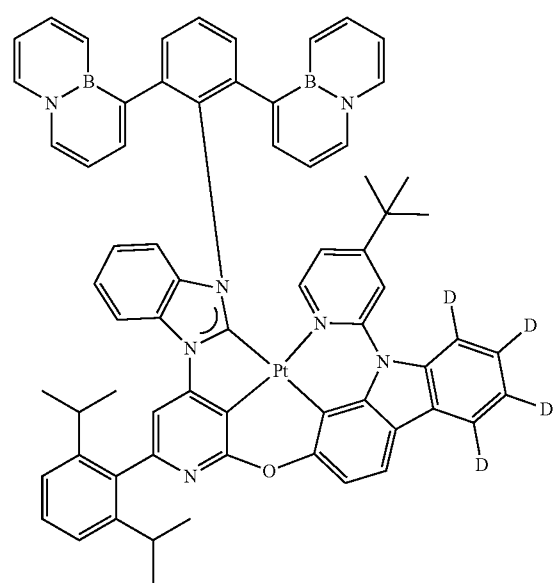

BD129
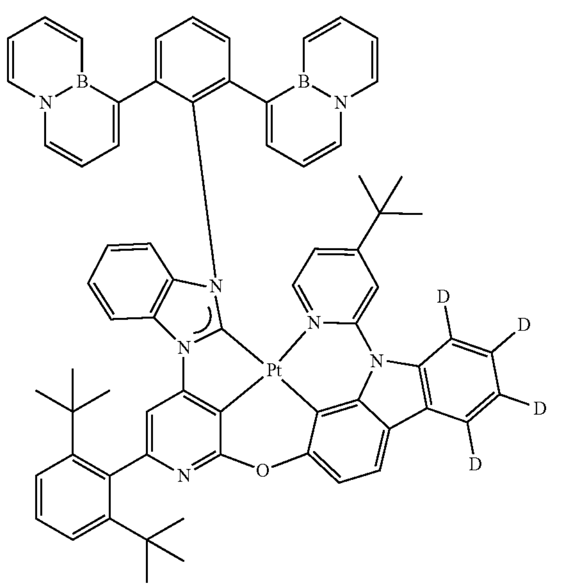
BD130
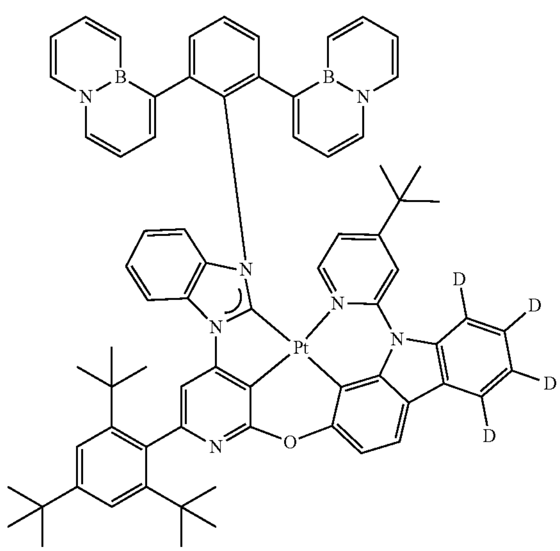
BD131
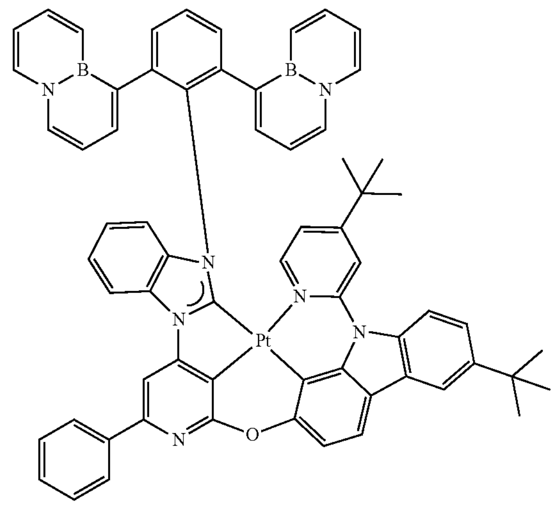
BD132
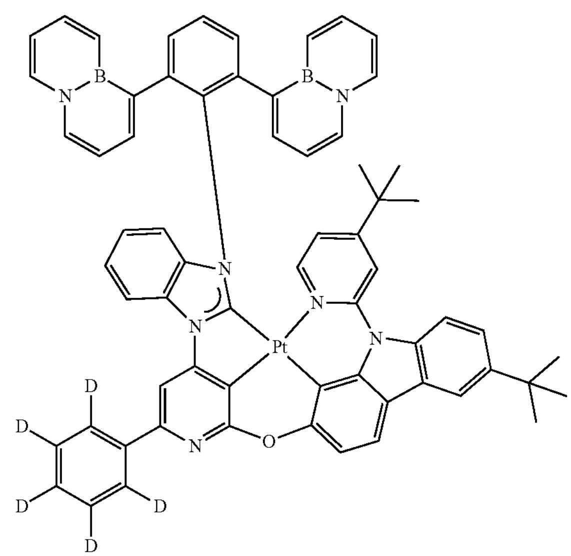
BD133
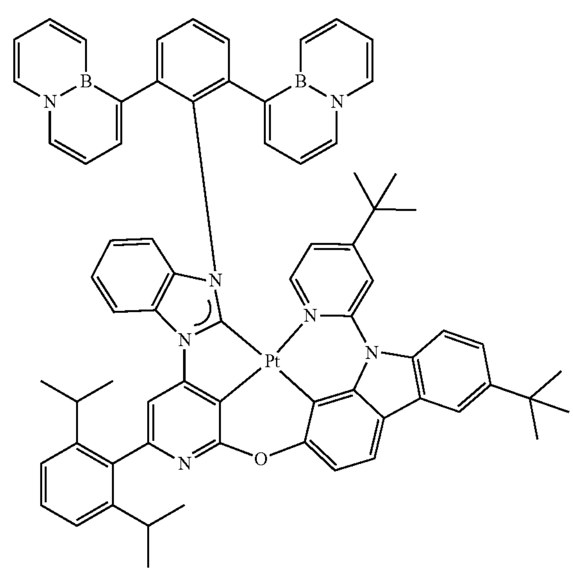

BD134
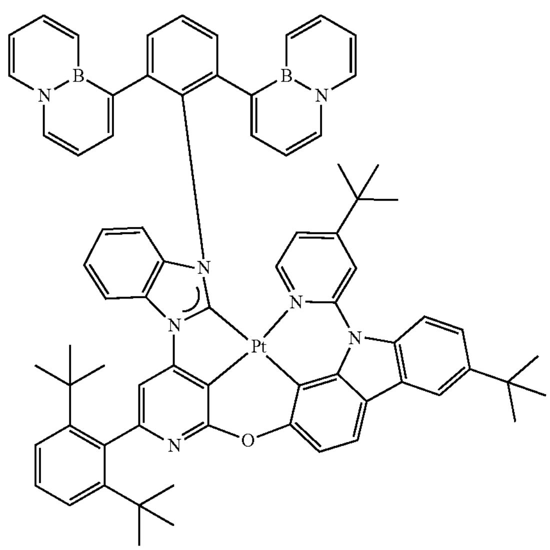
BD135
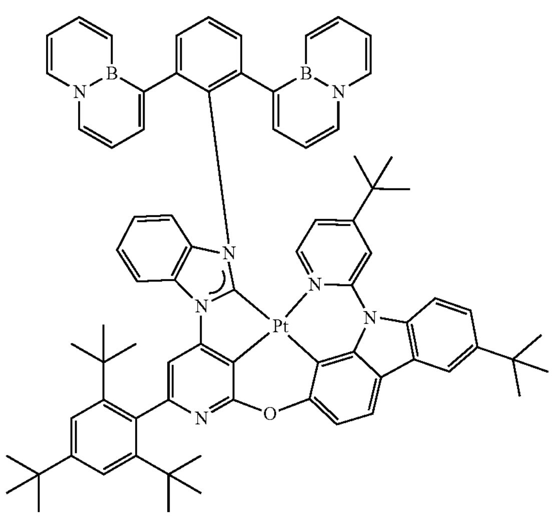
BD136
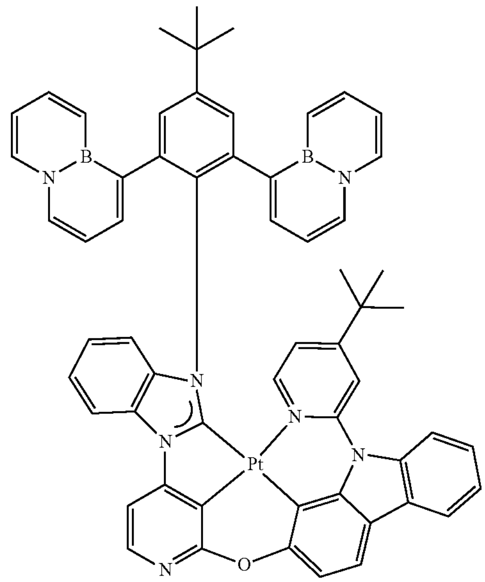
BD137
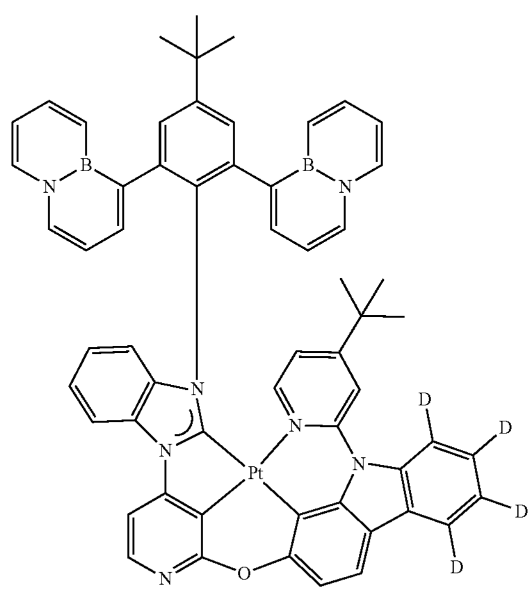

-continued
BD138
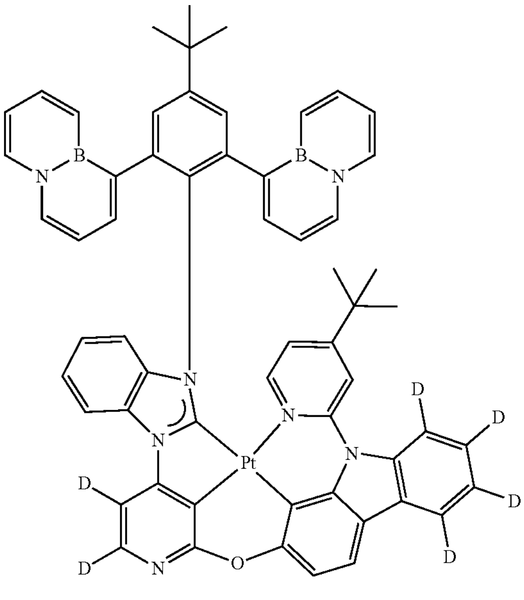
BD139
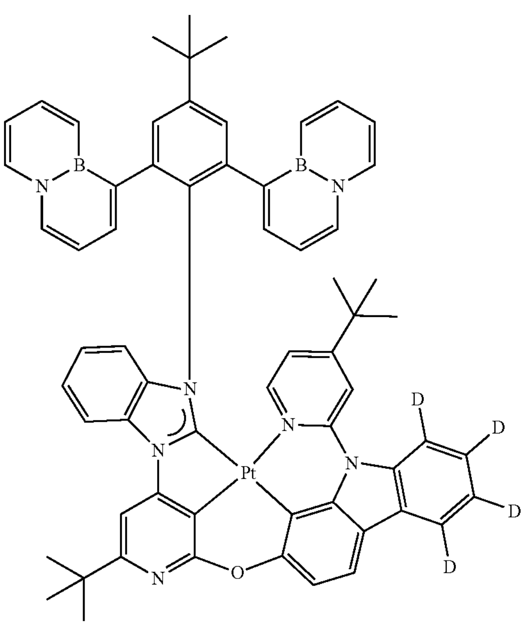
-continued
BD140
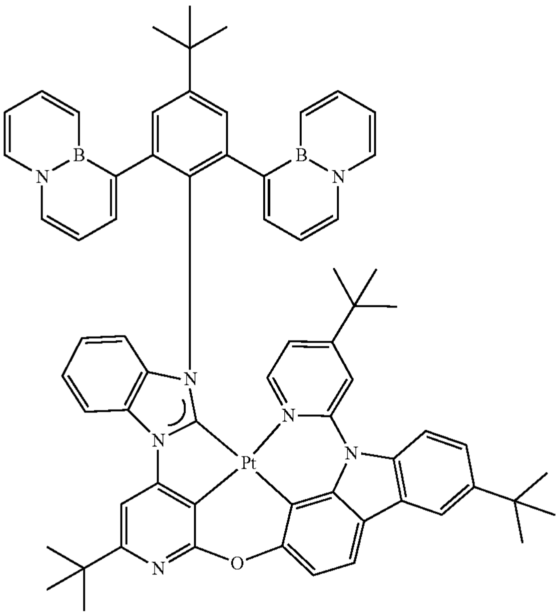
BD141
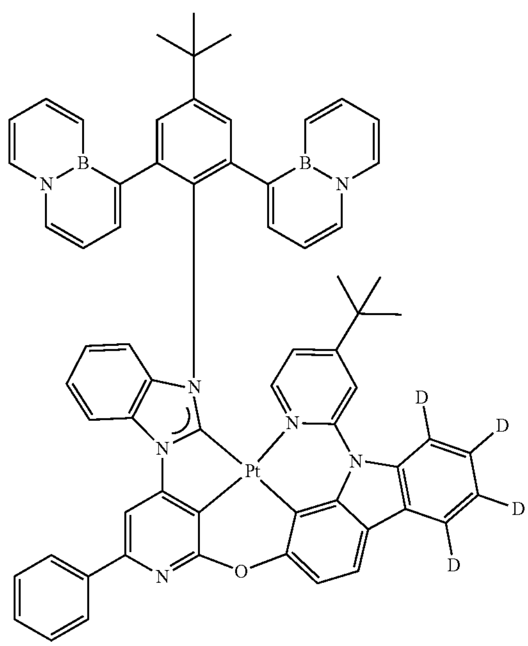

BD142
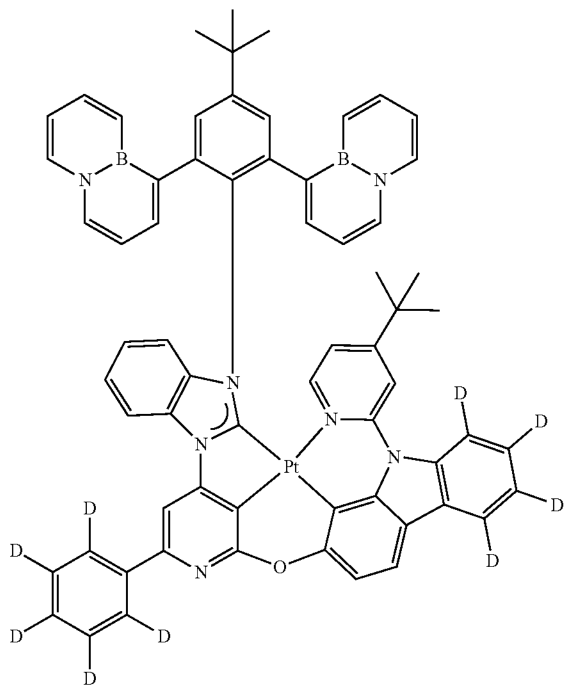
BD143
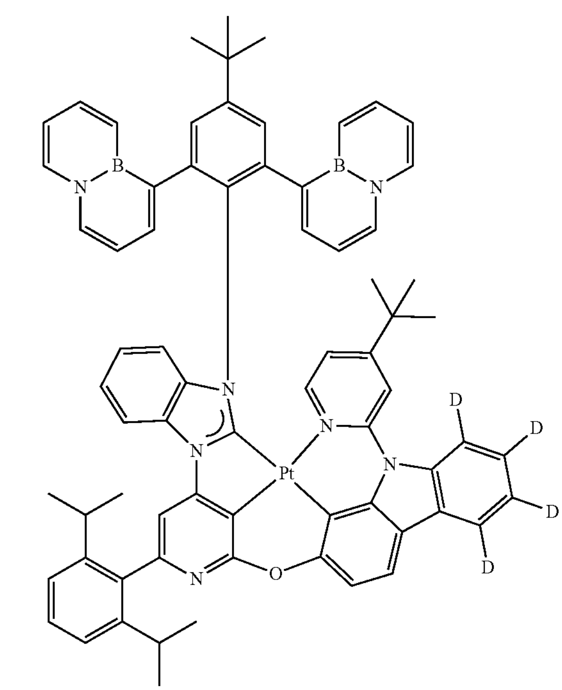
BD144
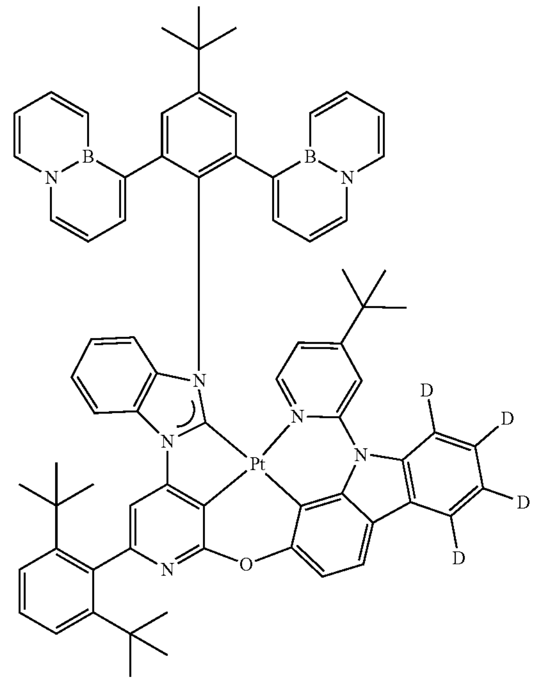
BD145
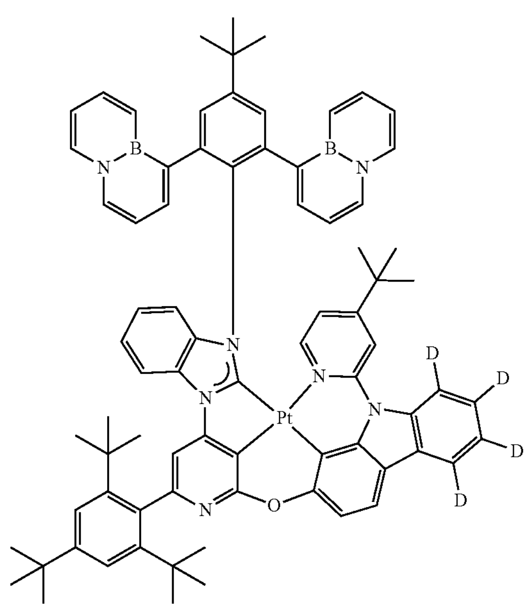

-continued
BD146
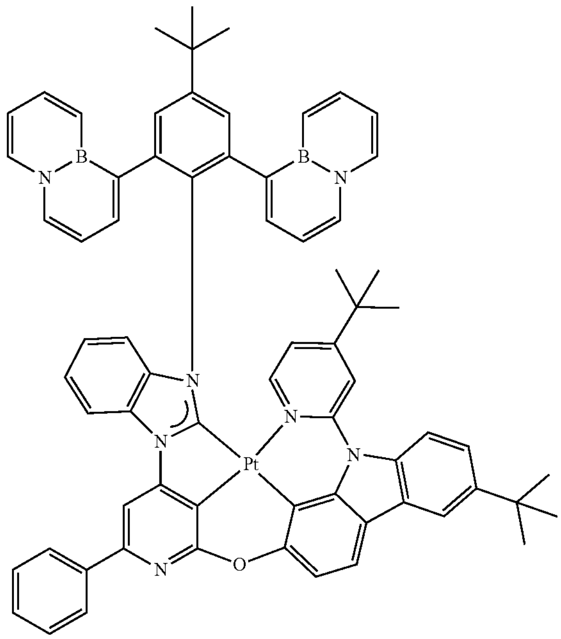
BD147
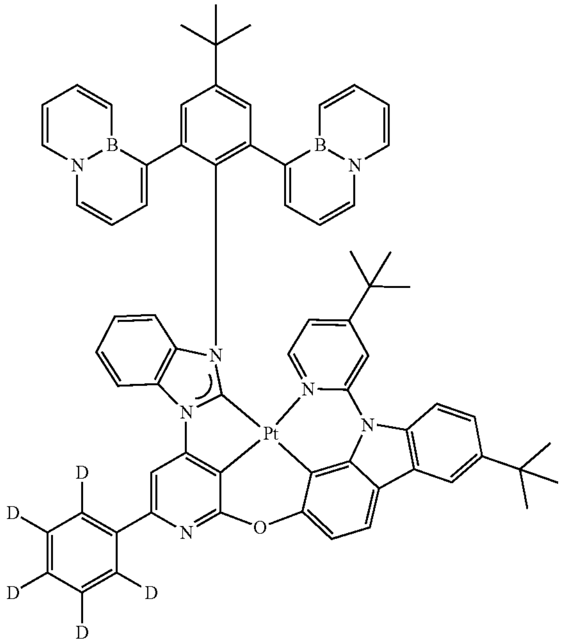
-continued
BD148
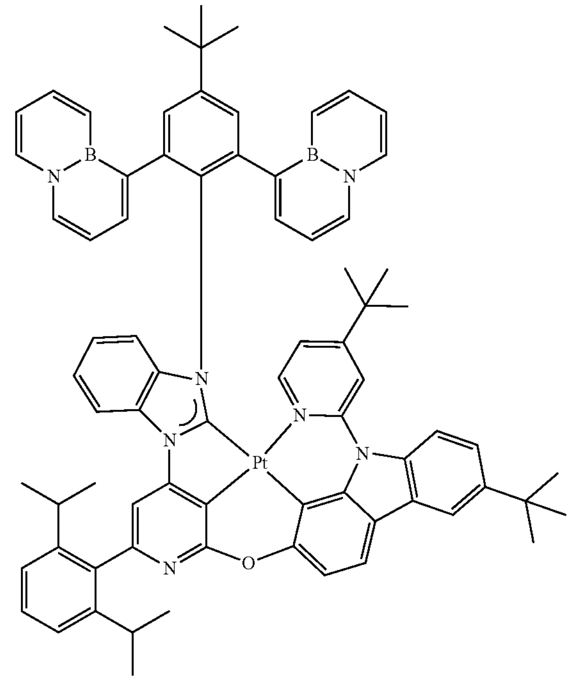
BD149
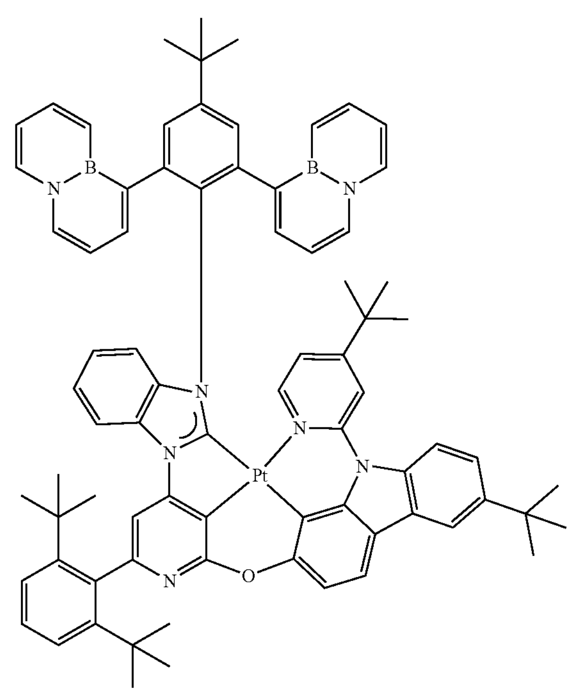

BD150
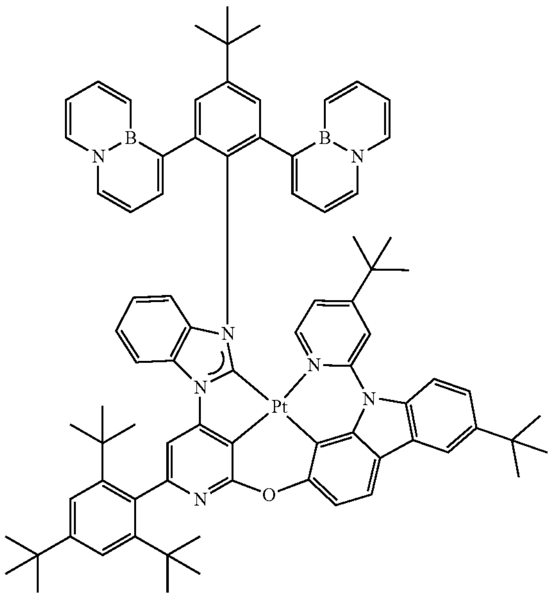
BD0151
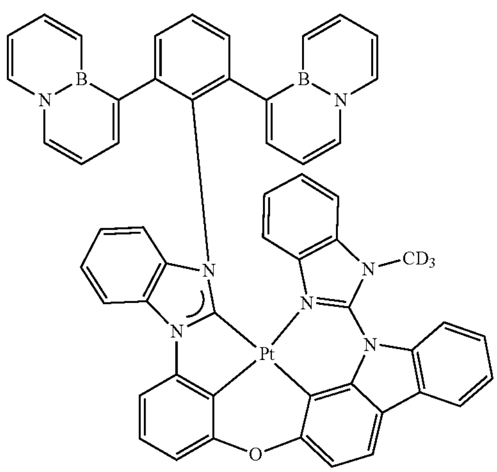
BD152
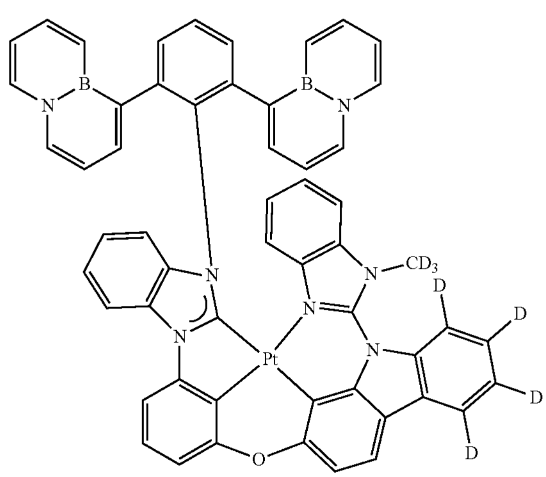
BD153
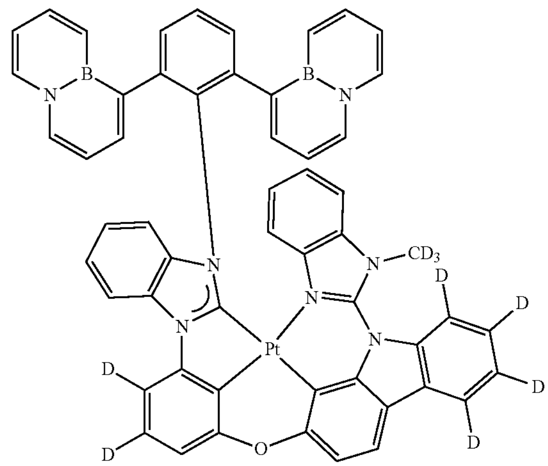
BD154
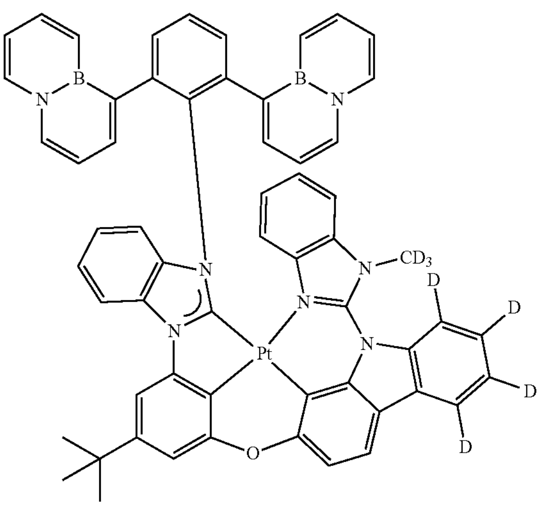
BD155
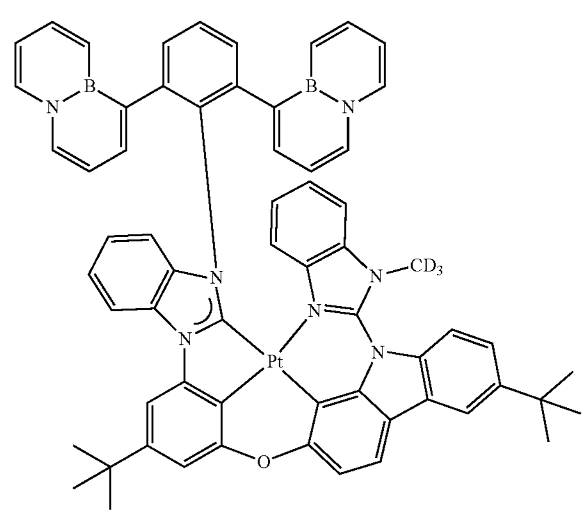

-continued
BD156
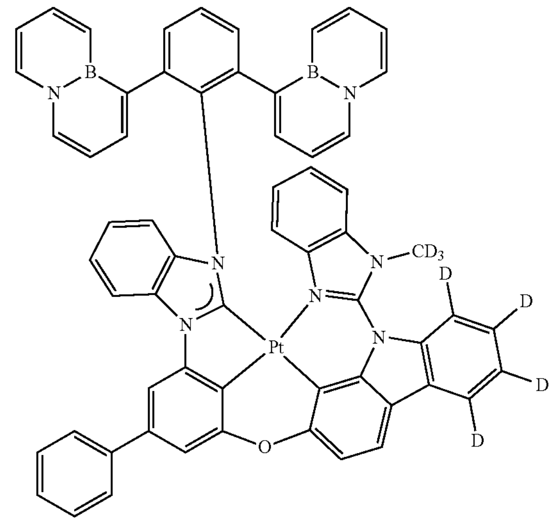
BD157
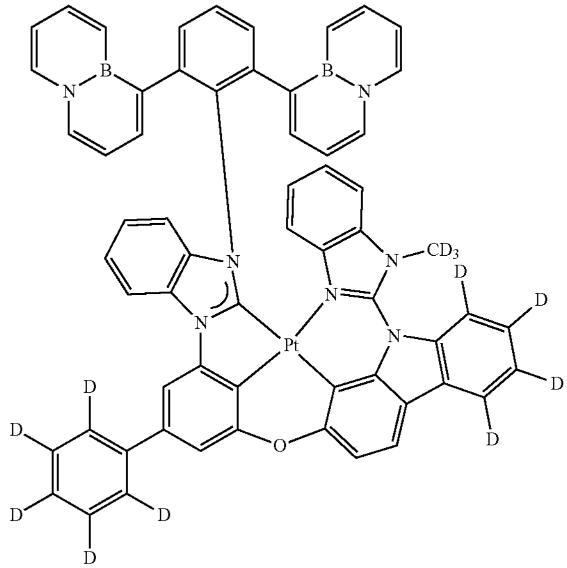
-continued
BD158
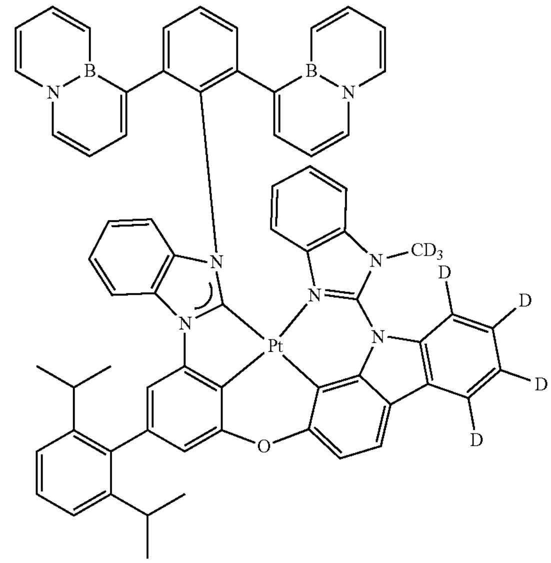
BD159
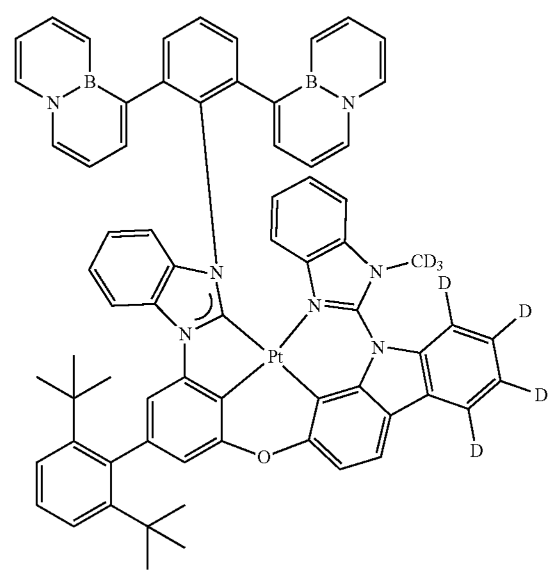

-continued
BD160
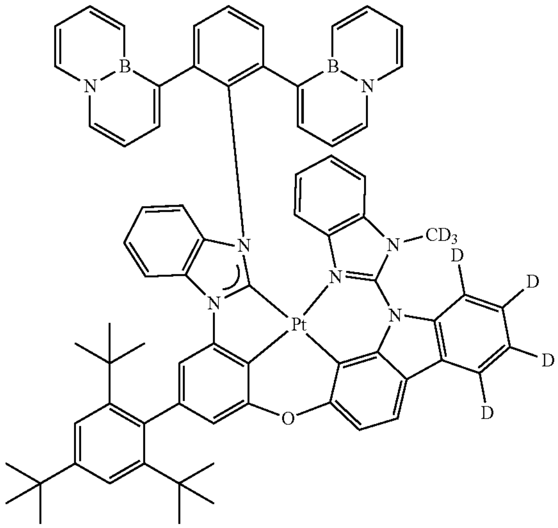
BD161
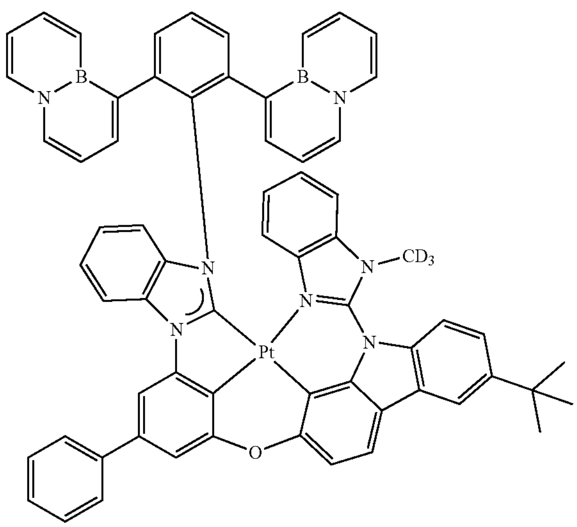
BD162
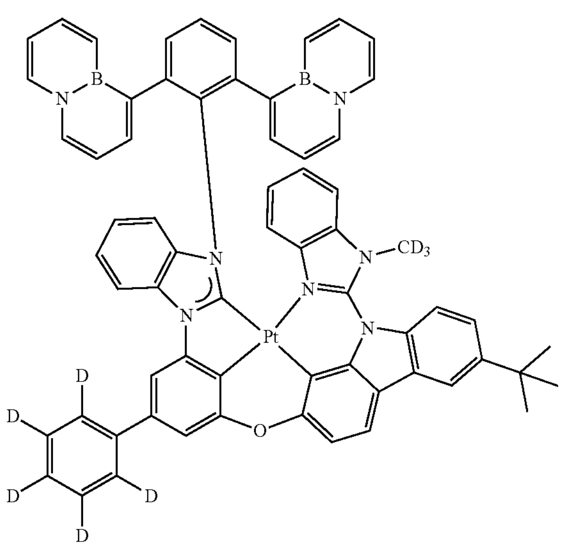
-continued
BD163
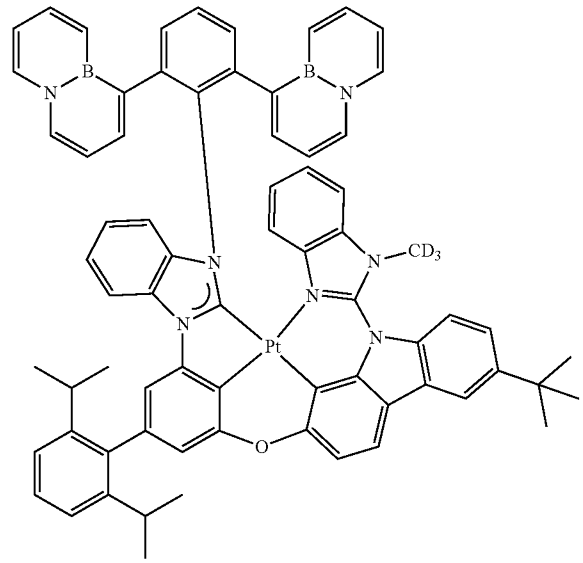
BD164
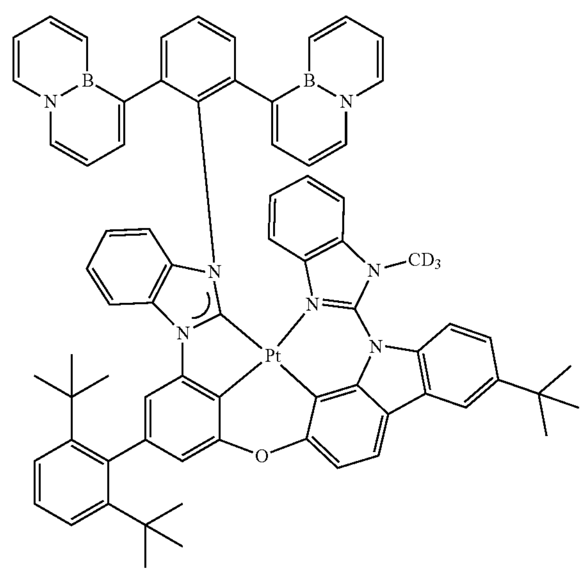

-continued
BD165
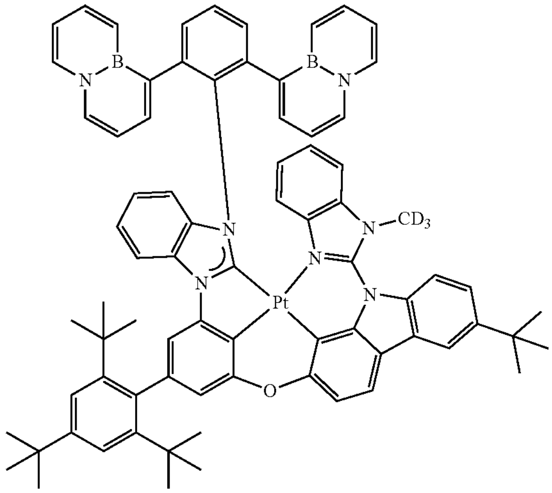
BD166
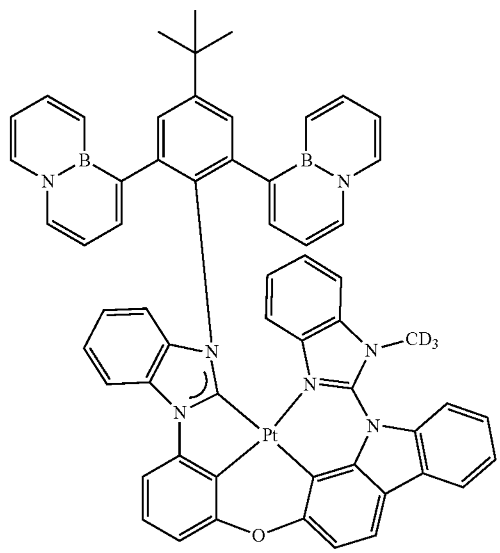
BD167
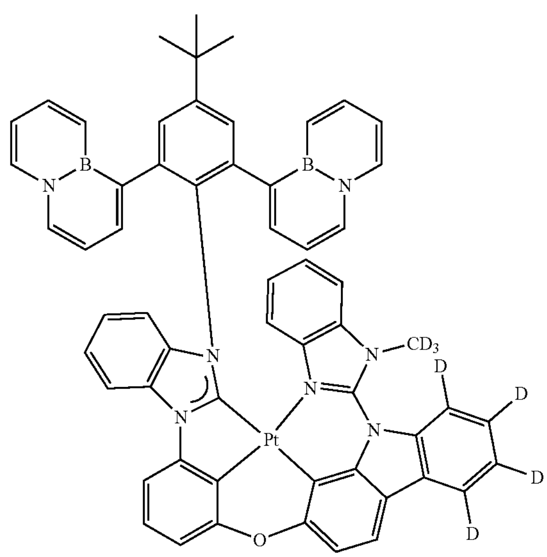
-continued
BD168
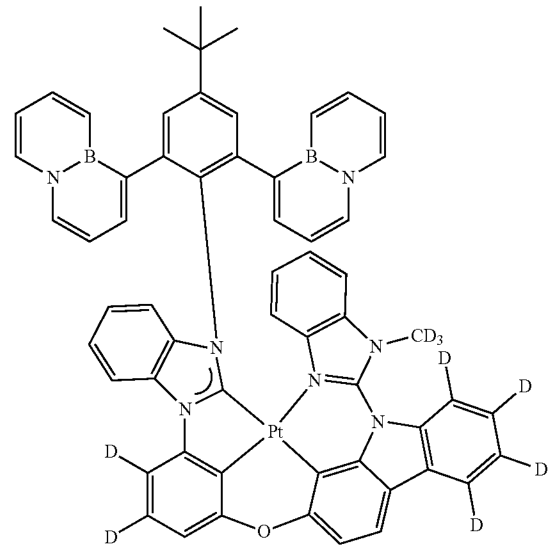
BD169
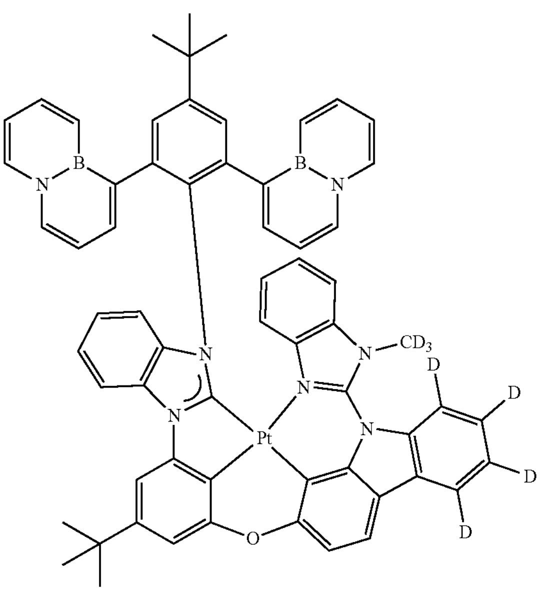

-continued
BD170
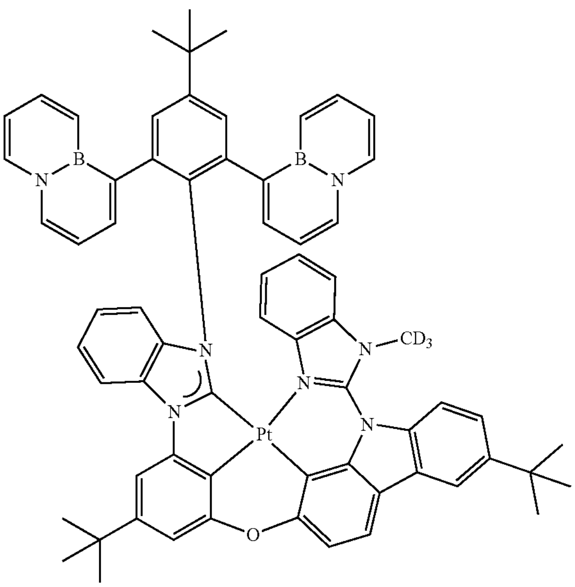
BD171
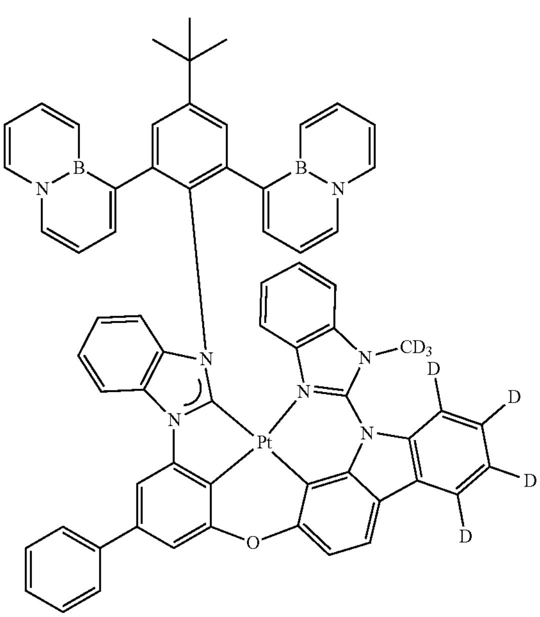
-continued
BD172
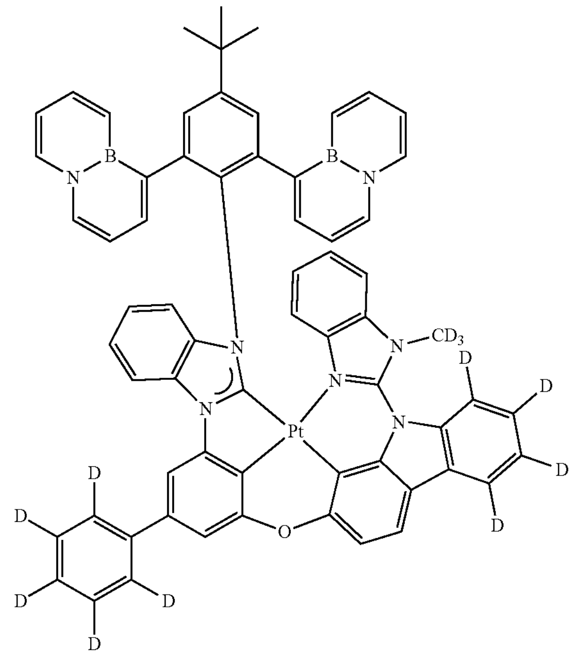
BD173
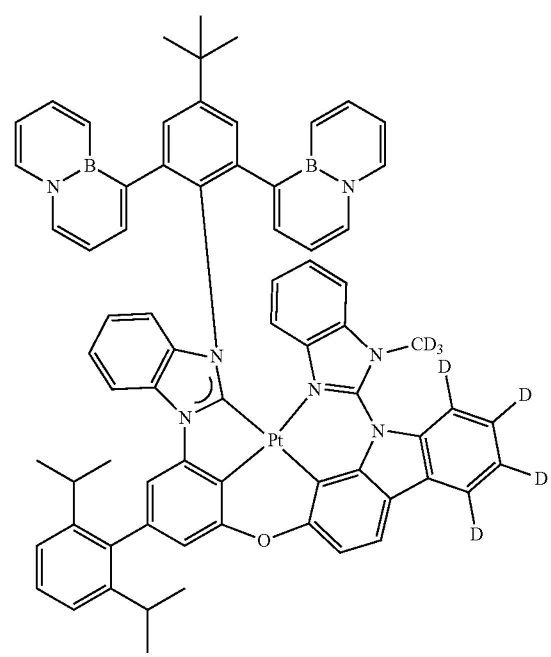

BD174
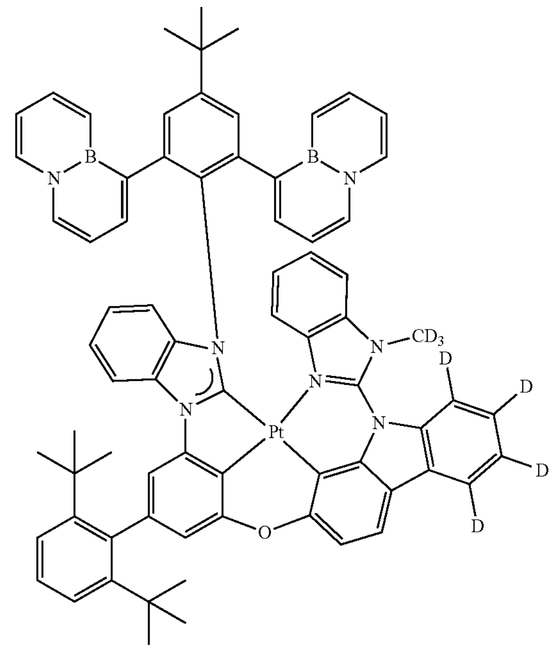
BD176
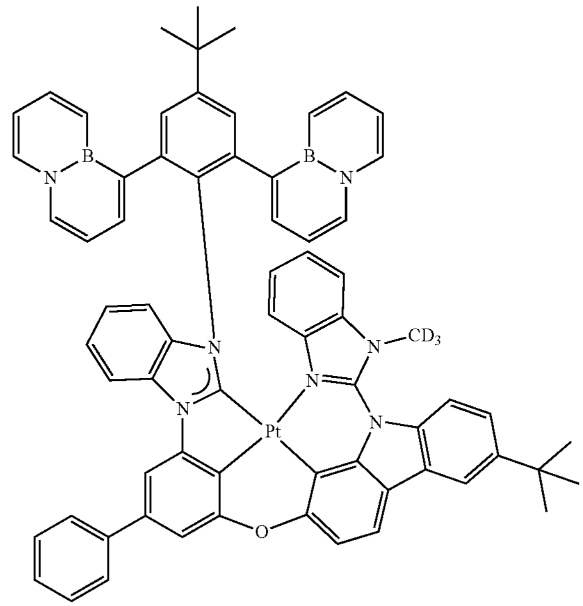
BD175
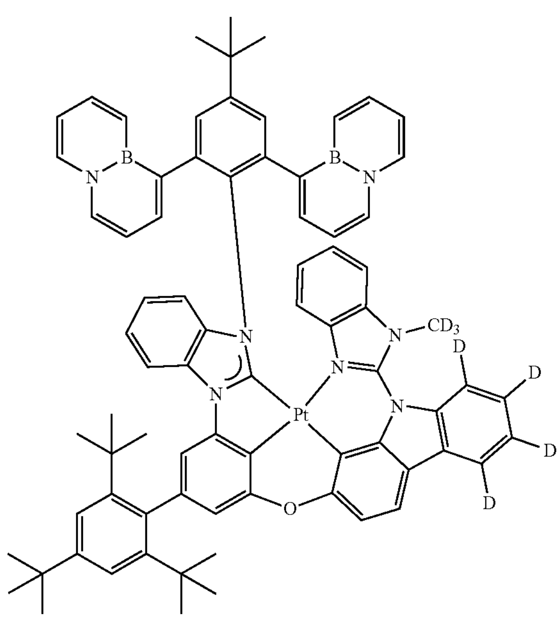
BD177
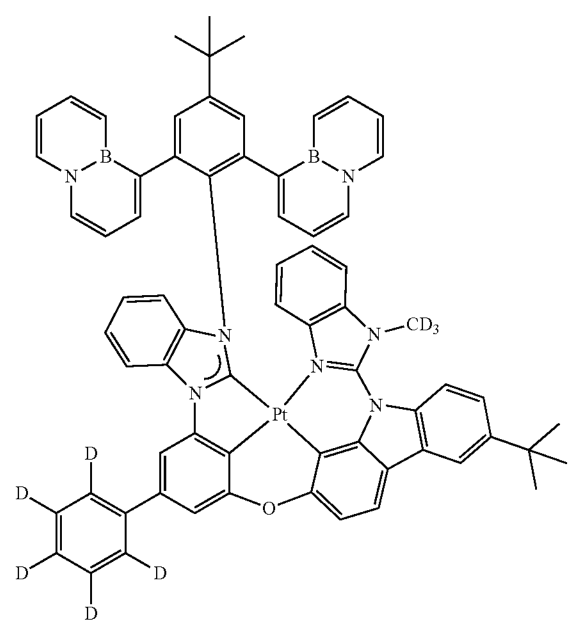

BD178
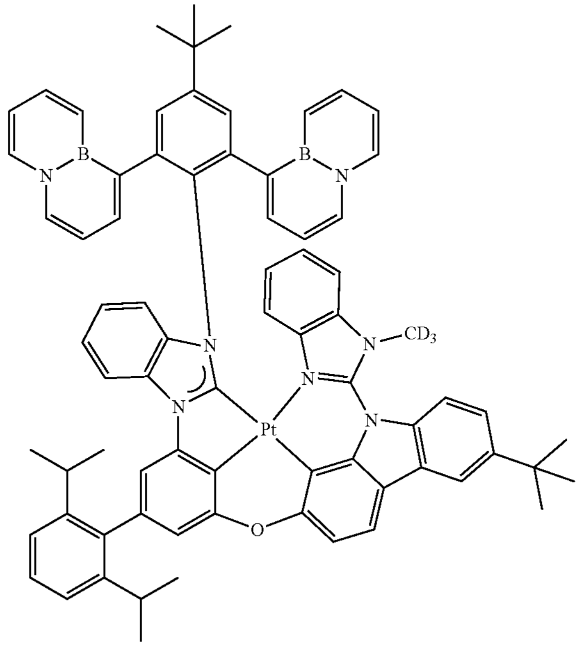
BD179
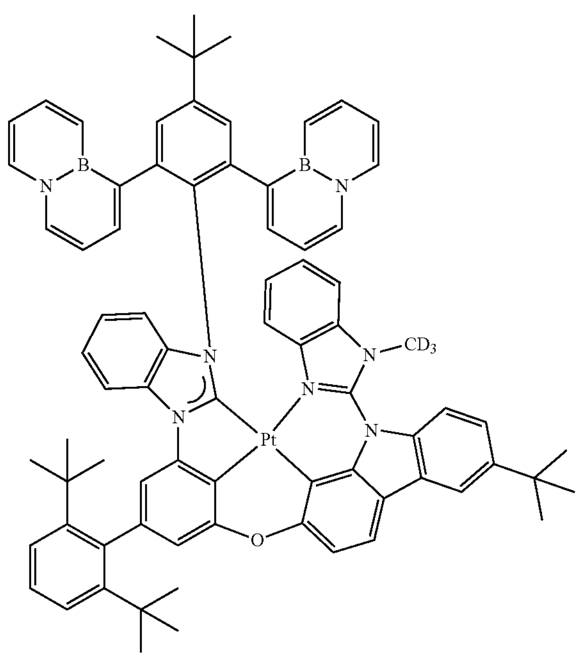
BD180
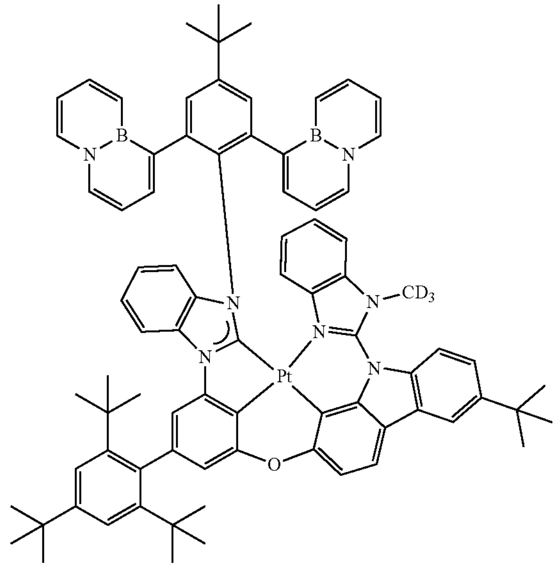
BD0181
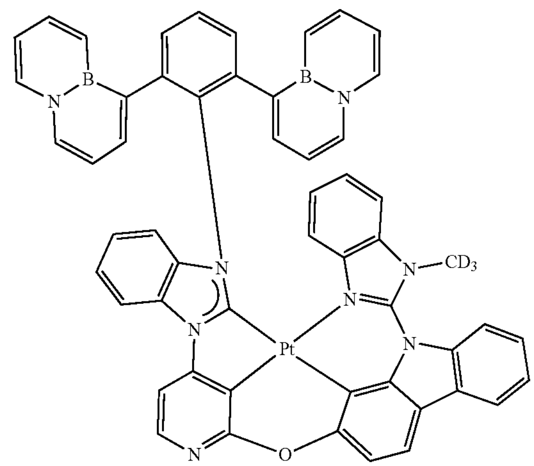
BD182
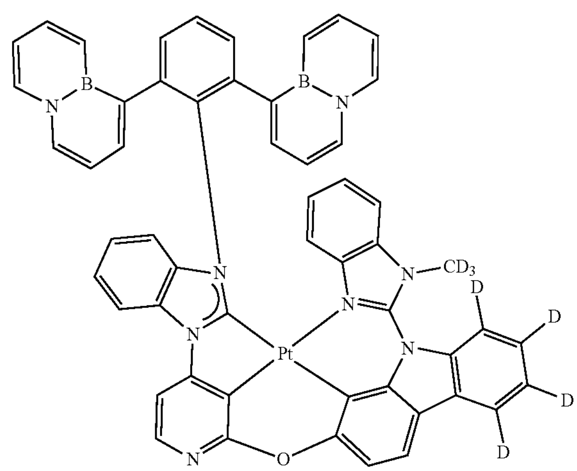

BD183
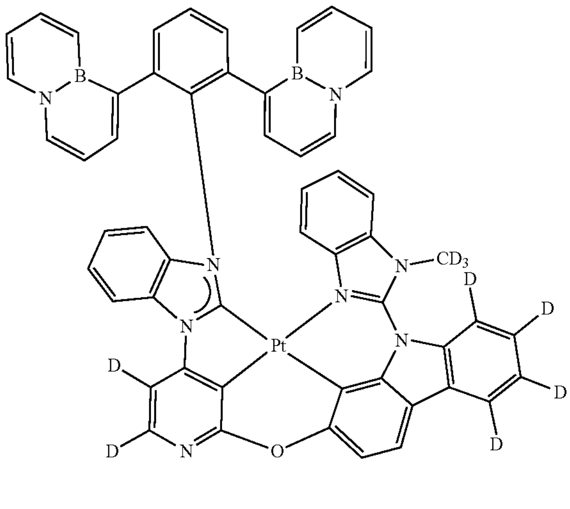
BD184
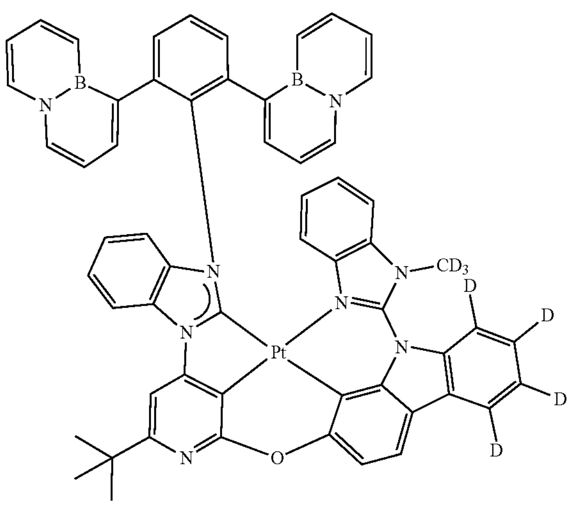
BD185
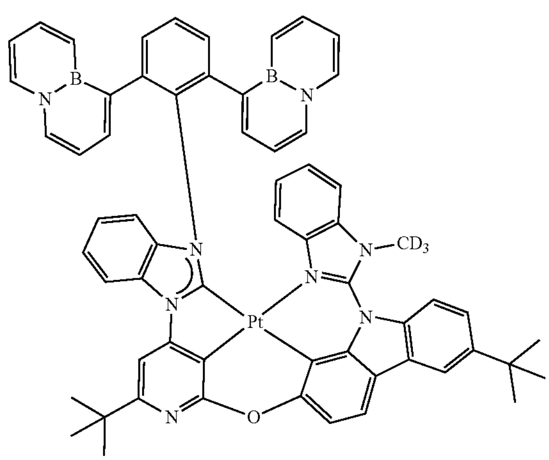
BD186
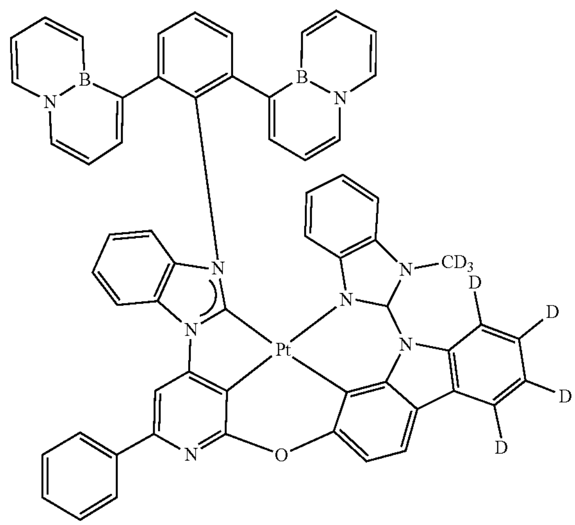
BD187
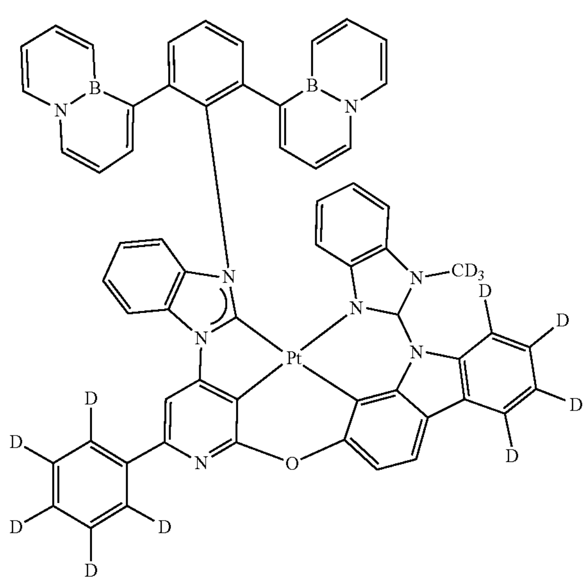

-continued
BD188
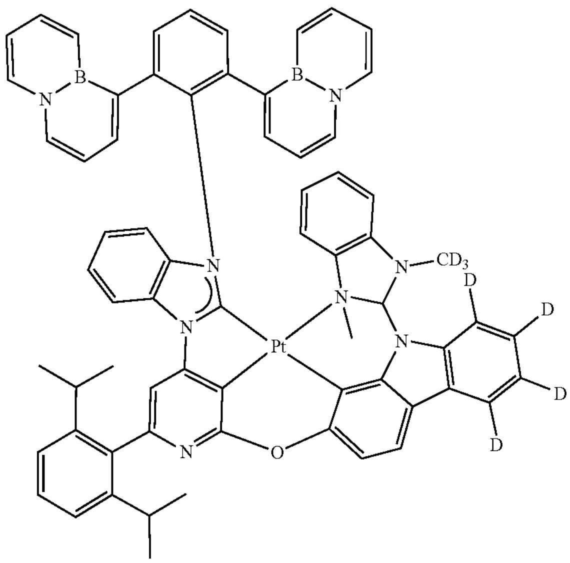
BD189
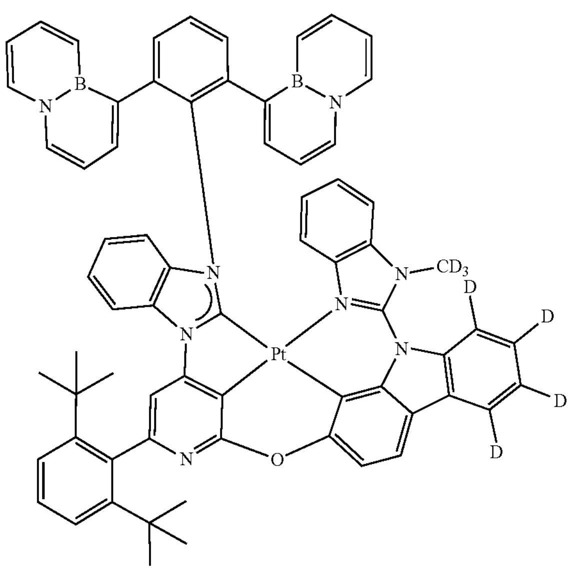
-continued
BD190
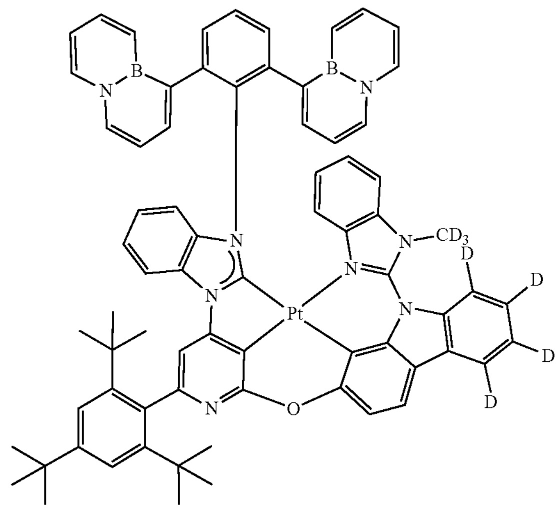
BD191
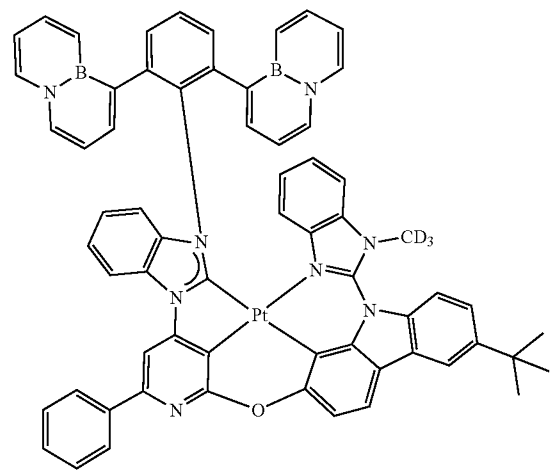
BD192
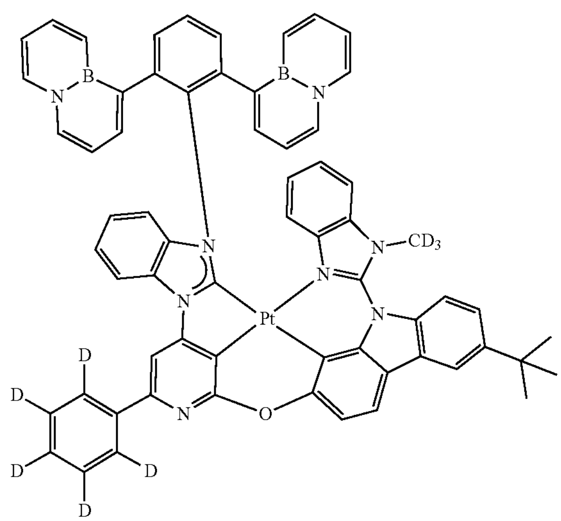

BD193
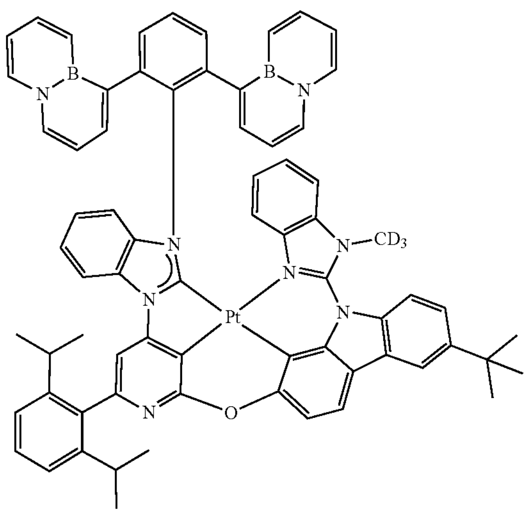
BD194
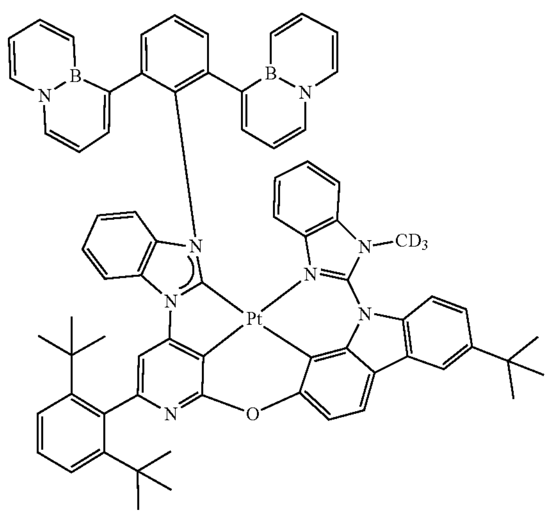
BD195
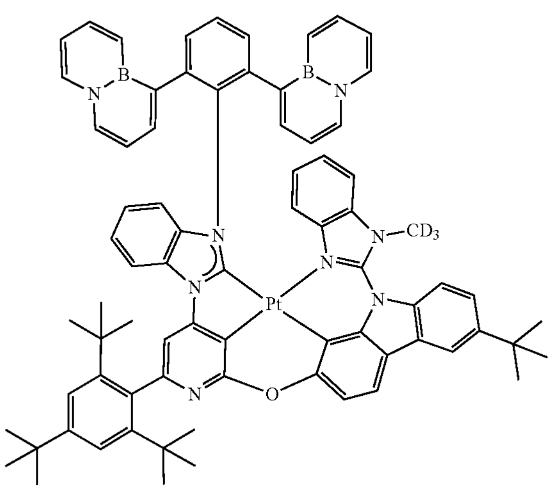
BD196
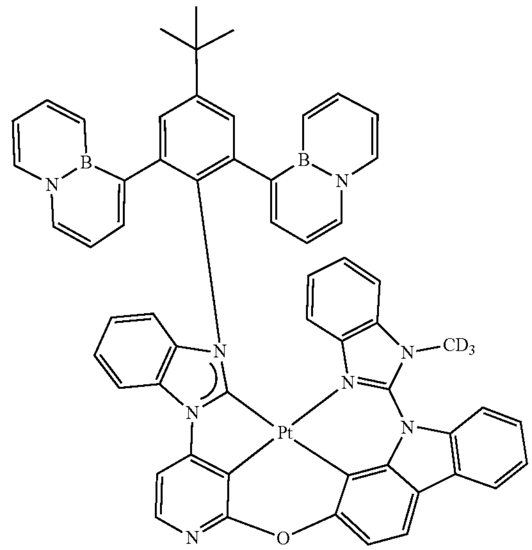
BD197
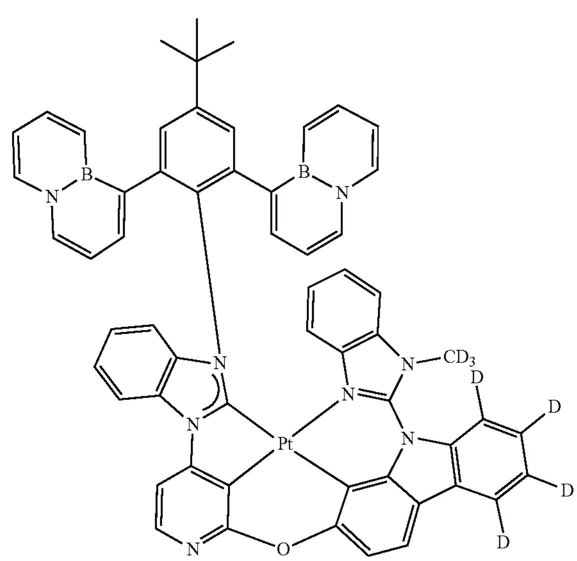

-continued
BD198
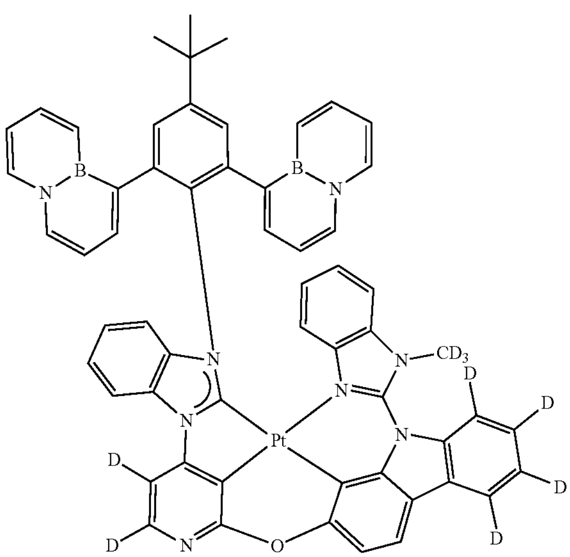
BD199
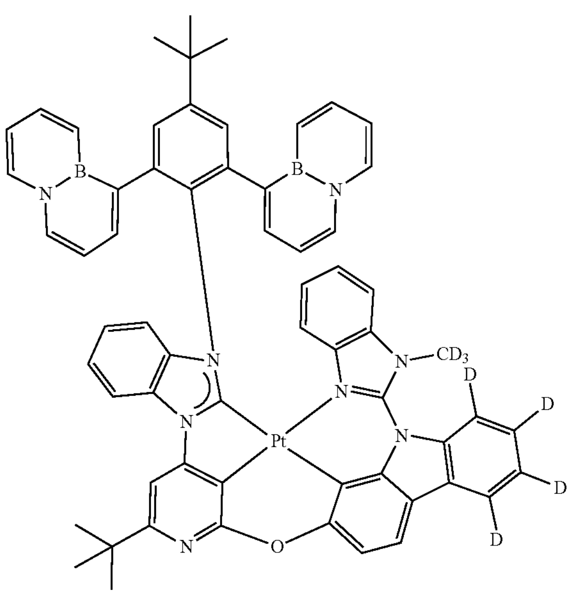
-continued
BD200
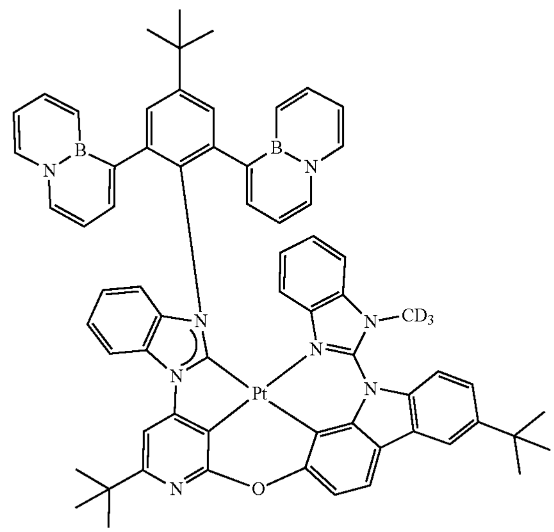
BD201
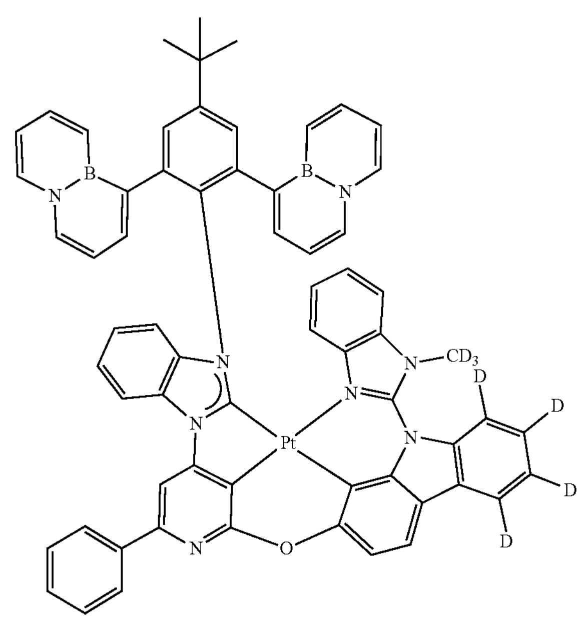

BD202
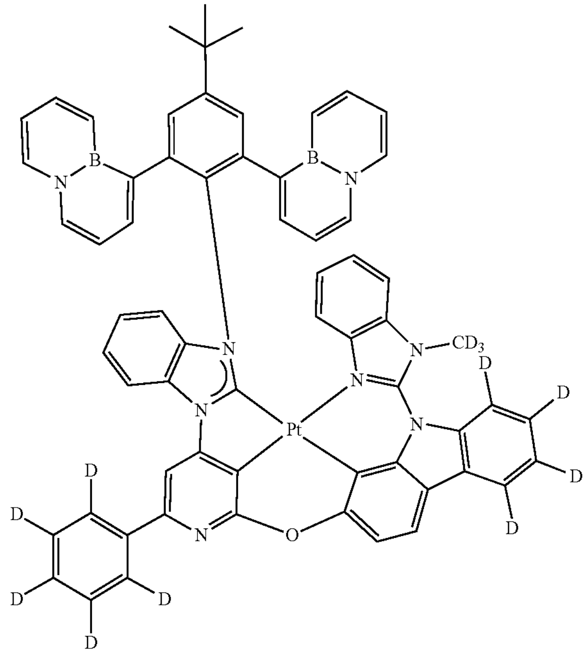
BD203
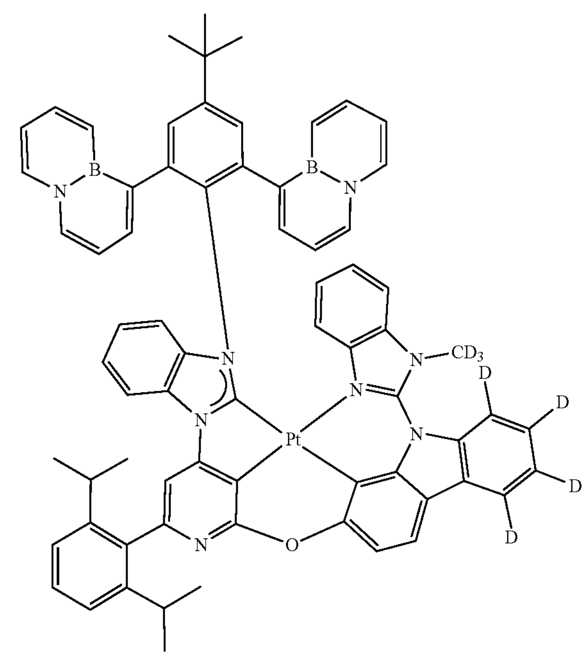
BD204
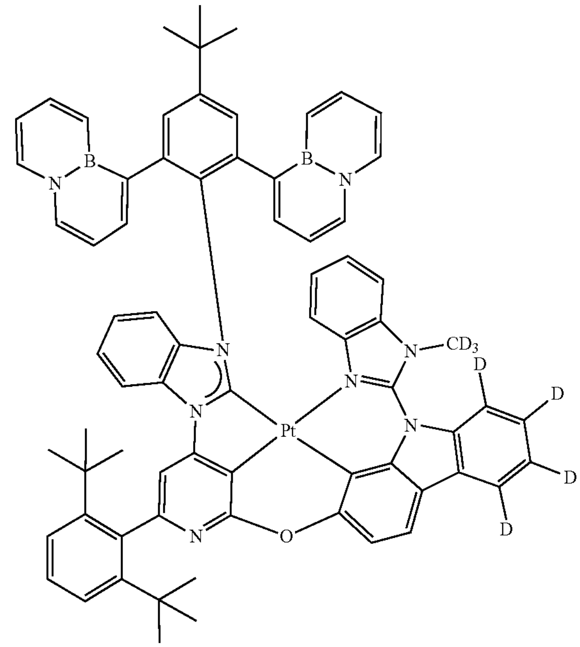
BD205
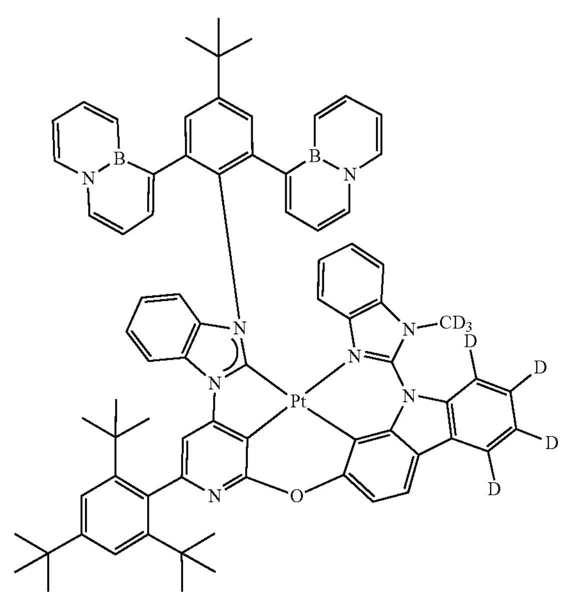

BD206
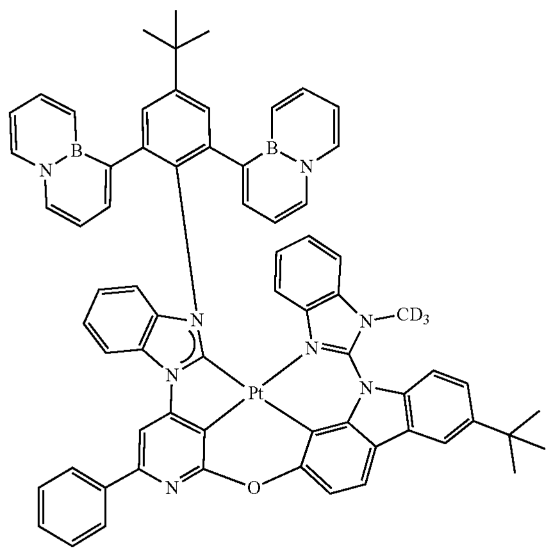
BD207
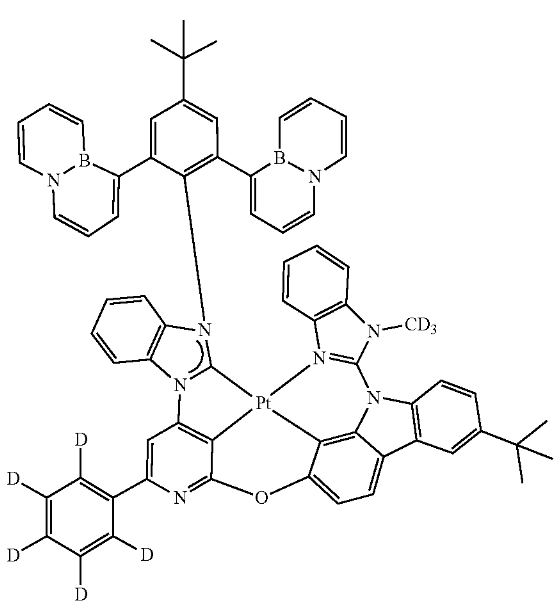
BD208
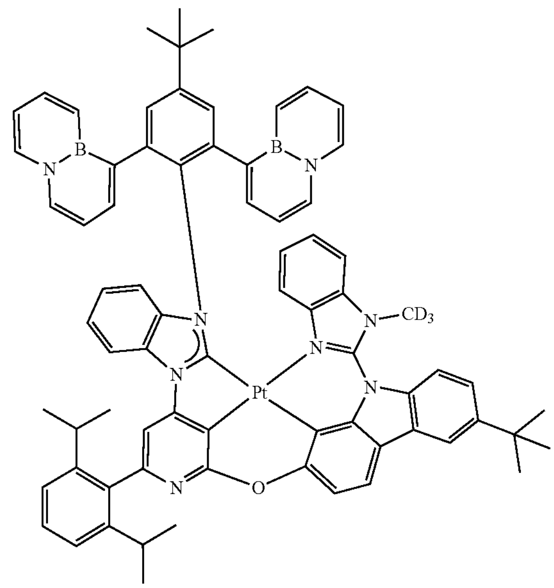
BD209
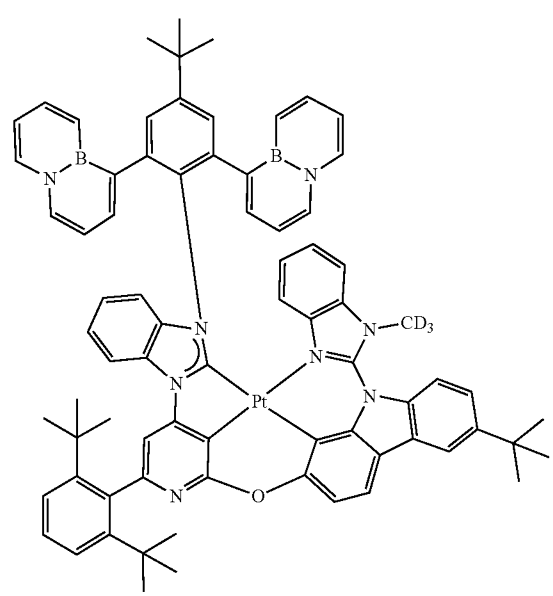

-continued

BD210

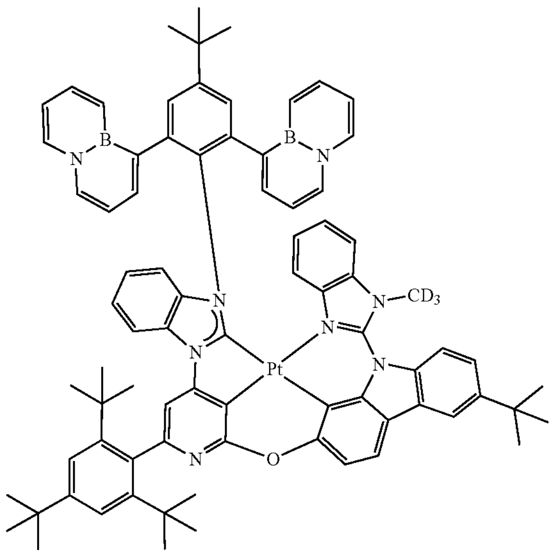

wherein, in Compounds BD01 to BD210, $D_4$ indicates substitution with four deuteriums (D).

In the organometallic compound represented by Formula 1, a triplet (T1) energy of $A_1$ group represented by Formula 1B may be about 0.01 eV or higher than a triplet energy of another moiety in the molecule. Because a bulky group such as a group represented by Formula 1A is substituted on the ligand, the group represented by Formula 1A may induce steric hindrance to thereby suppress or reduce substituent rotation and maintain structural rigidity of the molecule. Accordingly, when the organometallic compound is used as a dopant, intermolecular interaction between homogeneous or heterogeneous molecules may be suppressed or reduced to thereby suppress or reduce self-aggregation or aggregation with a host material. Due to such a structural characteristic, two types (or kinds) of energy transfer, including metal to ligand charge transfer ($^3$MLCT) and intraligand charge transfer ($^3$ILCT), may be activated. Accordingly, a light-emitting device including the organometallic compound may have improved efficiency and lifespan.

In addition, the organometallic compound represented by Formula 1 may include at least one carbon-deuterium (C-D) bond. A C-D bond may have a short bonding length, as compared with a C—H bond, and the binding energy may increase about 13 kcal/mol. Thus, the internal energy of the organometallic compound may decrease, and stability of the complex molecule may improve. Accordingly, upon energy transition in the molecule, nonradiative transition may be prevented or reduced to thereby improve a photoluminescence quantum yield (PLQY).

In the organometallic compound represented by Formula 1, a carbene-containing ligand and the group represented by Formula 1A may be disposed (e.g., positioned) to be substantially perpendicular to a carbene-containing core. Thus, the overall molecular conjugation may be broken or decreased. Accordingly, an emission wavelength may be blue-shifted, and thus, when the organometallic compound is applied to a light-emitting device, the light-emitting device may emit deep-blue light. Accordingly, the light-emitting device may exhibit improved colorimetric purity and color reproducibility.

Therefore, an electronic device, e.g., a light-emitting device, including the organometallic compound may have a low driving voltage, high efficiency, long lifespan, and/or high colorimetric purity.

Methods of synthesizing the organometallic compound represented by Formula 1 may be easily understood to those of ordinary skill in the art by referring to Synthesis Examples and Examples described herein.

At least one of the organometallic compounds represented by Formula 1 may be used in a light-emitting device (e.g., an organic light-emitting device).

According to one or more embodiments, a light-emitting device may include a first electrode; a second electrode facing the first electrode; an interlayer located between the first electrode and the second electrode and including an emission layer and the organometallic compound represented by Formula 1.

In some embodiments, the first electrode of the light-emitting device may be an anode, the second electrode of the light-emitting device may be a cathode, the interlayer may further include a hole transport region located between the first electrode and the emission layer, and an electron transport region located between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the organometallic compound may be included in an interlayer, e.g., an emission layer, of the light-emitting device.

In one or more embodiments, the emission layer may include a host and a dopant, and the dopant may include the organometallic compound. For example, the organometallic compound may serve as an emission layer dopant. A content (e.g., amount) of the dopant in the emission layer may be in a range of about 0.1 parts to about 49.99 parts by weight, based on 100 parts by weight of the emission layer.

The emission layer may emit red light, green light, blue light, and/or white light. In some embodiments, the emission layer may emit blue light. Blue light having a maximum emission wavelength in a range of about 440 nm to about 475 nm may be emitted from the emission layer. A bottom emission-based $CIE_x$ color-coordinate of the blue light may be in a range of about 0.13 to about 0.14, and a $CIE_y$ color-coordinate may be in a range of about 0.06 to about 0.25, but embodiments are not limited thereto.

In one or more embodiments, the host may include different types (or kinds) of hosts. In some embodiments, the host may include a hole transporting host and an electron transporting host.

In one or more embodiments, the host may include an electron transporting host represented by Formula 2, a hole transporting host represented by Formula 3, or any combination thereof:

Formula 2

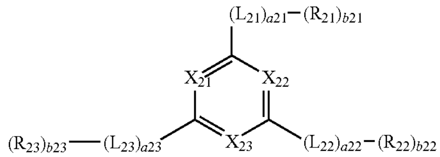

Formula 3

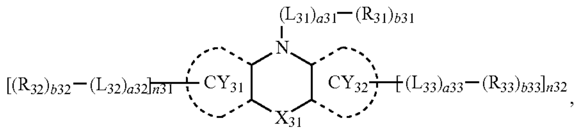

wherein, in Formulae 2 and 3, $X_{21}$ may be N or C-$(L_{24})_{a24}$-$(R_{24})_{b24}$, $X_{22}$ may be N or C-$(L_{25})_{a25}$-$(R_{25})_{b25}$, and $X_{23}$ may be N or C-$(L_{26})_{a26}$-$(R_{26})_{b26}$, $X_{31}$ may be selected from a single bond, O, S, N($R_{34}$), C($R_{34}$)($R_{35}$), and Si($R_{34}$)($R_{35}$), $CY_{31}$ and $CY_{32}$ may each independently be a $C_3$-$C_{60}$ carbocyclic group or a $C_1$-$C_{60}$ heterocyclic group, $L_{21}$ to $L_{26}$ and $L_{31}$ to $L_{33}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a26 and a31 to a33 may each independently be an integer from 0 to 5, $R_{21}$ to $R_{26}$ and $R_{31}$ to $R_{35}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b21 to b26, b31 to b33, n31, and n32 may each independently be an integer from 1 to 5, and $R_{10a}$ and $Q_1$ to $Q_3$ may respectively be understood by referring to the descriptions of $R_{10a}$ and $Q_1$ to $Q_3$ provided herein.

In Formula 2, when a21 is 0, $(L_{21})_{a21}$ may be a single bond, when a22 is 0, $(L_{22})_{a22}$ may be a single bond, when a23 is 0, $(L_{23})_{a23}$ may be a single bond, when a24 is 0, $(L_{24})_{a24}$ may be a single bond, when a25 is 0, $(L_{25})_{a25}$ may be a single bond, and when a26 is 0, $(L_{26})_{a26}$ may be a single bond.

In some embodiments, in Formula 2, a21 to a26 may each independently be 0 or 1.

In one or more embodiments, in Formula 2, $L_{21}$ to $L_{26}$ may each independently be a phenylene group unsubstituted or substituted with at least one $R_{10a}$.

In some embodiments, in Formula 3, $CY_{31}$ and $CY_{32}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, but embodiments are not limited thereto.

In one or more embodiments, in Formulae 2 and 3, $R_{21}$ to $R_{26}$ and $R_{31}$ to $R_{35}$ may each independently be:

hydrogen, deuterium, —F, —Cl, —Br, —I, —$CH_2$D, —CH$D_2$, —$CD_3$, —$CH_2$F, —CH$F_2$, —$CF_3$, a hydroxyl group, a cyano group, or a nitro group;

a $C_1$-$C_{60}$ alkyl group or a $C_1$-$C_{60}$ alkoxy group, each unsubstituted or substituted with deuterium, —F, —Cl, —Br, —I, —$CH_2$D, —CH$D_2$, —$CD_3$, —$CH_2$F, —CH$F_2$, —$CF_3$, a hydroxyl group, a cyano group, a nitro group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, or an indolocarbazolyl group, each unsubstituted or substituted with deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may respectively be understood by referring to the descriptions of $Q_1$ to $Q_3$ and $Q_{31}$ to $Q_{33}$ provided herein.

In some embodiments, in Formula 2, $R_{21}$ to $R_{26}$ may each independently be:

a phenyl group or a carbazolyl group, each unsubstituted or substituted with a $C_1$-$C_{10}$ alkyl group, a phenyl group, a carbazolyl group, $—Si(Q_{31})(Q_{32})(Q_{33})$, or any combination thereof; or $—Si(Q_1)(Q_2)(Q_3)$, wherein $Q_1$ to $Q_3$ and $Q_{31}$ to $Q_{33}$ may respectively be understood by referring to the descriptions of $Q_1$ to $Q_3$ and $Q_{31}$ to $Q_{33}$ provided herein.

In one or more embodiments, in Formula 2, at least one of $R_{21}$ in a number of b21, $R_{22}$ in a number of b22, or $R_{23}$ in a number of b23 may be: a phenyl group, a carbazolyl group, each unsubstituted or substituted with a phenyl group, a carbazolyl group, $Si(Q_1)(Q_2)(Q_3)$, or any combination thereof.

In one or more embodiments, the electron transporting host represented by Formula 2 may include at least one deuterium. In some embodiments, at least one selected from $R_{21}$ to $R_{26}$ may be deuterium, or at least one selected from $L_{21}$ to $L_{26}$ and $R_{21}$ to $R_{26}$ may be substituted with at least one deuterium.

In one or more embodiments, the hole transporting host represented by Formula 3 may include at least one deuterium. In some embodiments, at least one selected from $R_{31}$ to $R_{35}$ may be deuterium, or at least one selected from $L_{31}$ to $L_{33}$ and $R_{31}$ to $R_{35}$ may be substituted with at least one deuterium.

For example, the electron transporting host represented by Formula 2 may be one of Compounds ETH1 to ETH16, and the hole transporting host represented by Formula 3 may be one of Compounds HTH1 to HTH16, but embodiments are not limited thereto:

ETH1

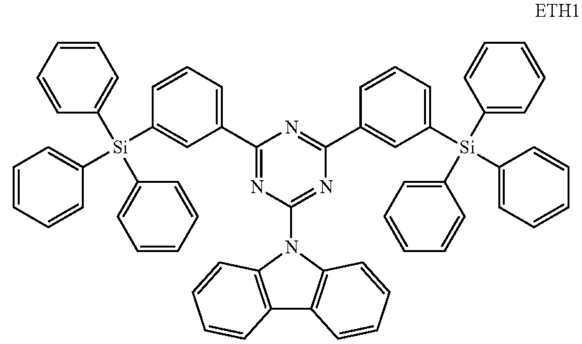

-continued
ETH2
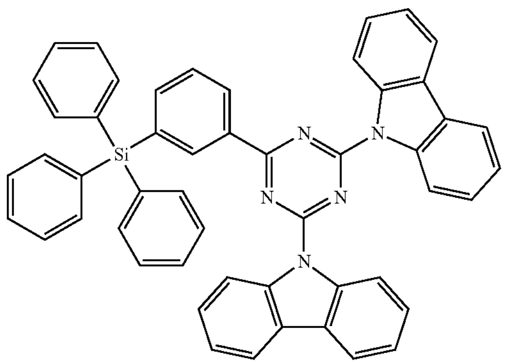
ETH3
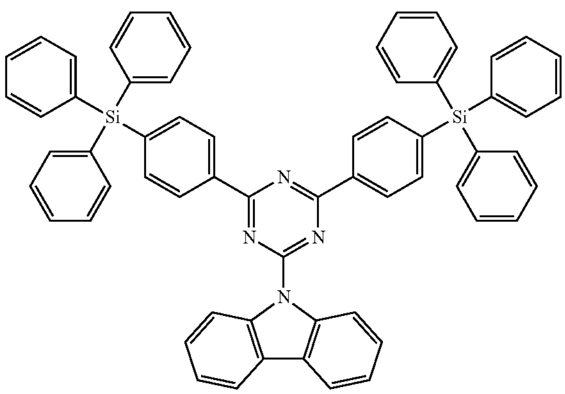
ETH4
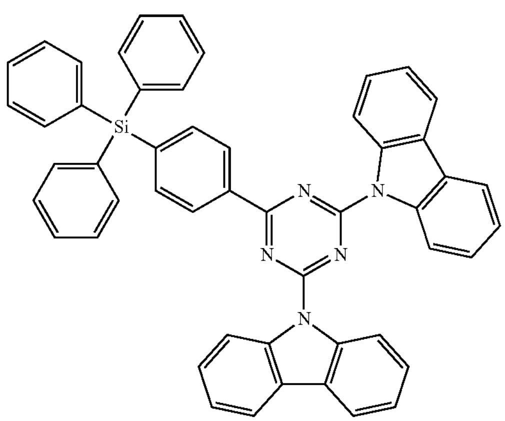
ETH5
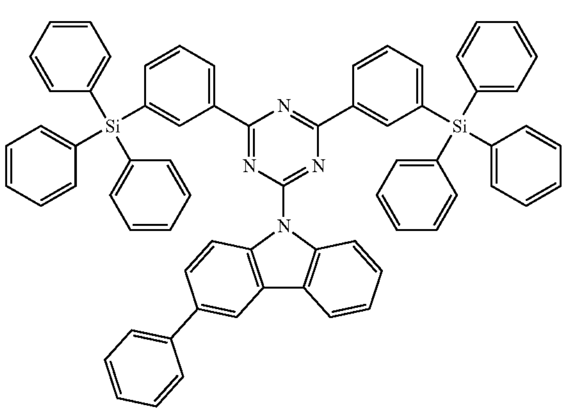
-continued
ETH6
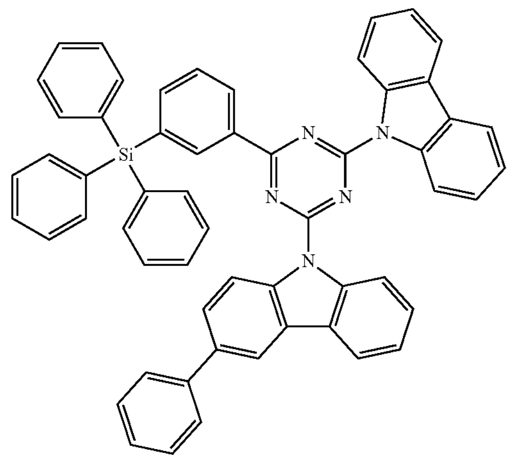
ETH7
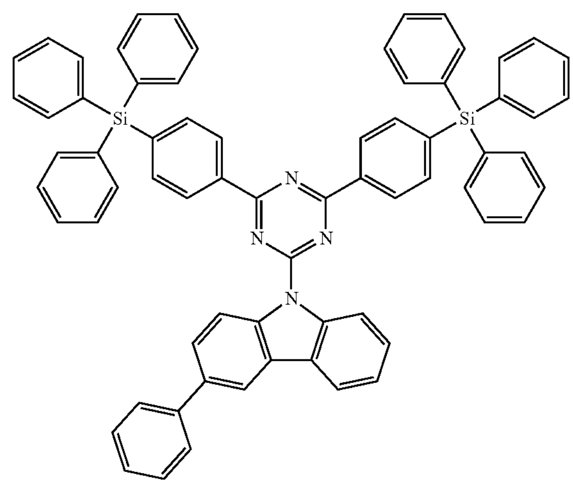
ETH8
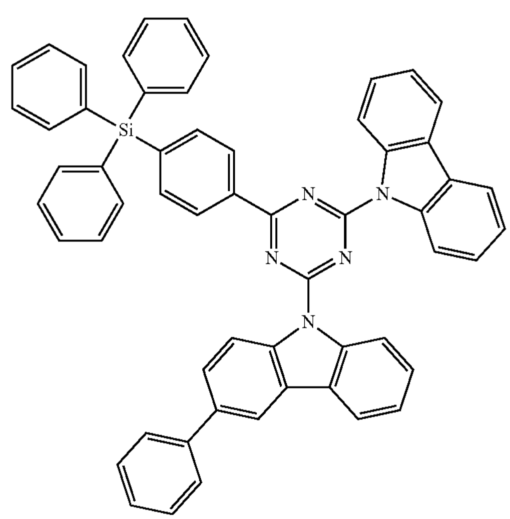

-continued
ETH9
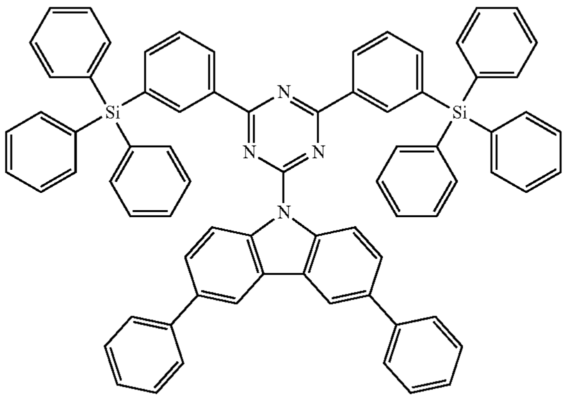
ETH10
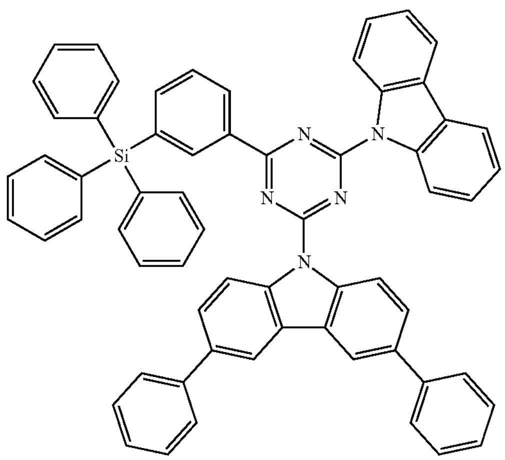
ETH11
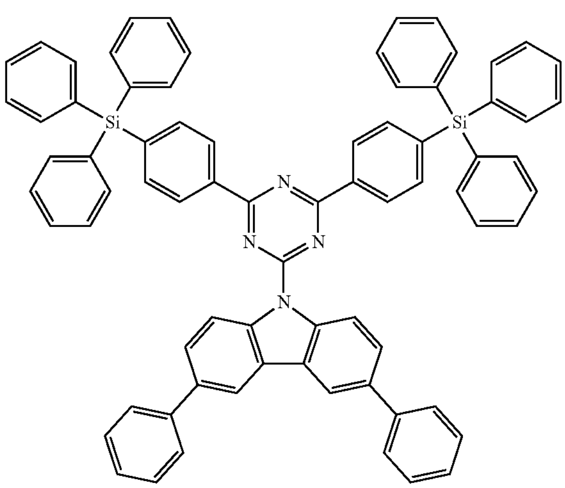
-continued
ETH12
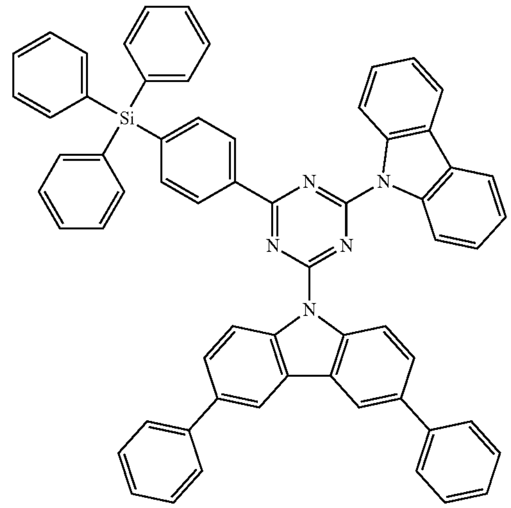
ETH13
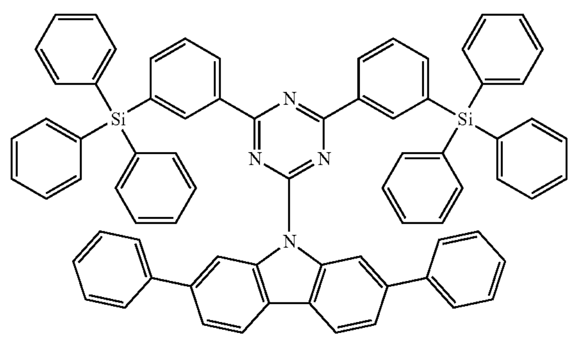
ETH14
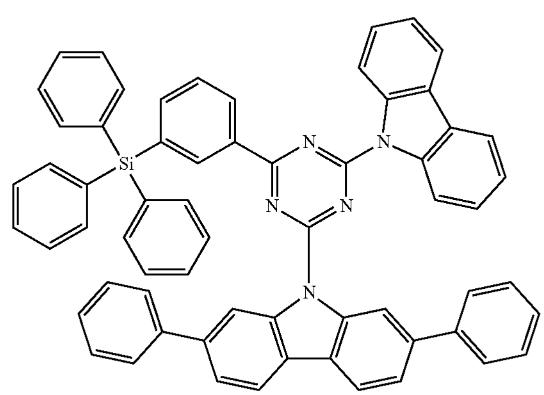

-continued
ETH15
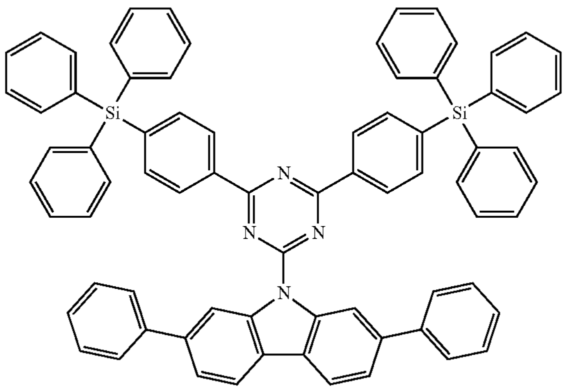
ETH16
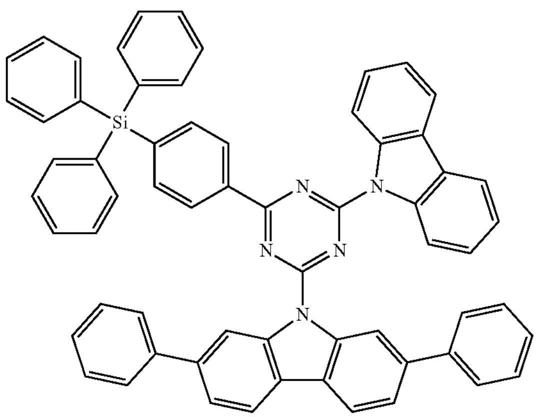
HTH1
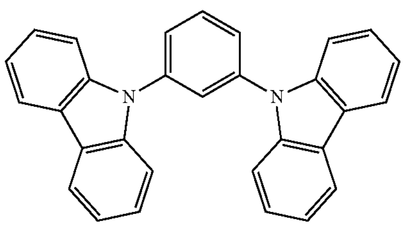
HTH2
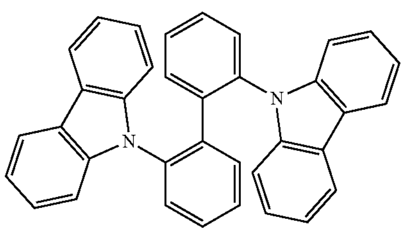
HTH3
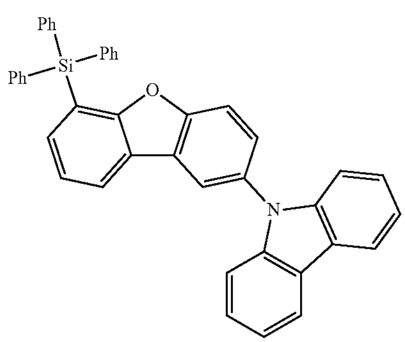
-continued
HTH4
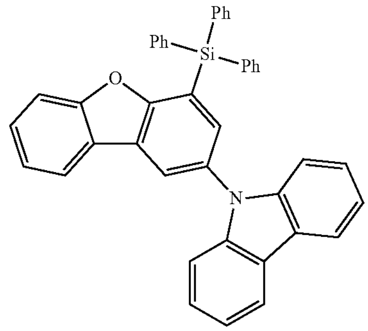
HTH5
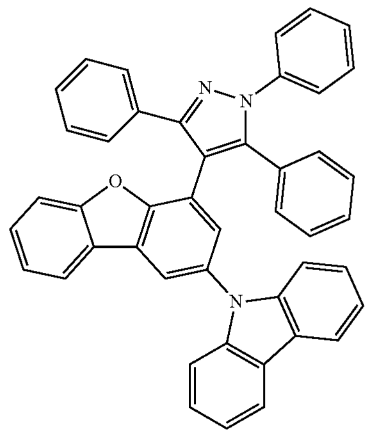
HTH6
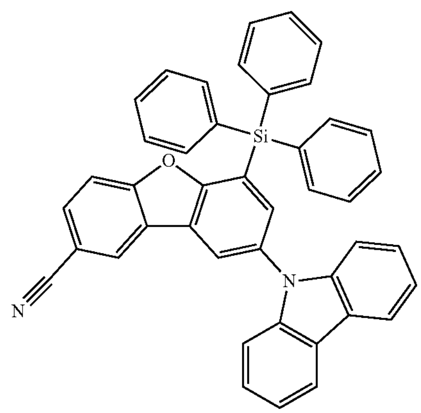
HTH7
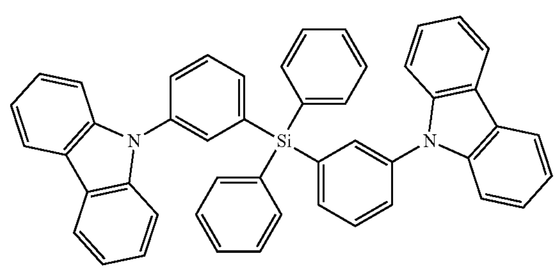

-continued

HTH8

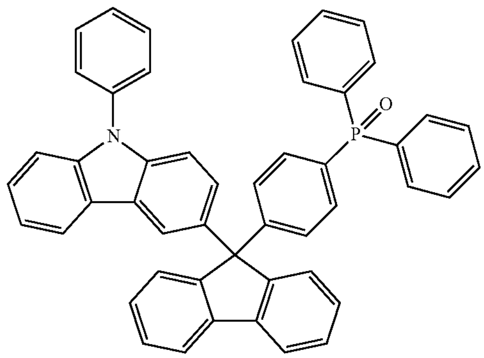

HTH9

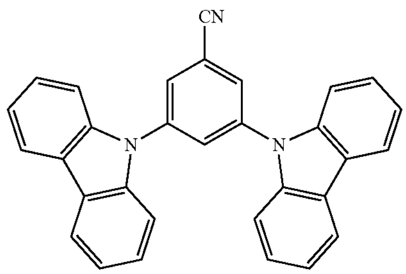

HTH10

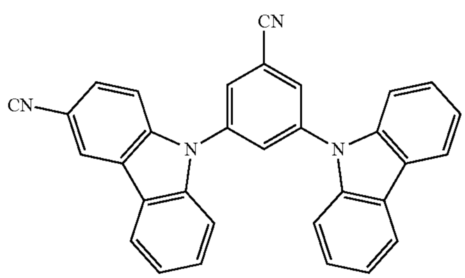

HTH11

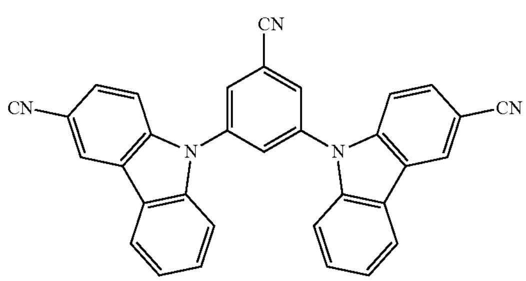

HTH12

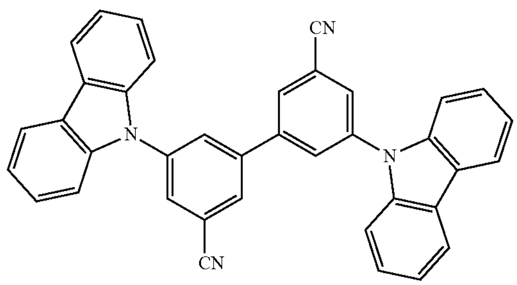

-continued

HTH13

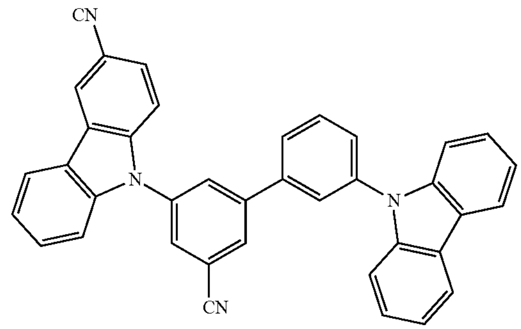

HTH14

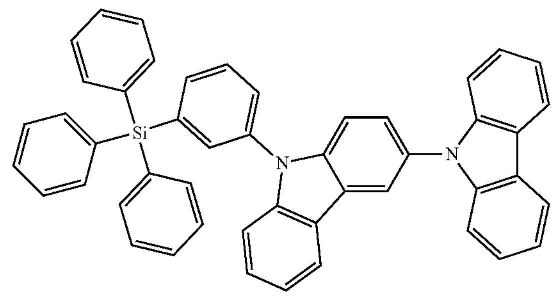

HTH15

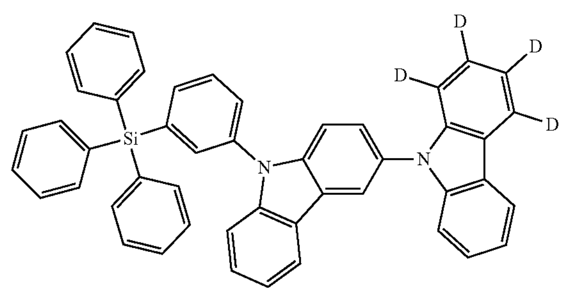

HTH16

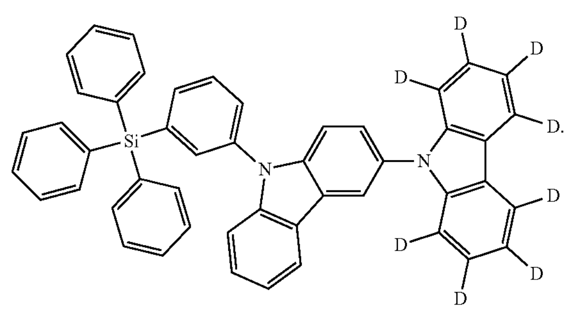

The electron transporting host represented by Formula 2 and the hole transporting host represented by Formula 3 may form an exciplex.

In one or more embodiments, the host may include the electron transporting host represented by Formula 2 and the hole transporting host represented by Formula 3. In this embodiment, the electron transporting host and the hole transporting host may form an exciplex. Thus, when the electron transporting host and the hole transporting host are used as co-hosts in the emission layer, a light-emitting device may have high efficiency and long lifespan.

A content ratio of the electron transporting host to the hole transporting host in the emission layer may be in a range of about 90:10 to about 10:90, for example, about 80:20 to about 20:80, or for example, about 70:30 to about 30:70, but embodiments are not limited thereto.

In one or more embodiments, the dopant may further include a delayed fluorescent material.

For example, the delayed fluorescent material may be a compound represented by Formula 4:

Formula 4

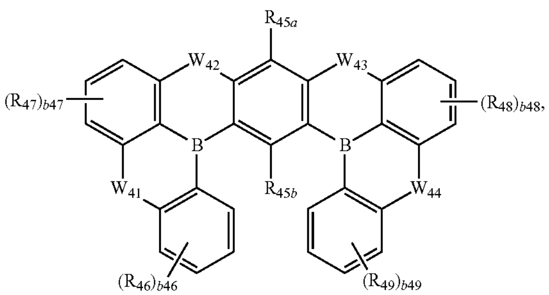

wherein, in Formula 4, $W_{41}$ may be O, S, $N(R_{41a})$ or $C(R_{41a})(R_{41b})$, $W_{42}$ may be O, S, $N(R_{42a})$, or $C(R_{42a})(R_{42b})$, $W_{43}$ may be O, S, $N(R_{43a})$, or $C(R_{43a})(R_{43b})$, and $W_{44}$ may be O, S, $N(R_{44a})$, or $C(R_{44a})(R_{44b})$, $R_{41a}$, $R_{41b}$, $R_{42a}$, $R_{42b}$, $R_{43a}$, $R_{43b}$, $R_{44a}$, $R_{44b}$, $R_{45a}$, $R_{45b}$, $R_{46}$, $R_{47}$, $R_{48}$, and $R_{49}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_6$-carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b46 and b49 may each independently be an integer from 1 to 4, b47 and b48 may each independently be an integer from 1 to 3, $R_{10a}$ and $Q_1$ to $Q_3$ may respectively be understood by referring to the descriptions of $R_{10a}$ and $Q_1$ to $Q_3$ provided herein.

An excited triplet energy level of the organometallic compound represented by Formula 1 and an excited triplet energy level of the compound represented by Formula 4 may be small such that dexter energy transition may occur.

A difference between an excited triplet energy level of the compound represented by Formula 4 and an excited singlet energy level thereof may be very small (e.g., about 0.3 eV or less). Thus, due to reverse intersystem crossing (RISC) mechanism, excitons of the excited triplet energy may be transferred to excitons of the excited singlet energy.

Accordingly, in a case of a light-emitting device further including the compound represented by Formula 4 according to one or more embodiments, excited triplet excitons transitioned from the organometallic compound may not be quenched and may be transitioned to an excited singlet state, and then transitioned to a ground state. Thus, an (organic) light-emitting device having high efficiency and long lifespan may be manufactured.

In one or more embodiments, the compound represented by Formula 4 may be a fluorescence emitter. For example, the compound represented by Formula 4 may be a delayed fluorescence dopant.

In one or more embodiments, $W_{41}$ may be $N(R_{41a})$, $W_{42}$ may be $N(R_{42a})$, $W_{43}$ may be $N(R_{43a})$, or $W_{44}$ may be $N(R_{44a})$. For example, $W_{41}$ may be $N(R_{41a})$, and $W_{42}$ may be $N(R_{42a})$. For example, $W_{41}$ may be $N(R_{41a})$, $W_{42}$ may be $N(R_{42a})$, and $W_{43}$ may be $N(R_{43a})$. For example, $W_{41}$ may be $N(R_{41a})$, $W_{42}$ may be $N(R_{42a})$, and $W_{44}$ may be $N(R_{44a})$. For example, $W_{42}$ may be $N(R_{42a})$, $W_{43}$ may be $N(R_{43a})$, and $W_{44}$ may be $N(R_{44a})$. For example, $W_{41}$ may be $N(R_{41a})$, $W_{42}$ may be $N(R_{42a})$, $W_{43}$ may be $N(R_{43a})$, and $W_{44}$ may be $N(R_{44a})$.

In one or more embodiments, $R_{47}$ and $R_{48}$ may each be —$N(Q_1)(Q_2)$, wherein $Q_1$ and $Q_2$ may each independently be a $C_6$-$C_{60}$ aryl group unsubstituted or substituted with deuterium, —F, a cyano group, a $C_1$-$C_{10}$ alkyl group, a phenyl group, a biphenyl group, or any combination thereof, and b47 and b48 may each be 1.

For example, the compound represented by Formula 4 may be one of Compounds DFD1 to DFD12, but embodiments are not limited thereto:

DDF1

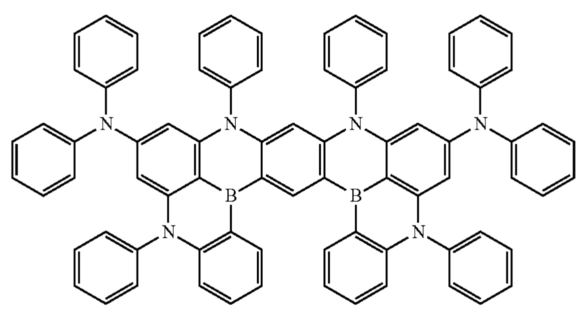

DFD2

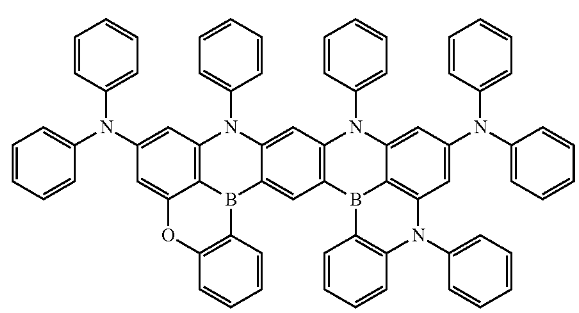

DFD3

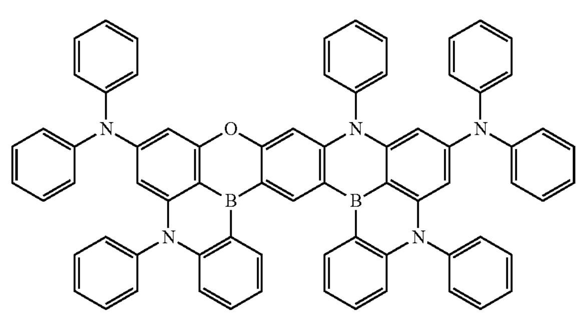

-continued

DFD4

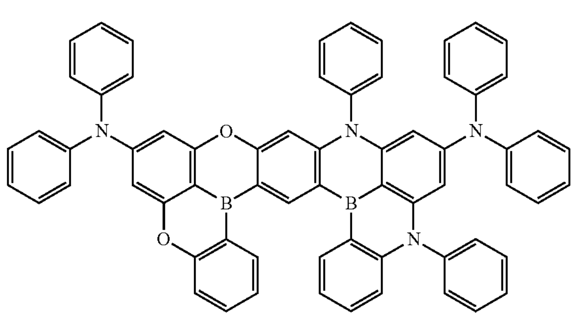

DFD5

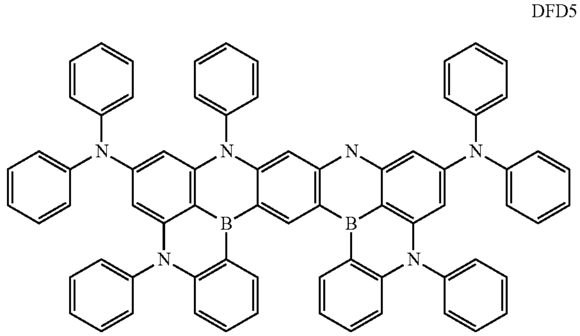

DFD6

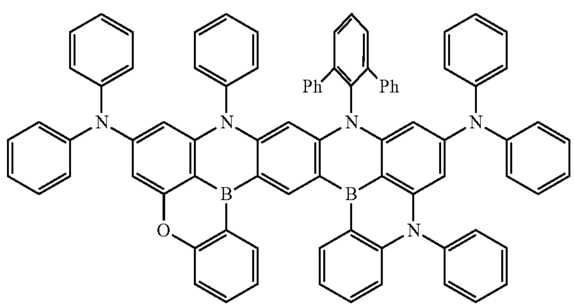

DFD7

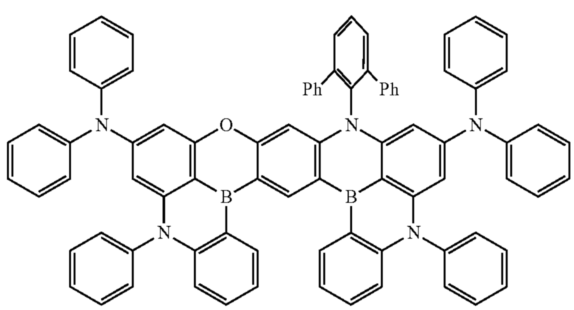

DFD8

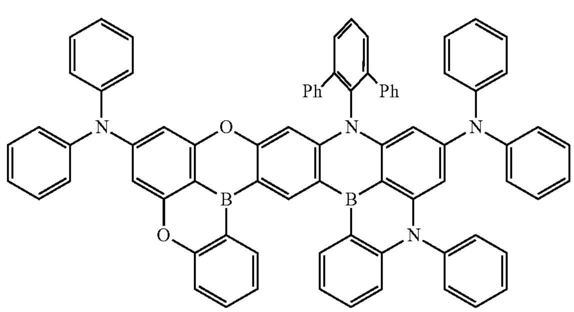

-continued

DFD9

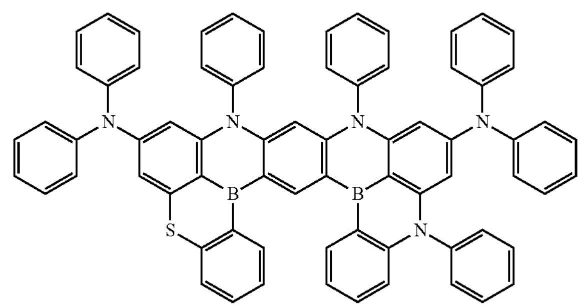

DFD10

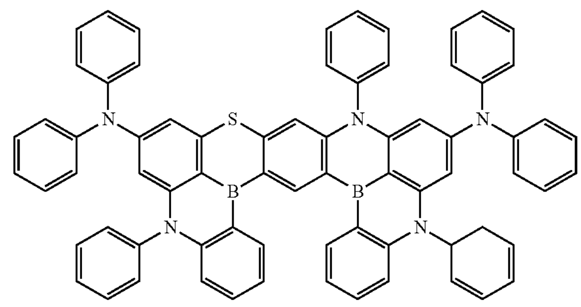

DFD11

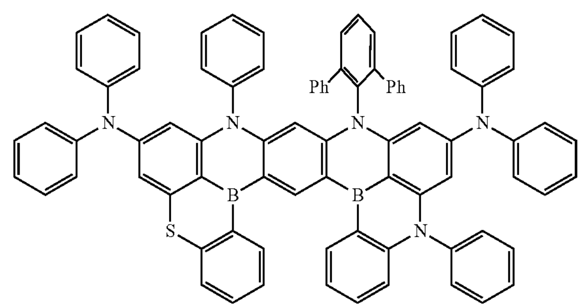

DFD12

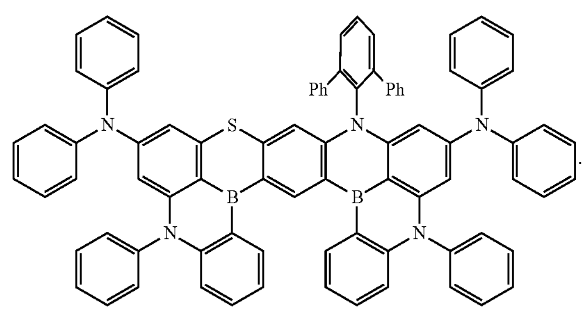

In one or more embodiments, the light-emitting device may include at least one of a first capping layer located outside the first electrode or a second capping layer located outside the second electrode. In some embodiments, the at least one of the first capping layer or the second capping layer may include the organometallic compound represented by Formula 1. The first capping layer and the second capping layer may respectively be understood by referring to the descriptions of the first capping layer and the second capping layer provided herein.

In some embodiments, the at least one of the first capping layer or the second capping layer may have a refractive index of about 1.6 or higher at a wavelength of 589 nanometers (nm).

The expression that an "(interlayer and/or a capping layer) includes at least one organometallic compound" as used herein may be construed as meaning that the "(interlayer and/or the capping layer) may include one organometallic compound of Formula 1 or two or more different organometallic compounds of Formula 1".

For example, Compound BD01 may only be included in the interlayer as the organometallic compound. In this embodiment, Compound BD01 may be included in the emission layer of the light-emitting device. In some embodiments, Compounds BD01 and BD02 may be included in the interlayer as the organometallic compounds. In this embodiment, Compounds BD01 and BD02 may be included in the same layer (for example, both Compounds BD01 and BD02 may be included in an emission layer) or in different layers (for example, Compound BD01 may be included in an emission layer, and Compound BD02 may be included in an electron transport region).

According to one or more embodiments, an electronic apparatus may include the light-emitting device. The electronic apparatus may further include a thin-film transistor. In some embodiments, the electronic apparatus may further include a thin-film transistor including a source electrode and a drain electrode, and a first electrode of the light-emitting device may be electrically connected (e.g., electrically coupled) to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

Description of FIG. 1

FIG. 1 is a schematic view of a light-emitting device 10 according to one or more embodiments. The light-emitting device 10 may include a first electrode 110, an interlayer 130, and a second electrode 150.

Hereinafter, the structure of the light-emitting device 10 according to one or more embodiments and a method of manufacturing the light-emitting device 10 according to one or more embodiments will be described in connection with FIG. 1.

First Electrode 110

In FIG. 1, a substrate may be additionally located under the first electrode 110 or above the second electrode 150. The substrate may be a glass substrate and/or a plastic substrate. The substrate may be a flexible substrate including plastic having excellent (or suitable) heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to one or more suitable organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and the charge generation layer, the light-emitting device 10 may be a tandem light-emitting device.

Hole Transport Region in Interlayer 130

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure are sequentially stacked on the first electrode 110 in each stated order.

The hole transport region may include the compound represented by Formula 201, the compound represented by Formula 202, or any combination thereof:

Formula 201

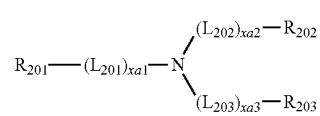

Formula 202

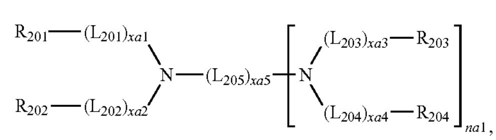

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group and/or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, na1 may be an integer from 1 to 4.

In some embodiments, Formulae 201 and 202 may each include at least one of groups represented by Formulae CY201 to CY217:

CY201

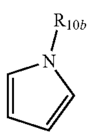

CY202

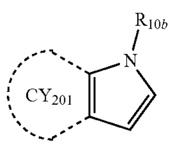

CY203

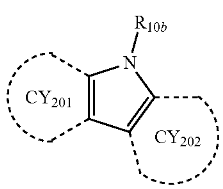

CY204

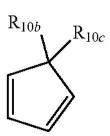

CY205

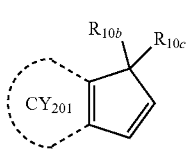

-continued

CY206

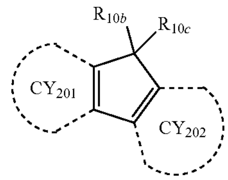

CY207

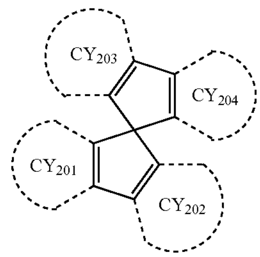

CY208

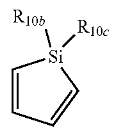

CY209

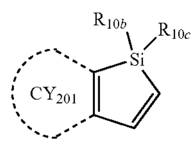

CY210

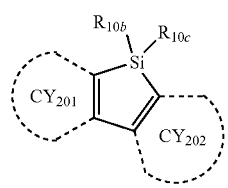

CY211

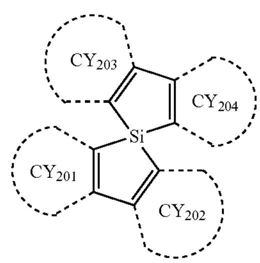

CY212

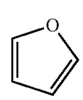

CY213

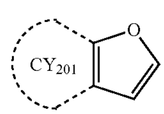

CY214

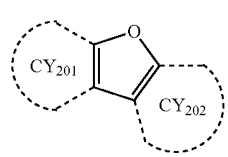

-continued

CY215

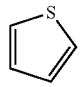

CY216

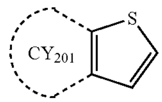

CY217

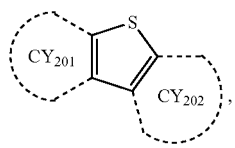

wherein, in Formulae CY201 to CY217, $R_{10b}$ and $R_{10c}$ may each be understood by referring to the descriptions of $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring CY201 to ring CY204 may each independently be a benzene group, a naphthalene group, a phenanthrene group, or an anthracene group.

In one or more embodiments, Formulae 201 and 202 may each include at least one of groups represented by Formula CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In one or more embodiments, Formula 201 and 202 may each not include groups represented by Formulae CY201 to CY203.

In one or more embodiments, Formula 201 and 202 may each not include groups represented by Formulae CY201 to CY203, and include at least one of groups represented by Formulae CY204 to CY217.

In one or more embodiments, Formula 201 and 202 may each not include groups represented by Formulae CY201 to CY217.

In some embodiments, the hole transport region may include one of Compounds HT1 to HT46, m-MTDATA, TDATA, 2-TNATA, NPB (NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

HT1

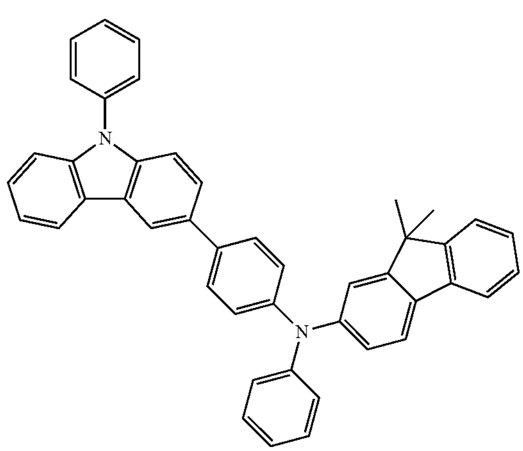

HT2

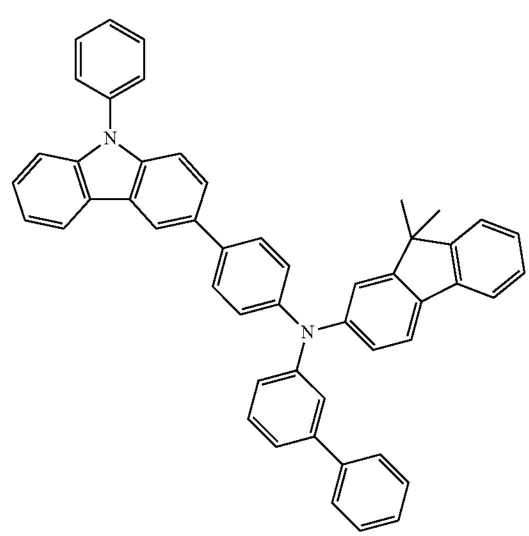

-continued
HT3
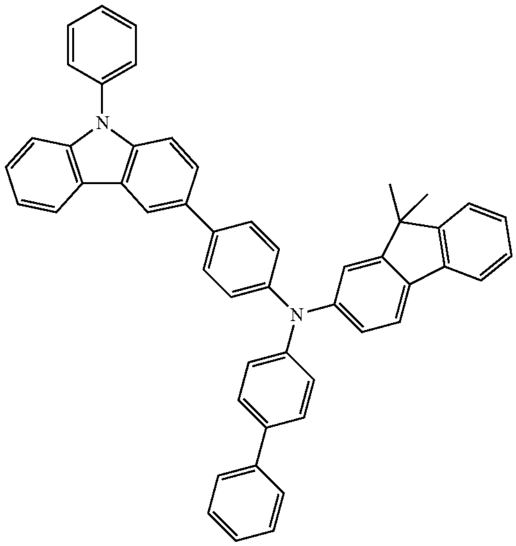
HT4
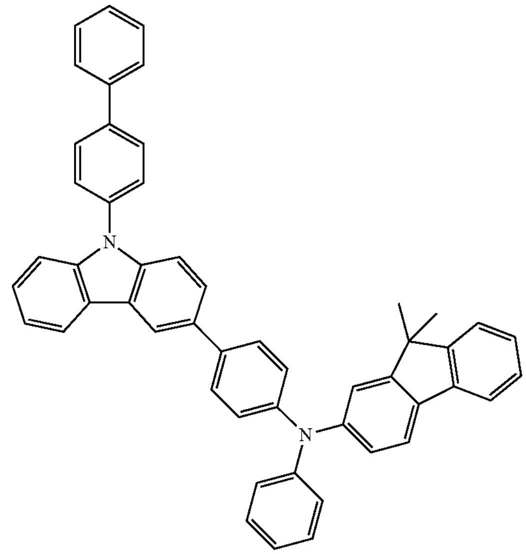
HT5
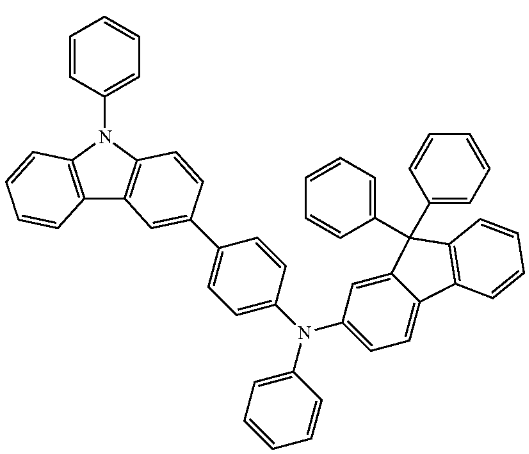
HT6
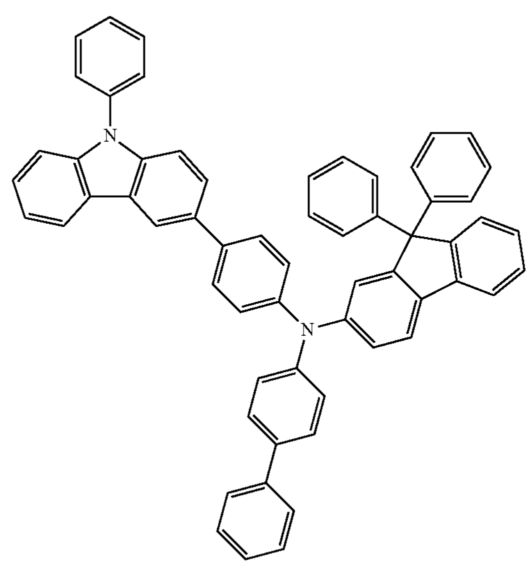

-continued
HT7
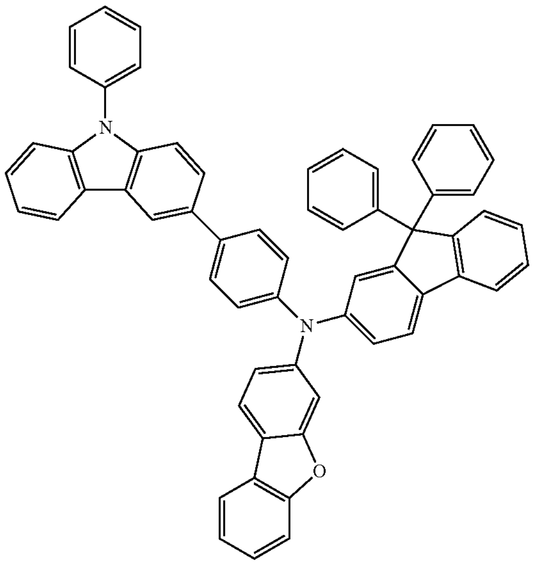
HT8
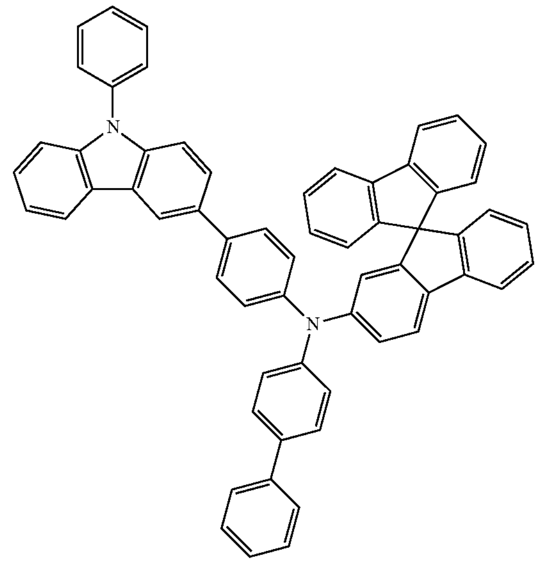
HT9
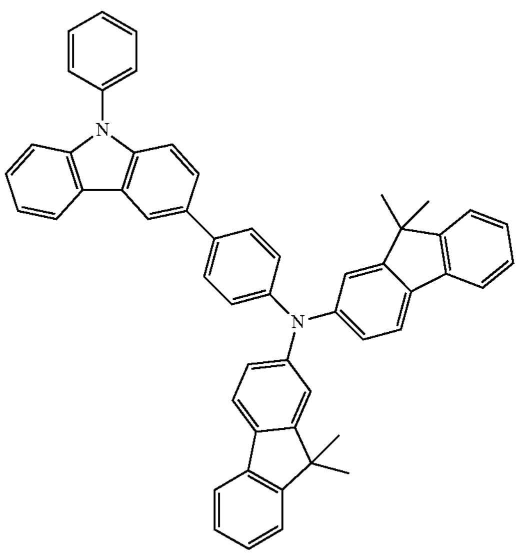
HT10
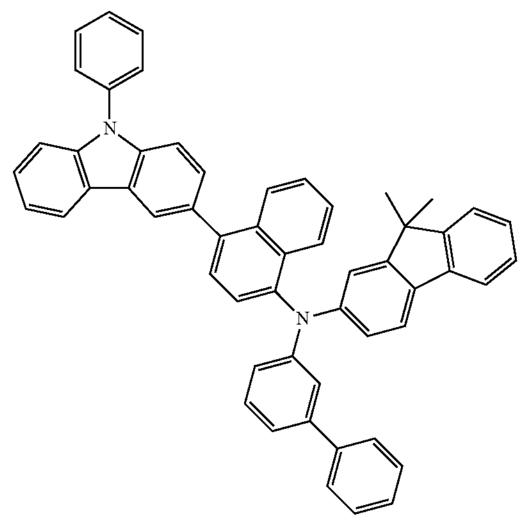
HT11
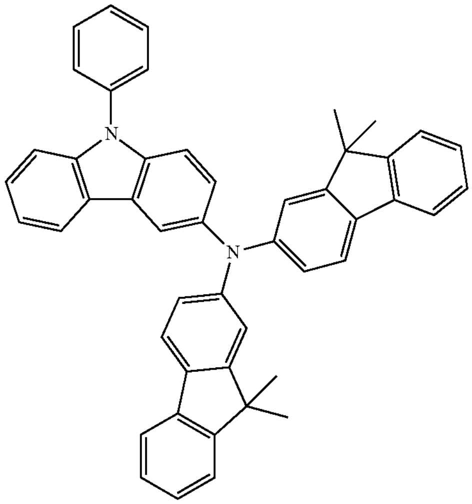
HT12
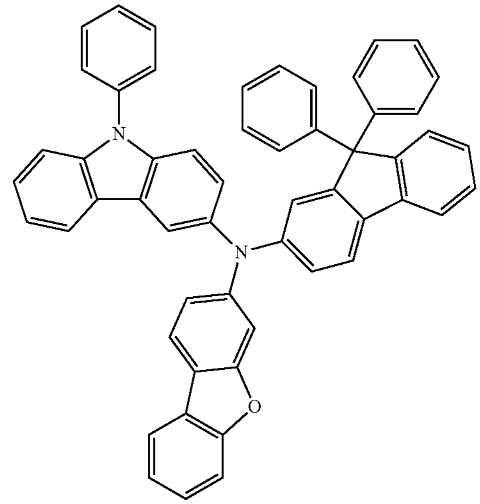

-continued
HT13
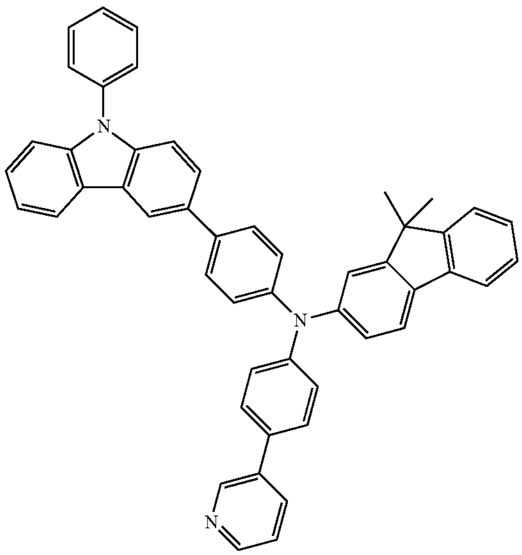
HT14
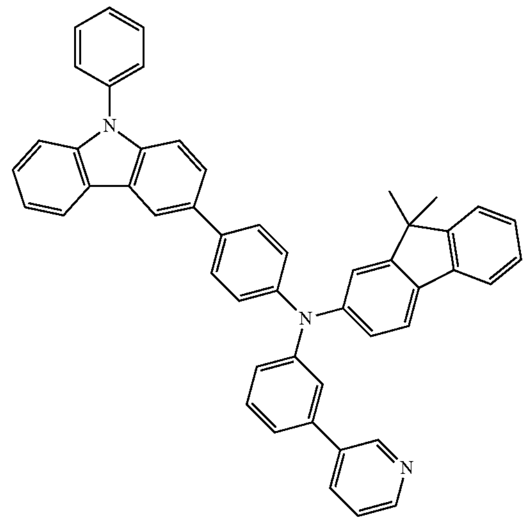
HT15
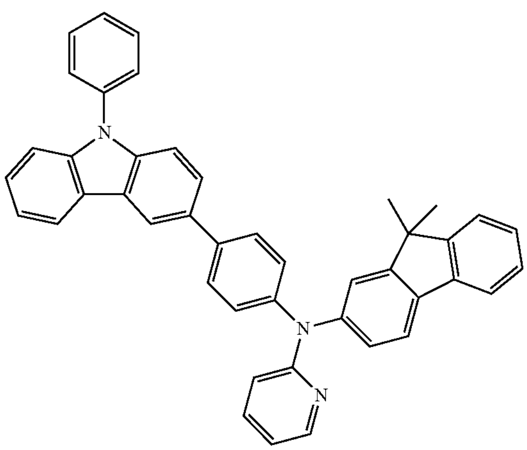
HT16
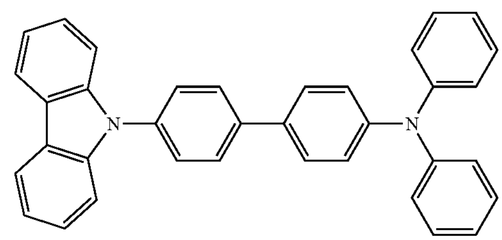
HT17
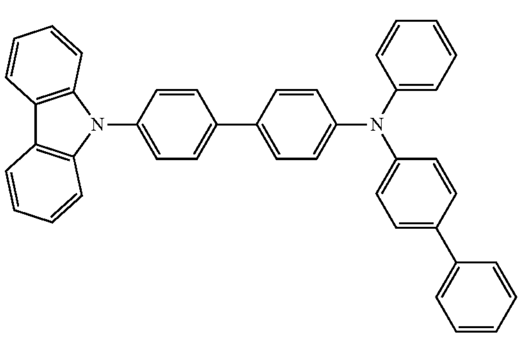
HT18
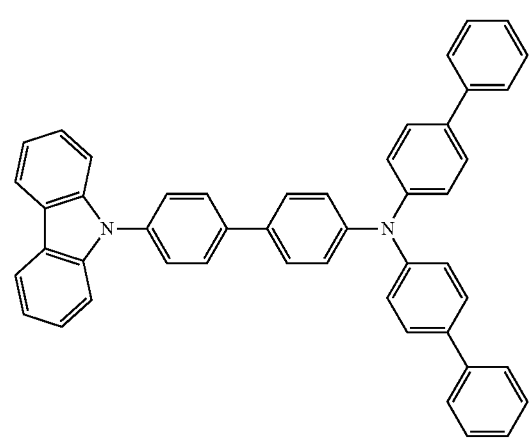

-continued
HT19
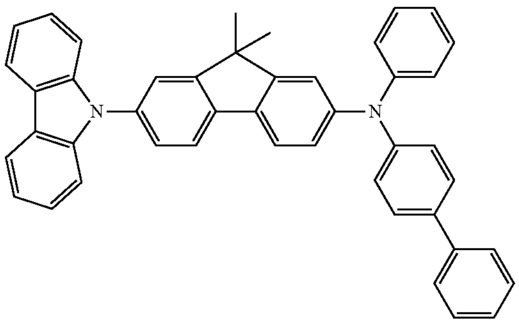
HT20
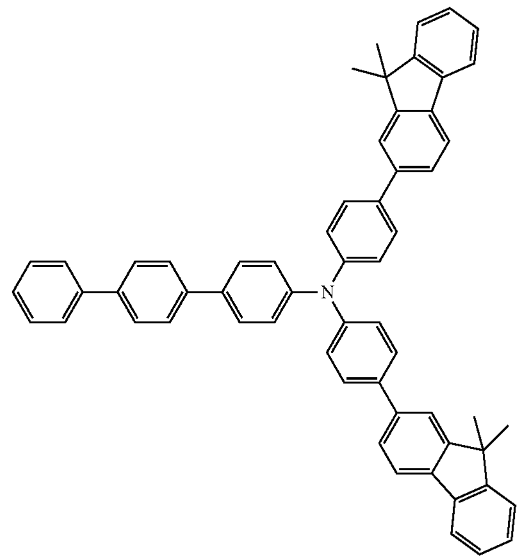
HT21
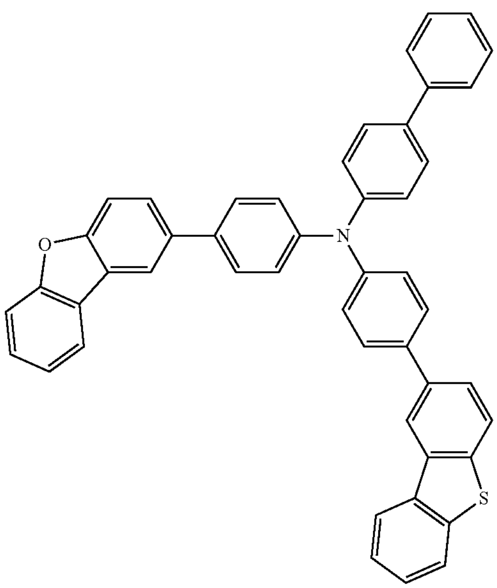
HT22
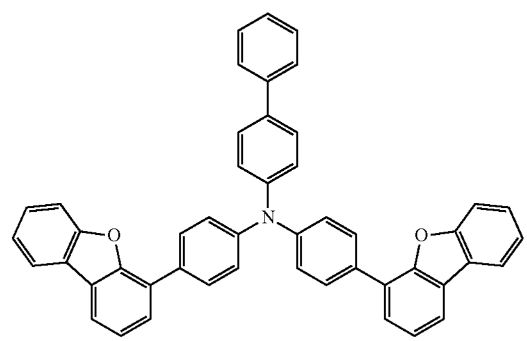
HT23
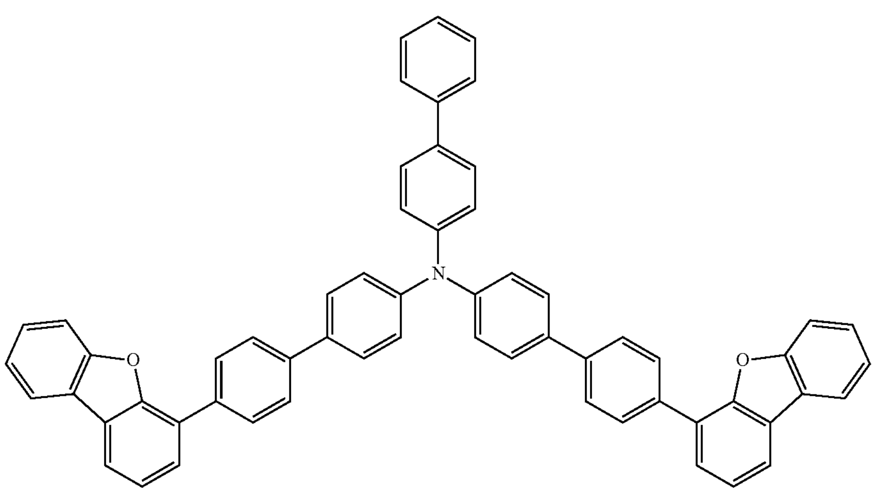

-continued
HT24
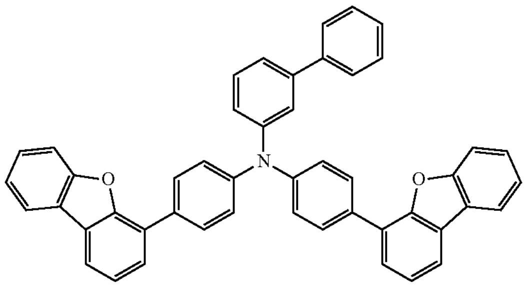
HT25
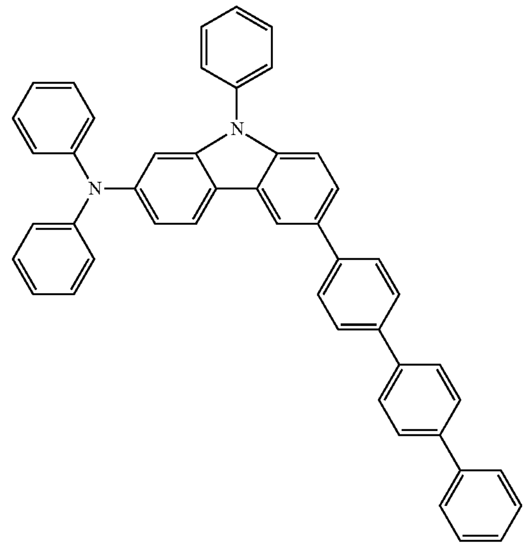
HT26
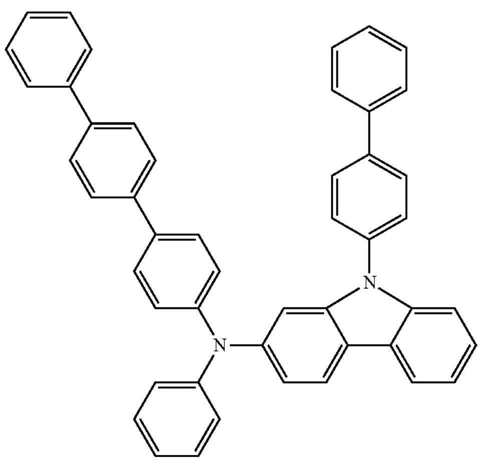
HT27
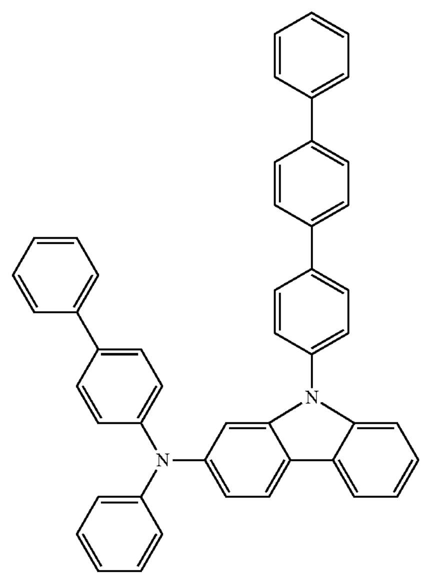
HT28
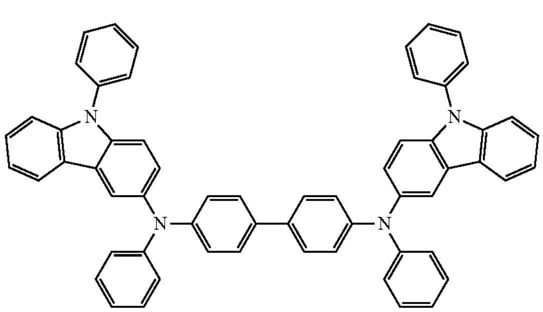
HT29
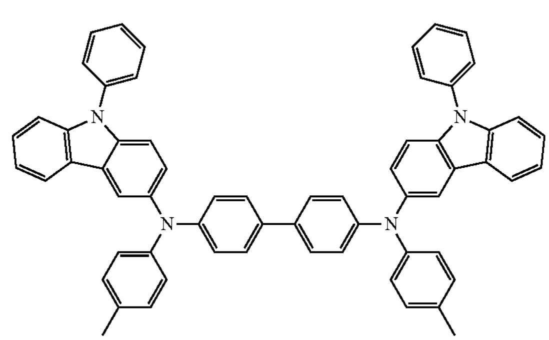

-continued
HT30
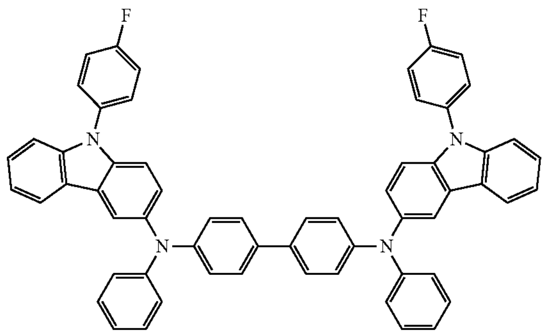
HT31
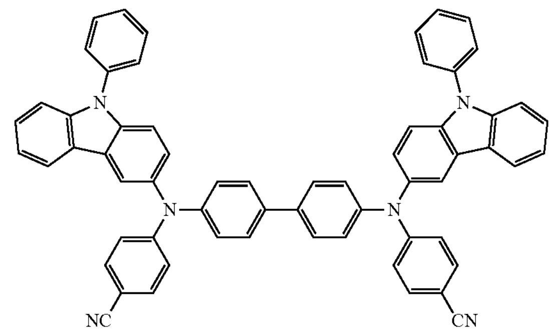
HT32
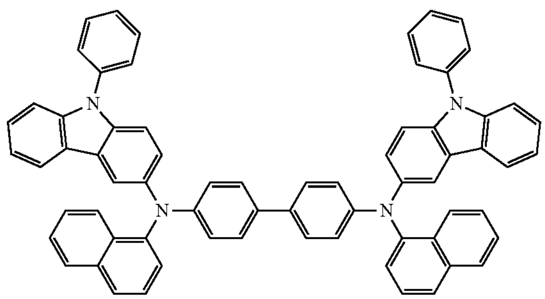
HT33
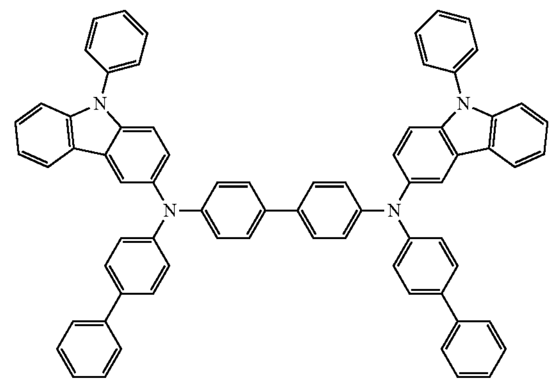
HT34
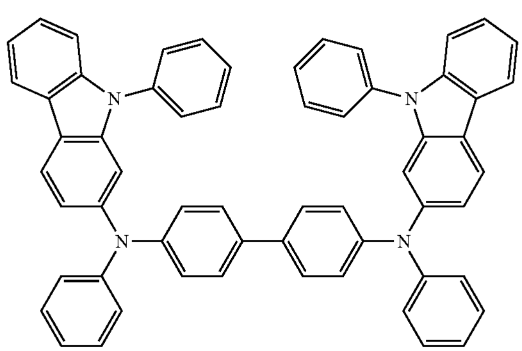
HT35
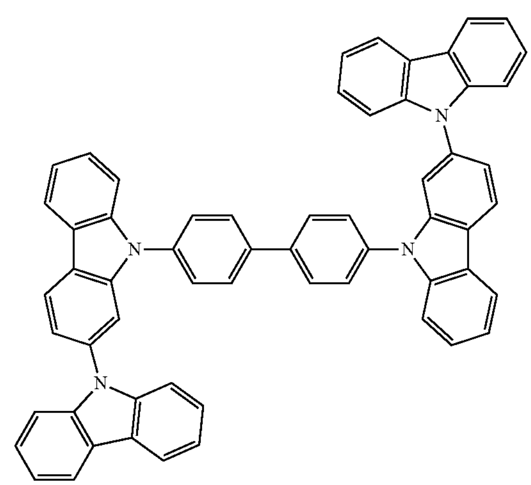

-continued
HT36
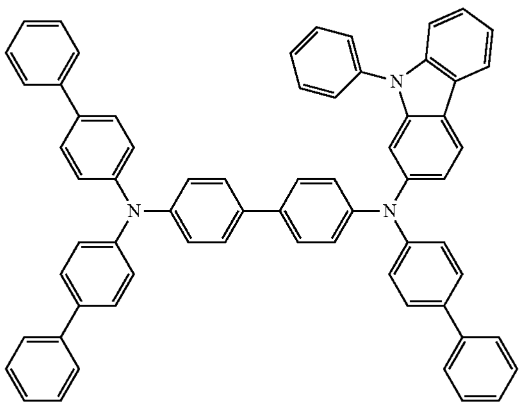
HT37
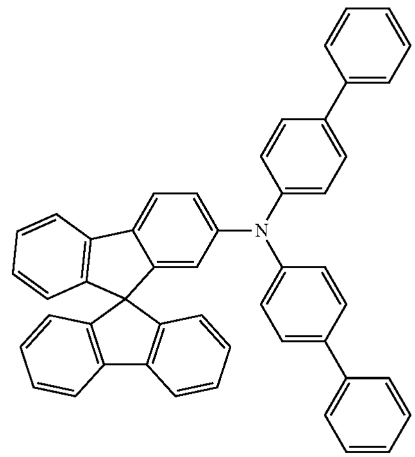
HT38
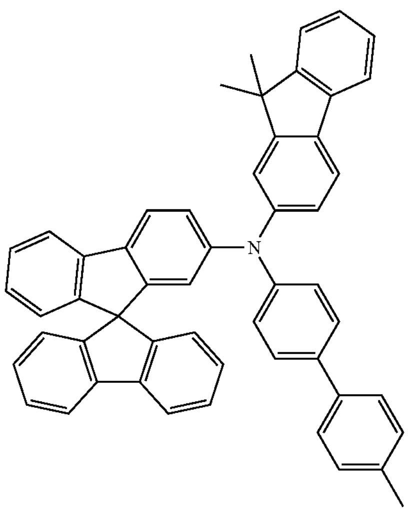
HT39
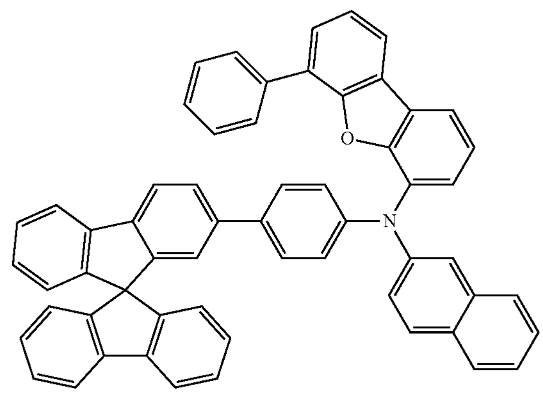
HT40
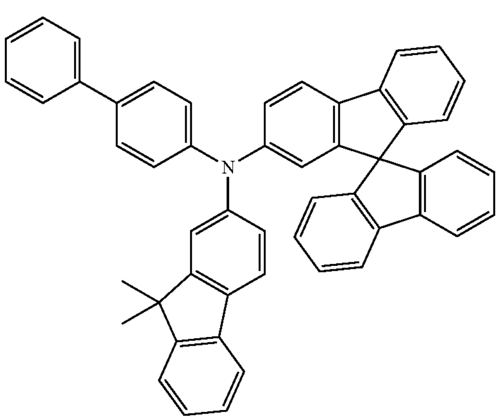
HT41
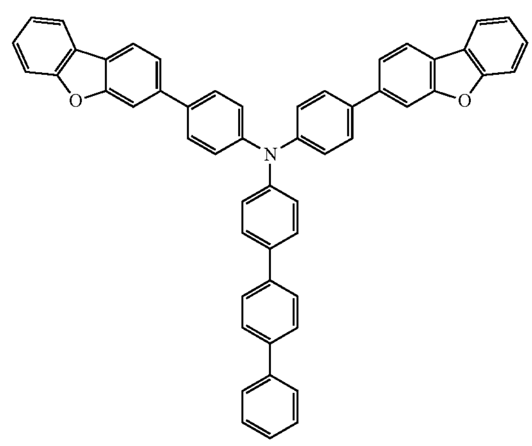

-continued
HT42
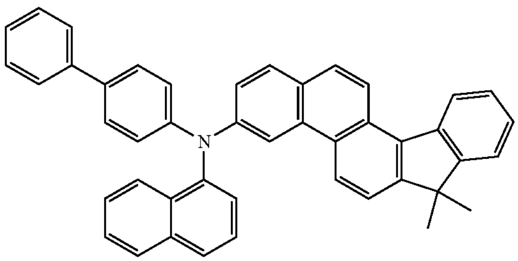
HT43
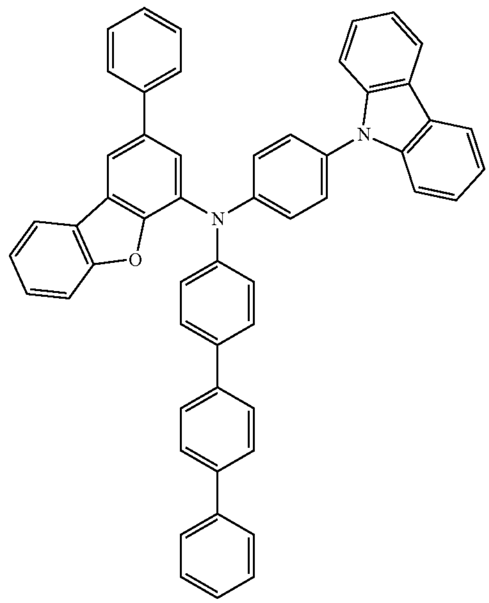
HT44
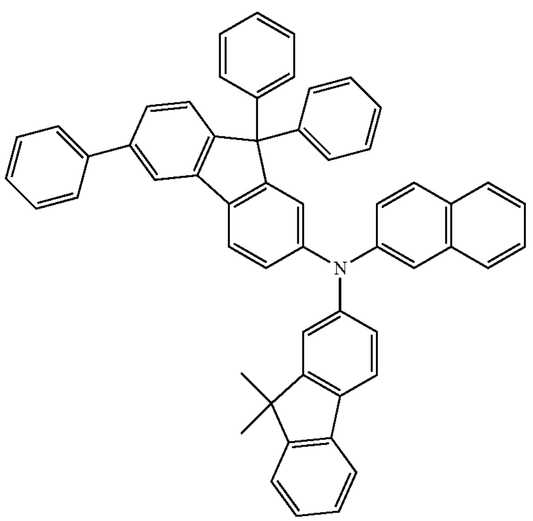
HT45
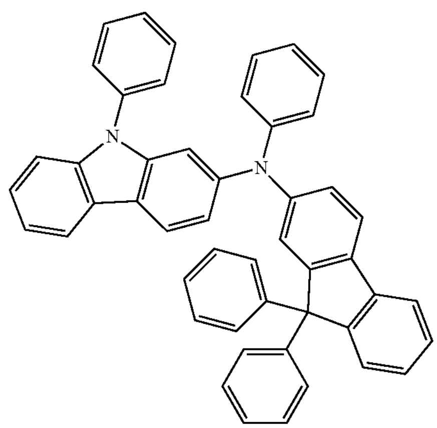
HT46
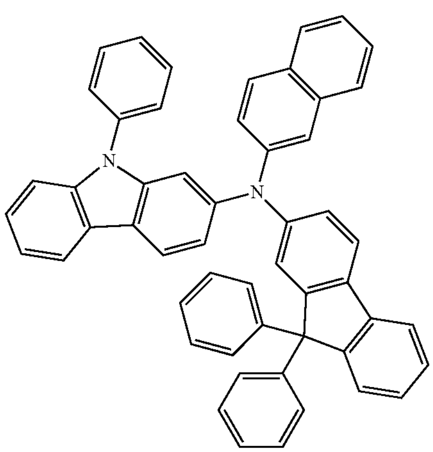

-continued
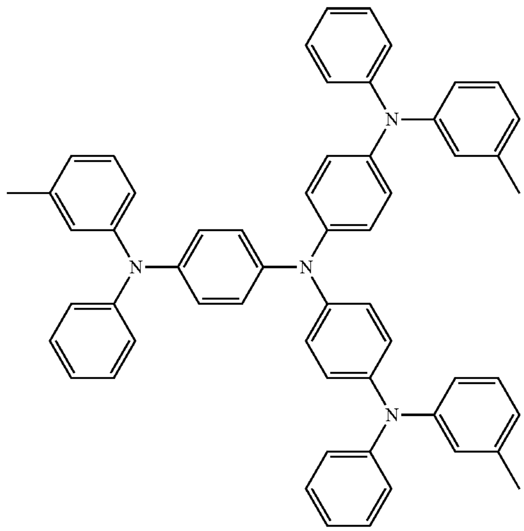
m-MTDATA
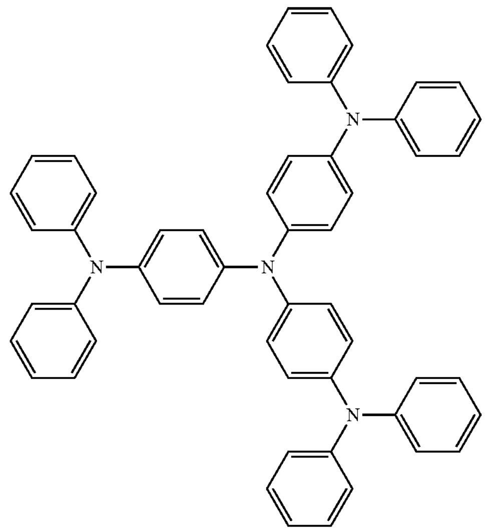
TDATA
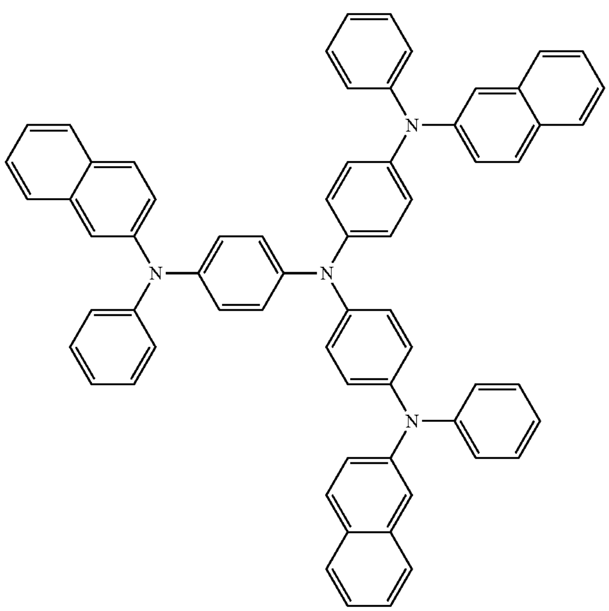
2-TNATA
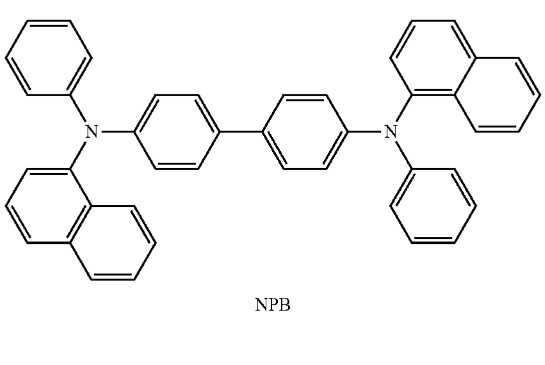
NPB -continued
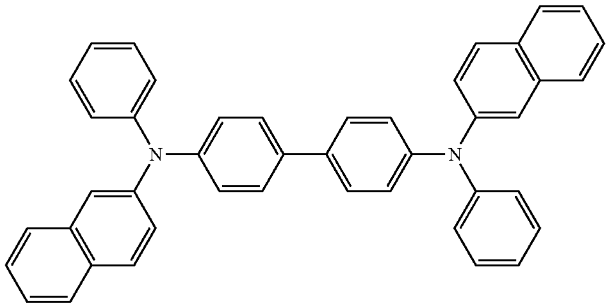
β-NPB
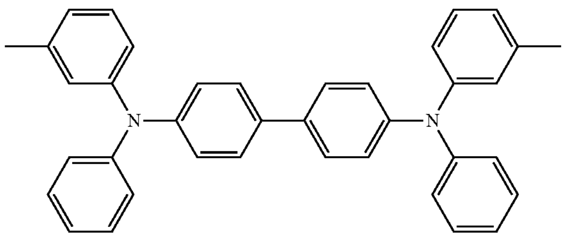
TPD
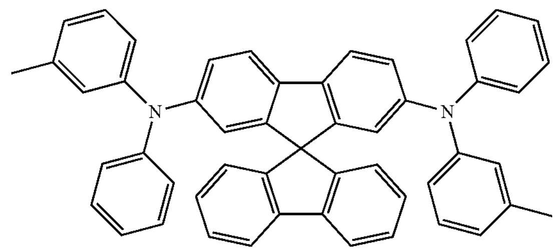
Spiro-TPD
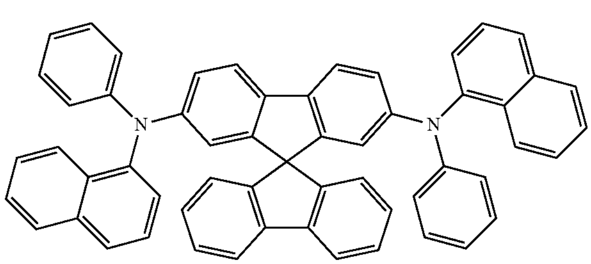
Spiro-NPB
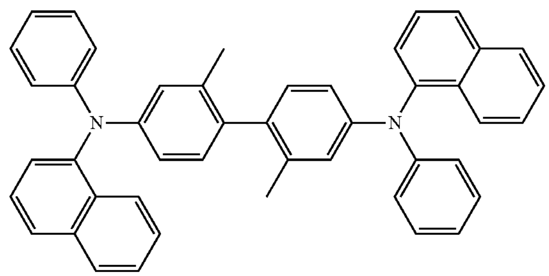
methylated-NPB
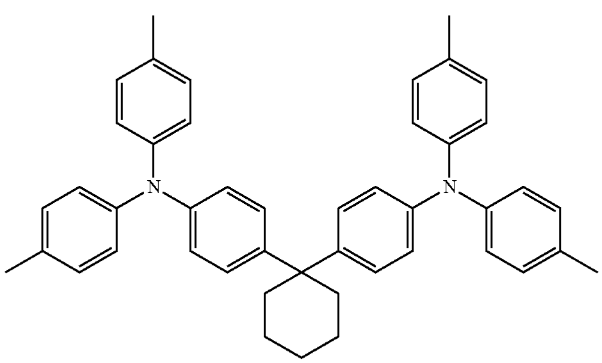
TAPC
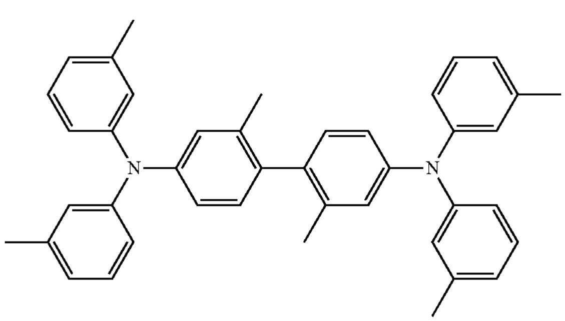
HMTPD The thickness of the hole transport region may be in a range of about 50 Angstroms (Å) to about 10,000 Å, for example, about 100 Å to about 4,000 Å. When the hole transport region includes a hole injection layer, a hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent (or improved) hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may each independently include any of the aforementioned materials.

p-Dopant

The hole transport region may include a charge generating material, as well as the aforementioned materials, to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be about −3.5 eV or less.

In some embodiments, the p-dopant may include a quinone derivative, a cyano group-containing compound, elements EL1 and/or EL2-containing compound, or any combination thereof.

Examples of the quinone derivative may include TCNQ, F4-TCNQ, and the like.

Examples of the cyano group-containing compound may include HAT-CN, a compound represented by Formula 221, and the like:

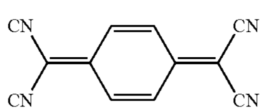

TCNQ

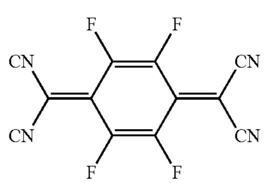

F4-TCNQ

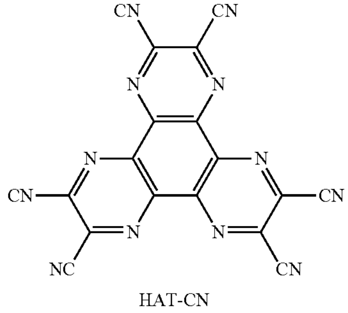

HAT-CN

-continued

Formula 221

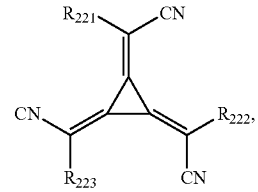

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, each independently substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and/or EL2-containing compound, element EL1 may be metal, metalloid, or a combination thereof, and element EL2 may be non-metal, metalloid, or a combination thereof.

Examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid may include silicon (Si), antimony (Sb), tellurium (Te), and/or the like.

Examples of the non-metal may include oxygen (O), halogen (e.g., F, Cl, Br, I, and/or the like), and/or the like.

For example, the elements EL1 and/or EL2-containing compound may include a metal oxide, a metal halide (e.g., metal fluoride, metal chloride, metal bromide, metal iodide, and/or the like), a metalloid halide (e.g., a metalloid fluoride, a metalloid chloride, a metalloid bromide, a metalloid iodide, and/or the like), a metal telluride, or any combination thereof.

Examples of the metal oxide may include tungsten oxide (e.g., WO, $W_2O_3$, $WO_2$, $WO_3$, $W_2O_5$, and/or the like), vanadium oxide (e.g., VO, $V_2O_3$, $VO_2$, $V_2O_5$, and/or the like), molybdenum oxide (MoO, $Mo_2O_3$, $MoO_2$, $MoO_3$, $Mo_2O_5$, and/or the like), rhenium oxide (e.g., $ReO_3$, and/or the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and/or the like), zirconium halide (e.g., $ZrF_4$, $ZrCl_4$, $ZrBr_4$, $ZrI_4$, and/or the like), hafnium halide (e.g., $HfF_4$, $HfCl_4$, $HfBr_4$, $HfI_4$, and/or the like), vanadium halide (e.g., $VF_3$, $VCl_3$, $VBr_3$, $VI_3$, and/or the like), niobium halide (e.g., $NbF_3$, $NbCl_3$, $NbBr_3$, $NbI_3$, and/or the like), tantalum halide (e.g., $TaF_3$, $TaCl_3$, $TaBr_3$, $TaI_3$, and/or the like), chromium halide (e.g., $CrF_3$, $CrCl_3$, $CrBr_3$, $CrI_3$, and/or the like), molybdenum halide (e.g., $MoF_3$, $MoCl_3$, $MoBr_3$, $MoI_3$, and/or the like), tungsten halide (e.g., $WF_3$, $WCl_3$, $WBr_3$, $WI_3$, and/or the like), manganese halide (e.g., $MnF_2$, $MnCl_2$, $MnBr_2$, $MnI_2$, and/or the like), technetium halide (e.g., $TcF_2$, $TcCl_2$, $TcBr_2$, $TcI_2$, and/or the like), rhenium halide (e.g., $ReF_2$, $ReCl_2$, $ReBr_2$, $ReI_2$, and/or the like), iron halide (e.g., $FeF_2$, $FeCl_2$, $FeBr_2$, $FeI_2$, and/or the like), ruthenium halide (e.g., $RuF_2$, $RuCl_2$, $RuBr_2$, $RuI_2$, and/or the like), osmium halide (e.g., $OsF_2$, $OsCl_2$, $OsBr_2$, $OsI_2$, and/or the like), cobalt halide (e.g., $CoF_2$, $CoCl_2$, $CoBr_2$, $CoI_2$, and/or the like), rhodium halide (e.g., $RhF_2$, $RhCl_2$, $RhBr_2$, $RhI_2$, and/or the like), iridium halide (e.g., $IrF_2$, $IrCl_2$, $IrBr_2$, $IrI_2$, and/or the like), nickel halide (e.g., $NiF_2$, $NiCl_2$, $NiBr_2$, $NiI_2$, and/or the like), palladium halide (e.g., $PdF_2$, $PdCl_2$, $PdBr_2$, $PdI_2$, and/or the like), platinum halide (e.g., $PtF_2$, $PtCl_2$, $PtBr_2$, $PtI_2$, and/or the like), copper halide (e.g., CuF, CuCl, CuBr, CuI, and/or the like), silver halide (e.g., AgF, AgCl, AgBr, AgI, and/or the like), gold halide (e.g., AuF, AuCl, AuBr, AuI, and/or the like), and the like.

Examples of the post-transition metal halide may include zinc halide (e.g., $ZnF_2$, $ZnCl_2$, $ZnBr_2$, $ZnI_2$, and/or the like), indium halide (e.g., $InI_3$ and/or the like), tin halide (e.g., $SnI_2$ and/or the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and/or the like) and the like.

Examples of the metal telluride may include alkali metal telluride (e.g., $Li_2Te$, $Na_2Te$, $K_2Te$, $Rb_2Te$, $Cs_2Te$, and/or the like), alkaline earth metal telluride (e.g., BeTe, MgTe, CaTe, SrTe, BaTe, and/or the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), post-transition metal telluride (e.g., ZnTe and/or the like), lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, and/or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof.

In one or more embodiments, the host may include the electron transporting host represented by Formula 2, the hole transporting host represented by Formula 3, or any combination thereof.

The dopant may include the organometallic compound represented by Formula 1. In some embodiments, the dopant may further include the compound represented by Formula 4.

The amount of the dopant in the emission layer may be in a range of about 0.01 parts to about 15 parts by weight based on 100 parts by weight of the host.

In some embodiments, the emission layer may include a quantum dot.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include the electron transporting host represented by Formula 2, the hole transporting host represented by Formula 3, or the compound represented by Formula 301:

$$[Ar_{301}]_{xb11}\text{-}[(L_{301})_{xb1}\text{-}R_{301}]_{xb21}, \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be understood by referring to the description of $Q_1$ provided herein.

In some embodiments, when xb11 in Formula 301 is 2 or greater, at least two $Ar_{301}$(s) may be bound via a single bond.

In some embodiments, the host may include a compound represented by Formula 301-1, a compound represented by Formula 301-2, or any combination thereof:

Formula 301-1

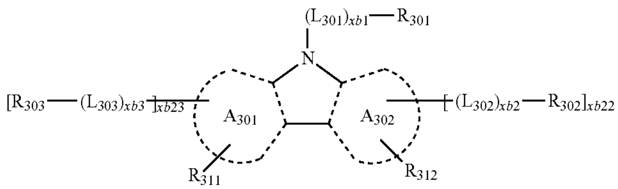

Formula 301-2

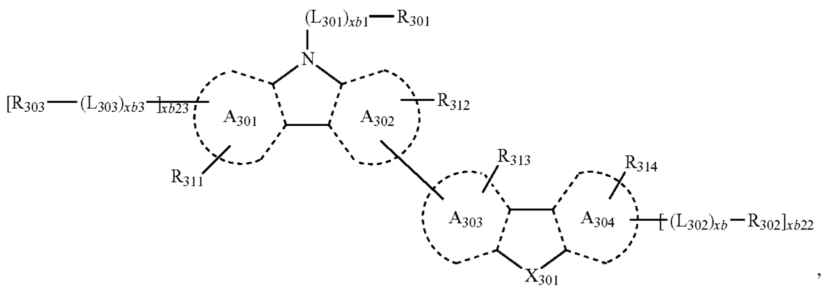

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In some embodiments, the host may include an alkaline earth metal complex. For example, the host may include a Be complex (e.g., Compound H55), a Mg complex, a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

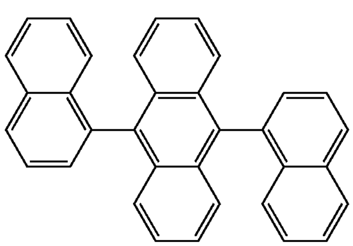

H2

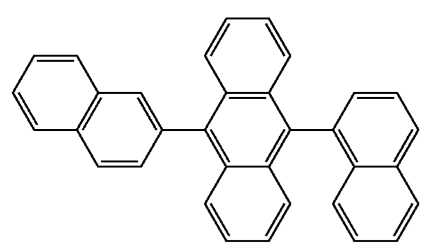

H3

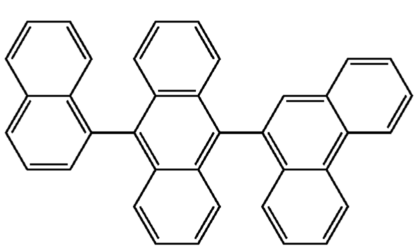

H4

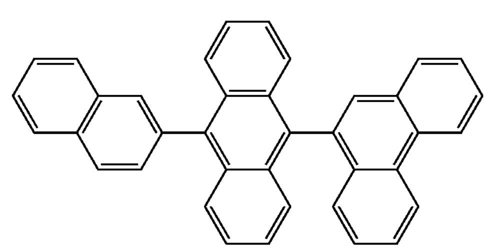

-continued
H5
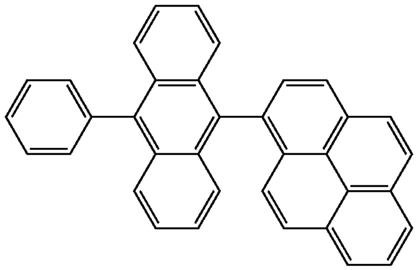
H6
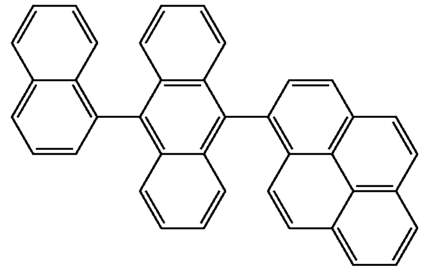
H7
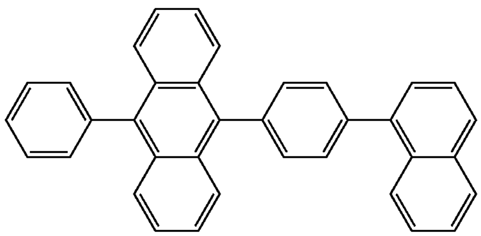
H8
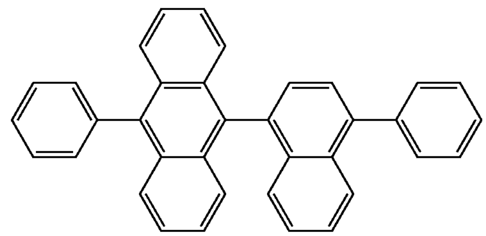
H9
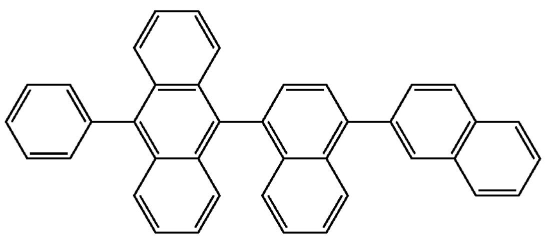
H10
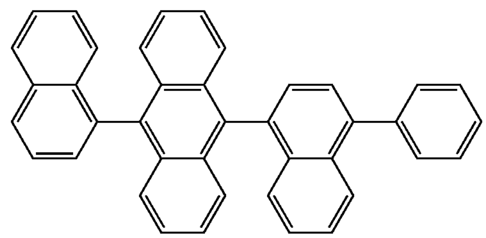
H11
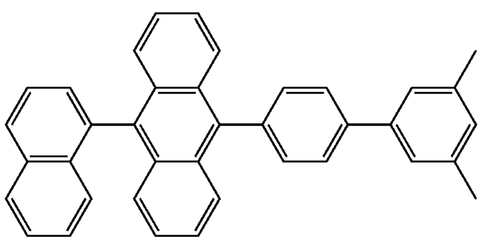
H12
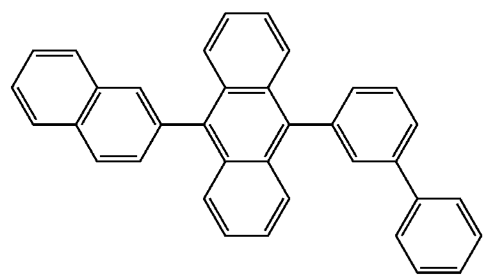
H13
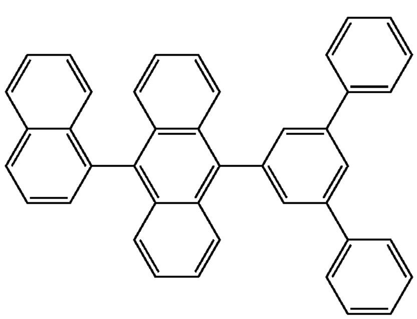
H14
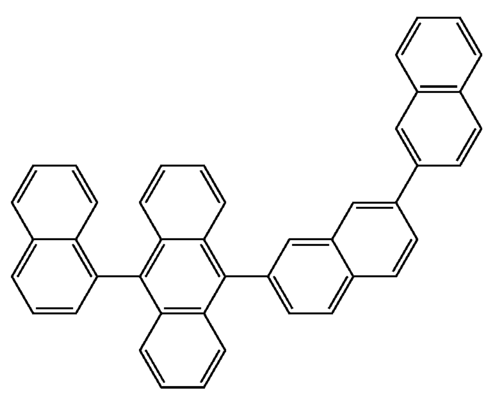

-continued
H15
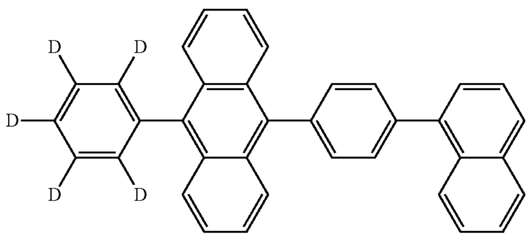
H16
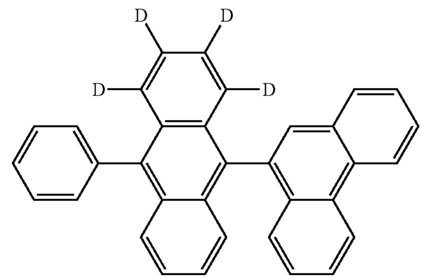
H17
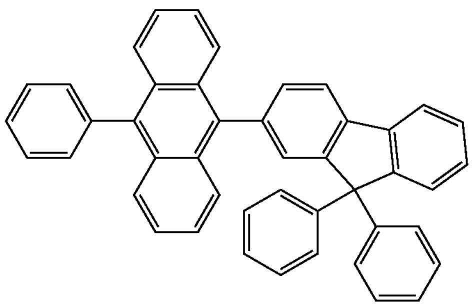
H18
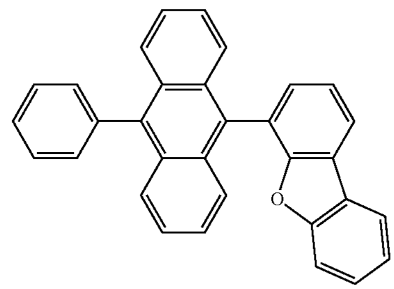
H19
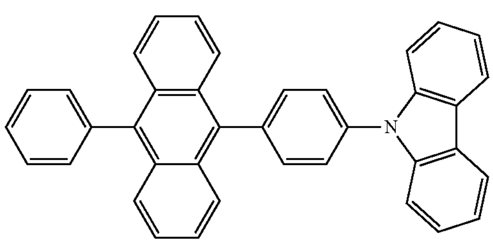
H20
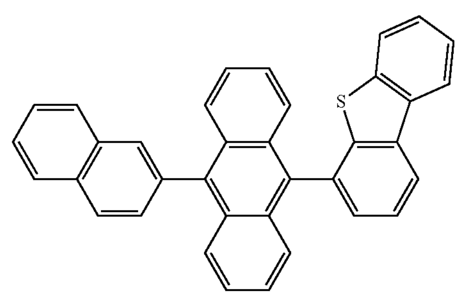
H21
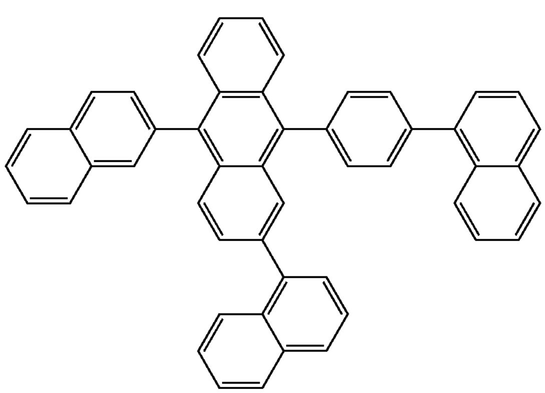
H22
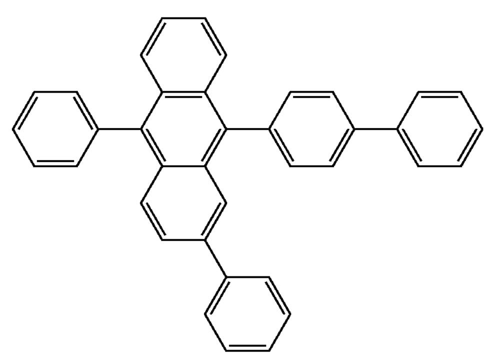

-continued
H23
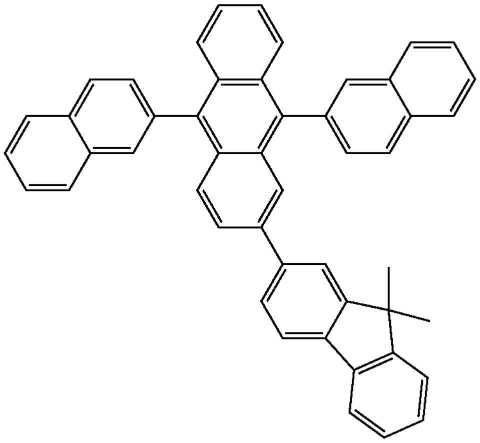
H24
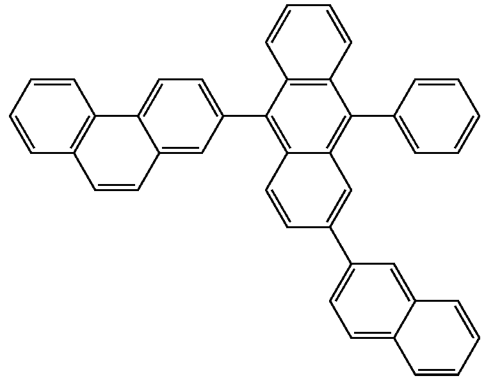
H25
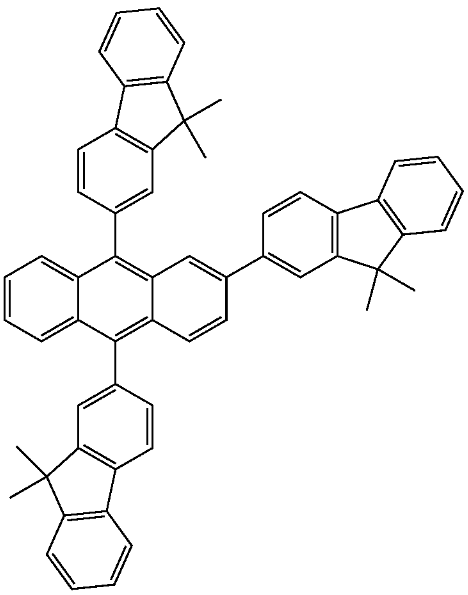
H26
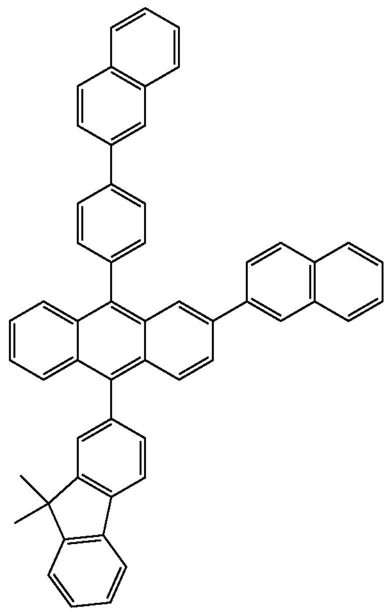
H27
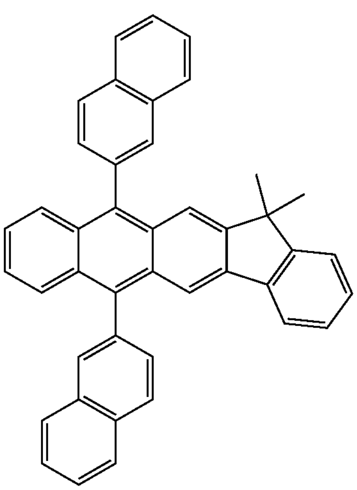
H28
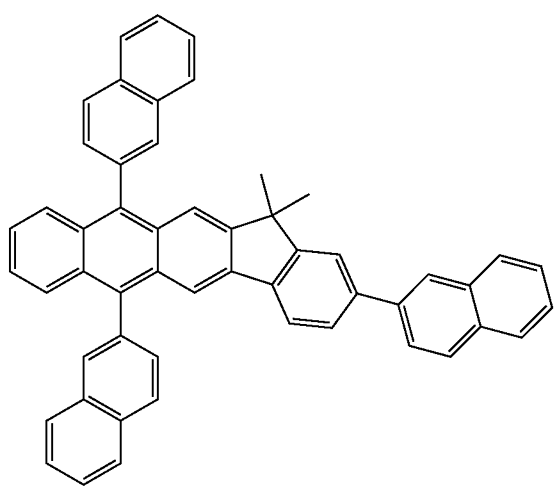

-continued
H29
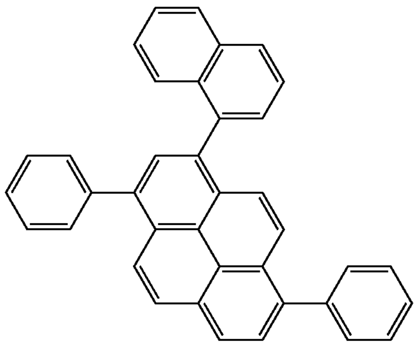
H30
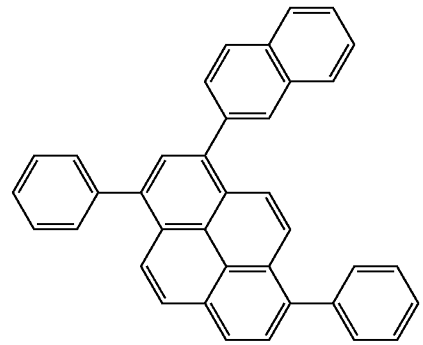
H31
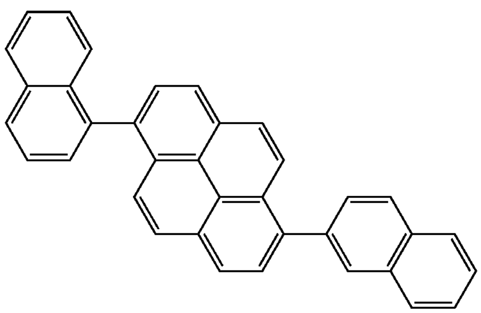
H32
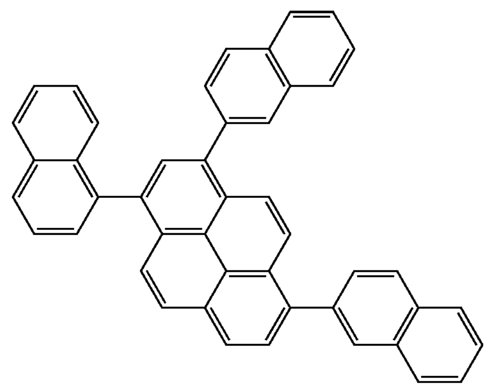
H33
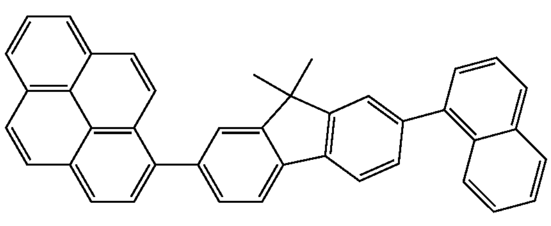
H34
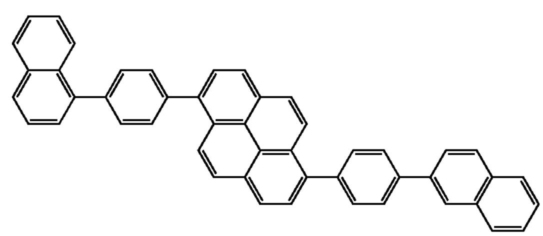
H35
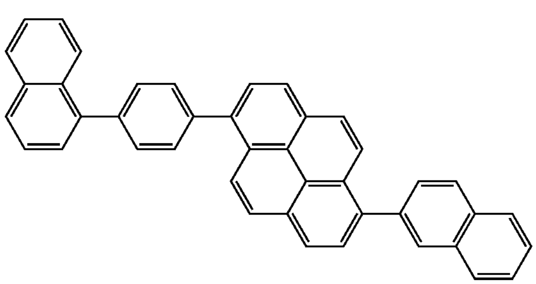
H36
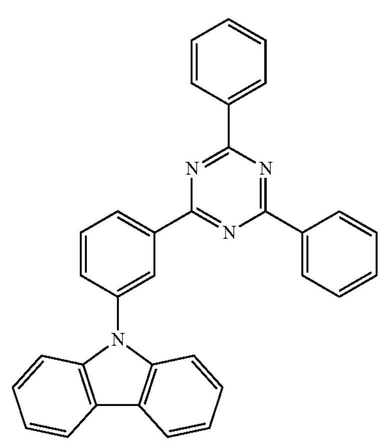

-continued
H37
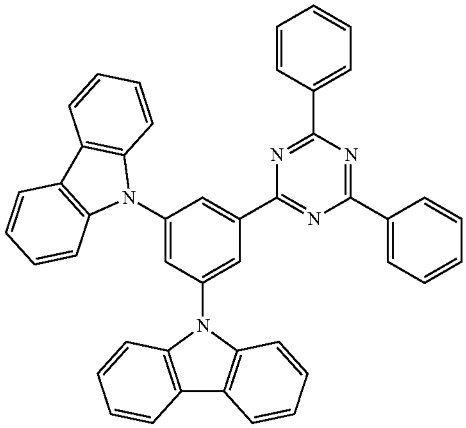
H38
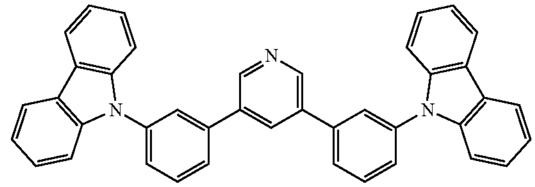
H39
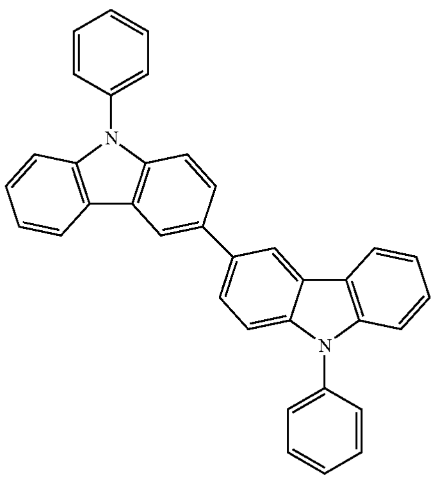
H40
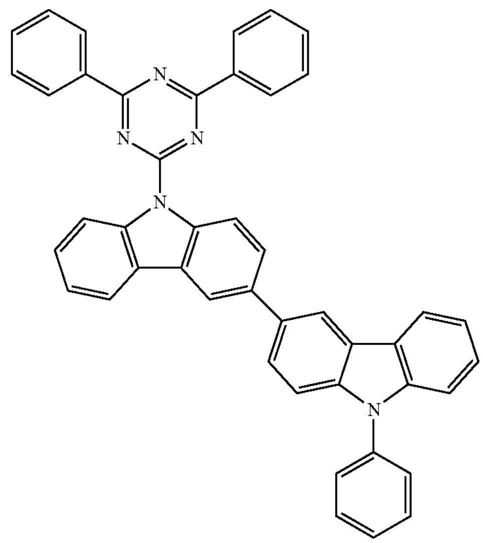
H41
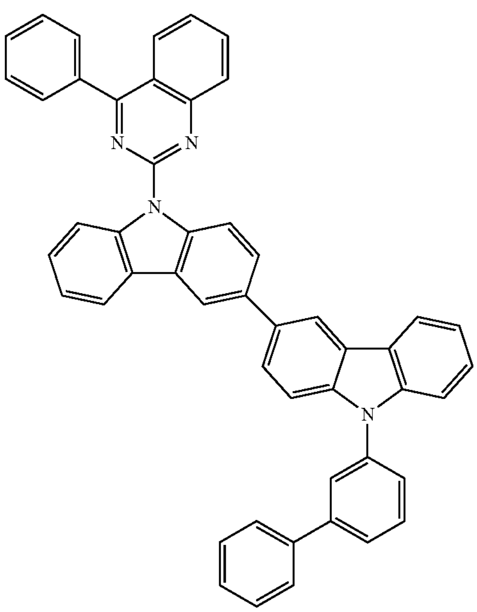
H42
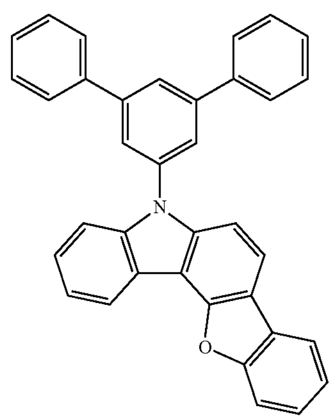

-continued
H43
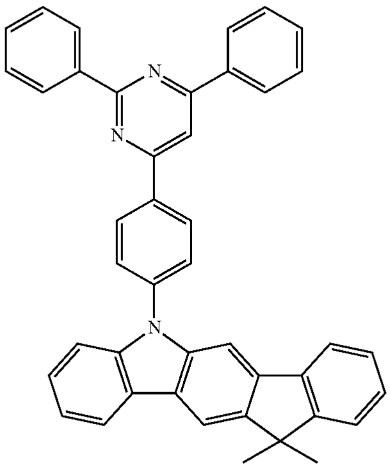
H44
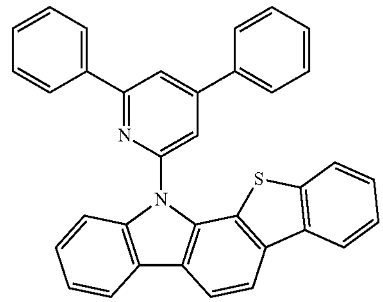
H45
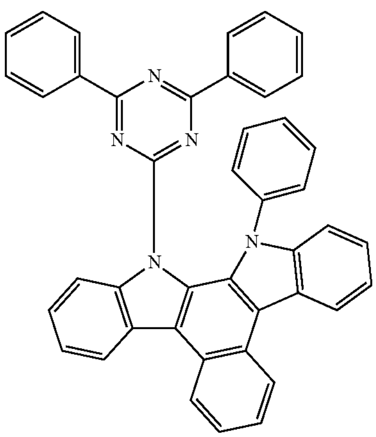
H46
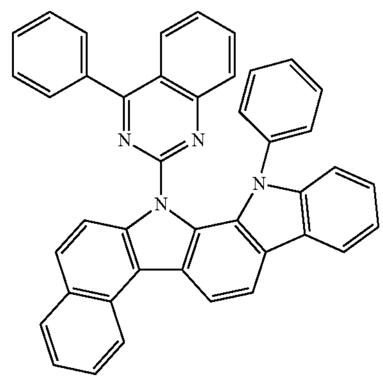
H47
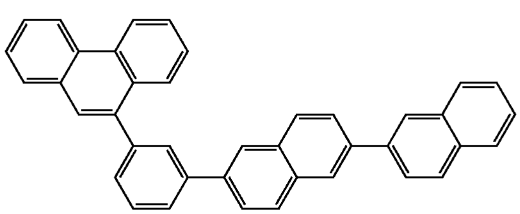
H48
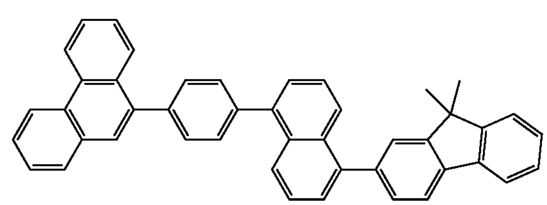
H49
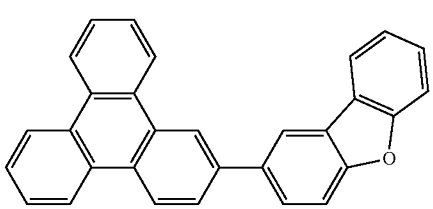
H50
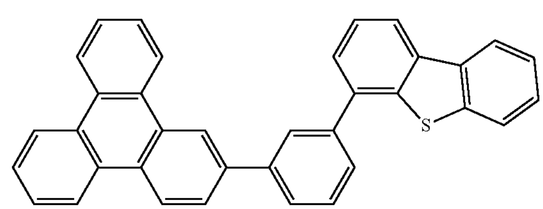

-continued
H51
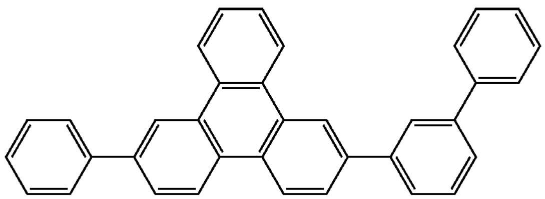
H52
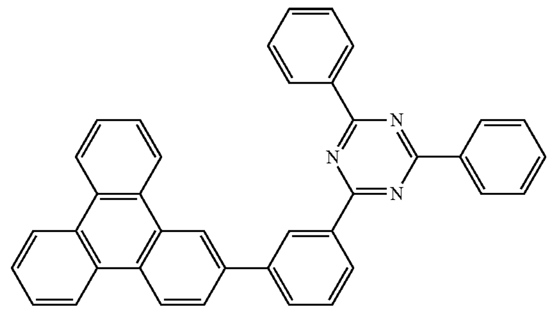
H53
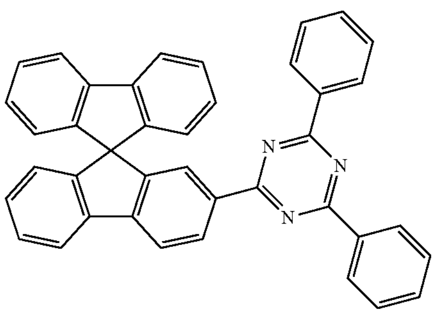
H54
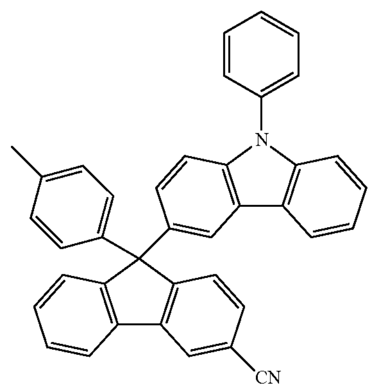
H55
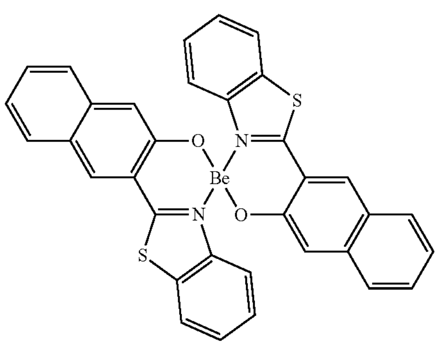
H56
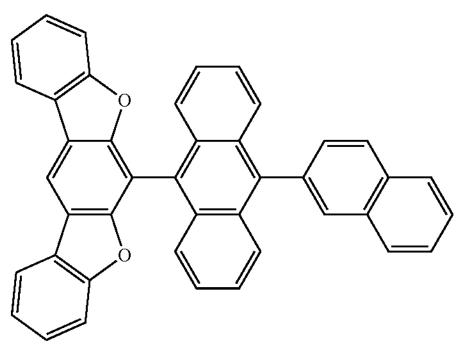
H57
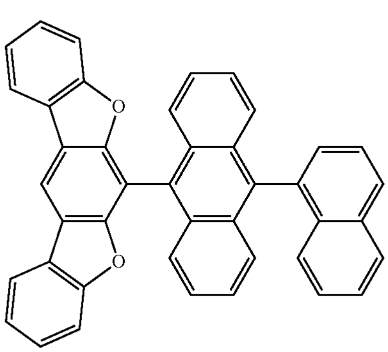
H58
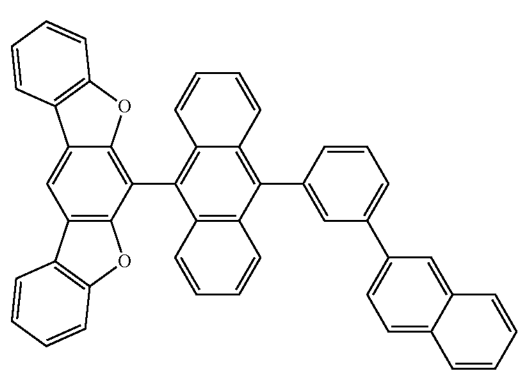

-continued
H59
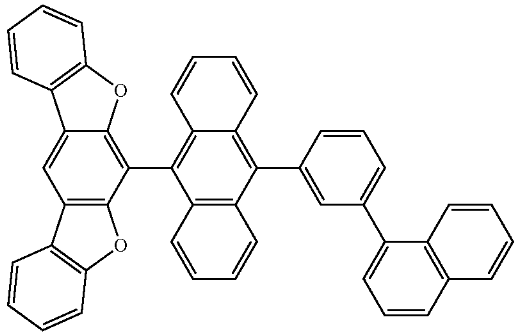
H60
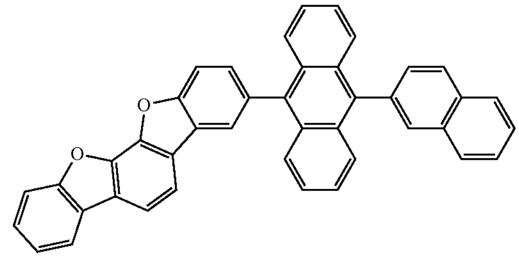
H61
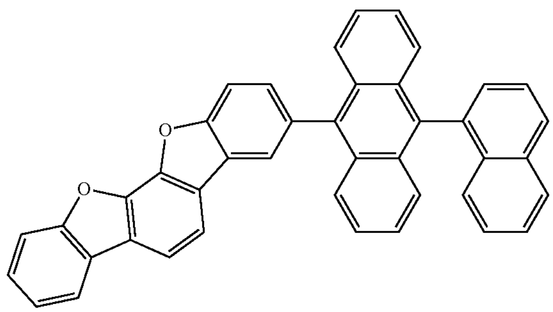
H62
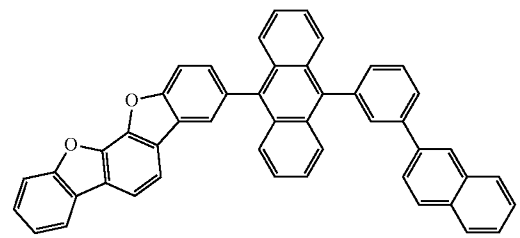
H63
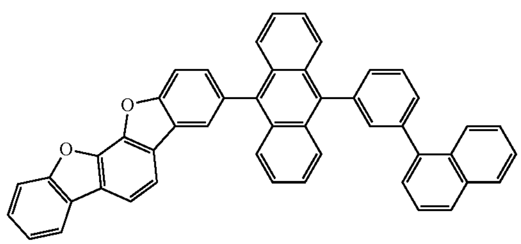
H64
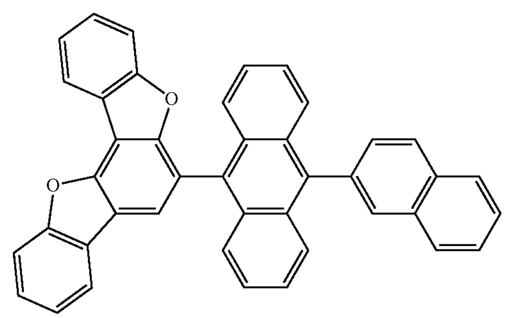
H65
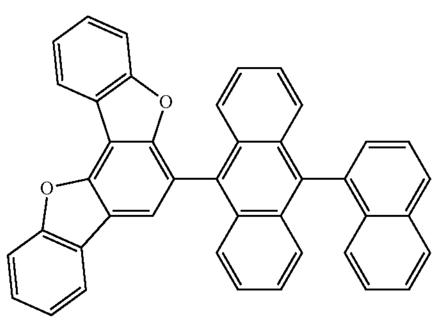
H66
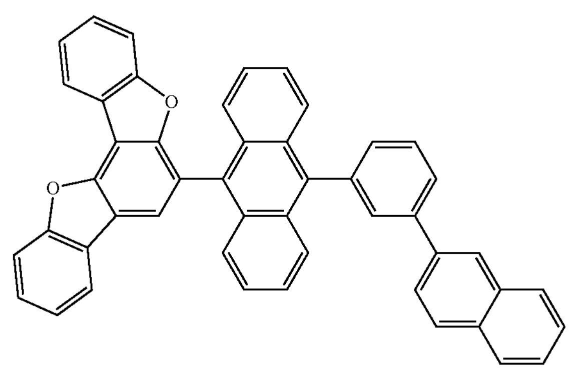

-continued
H67
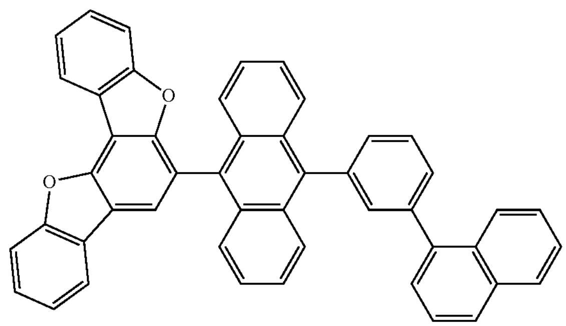
H68
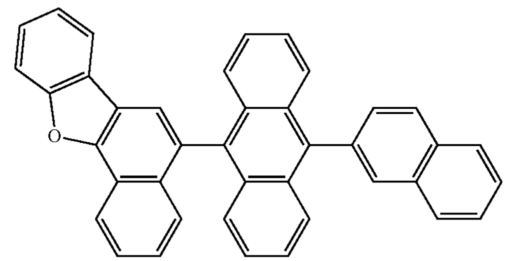
H69
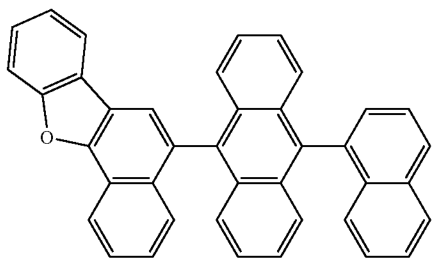
H70
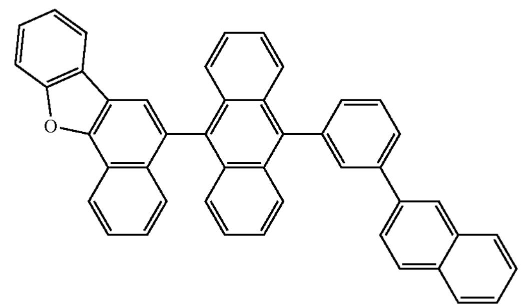
H71
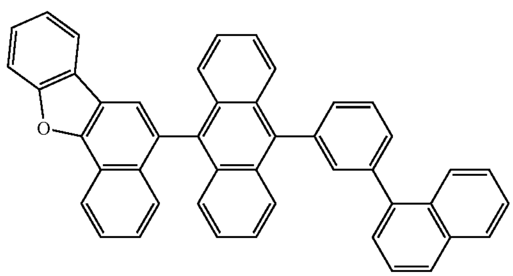
H72
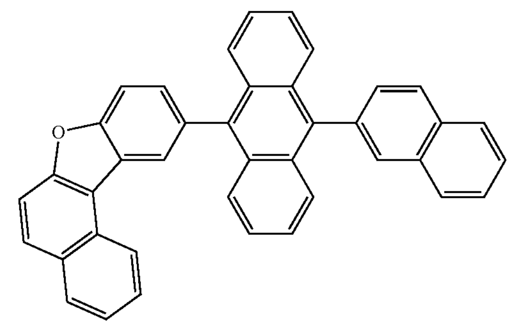
H73
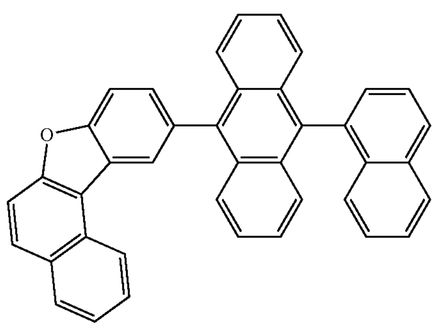
H74
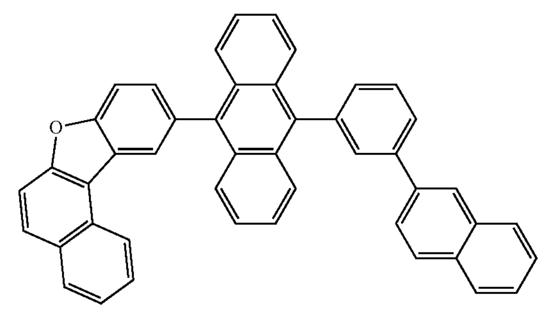
H75
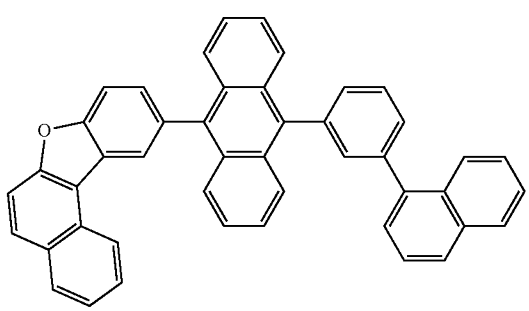
H76
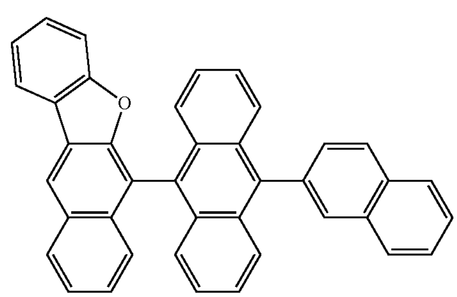

-continued
H77
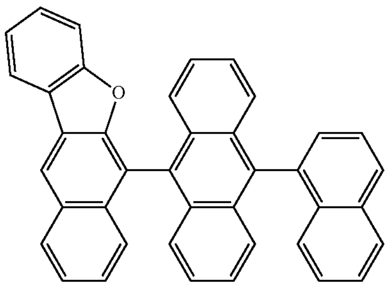
H78
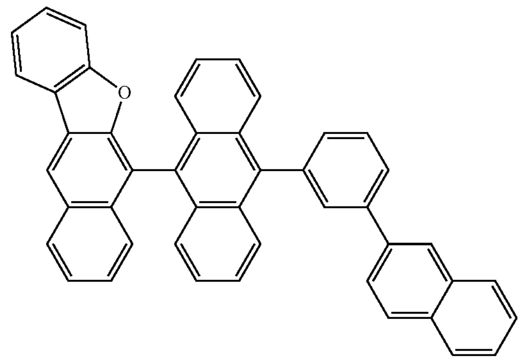
H79
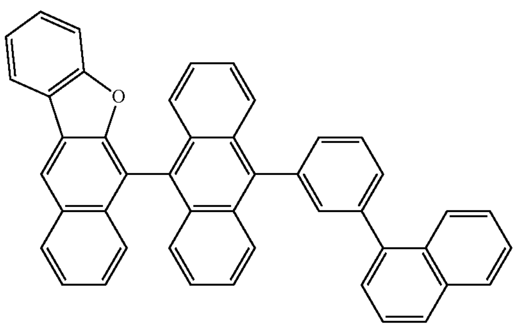
H80
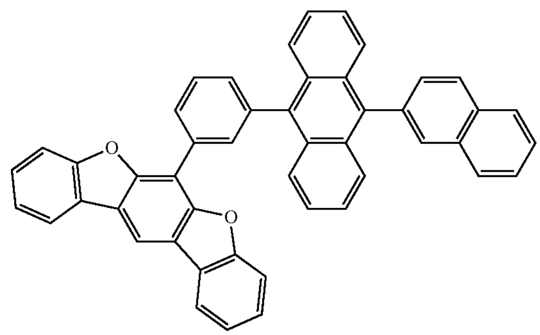
H81
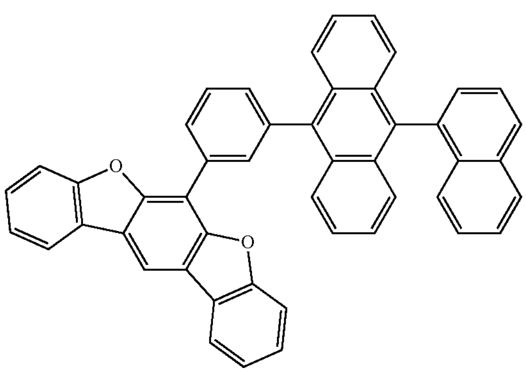
H82
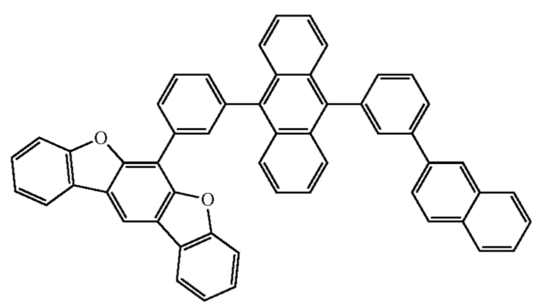
H83
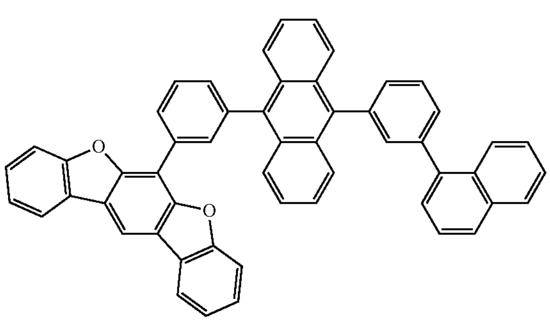
H84
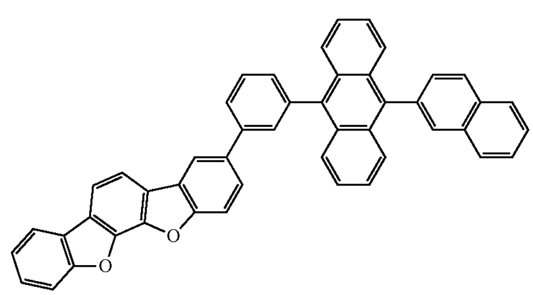

-continued
H85
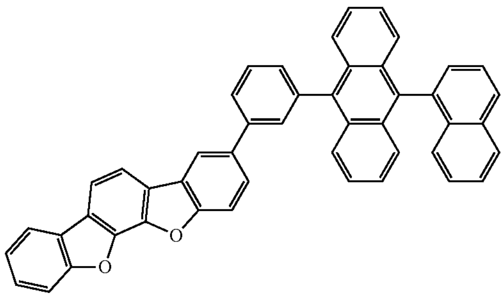
H86
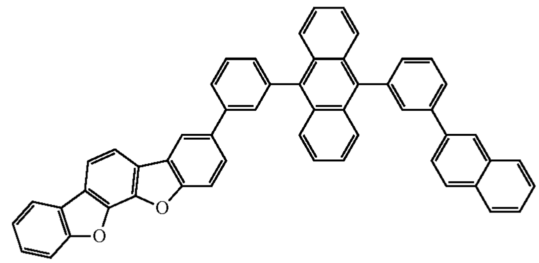
H87
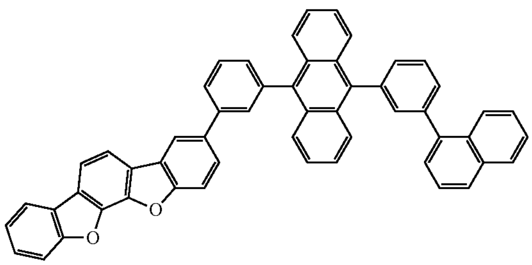
H88
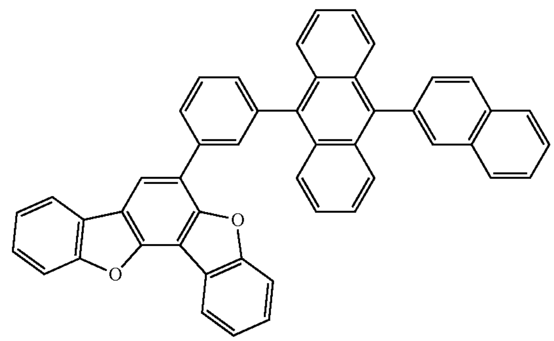
H89
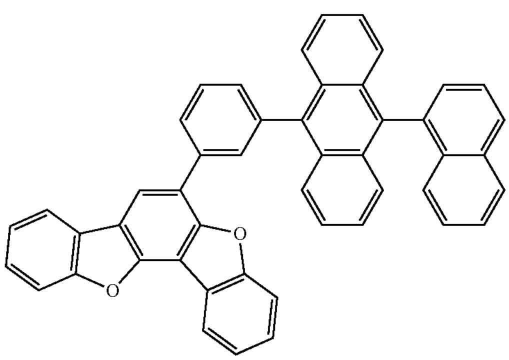
H90
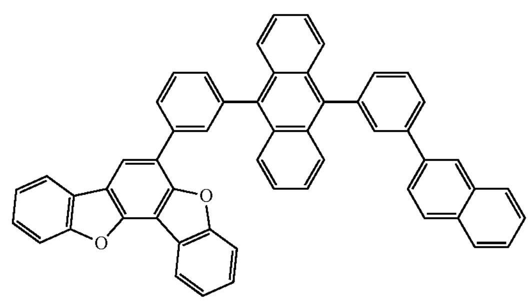
H91
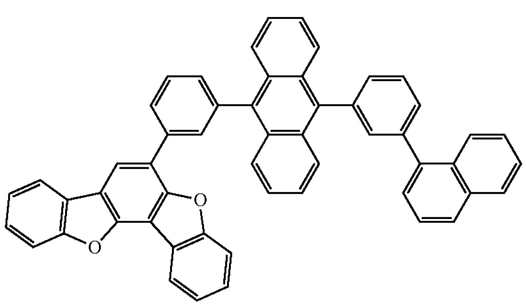
H92
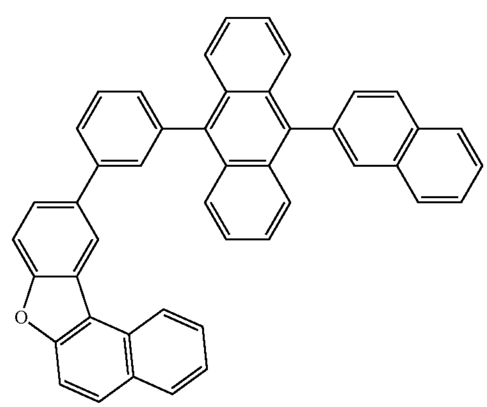

-continued
H93
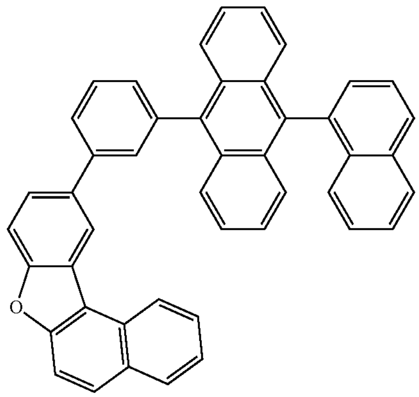
H94
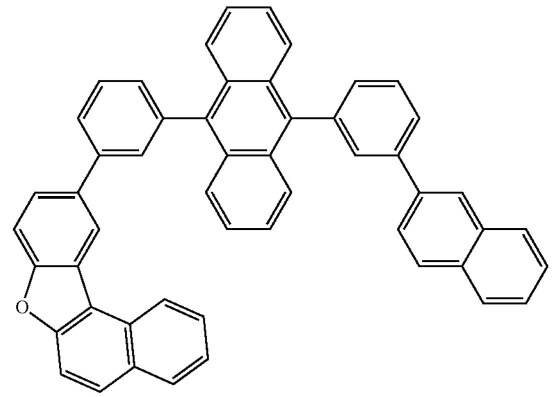
H95
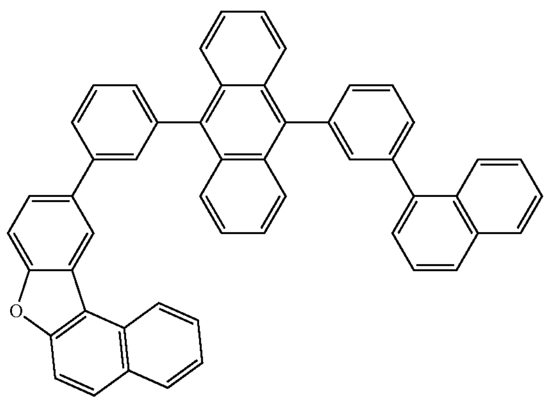
H96
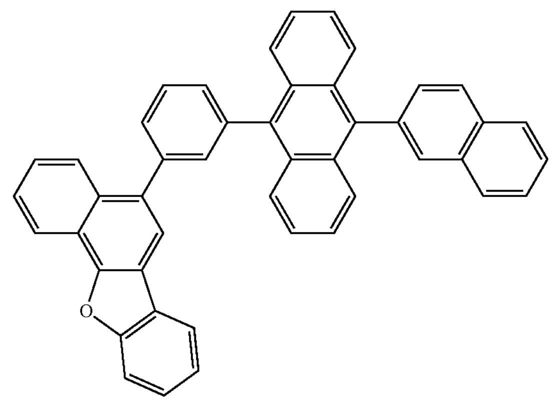
H97
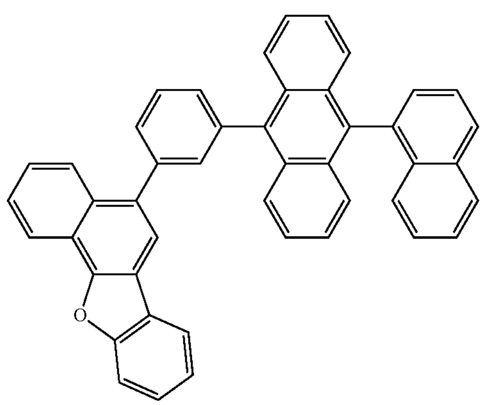
H98
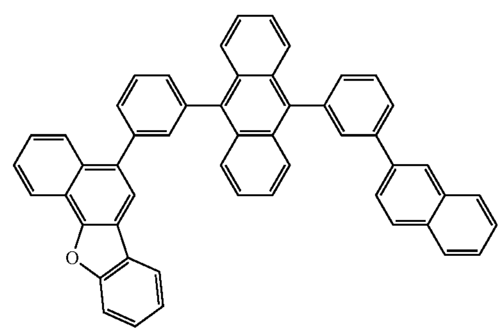
H99
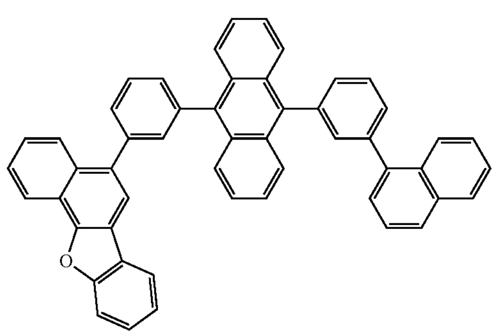
H100
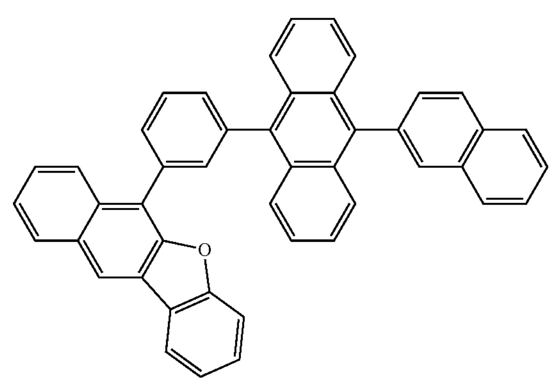

-continued
H101
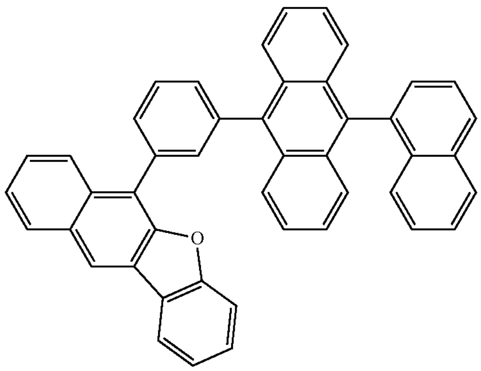
H102
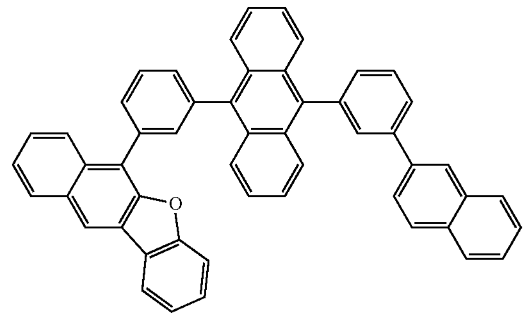
H103
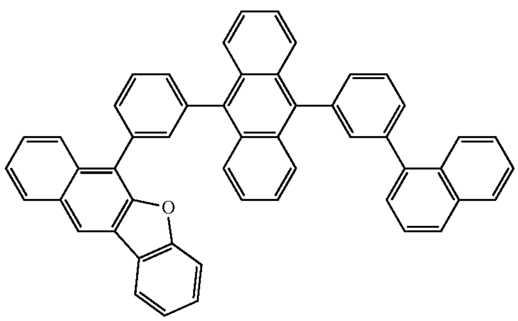
H104
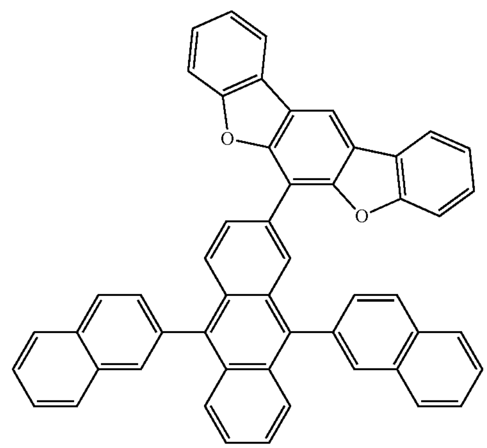
H105
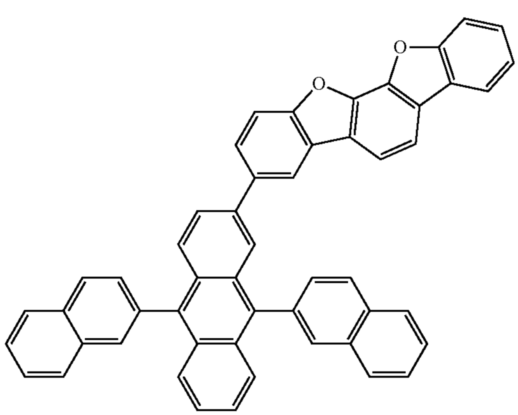
H106
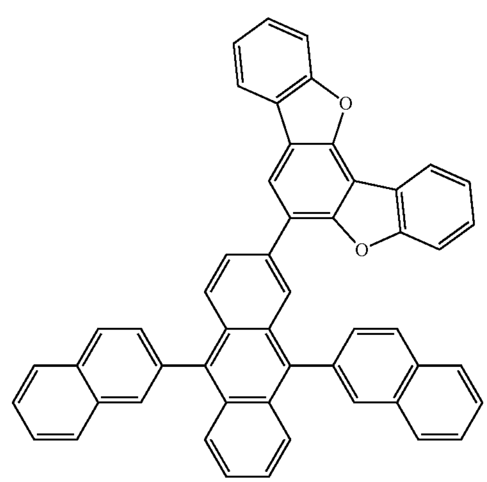

-continued
H107
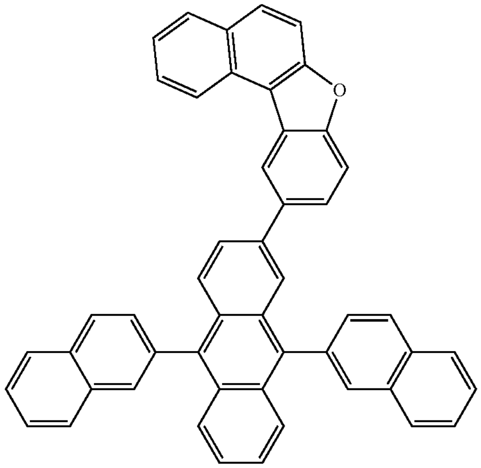
H108
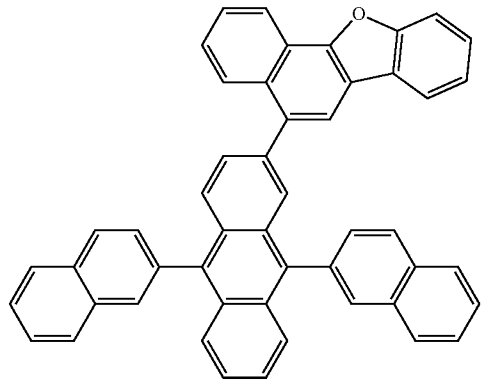
H109
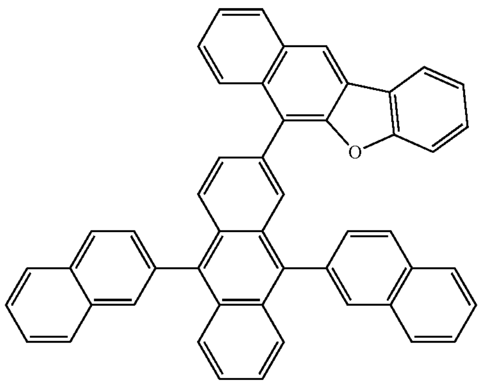
H110
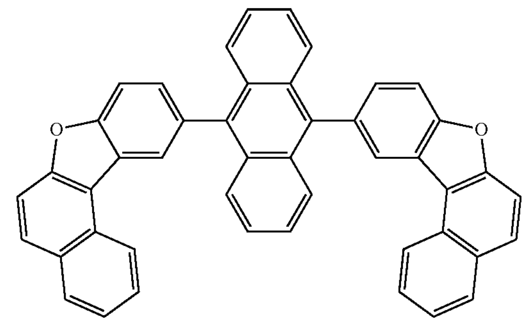
H111
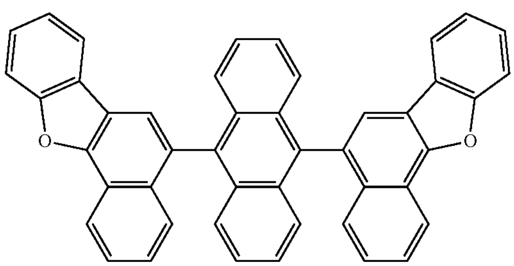
H112
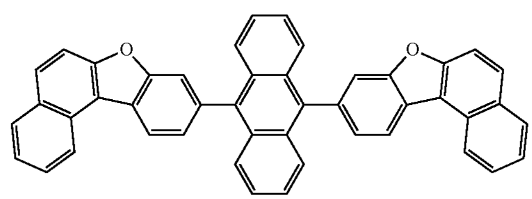
H113
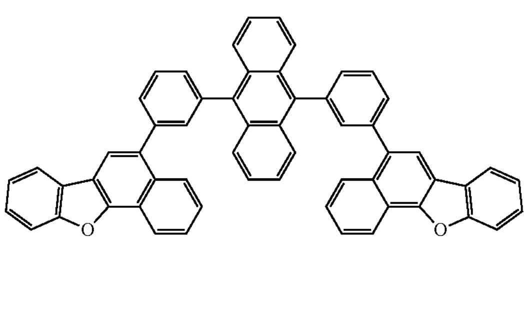

-continued
H114
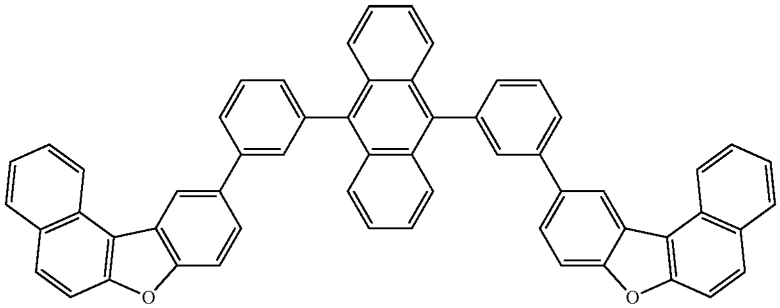
H115
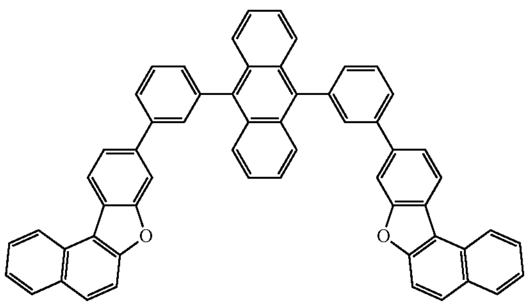
H116
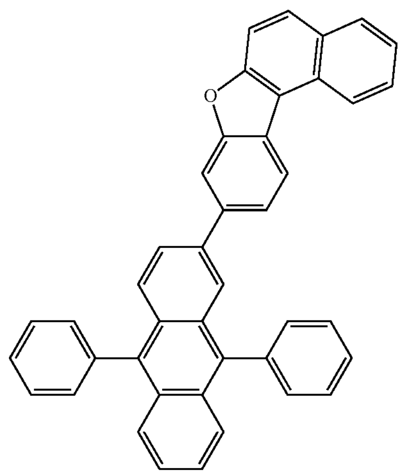
H117
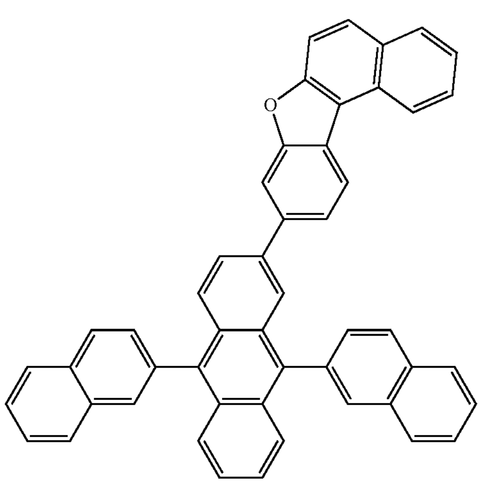
H118
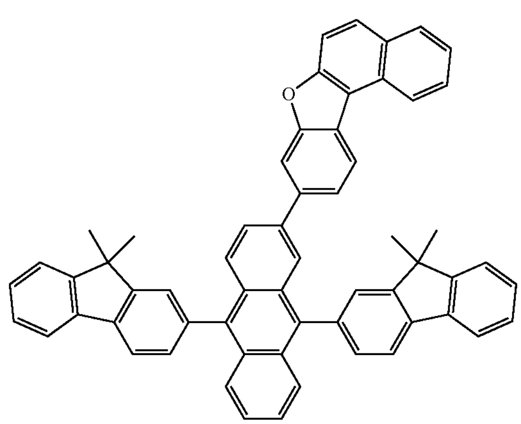

-continued
H119
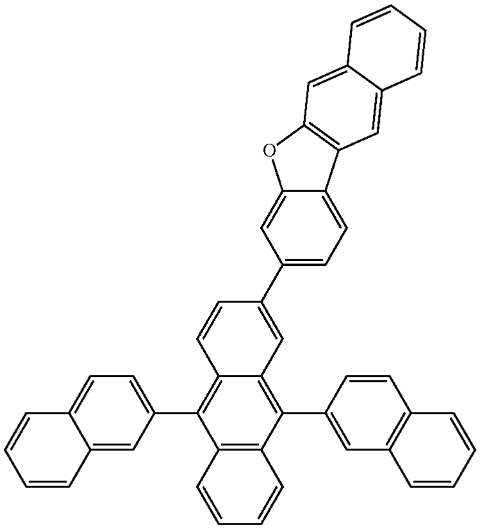
H120
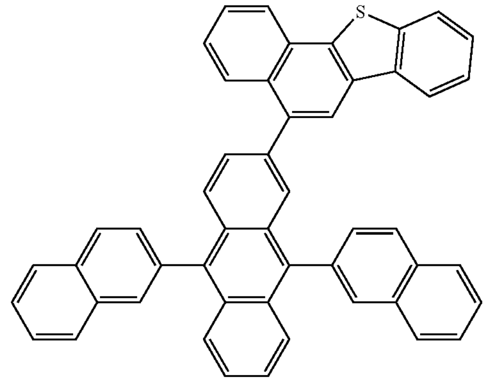
H121
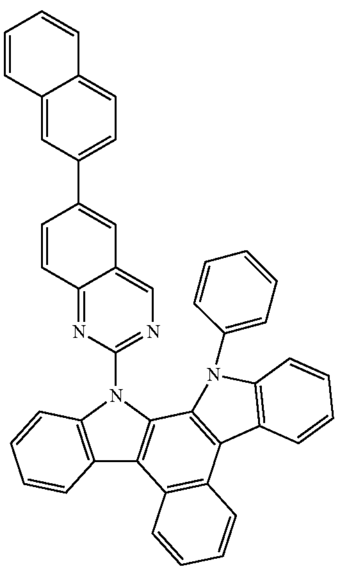
H122
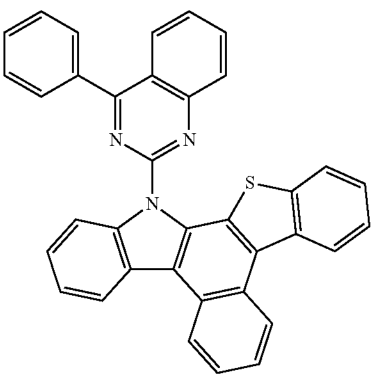
H123
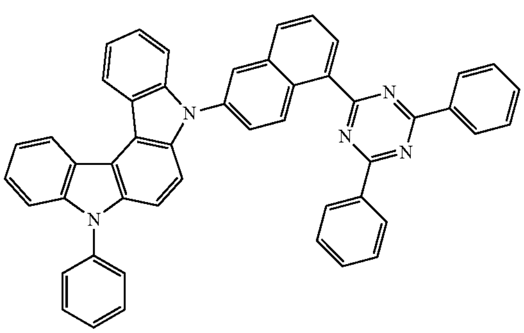
H124
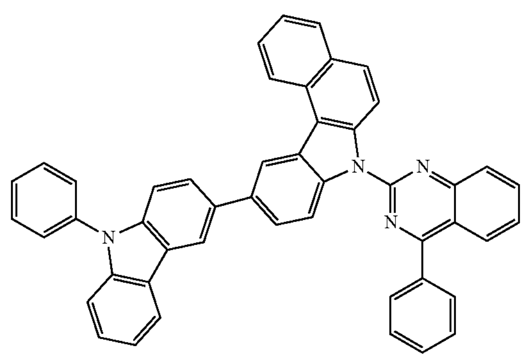

Phosphorescent Dopant

The phosphorescent dopant may include the organometallic compound represented by Formula 1 described herein.

Fluorescent Dopant

The fluorescent dopant may include an amine group-containing compound, a styryl group-containing compound, or any combination thereof.

In some embodiments, the fluorescent dopant may include a compound represented by Formula 501:

Formula 501

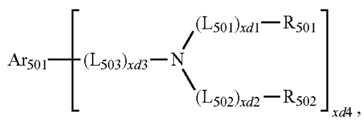

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, DPVBi, DPAVBi, or any combination thereof:

FD1

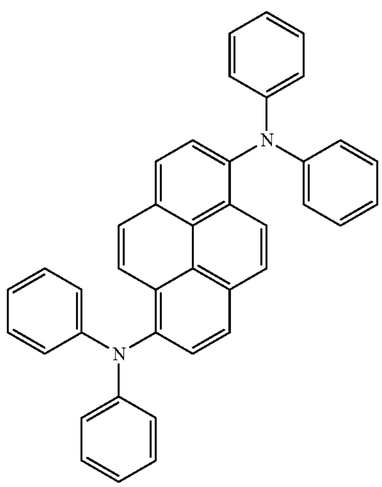

FD2

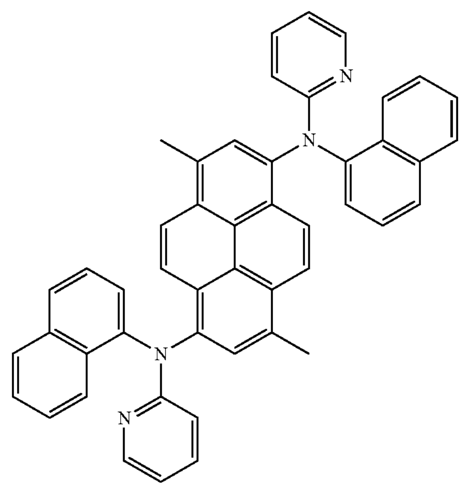

FD3

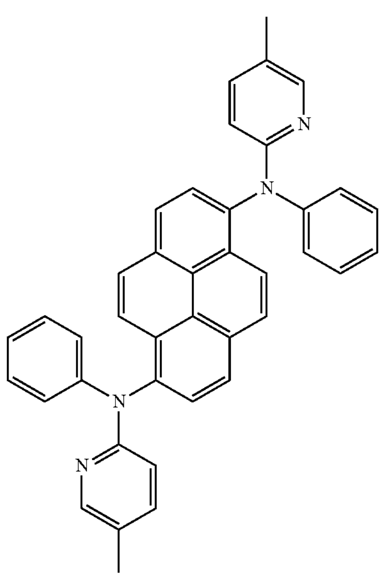

FD4

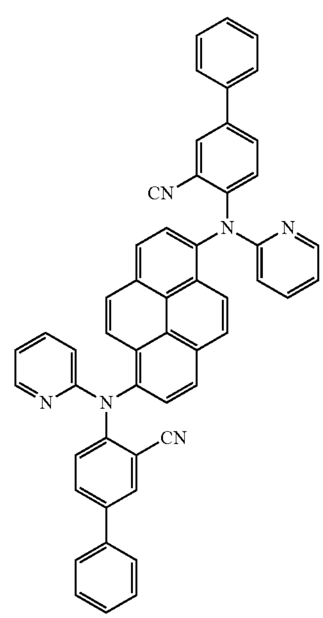

-continued
FD5
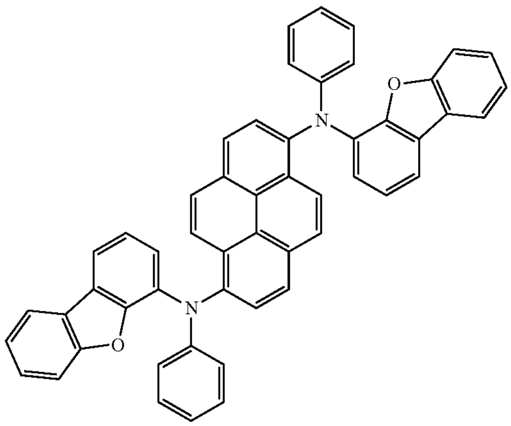
FD6
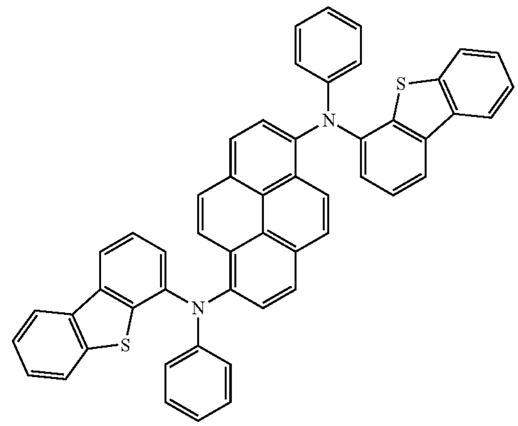
FD7
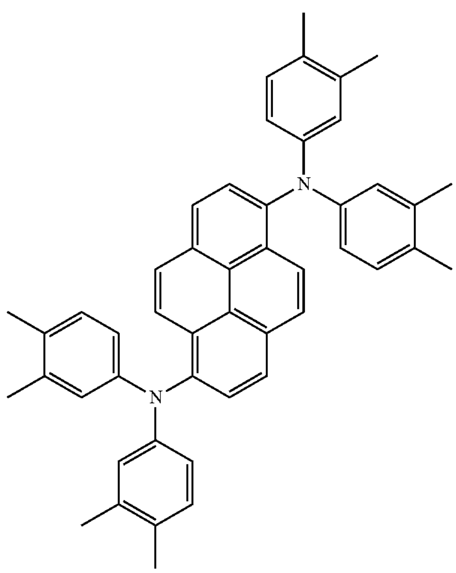
FD8
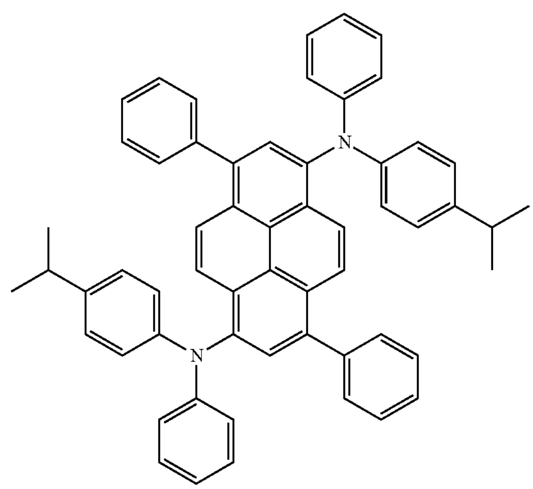
FD9
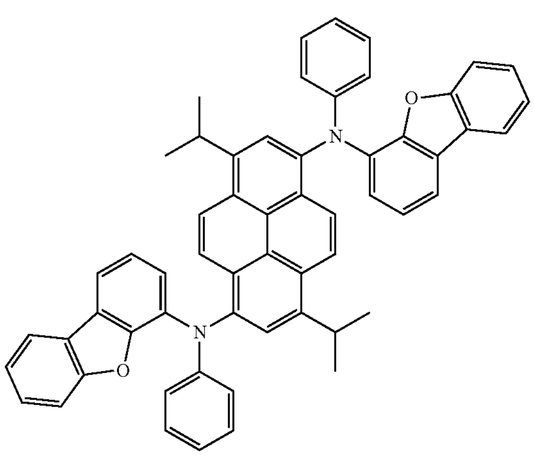
FD10
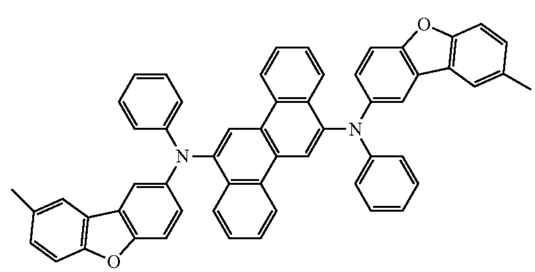

-continued
FD11
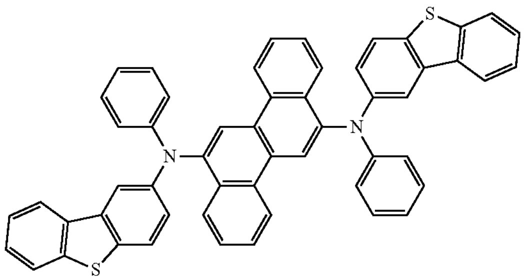
FD12
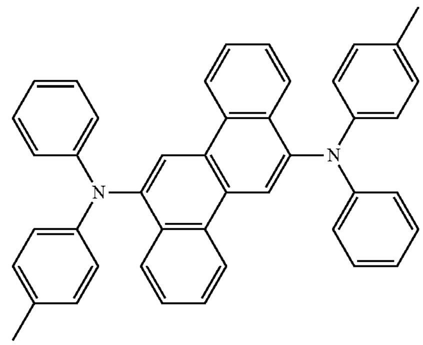
FD13
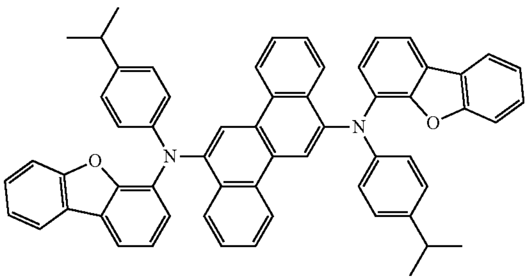
FD14
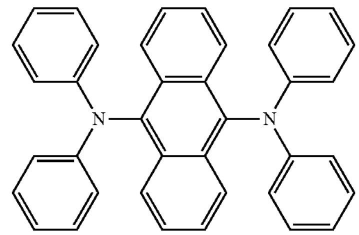
FD15
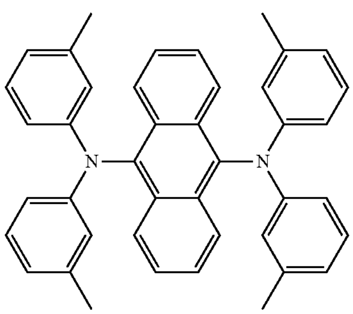
FD16
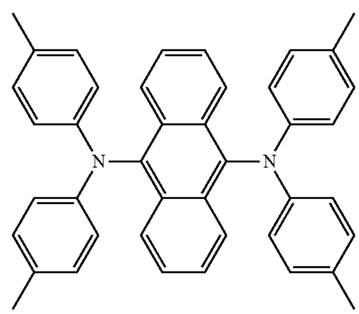
FD17
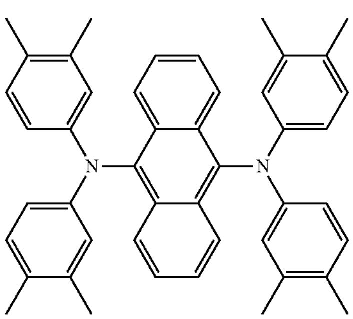
FD18
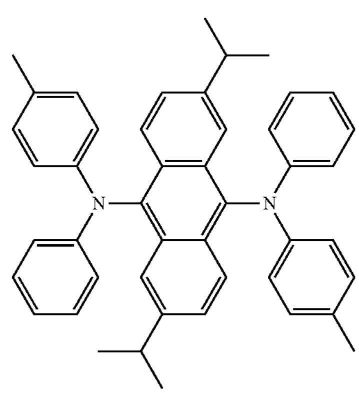

-continued
FD19
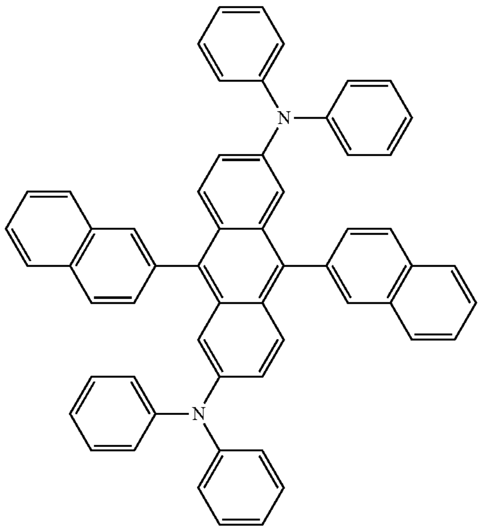
FD20
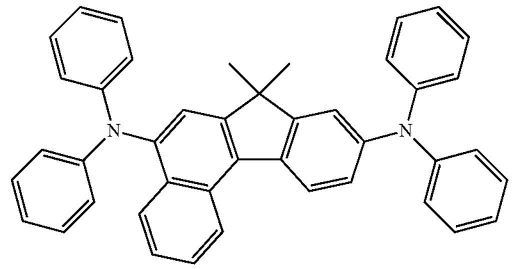
FD21
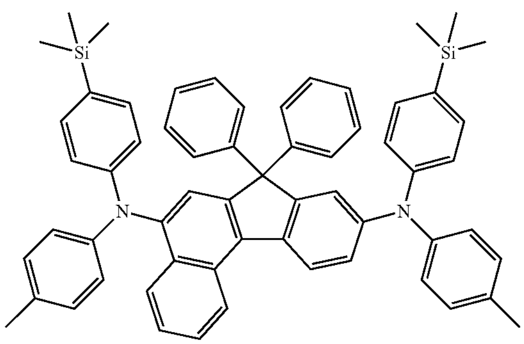
FD22
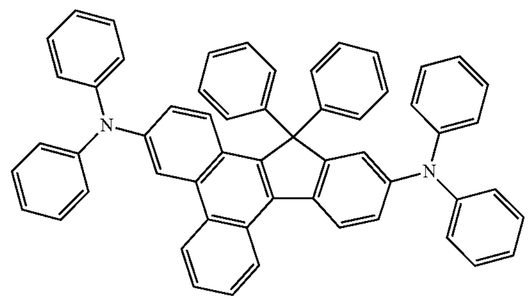
FD23
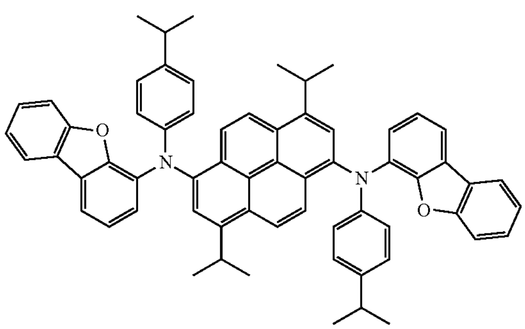
FD24
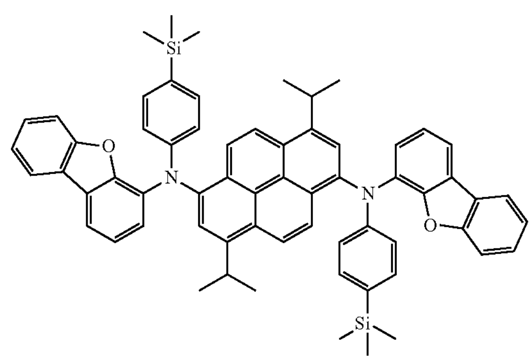
FD25
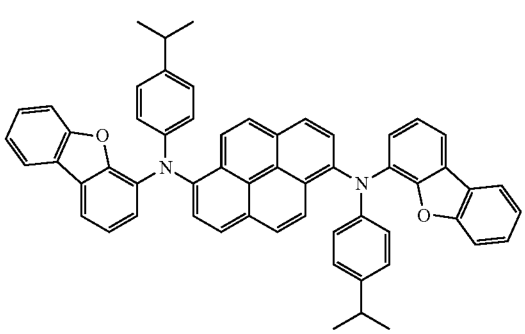
FD26
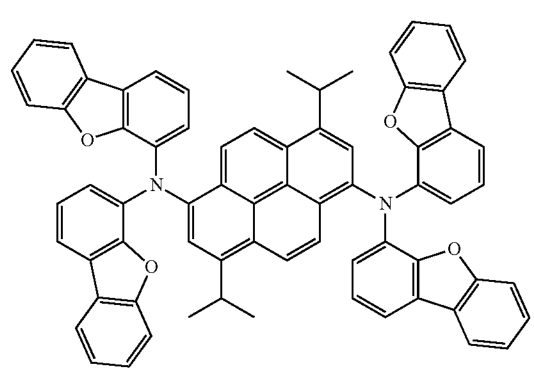

-continued
FD27
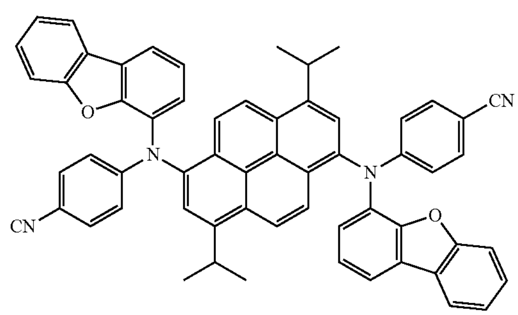
FD28
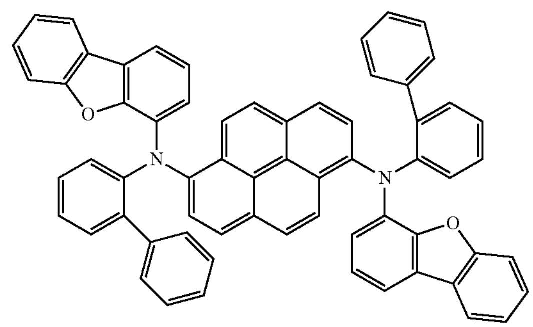
FD29
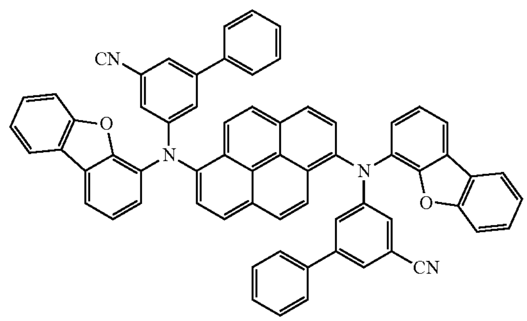
FD30
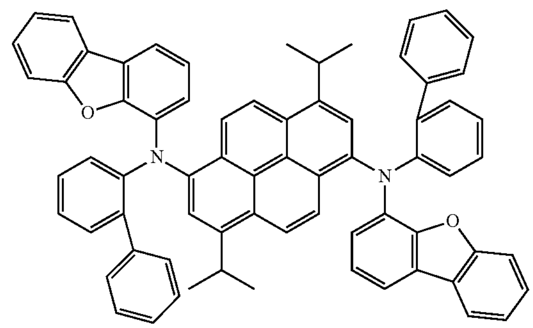
FD31
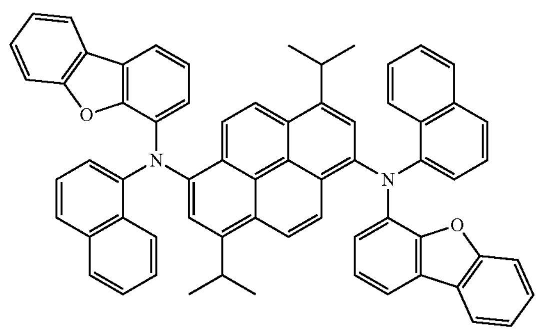
FD32
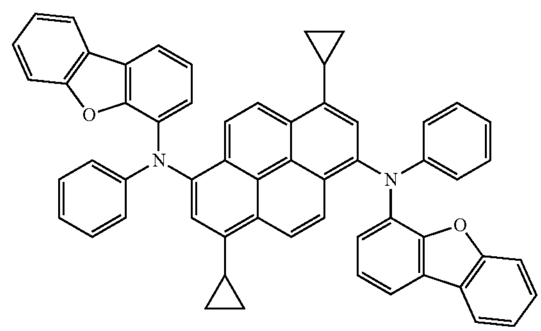
FD33
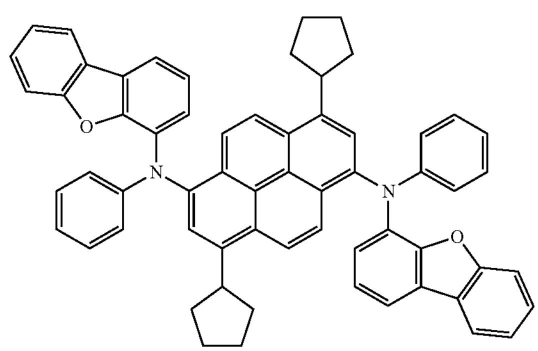
FD34
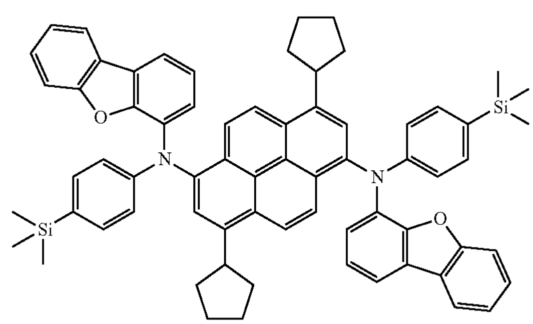

-continued

FD35

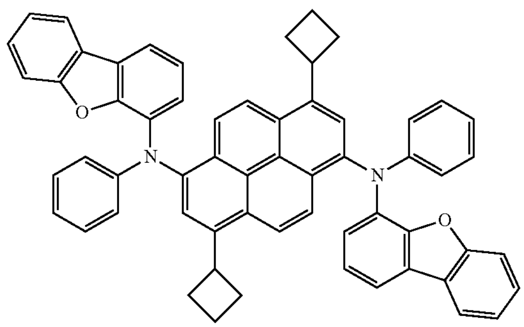

FD36

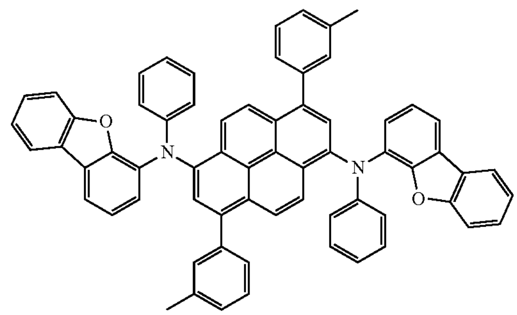

DPVBi

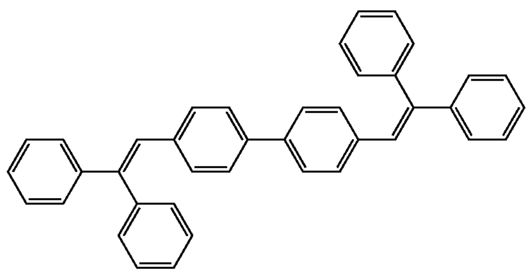

DPAVBi

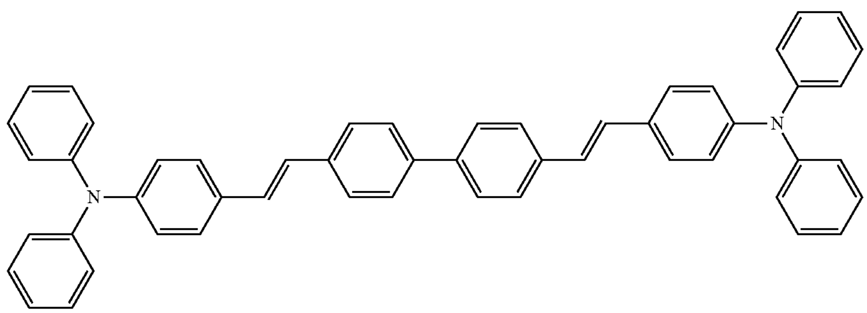

.

Delayed Fluorescence Material

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types (or kinds) of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or less. When the difference between a triplet energy level (eV) of the delayed fluorescence material and a singlet energy level (eV) of the delayed fluorescence material is within this range, up-conversion from a triplet state to a singlet state in the delayed fluorescence material may effectively (or suitably) occur, thus improving luminescence efficiency and/or the like of the light-emitting device 10.

In some embodiments, the delayed fluorescence material may include: i) a material including at least one electron donor (e.g., a π electron-rich $C_3$-$C_{60}$ cyclic group such as a carbazole group and/or the like) and at least one electron acceptor (e.g., a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other and sharing boron (B), and/or the like.

Examples of the delayed fluorescence material may include Compounds DF1 to DF9:

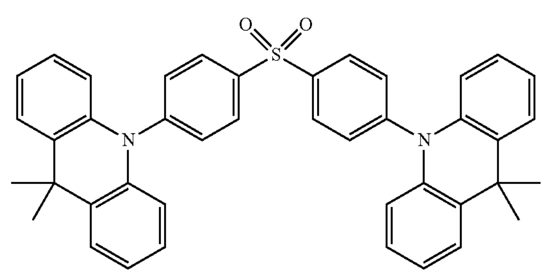

DF1(DMAC-DPS)

-continued
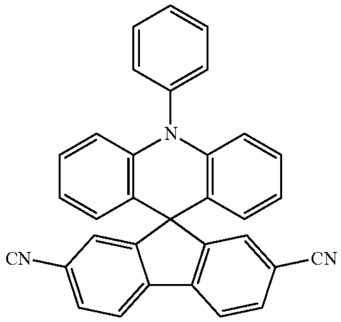
DF2(ACRFLCN)
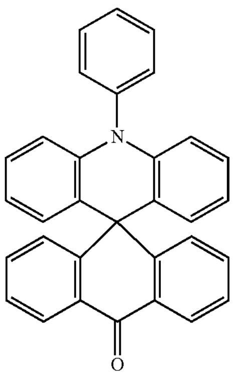
DF3(ACRSA)
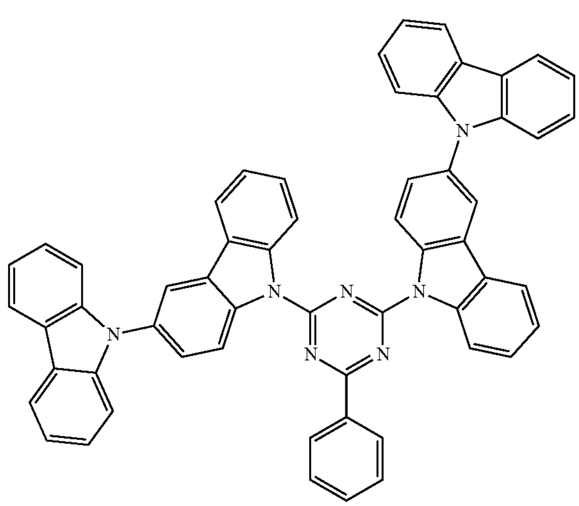
DF4(CC2TA)
-continued
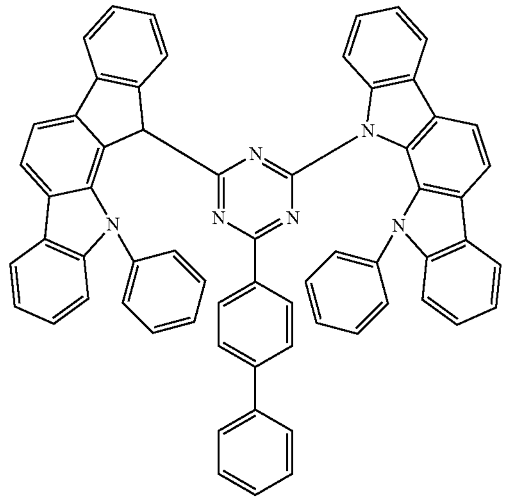
DF5(PIC-TRZ)
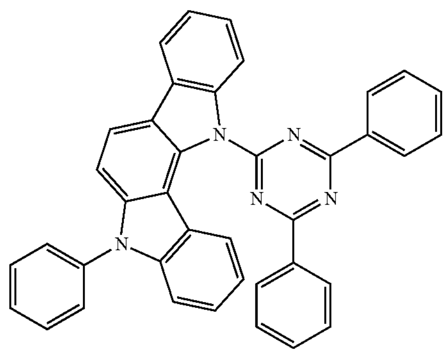
DF6(PIC-TRZ2)
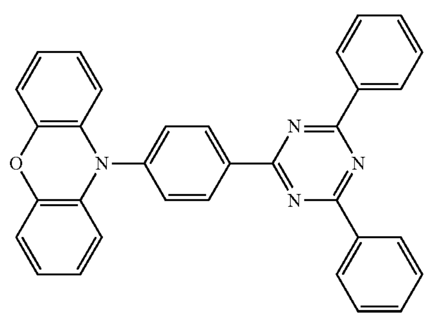
DF7(PXZ-TRZ)
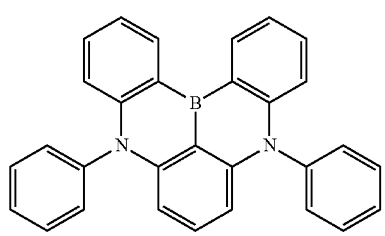
DF8(DABNA-1)

-continued

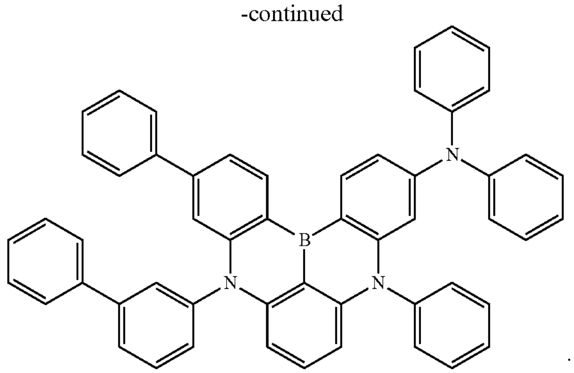

DF9(DABNA-2)

Quantum Dot

The emission layer may include quantum dots.

The term "quantum dot" as used herein refers to a crystal of a semiconductor compound and may include any suitable material capable of emitting emission wavelengths of various lengths according to the size of the crystal.

The diameter of the quantum dot may be, for example, in a range of about 1 nm to about 10 nm.

Quantum dots may be synthesized by a wet chemical process, an organic metal chemical vapor deposition process, a molecular beam epitaxy process, or any similar suitable process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of quantum dot particles may be controlled with a lower manufacturing cost.

The quantum dot may include a group II-VI semiconductor compound; a group III-V semiconductor compound; a group III-VI semiconductor compound; a group I-III-VI semiconductor compound; a group IV-VI semiconductor compound; a group IV element, a group IV compound; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, and/or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound such as CdZnSeS, CdZnSeTe, CdZnSTe, CdHgSeS, CdHgSeTe, CdHgSTe, HgZnSeS, HgZnSeTe, and/or HgZnSTe; and any combination thereof.

Examples of the group III-V semiconductor compound may include a binary compound such as GaN, GaP, GaAs, GaSb, AlN, AlP, AlAs, AlSb, InN, InP, InAs, and/or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; and any combination thereof. In some embodiments, the group III-V semiconductor compound may further include a group II element. Examples of the group III-V semiconductor compound further including the group II element may include InZnP, InGaZnP, InAlZnP, and the like.

Examples of the group III-VI semiconductor compound may include a binary compound such as GaS, GaSe, $Ga_2Se_3$, GaTe, InS, $In_2S_3$, InSe, $In_2Se_3$, InTe, and/or the like; a ternary compound such as $InGaS_3$, $InGaSe_3$, and/or the like; and any combination thereof.

Examples of the group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the group IV-VI semiconductor compound may include a binary compound such as SnS, SnSe, SnTe, PbS, PbSe, and/or PbTe; a ternary compound such as SnSeS, SnSeTe, SnSTe, PbSeS, PbSeTe, PbSTe, SnPbS, SnPbSe, and/or SnPbTe; a quaternary compound such as SnPbSSe, SnPbSeTe, and/or SnPbSTe; and any combination thereof.

The group IV element and the group IV compound may be a single element compound such as Si and/or Ge; a binary compound such as SiC and/or SiGe; or any combination thereof.

Individual elements included in the multi-element compound, such as a binary compound, a ternary compound, and/or a quaternary compound, may be present in a particle thereof at a uniform or non-uniform concentration.

The quantum dot may have a single structure in which the concentration of each element included in the quantum dot is uniform (or substantially uniform), or a core-shell double structure. In some embodiments, materials included in the core may be different from materials included in the shell.

The shell of the quantum dot may serve as a protective layer for preventing or reducing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell decreases toward the core.

Examples of the shell of the quantum dot include a metal oxide, a nonmetal oxide, a semiconductor compound, and a combination thereof. Examples of the metal oxide and the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound such as $MgAl_2O_4$, $CoFe_2O_4$, $NiFe_2O_4$, and/or $CoMn_2O_4$; and any combination thereof. Examples of the semiconductor compound may include a group III-VI semiconductor compound; a group II-VI semiconductor compound; a group III-V semiconductor compound; a group I-III-VI semiconductor compound; a group IV-VI semiconductor compound; and any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within any of these ranges, color purity or color reproducibility may be improved. In addition, because light emitted through the quantum dot is emitted in all directions, an optical viewing angle may be improved.

In one or more embodiments, the quantum dot may be, for example, a spherical, pyramidal, multi-arm, and/or cubic nanoparticle, nanotube, nanowire, nanofiber, and/or nanoplate particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In some embodiments, the size of the quantum dot may be selected such that the quantum dot may emit red, green, and/or blue light. In addition, the size of the quantum dot may be selected such that the quantum dot may emit white light by combining light of various colors.

Electron Transport Region in Interlayer 130

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, and/or an electron injection layer.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure are sequentially stacked on the emission layer in each stated order.

The electron transport region (e.g., a buffer layer, a hole blocking layer, an electron control layer, and/or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21},$$ Formula 601 wherein, in Formula 601, $Ar_{601}$ and $L_{601}$ may each independently be a $C_3$-$C_{60}$ carbocyclic group unsubstituted or substituted with at least one $R_{10a}$ and/or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), and/or —P(=O)($Q_{601}$)($Q_{602}$), $Q_{601}$ to $Q_{603}$ may each be understood by referring to the description of $Q_1$ provided herein, xe21 may be 1, 2, 3, 4, or 5, and at least one of $Ar_{601}$, $L_{601}$, or $R_{601}$ may each independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport region may include a compound represented by Formula 601-1:

Formula 601-1

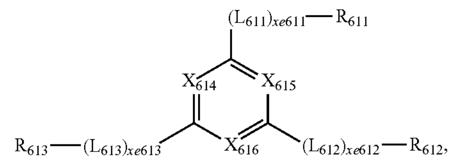

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, and/or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

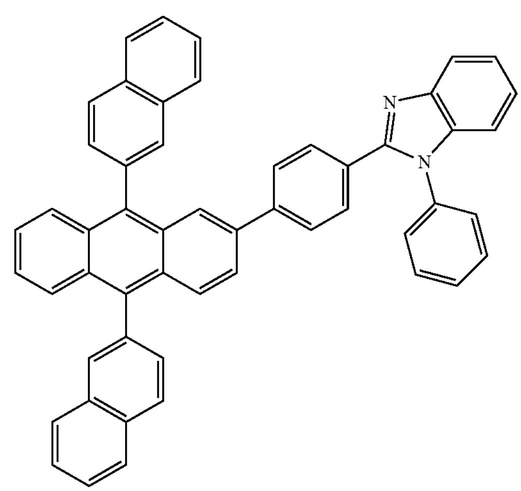

-continued
ET2
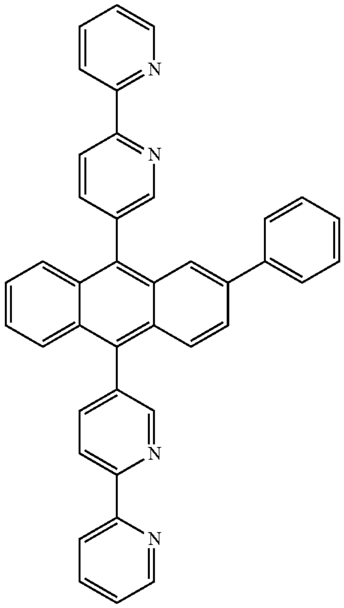
ET3
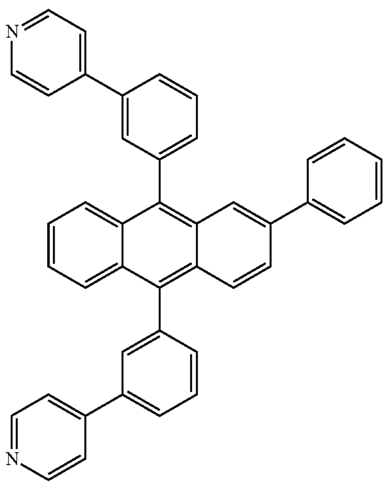
ET4
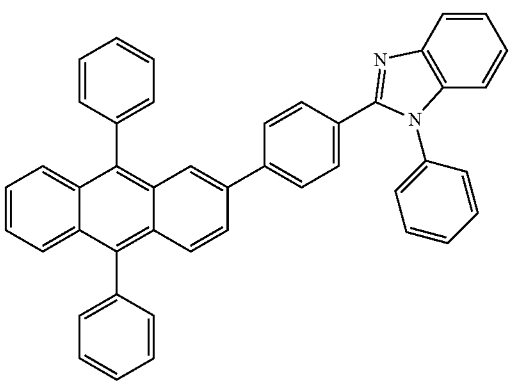
-continued
ET5
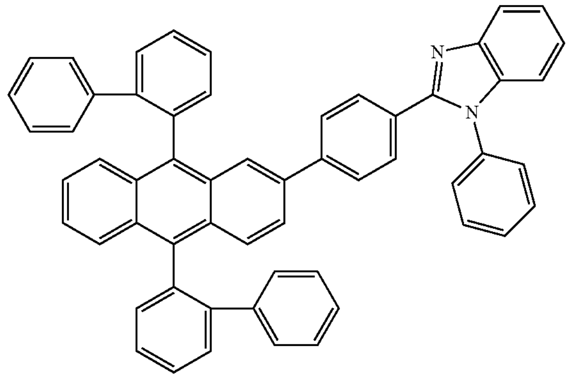
ET6
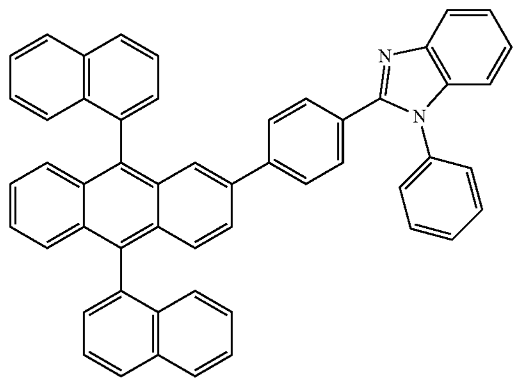
ET7
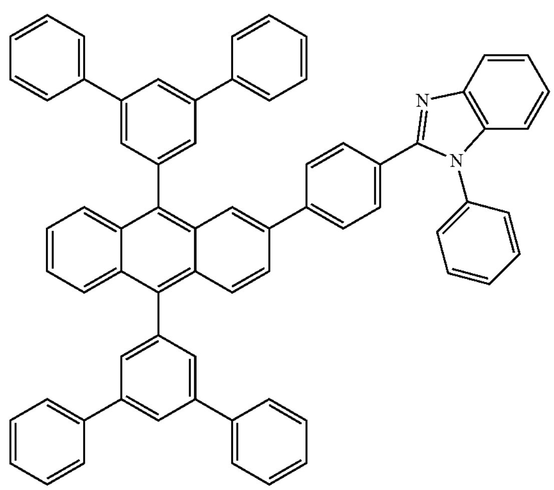

ET8
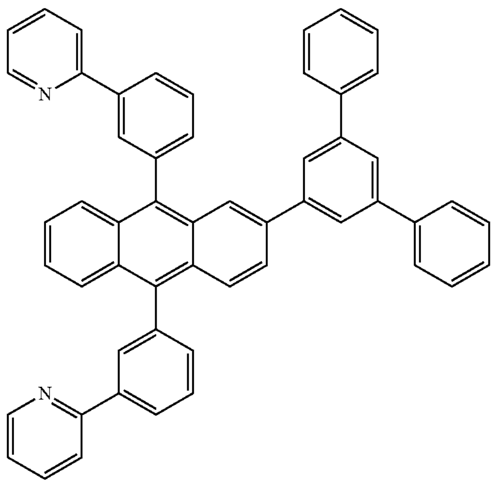
ET9
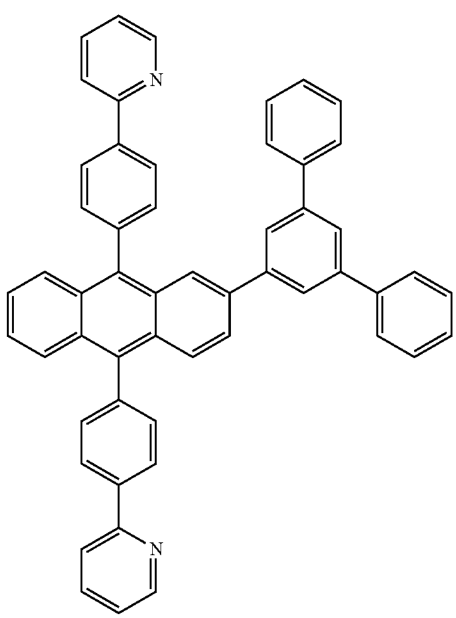
ET10
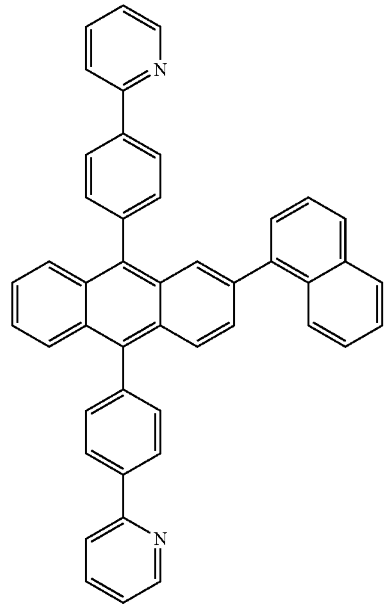
ET11
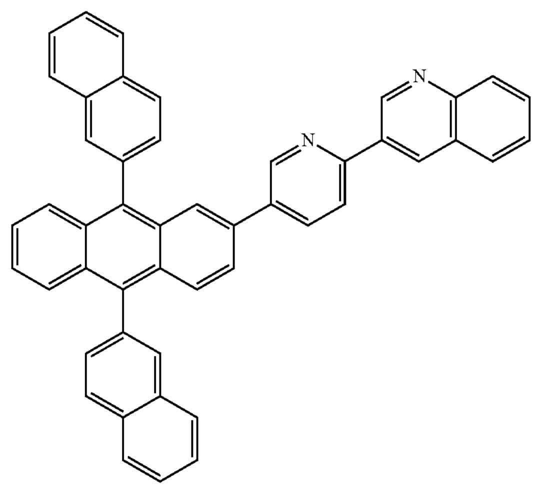
ET12
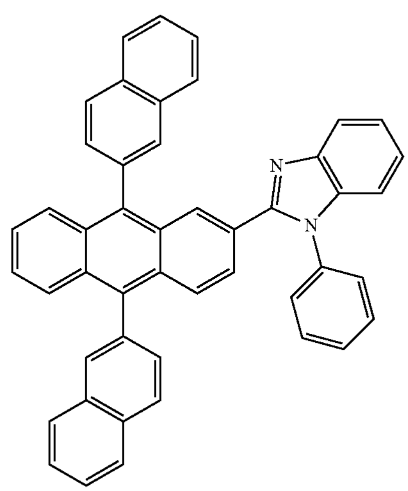

-continued
ET13
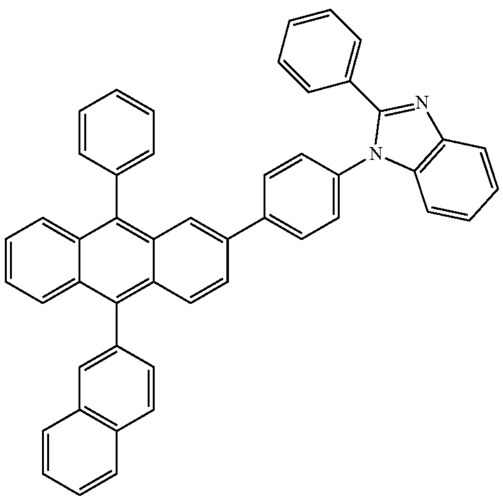
ET14
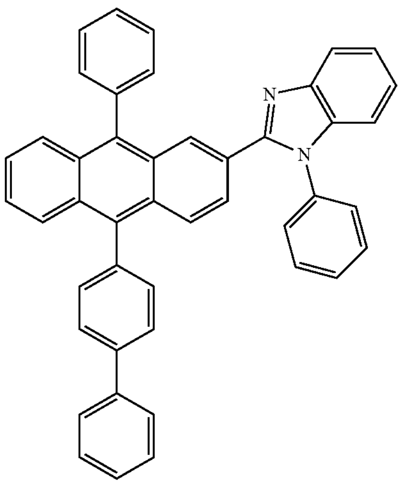
ET15
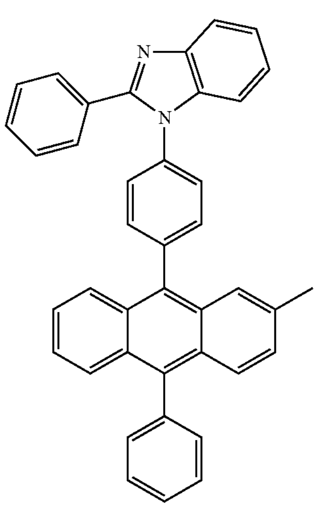
-continued
ET16
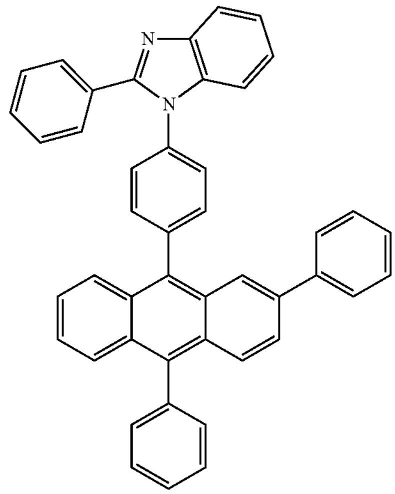
ET17
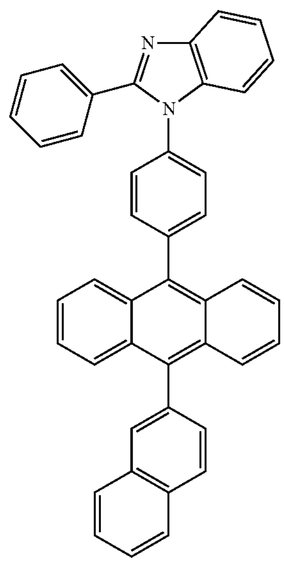
ET18
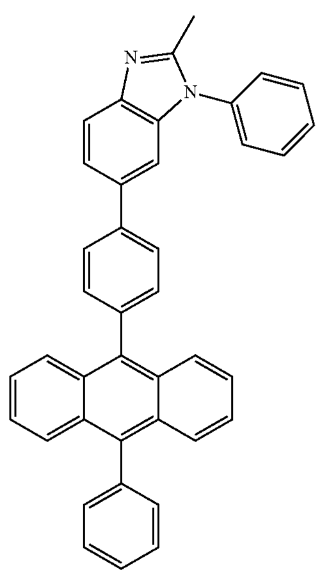

ET19
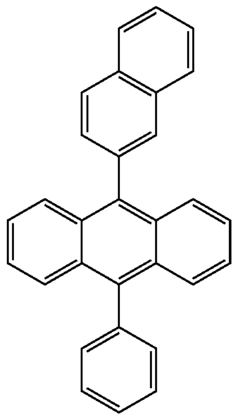
ET20
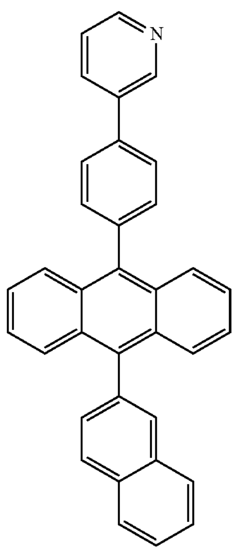
ET21
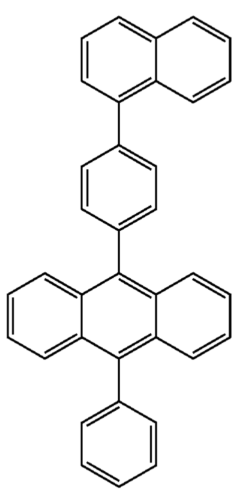
ET22
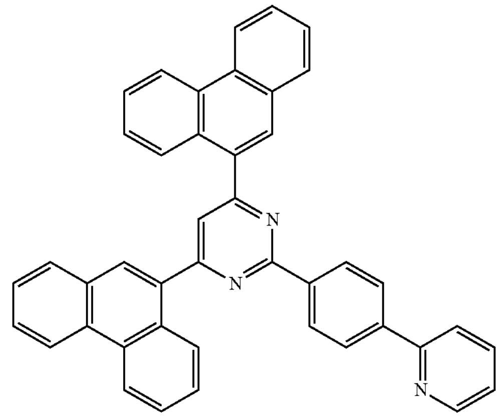
ET23
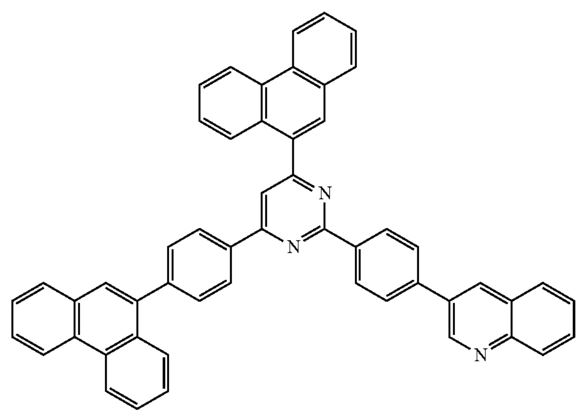
ET24
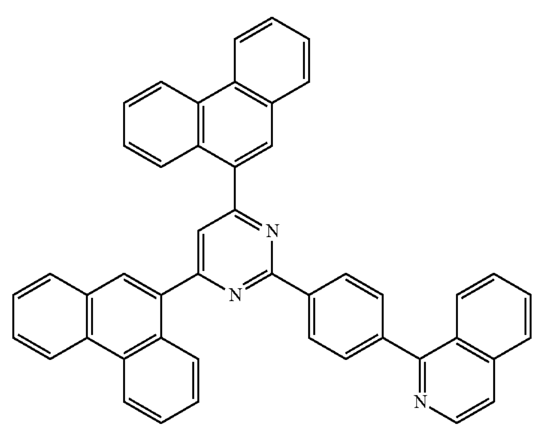

-continued
ET25
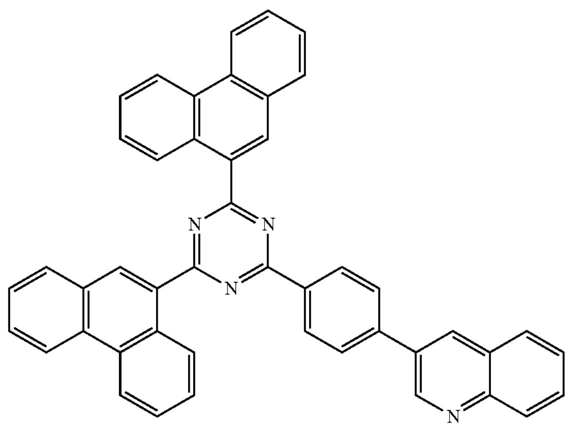
ET26
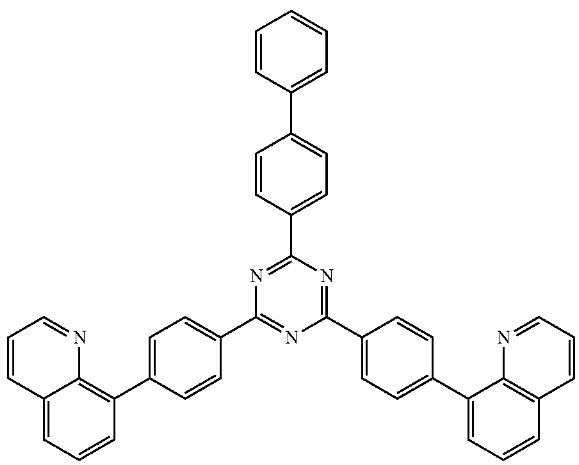
ET27
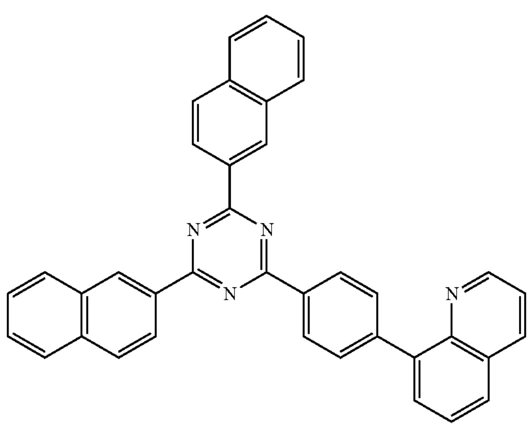
-continued
ET28
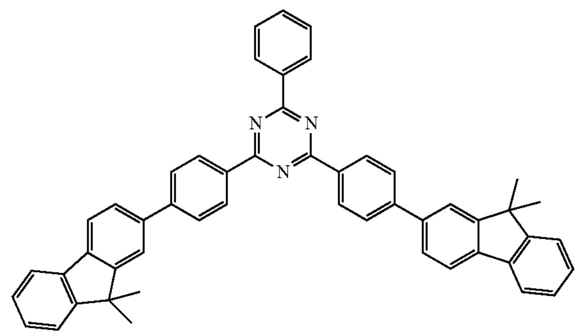
ET29
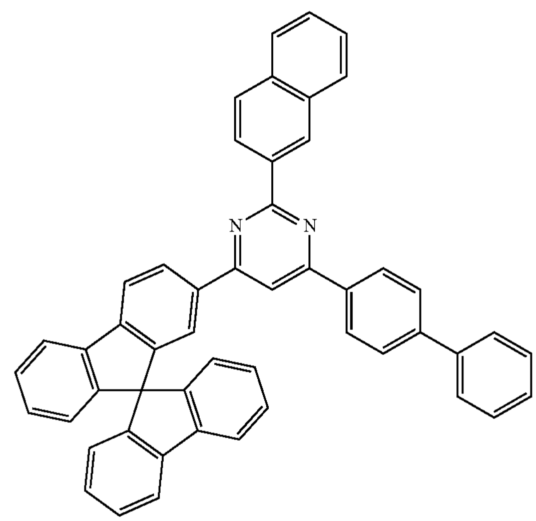
ET30
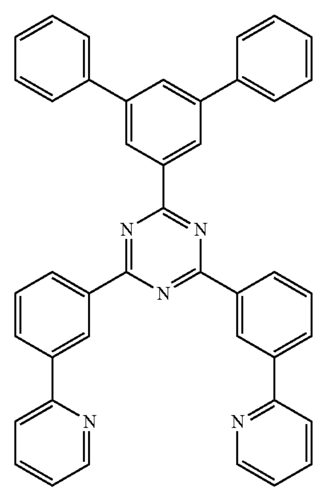

-continued
ET31
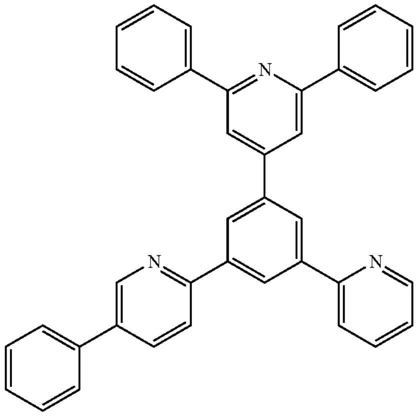
ET32
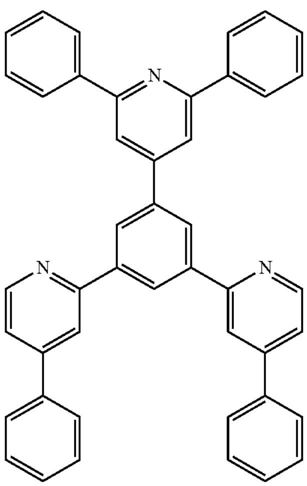
ET33
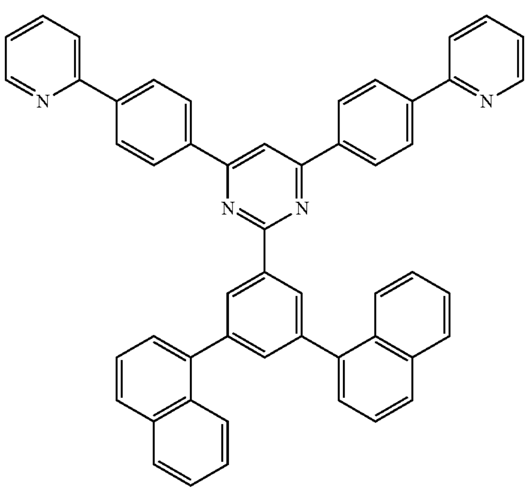
-continued
ET34
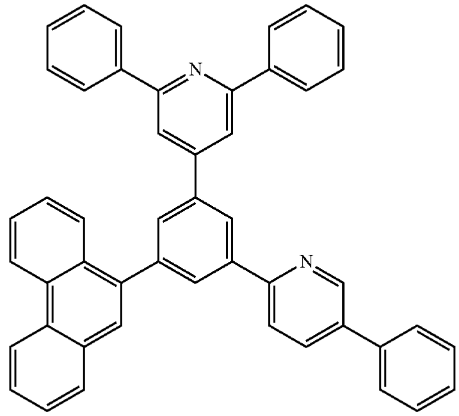
ET35
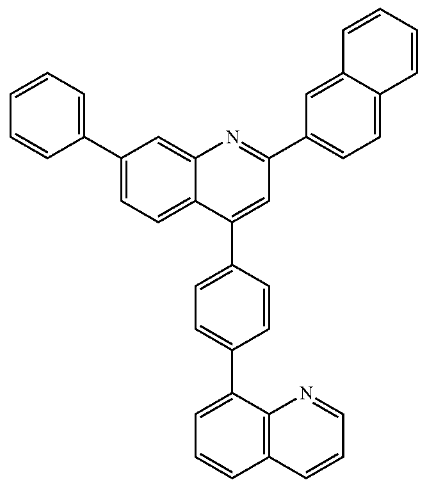
ET36
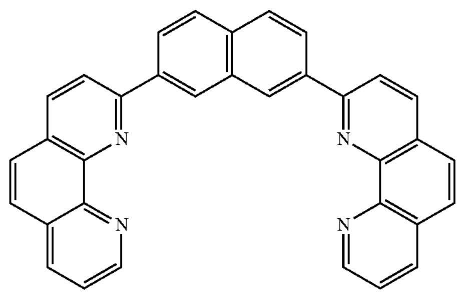
ET37
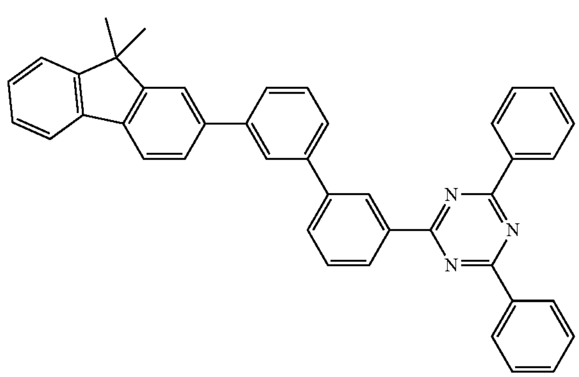

ET38
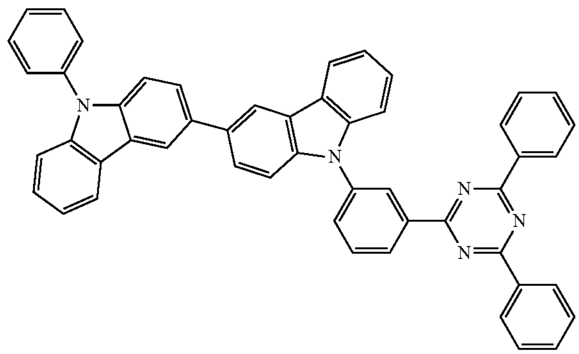
ET39
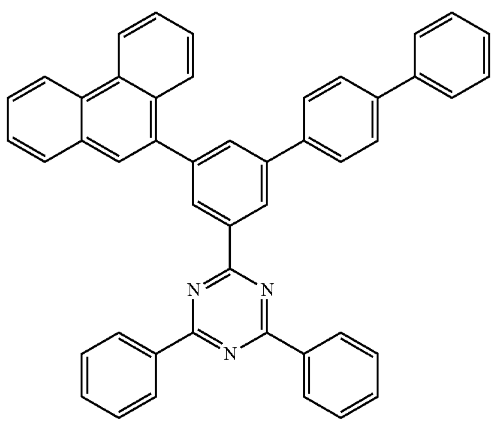
ET40
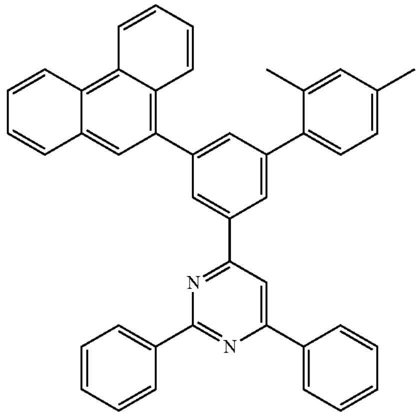
ET41
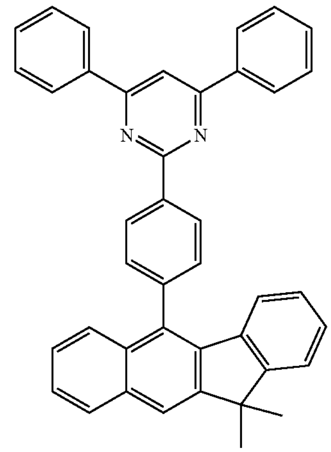
ET42
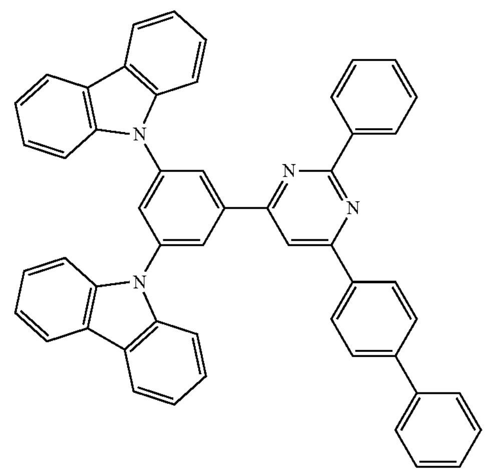
ET43
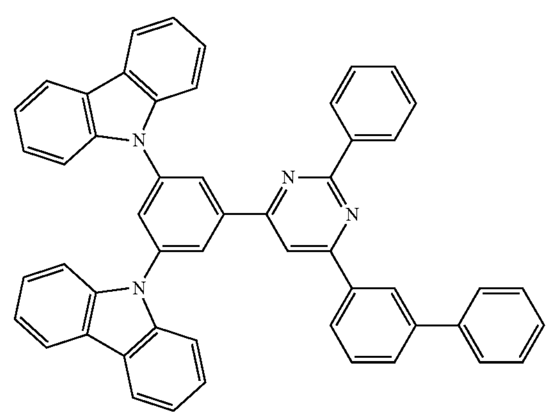

-continued

ET44

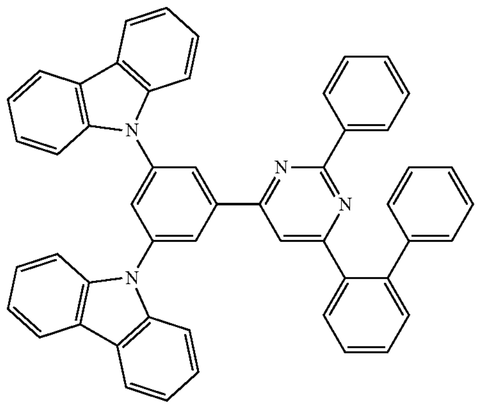

ET45

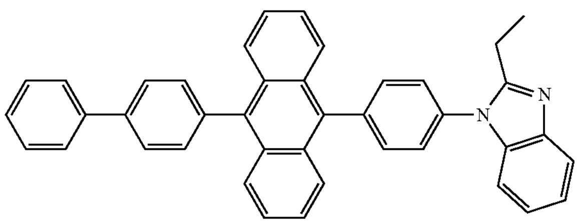

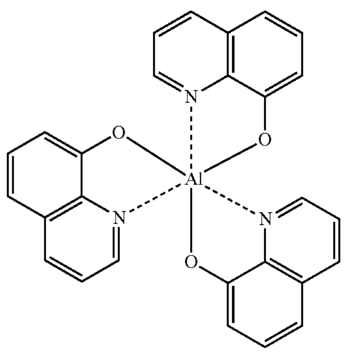

$Alq_3$

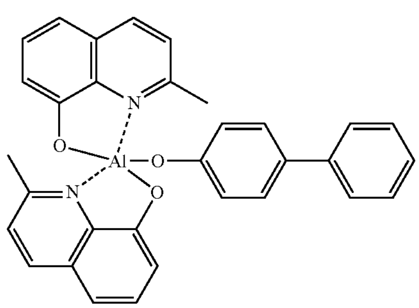

BAlq

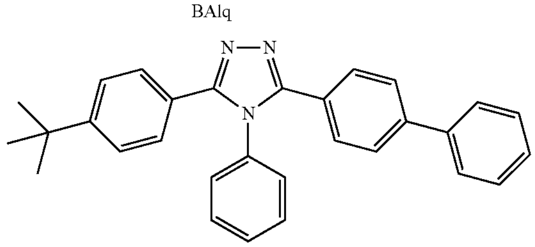

TAZ

-continued

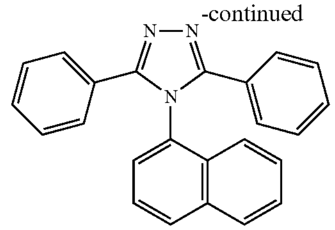

NTAZ

The thickness of the electron transport region may be in a range of about 50 Angstroms (Å) to about 5,000 Å, for example, about 100 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are each within these ranges, excellent (or improved) electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, and/or a cesium (Cs) ion. A metal ion of the alkaline earth metal complex may be a beryllium (Be) ion, a magnesium (Mg) ion, a calcium (Ca) ion, a strontium (Sr) ion, and/or a barium (Ba) ion. A ligand coordinated with the metal ion of the alkali metal complex and the alkaline earth metal complex may each independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) and/or Compound ET-D2:

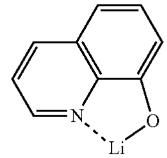

ET-D1

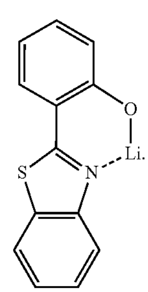

ET-D2

The electron transport region may include an electron injection layer that facilitates injection of electrons from the second electrode 150. The electron injection layer may be in direct contact with the second electrode 150.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may each independently be oxides, halides (e.g., fluorides, chlorides, bromides, and/or iodides), tellurides, or any combination thereof of the alkali metal, the alkaline earth metal, and the rare earth metal, respectively.

The alkali metal-containing compound may be alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth-metal-containing compound may include alkaline earth-metal oxides, such as BaO, SrO, CaO, $Ba_xSr_{1-x}O$ (wherein x is a real number satisfying $0<x<1$), and/or $Ba_xCa_{1-x}O$ (wherein x is a real number satisfying $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above, respectively, and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., may consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may include (e.g., may consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent (or improved) electron injection characteristics may be obtained without a substantial increase in driving voltage.

Second Electrode 150

The second electrode 150 may be on the interlayer 130. In one or more embodiments, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside, and/or may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of about 1.6 or higher (at 589 nm).

The first capping layer and the second capping layer may each independently be a capping layer including an organic material, an inorganic capping layer including an inorganic material, and/or a composite capping layer including an organic material and an inorganic material.

At least one of the first capping layer or the second capping layer may each independently include carbocyclic compound(s), heterocyclic compound(s), amine group-containing compound(s), porphine derivative(s), phthalocyanine derivative(s), naphthalocyanine derivative(s), alkali metal complex(es), alkaline earth metal complex(es), or any combination thereof. The carbocyclic compound, the heterocyclic compound, and the amine group-containing compound may each independently be optionally substituted with a substituent of O, N, S, Se, Si, F, Cl, Br, I, or any combination thereof. In some embodiments, at least one of the first capping layer or the second capping layer may each independently include an amine group-containing compound.

In some embodiments, at least one of the first capping layer or the second capping layer may each independently include the compound represented by Formula 201, the compound represented by Formula 202, or any combination thereof.

In one or more embodiments, at least one of the first capping layer or the second capping layer may each independently include one of Compounds HT28 to HT33, one of Compounds CP1 to CP6, β-NPB, or any combination thereof:

CP1

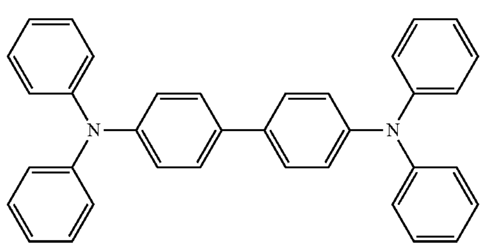

CP2

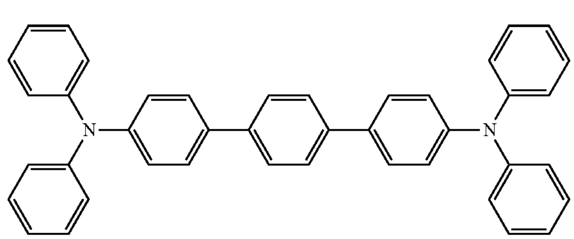

-continued

CP3

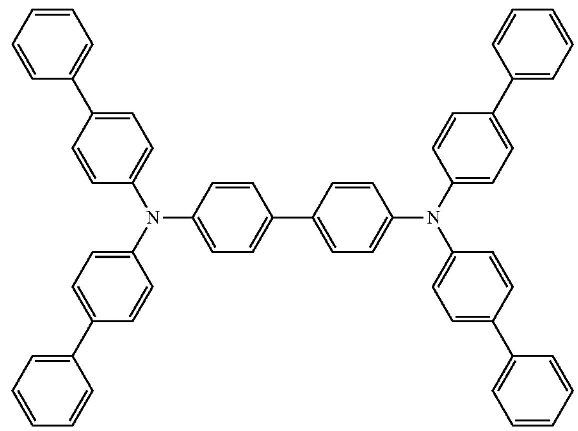

CP4

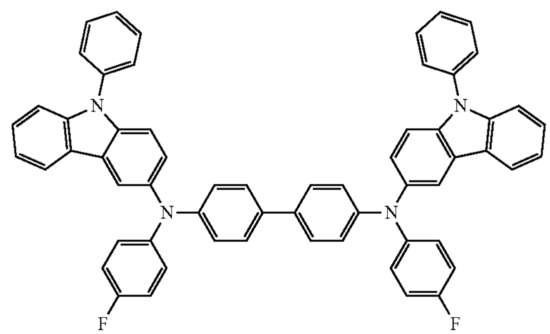

CP5

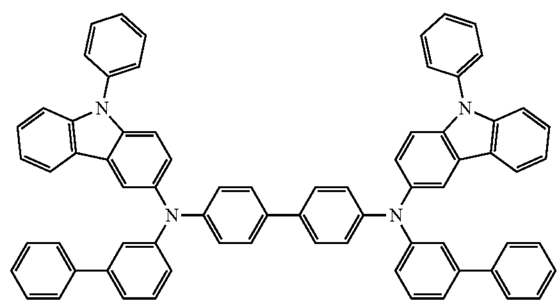

CP6

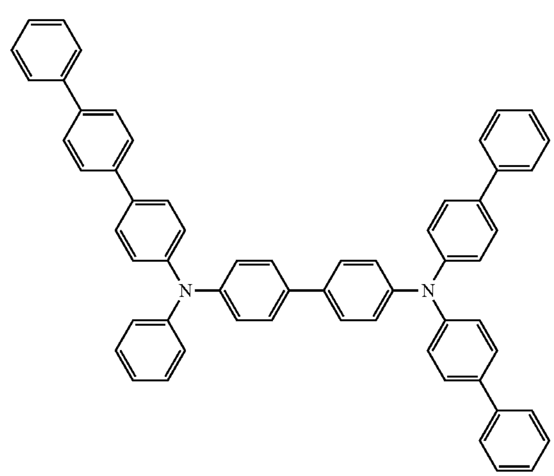

-continued

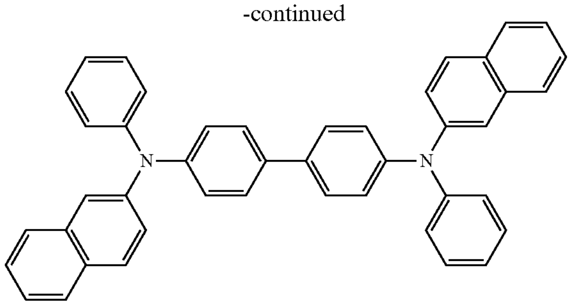

β-NPB

Electronic Apparatus

The light-emitting device may be included in one or more suitable electronic apparatuses. In some embodiments, an electronic apparatus including the light-emitting device may be an emission apparatus and/or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed (e.g., positioned) in at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or the plurality of color-conversion areas) may include: a first area emitting (e.g., to emit) first color light; a second area emitting (e.g., to emit) second color light; and/or a third area emitting (e.g., to emit) third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may further include a scatterer.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected (e.g., electrically coupled) to one of the first electrode and the second electrode of the light-emitting device.

The thin-film transistor may further include a gate electrode, a gate insulating film, and/or the like.

The active layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device, and may at the same time (e.g., concurrently) prevent or reduce the permeation of air and moisture into the light-emitting device. The encapsulation unit may be a sealing substrate including a transparent glass and/or a plastic substrate. The encapsulation unit may be a thin-film encapsulating layer including at least one organic layer and/or at least one inorganic layer. When the encapsulation unit is a thin film encapsulating layer, the electronic apparatus may be flexible.

In addition to the color filter and/or the color-conversion layer, various functional layers may be disposed (e.g., provided) on the encapsulation unit depending on the use of an electronic apparatus. Examples of the functional layer may include a touch screen layer, a polarization layer, and the like. The touch screen layer may be a resistive touch screen layer, a capacitive touch screen layer, and/or an infrared beam touch screen layer. The authentication apparatus may be, for example, a biometric authentication apparatus that identifies an individual according biometric information (e.g., a fingertip, a pupil, and/or the like).

The authentication apparatus may further include a biometric information collecting unit, in addition to the light-emitting device described above.

The electronic apparatus may be applicable to various suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, without limitation.

Figure 2:
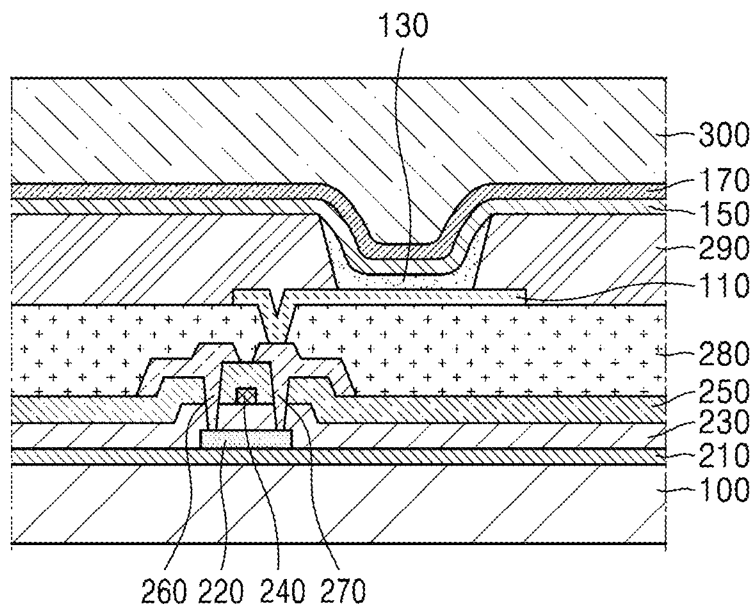
FIG. 2 is a schematic cross-sectional view of an electronic apparatus according to one or more embodiments.
Figure 3:
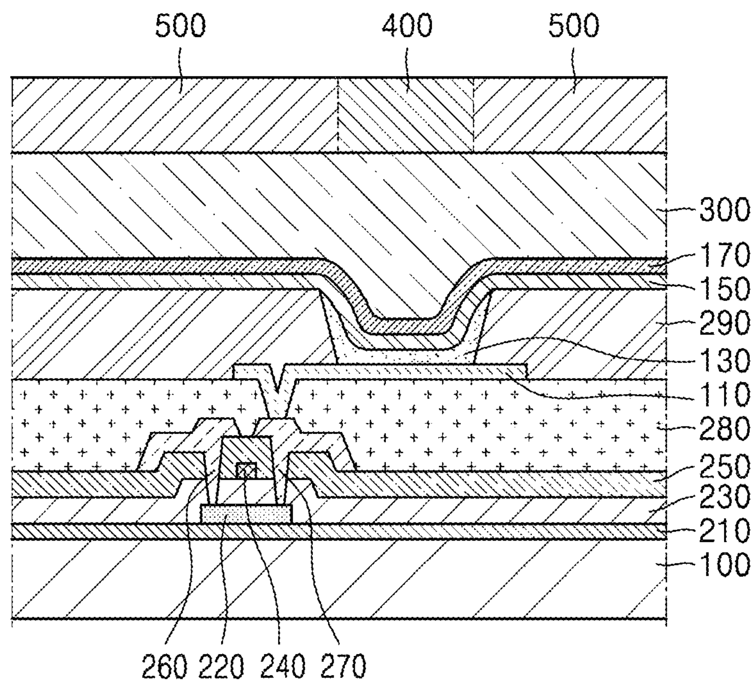
FIG. 3 is a schematic cross-sectional view of an electronic apparatus according to one or more other embodiments.

Descriptions of FIGS. 2 and 3

FIG. 2 is a schematic cross-sectional view of a light-emitting apparatus according to one or more embodiments.

A light-emitting apparatus in FIG. 2 may include a substrate 100, a thin-film transistor, a light-emitting device, and an encapsulation unit 300 sealing the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100, and may provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon and/or polysilicon, an organic semiconductor, and/or an oxide semiconductor, and may include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected (e.g., electrically coupled) to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and may expose a specific or set area of the drain electrode 270, and the first electrode 110 may be disposed to connect (e.g., to electrically couple) to the exposed drain electrode 270.

A pixel-defining film 290 may be on the first electrode 110. The pixel-defining film 290 may expose a specific or set area of the first electrode 110, and the interlayer 130 may be formed in the exposed area. The pixel-defining film 290 may include one or more suitable organic insulating materials, inorganic insulating materials, and/or organic/inorganic composite insulating materials. In some embodiments, the pixel-defining film 290 may be a polyimide and/or a polyacryl organic film. In one or more embodiments, some or more layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, poly aryllate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

FIG. 3 is a schematic cross-sectional view of another light-emitting apparatus according to one or more embodiments.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

Manufacturing Method

The layers constituting the hole transport region, the emission layer, and the layers constituting the electron transport region may each independently be formed in a set or specific region by using one or more suitable methods such as vacuum deposition, spin coating, casting, Langmuir-Blodgett (LB) deposition, ink-jet printing, laser printing, and/or laser-induced thermal imaging.

When layers constituting the hole transport region, the emission layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms, in addition to a heteroatom other than carbon atoms. The $C_3$-$C_{60}$ carbocyclic group and the $C_1$-$C_{60}$ heterocyclic group may each independently be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "r electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, the π electron-rich $C_3$-$C_{60}$ cyclic group may be a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and/or the like), and the π electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, and/or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group, the T3 group may be a furan group, a thiophene group, a 1H-pyrrole group, a silole group, and/or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group.

The "cyclic group", "$C_3$-$C_{60}$ carbocyclic group", "$C_1$-$C_{60}$ heterocyclic group", "π electron-rich $C_3$-$C_{60}$ cyclic group", and/or "π electron-deficient nitrogen-containing $C_1$-$C_{60}$ cyclic group" as used herein may each independently be a group condensed with any suitable cyclic group, a monovalent group, and/or a polyvalent group (e.g., a divalent group, a trivalent group, a quadvalent group, or the like), depending on the structure of the formula to which the respective term is applied. For example, a "benzene group" may be a benzo group, a phenyl group, a phenylene group, and/or the like, and this may be understood by one of ordinary skill in the art, depending on the structure of the formula including the "benzene group".

Examples of the monovalent $C_3$-$C_{60}$ carbocyclic group and the monovalent $C_1$-$C_6$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle and/or at either terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at either terminus of the $C_2$-$C_{60}$ alkyl group. Examples thereof include an ethynyl group and a propynyl group. The term "$C_2$-$C_6$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantyl group, a norbornyl (bicyclo[2.2.1]heptyl) group, a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. The term "$C_1$-$C_{60}$ heteroarylene group" as used herein refers to a divalent group having the same structure as the $C_1$-$C_{60}$ heteroaryl group. When the $C_1$-$C_6$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms (e.g., 8 to 60 carbon atoms) as ring forming atoms, wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a 9,10-dihydroacridinyl group and a 9H-xanthenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group). The term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, and any combination thereof.

"Ph" used herein represents a phenyl group, "Me" used herein represents a methyl group, "Et" used herein represents an ethyl group, "ter-Bu" or "$Bu^t$" used herein represents a tert-butyl group, and "OMe" used herein represents a methoxy group.

The term "biphenyl group" as used herein may refer to a phenyl group substituted with a phenyl group. For example, the "biphenyl group" may be "a substituted phenyl group" having a "$C_6$-$C_{60}$ aryl group" as a substituent.

The term "terphenyl group" as used herein may refer to a phenyl group substituted with biphenyl group. For example, the "terphenyl group" may be "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, compounds and a light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

SYNTHESIS EXAMPLES

Compounds 1 to 6 used in the Synthesis Examples are as follows:

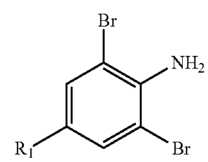

(1) $R_1$ = H
(2) $R_1$ = tert-Bu

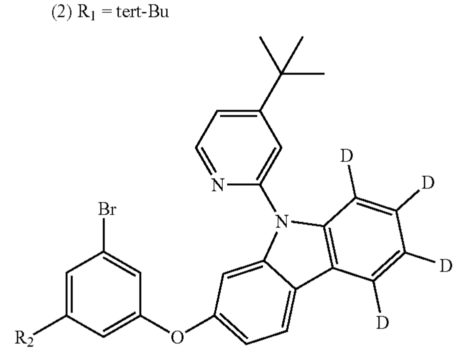

(3) $R_2$ = tert-Bu
(4) $R_2$ = H
(5) $R_2$ = phenyl-$d_5$
(6) $R_2$ = 1,3,5-tri-$^{tert}$Bu-phenyl -continued

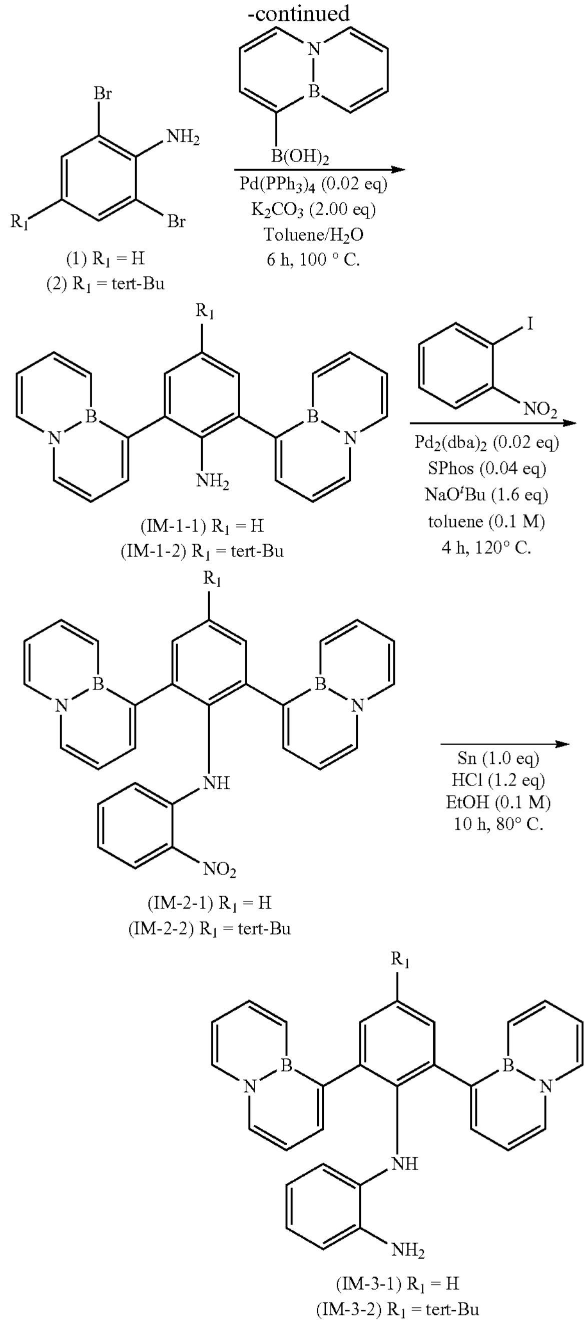

Synthesis Example 1: Synthesis of Intermediate (IM-1-1)

11.5 grams (g) of 2,6-dibromoaniline (Compound 1) (45.7 millimole (mmol)), 1.1 g of $Pd(PPh_3)_4$ (0.9 mmol), $K_2CO_3$ (137.1 mmol), and 8.7 g of [1,2]azaborinino[1,2-a][1,2]azaborinin-1-ylboronic acid (50.3 mmol) were added to a reaction vessel, and suspended in 300 milliliters (mL) of toluene and 100 mL of $H_2O$, followed by heating at a temperature of 100° C. for 6 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 11.9 g (34.3 mmol) of Intermediate IM-1-1 (yield: 75%).

Synthesis Example 2: Synthesis of Intermediate (IM-1-2)

13.5 g of Intermediate IM-1-2 (33.4 mmol) was synthesized in substantially the same manner as in Synthesis of Intermediate IM-1-1, except that 2,6-dibromo-4-(tert-butyl)aniline (Compound 2) was used instead of 2,6-dibromoaniline (Compound 1) (yield: 73%).

Synthesis Example 3: Synthesis of Intermediate (IM-2-1)

11.9 g of Intermediate IM-1-1 (34.3 mmol), 9.4 g of 1-iodo-2-nitrobenzene (37.7 mmol), 0.6 g of $Pd_2(dba)_3$ (0.69 mmol), 0.6 g of SPhos (1.37 mmol), and 5.3 g of $NaO^{tert}Bu$ (54.9 mmol) were added to a reaction vessel and suspended in 343 mL of toluene, followed by heating at a temperature of 120° C. for 4 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 12.5 g (26.8 mmol) of Intermediate IM-2-1 (yield: 78%).

Synthesis Example 4: Synthesis of Intermediate (IM-2-2)

13.1 g of Intermediate IM-2-2 (25.0 mmol) was synthesized in substantially the same manner as in Synthesis of Intermediate IM-2-1, except that Intermediate IM-1-2 was used instead of Intermediate IM-1-1 (yield: 73%).

Synthesis Example 5: Synthesis of Intermediate (IM-3-1)

12.5 g of Intermediate IM-2-1 (26.8 mmol) and 3.2 g of Sn (26.8 mmol) were added to a reaction vessel and suspended in 268 mL of ethanol, followed by adding 3.2 mL of HCl (37%) dropwise thereto and heating at 80° C. for 10 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 9.4 g (21.4 mmol) of Intermediate IM-3-1 (yield: 80%).

Synthesis Example 6: Synthesis of Intermediate (IM-3-2)

10.3 g of Intermediate IM-3-2 (20.9 mmol) was synthesized in substantially the same manner as in Synthesis of Intermediate IM-3-1, except that Intermediate IM-2-2 was used instead of Intermediate IM-2-1 (yield: 78%).

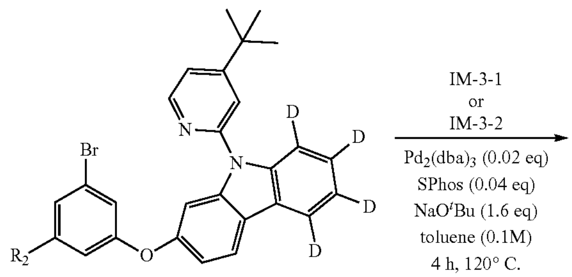

(3) $R_2$ = tert-Bu
(4) $R_2$ = H
(5) $R_2$ = phenyl-$d_5$
(6) $R_2$ = 1,3,5-$^{tert}$Bu-phenyl

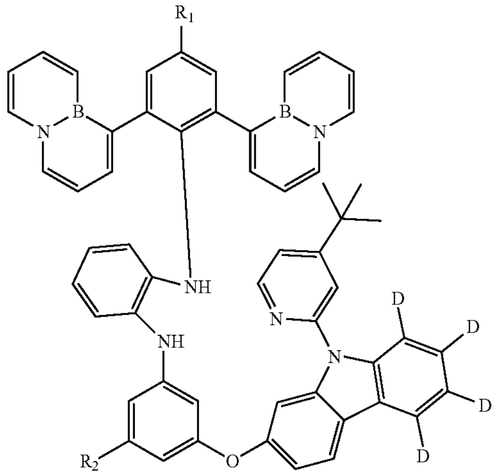

(IM-4-1) $R_1$ = H, $R_2$ = tert-Bu
(IM-4-2) $R_1$ = tert-Bu, $R_2$ = tert-Bu
(IM-4-3) $R_1$ = tert-Bu, $R_2$ = H
(IM-4-4) $R_1$ = tert-Bu, $R_1$ = phenyl-$d_5$
(IM-4-5) $R_1$ = H, $R_2$ = 1,3,5-$^{tert}$Bu-phenyl
(IM-4-6) $R_1$ = tert-Bu, $R_2$ = 1,3,5-$^{tert}$Bu-phenyl Synthesis Example 7: Synthesis of Intermediate (IM-4-1)

5.0 g of Intermediate IM-3-1 (11.4 mmol), 6.1 g of 2-(3-bromo-5-(tert-butyl)phenoxy)-9-(4-(tert-butyl)pyridin-2-yl)-9H-carbazole-5,6,7,8-$d_4$ (Compound 3) (11.4 mmol), 0.2 g of $Pd_2(dba)_3$ (0.2 mmol), 1.9 g of SPhos (4.6 mmol), and 1.7 g of $NaO^{tert}Bu$ (18.2 mmol) were added to a reaction vessel and suspended in 114 mL of toluene, followed by heating at a temperature of 120° C. for 4 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 7.6 g (8.6 mmol) of Intermediate IM-4-1 (yield: 75%).

Synthesis Example 8: Synthesis of Intermediate (IM-4-2)

7.8 g of Intermediate IM-4-2 (8.3 mmol) was synthesized in substantially the same manner as in Synthesis of Intermediate IM-4-1, except that Intermediate IM-3-2 was used instead of Intermediate IM-3-1 (yield: 73%).

Synthesis Example 9: Synthesis of Intermediate (IM-4-3)

13.5 g of Intermediate IM-4-3 (15.2 mmol) was synthesized in substantially the same manner as in Synthesis of Intermediate IM-4-2, except that 2-(3-bromophenoxy)-9-(4-(tert-butyl)pyridin-2-yl)-9H-carbazole-5,6,7,8-$d_4$ (Compound 4), instead of Compound 3, was reacted with Intermediate IM-3-2 (yield: 75%).

Synthesis Example 10: Synthesis of Intermediate (IM-4-4)

8.2 g of Intermediate IM-4-4 (8.4 mmol) was synthesized in substantially the same manner as in Synthesis of Intermediate IM-4-3, except that 2-((5-bromo-[1,1'-biphenyl]-3-yl-2',3',4',5',6'-$d_5$)oxy)-9-(4-(tert-butyl)py-ridin-2-yl)-9H-carbazole-5,6,7,8-$d_4$ (Compound 5), instead of Compound 4, was reacted with Intermediate IM-3-2 (yield: 74%).

Synthesis Example 11: Synthesis of Intermediate (IM-4-5)

8.4 g of Intermediate IM-4-5 (7.8 mmol) was synthesized in substantially the same manner as in Synthesis of Intermediate IM-4-4, except that 2-((5-bromo-2',4',6'-tri-tert-butyl-[1,1'-biphenyl]-3-yl)oxy)-9-(4-(tert-butyl)-pyridin-2-yl)-9H-carbazole-5,6,7,8-$d_4$ (Compound 6), instead of Compound 5, was reacted with Intermediate IM-3-1, instead of Intermediate IM-3-2 (yield: 68%).

Synthesis Example 12: Synthesis of Intermediate (IM-4-6)

8.4 g of Intermediate IM-4-6 (7.4 mmol) was synthesized in substantially the same manner as in Synthesis of Intermediate IM-4-5, except that 2-((5-bromo-2',4',6'-tri-tert-butyl-[1, 1'-biphenyl]-3-yl)oxy)-9-(4-(tert-butyl)-pyridin-2-yl)-9H-carbazole-5,6,7,8-$d_4$ (Compound 6) was reacted with Intermediate IM-3-2 instead of Intermediate IM-3-1 (yield: 65%).

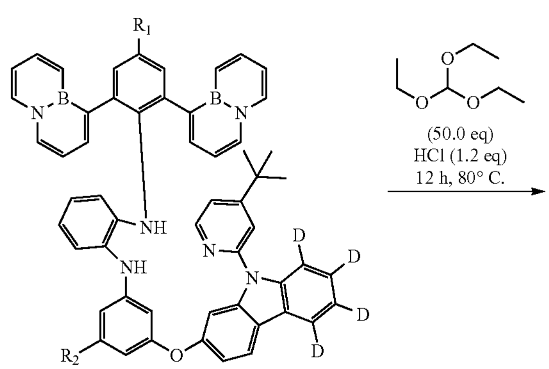

(IM-4-1) $R_1$ = H, $R_2$ = tert-Bu
(IM-4-2) $R_1$ = tert-Bu, $R_2$ = tert-Bu
(IM-4-3) $R_1$ = tert-Bu, $R_2$ = H
(IM-4-4) $R_1$ = tert-Bu, $R_1$ = phenyl-$d_5$
(IM-4-5) $R_1$ = H, $R_2$ = 1,3,5-$^{tert}$Bu-phenyl
(IM-4-6) $R_1$ = tert-Bu, $R_2$ = 1,3,5-$^{tert}$Bu-phenyl -continued

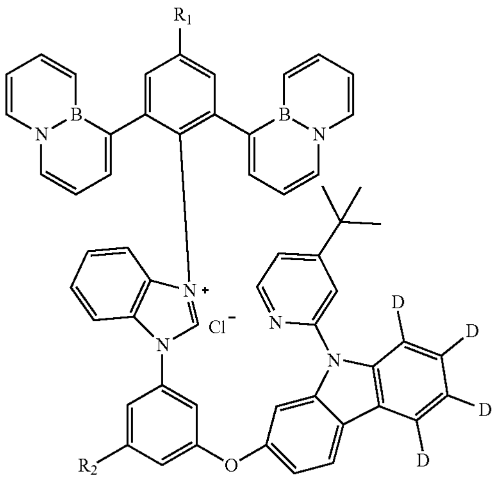

(IM-5-1) $R_1$ = H, $R_2$ = tert-Bu
(IM-5-2) $R_1$ = tert-Bu, $R_2$ = tert-Bu
(IM-5-3) $R_1$ = tert-Bu, $R_2$ = H
(IM-5-4) $R_1$ = tert-Bu, $R_1$ = phenyl-$d_5$
(IM-5-5) $R_1$ = H, $R_2$ = 1,3,5-$^{tert}$Bu-phenyl
(IM-5-6) $R_1$ = tert-Bu, $R_2$ = 1,3,5-$^{tert}$Bu-phenyl

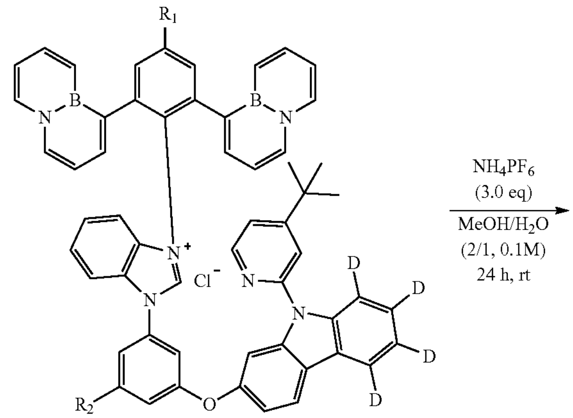

(IM-5-1) $R_1$ = H, $R_2$ = tert-Bu
(IM-5-2) $R_1$ = tert-Bu, $R_2$ = tert-Bu
(IM-5-3) $R_1$ = tert-Bu, $R_2$ = H
(IM-5-4) $R_1$ = tert-Bu, $R_1$ = phenyl-$d_5$
(IM-5-5) $R_1$ = H, $R_2$ = 1,3,5-$^{tert}$Bu-phenyl
(IM-5-6) $R_1$ = tert-Bu, $R_2$ = 1,3,5-$^{tert}$Bu-phenyl

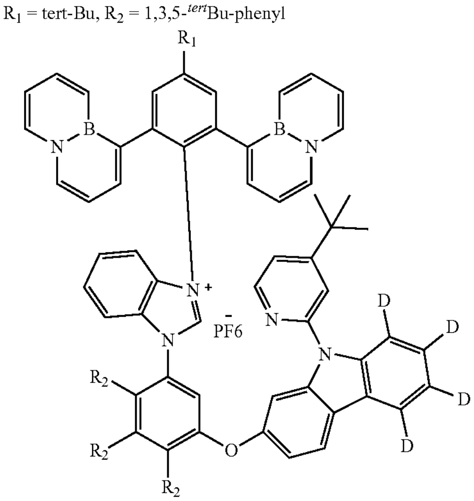

(IM-6-1) $R_1$ = H, $R_2$ = tert-Bu
(IM-6-2) $R_1$ = tert-Bu, $R_2$ = tert-Bu
(IM-6-3) $R_1$ = tert-Bu, $R_2$ = H
(IM-6-4) $R_1$ = tert-Bu, $R_1$ = phenyl-$d_5$
(IM-6-5) $R_1$ = H, $R_2$ = 1,3,5-$^{tert}$Bu-phenyl
(IM-6-6) $R_1$ = tert-Bu, $R_2$ = 1,3,5-$^{tert}$Bu-phenyl

Synthesis Example 13: Synthesis of Intermediate (IM-5-1)

7.6 g of Intermediate IM-4-1 (8.6 mmol), 86 mL of triethyl orthoformate (516 mmol), and 1.0 mL of HCl (37%) (10.3 mmol) were added to a reaction vessel, followed by heating at a temperature of 80° C. for 12 hours. Once the reaction was complete, the temperature was cooled to room temperature, and the resulting solid was filtered and washed using ether. Then, the washed solid was dried to thereby obtain 7.2 g (7.7 mmol) of Intermediate IM-5-1 at a yield of 90%.

Synthesis Example 14: Synthesis of Intermediates IM-5-2 to IM-5-6

7.3 g of Intermediate IM-5-2 (7.4 mmol), 6.9 g of Intermediate IM-5-3 (7.4 mmol), 7.4 g of Intermediate IM-5-4 (7.3 mmol), 8.0 g of Intermediate IM-5-5 (7.1 mmol), and 8.4 g of Intermediate IM-5-6 (7.1 mmol) were respectively synthesized in substantially the same manner as in Synthesis of Intermediate IM-5-1, except that Intermediate IM-4-2, Intermediate IM-4-3, Intermediate IM-4-4, Intermediate IM-4-5, and Intermediate IM-4-6 were respectively used instead of Intermediate IM-4-1, at a yield of 86%, 86%, 85%, 83%, and 82%, respectively.

Synthesis Example 15: Synthesis of Intermediate (IM-6-1)

7.2 g of Intermediate IM-5-1 (7.7 mmol) and 3.8 g of $NH_4PF_6$ (23.1 mmol) were added to a reaction vessel, followed by suspension in a mixture solution of 100 mL of methanol and 50 mL of water and stirring at room temperature for 24 hours. Once the reaction was complete, the resulting solid was filtered and washed using ether. Then, the washed solid was dried to thereby obtain 7.0 g (6.9 mmol) of Intermediate IM-6-1 at a yield of 90%.

Synthesis Example 16: Synthesis of Intermediates IM-6-2 to IM-6-6

7.6 g of Intermediate IM-6-2 (6.9 mmol), 6.9 g of Intermediate IM-6-3 (6.8 mmol), 8.0 g of Intermediate IM-6-4

(7.1 mmol), 8.5 g of Intermediate IM-6-5 (6.9 mmol), and 8.8 g of Intermediate IM-6-6 (6.8 mmol) were respectively synthesized in substantially the same manner as in Synthesis of Intermediate IM-6-1, except that Intermediate IM-5-2, Intermediate IM-5-3, Intermediate IM-5-4, Intermediate IM-5-5, and Intermediate IM-5-6 were respectively used instead of Intermediate IM-5-1, at a yield of 90%, 88%, 92%, 90%, and 89%, respectively.

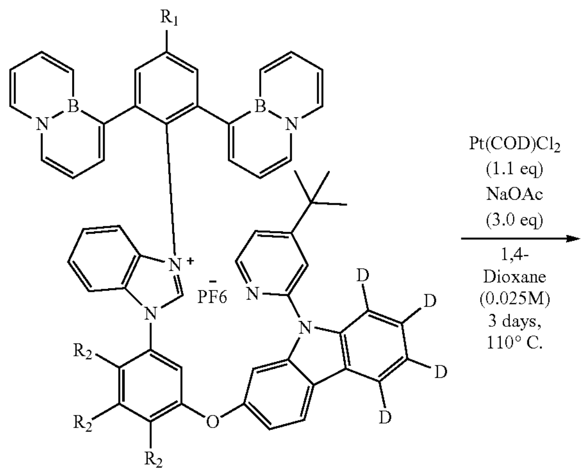

(IM-6-1) $R_1$ = H, $R_2$ = tert-Bu
(IM-6-2) $R_1$ = tert-Bu, $R_2$ = tert-Bu
(IM-6-3) $R_1$ = tert-Bu, $R_2$ = H
(IM-6-4) $R_1$ = tert-Bu, $R_1$ = phenyl-$d_5$
(IM-6-5) $R_1$ = H, $R_2$ = 1,3,5-$^{tert}$Bu-phenyl
(IM-6-6) $R_1$ = tert-Bu, $R_2$ = 1,3,5-$^{tert}$Bu-phenyl

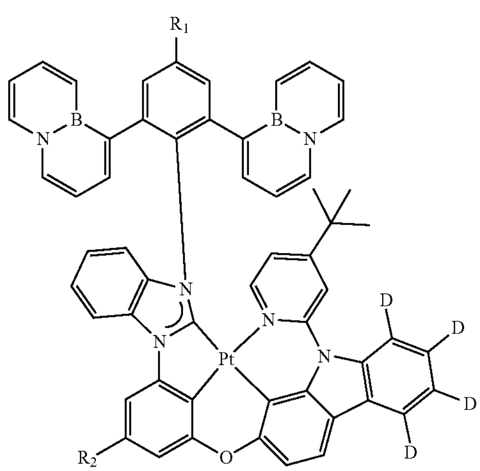

(BD05) $R_1$ = H, $R_2$ = tert-Bu
(BD19) $R_1$ = tert-Bu, $R_2$ = tert-Bu
(BD17) $R_1$ = tert-Bu, $R_2$ = H
(BD22) $R_1$ = tert-Bu, $R_1$ = phenyl-$d_5$
(BD10) $R_1$ = H, $R_2$ = 1,3,5-$^{tert}$Bu-phenyl
(BD25) $R_1$ = tert-Bu, $R_2$ = 1,3,5-$^{tert}$Bu-phenyl Synthesis Example 17: Synthesis of Compound BD04

BD04

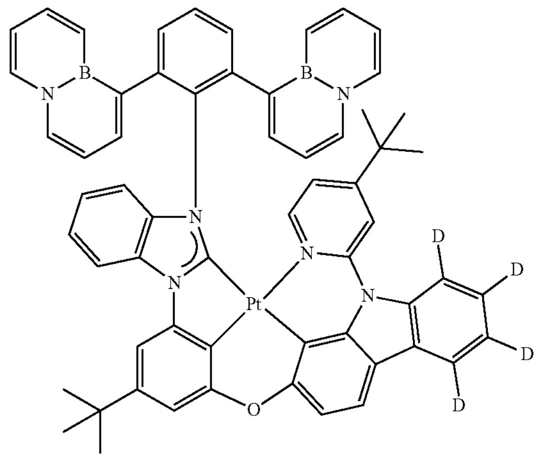

7.0 g of Intermediate IM-6-1 (6.9 mmol), 2.8 g of dichloro (1,5-cyclooctadiene) platinum (7.6 mmol), and 1.7 g of NaOAc (20.7 mmol) were suspended in 150 mL of 1,4-dioxane, followed by heating at a temperature of 110° C. for 72 hours. Once the reaction was complete, the temperature was cooled to room temperature, 150 mL of distilled water was added thereto, and an organic layer was extracted therefrom using ethyl acetate, and the extracted organic layer was washed using NaCl aqueous solution and dried using $MgSO_4$. The resulting product was subjected to column chromatography to thereby obtain 2.6 g (2.4 mmol) of Compound BD04 (yield: 35%).

Synthesis Example 18: Synthesis of Compound BD19

BD19

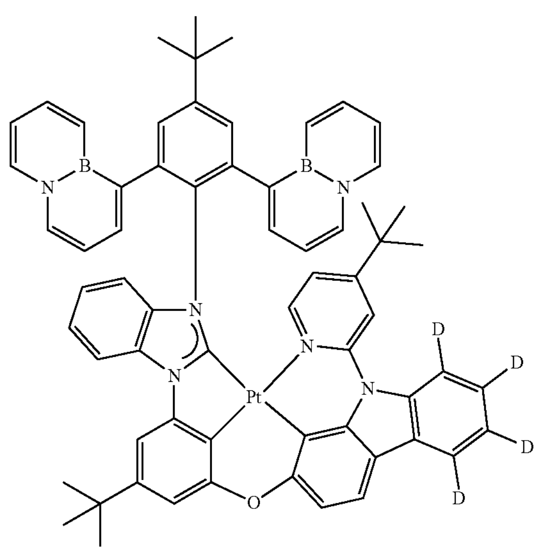

2.8 g of Compound BD19 (2.4 mmol) was synthesized in substantially the same manner as in Synthesis of Compound BD04, except that Intermediate IM-6-2 was used instead of Intermediate IM-6-1 (yield: 35%).

Synthesis Example 19: Synthesis of Compound BD17

BD17

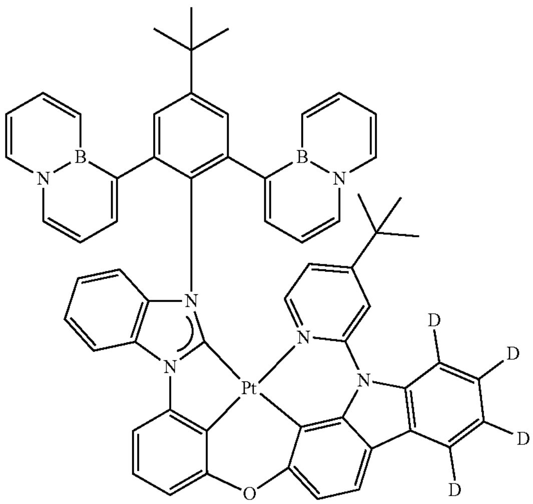

2.4 g of Compound BD17 (2.2 mmol) was synthesized in substantially the same manner as in Synthesis of Compound BD04, except that Intermediate IM-6-3 was used instead of Intermediate IM-6-1 (yield: 32%).

Synthesis Example 20: Synthesis of Compound BD22

BD22

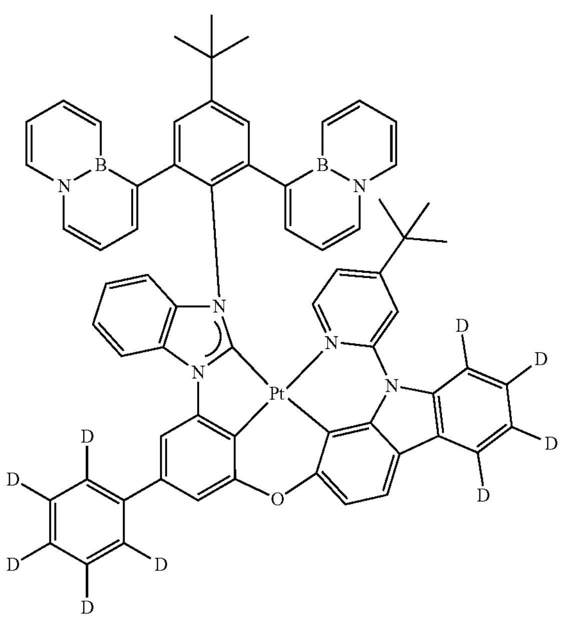

2.9 g of Compound BD22 (2.5 mmol) was synthesized in substantially the same manner as in Synthesis of Compound BD04, except that Intermediate IM-6-4 was used instead of Intermediate IM-6-1 (yield: 36%).

Synthesis Example 21: Synthesis of Compound BD10

BD10

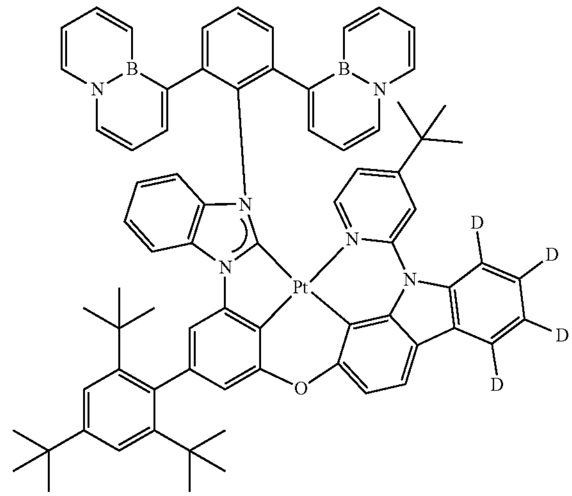

2.9 g of Compound BD10 (2.3 mmol) was synthesized in substantially the same manner as in Synthesis of Compound BD04, except that Intermediate IM-6-5 was used instead of Intermediate IM-6-1 (yield: 34%).

Synthesis Example 22: Synthesis of Compound BD25

BD25

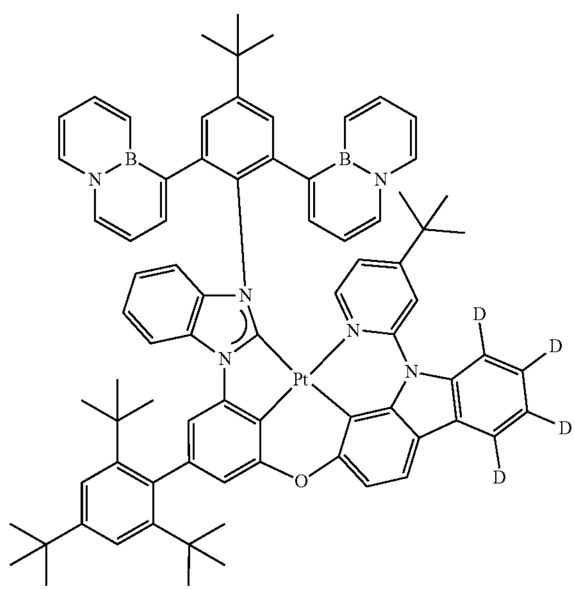

3.2 g of Compound BD25 (2.4 mmol) was synthesized in substantially the same manner as in Synthesis of Compound BD04, except that Intermediate IM-6-6 was used instead of Intermediate IM-6-1 (yield: 35%).

Compounds synthesized in Synthesis Examples 17 to 22 were identified by $^{1}$H nuclear magnetic resonance (NMR) and matrix-assisted laser desorption/ionization mass spectrometry time-of-flight mass spectroscopy (MALDI-TOF MS). The results thereof are shown in Table 1.

Methods of synthesizing compounds other than the compounds synthesized in Synthesis Examples 17 to 22 may be easily understood by those skilled in the art by referring to the synthesis pathways and raw materials described above.

TABLE 1

| Compound | $^{1}$H NMR ($CDCl_3$, 500 MHz) | MALDI-TOF MS [M$^+$] found | MALDI-TOF MS [M$^+$] calc. |
|---|---|---|---|
| BD04 | δ 9.01 (d, $^3J_{H-H}$ = 6.3 Hz, 1H), 8.08 (s, 1H), 7.86 (d, $^3J_{H-H}$ = 8.3 Hz, 1H), 7.64 (d, $^3J_{H-H}$ = 8.3 Hz, 1H), 7.60-7.40 (m, 3H), 7.32 (d, $^3J_{H-H}$ = 8.2 Hz, 1H), 7.24-7.22 (m, 3H), 7.15-7.00 (m, 2H), 6.89 (d, $^3J_{H-H}$ = 8.2 Hz, 1H), 6.86-6.65 (m, 7H), 6.37 (dd, $^3J_{H-H}$ = 8.1 Hz, 2H), 6.19 (dd, $^3J_{H-H}$ = 6.3 Hz, $^4J_{H-H}$ = 1.7 Hz, 1H), 6.16 (dd, $^3J_{H-H}$ = 8.1 Hz, 2H), 5.32 (dd, $^3J_{H-H}$ = 8.1 Hz, 2H), 1.42 (s, 9H), 1.29 (s, 9H). | 1091.4134 | 1091.4131 |
| BD19 | δ 9.03 (d, $^3J_{H-H}$ = 6.3 Hz, 1H), 8.01 (s, 1H), 7.86 (d, $^3J_{H-H}$ = 8.3 Hz, 1H), 7.64 (d, $^3J_{H-H}$ = 8.3 Hz, 1H), 7.60-7.40 (m, 2H), 7.32 (d, $^3J_{H-H}$ = 8.2 Hz, 1H), 7.24-7.22 (m, 3H), 7.15-7.00 (m, 2H), 6.89 (d, $^3J_{H-H}$ = 8.2 Hz, 1H), 6.86-6.65 (m, 7H), 6.37 (dd, $^3J_{H-H}$ = 8.1 Hz, 2H), 6.19 (dd, $^3J_{H-H}$ = 6.3 Hz, $^4J_{H-H}$ = 1.7 Hz, 1H), 6.16 (dd, $^3J_{H-H}$ = 8.1 Hz, 2H), 5.32 (dd, $^3J_{H-H}$ = 8.1 Hz, 2H), 1.42 (s, 9H), 1.31 (s, 9H), 1.29 (s, 9H). | 1147.4761 | 1147.4757 |
| BD17 | δ 9.10 (d, $^3J_{H-H}$ = 6.3 Hz, 1H), 8.12 (s, 1H), 7.88 (d, $^3J_{H-H}$ = 8.3 Hz, 1H), 7.63 (d, $^3J_{H-H}$ = 8.3 Hz, 1H), 7.62-7.41 (m, 3H), 7.31 (d, $^3J_{H-H}$ = 8.2 Hz, 1H), 7.24-7.22 (m, 3H), 7.16-7.01 (m, 2H), 6.87 (d, $^3J_{H-H}$ = 8.2 Hz, 1H), 6.86-6.65 (m, 7H), 6.36 (dd, $^3J_{H-H}$ = 8.1 Hz, 2H), 6.18 (dd, $^3J_{H-H}$ = 6.3 Hz, $^4J_{H-H}$ = 1.7 Hz, 1H), 6.15 (dd, $^3J_{H-H}$ = 8.1 Hz, 2H), 5.34 (dd, $^3J_{H-H}$ = 8.1 Hz, 2H), 1.31 (s, 9H), 1.29 (s, 9H). | 1091.4136 | 1091.4131 |
| BD22 | δ 9.00 (d, $^3J_{H-H}$ = 6.3 Hz, 1H), 8.03 (s, 1H), 7.87 (d, $^3J_{H-H}$ = 8.3 Hz, 1H), 7.65 (d, $^3J_{H-H}$ = 8.3 Hz, 1H), 7.58-7.38 (m, 2H), 7.30 (d, $^3J_{H-H}$ = 8.2 Hz, 1H), 7.26-7.23 (m, 3H), 7.16-7.01 (m, 2H), 6.87 (d, $^3J_{H-H}$ = 8.2 Hz, 1H), 6.87-6.64 (m, 7H), 6.36 (dd, $^3J_{H-H}$ = 8.1 Hz, 2H), 6.18 (dd, $^3J_{H-H}$ = 6.3 Hz, $^4J_{H-H}$ = 1.7 Hz, 1H), 6.14 (dd, $^3J_{H-H}$ = 8.1 Hz, 2H), 5.31 (dd, $^3J_{H-H}$ = 8.1 Hz, 2H), 1.42 (s, 9H), 1.30 (s, 9H). | 1172.4763 | 1172.4758 |
| BD10 | δ 9.01 (d, $^3J_{H-H}$ = 6.3 Hz, 1H), 8.08 (s, 1H), 7.84 (d, $^3J_{H-H}$ = 8.3 Hz, 1H), 7.64 (d, $^3J_{H-H}$ = 8.3 Hz, 1H), 7.60-7.41 (m, 2H), 7.29 (d, $^3J_{H-H}$ = 8.2 Hz, 1H), 7.28-7.21 (m, 4H), 7.16-7.00 (m, 4H), 6.89 (d, $^3J_{H-H}$ = 8.2 Hz, 1H), 6.85-6.63 (m, 7H), 6.33 (dd, $^3J_{H-H}$ = 8.1 Hz, 2H), 6.18 (dd, $^3J_{H-H}$ = 6.3 Hz, $^4J_{H-H}$ = 1.7 Hz, 1H), 6.12 (dd, $^3J_{H-H}$ = 8.1 Hz, 2H), 5.26 (dd, $^3J_{H-H}$ = 8.1 Hz, 2H), 1.35 (s, 18H), 1.31 (s, 9H), 1.30 (s, 9H). | 1279.5701 | 1279.5696 |
| BD25 | δ 9.12 (d, $^3J_{H-H}$ = 6.3 Hz, 1H), 8.02 (s, 1H), 7.86 (d, $^3J_{H-H}$ = 8.3 Hz, 1H), 7.64 (d, $^3J_{H-H}$ = 8.3 Hz, 1H), 7.60-7.41 (m, 2H), 7.29 (d, $^3J_{H-H}$ = 8.2 Hz, 1H), 7.27-7.22 (m, 3H), 7.16-7.00 (m, 4H), 6.88 (d, $^3J_{H-H}$ = 8.2 Hz, 1H), 6.86-6.64 (m, 7H), 6.32 (dd, $^3J_{H-H}$ = 8.1 Hz, 2H), 6.17 (dd, $^3J_{H-H}$ = 6.3 Hz, $^4J_{H-H}$ =1.7 Hz, 1H), 6.11 (dd, $^3J_{H-H}$ = 8.1 Hz, 2H), 5.28 (dd, $^3J_{H-H}$ = 8.1 Hz, 2H), 1.42 (s, 9H), 1.35 (s, 18H), 1.31 (s, 9H), 1.30 (s, 9H). | 1335.6325 | 1335.6322 |

EXAMPLES

Example 1

A Corning 15 Ohms per square centimeter (Ω/cm$^2$) (1,200 Å) ITO glass substrate was cut to a size of 50 millimeters (mm)×50 mm×0.7 mm, sonicated in isopropyl alcohol and pure water for 5 minutes in each solvent, and cleaned by exposure to ultraviolet rays with ozone to use the glass substrate as an anode. Then, the glass substrate was mounted onto a vacuum-deposition apparatus. 2-TNATA was vacuum-deposited on the glass substrate to form a hole injection layer having a thickness of 600 Å. Then, 4,4'-bis[N-(1-naphthyl)-N-phenylamino]biphenyl (NPB) was vacuum-deposited on the hole injection layer to form a hole transport layer having a thickness of about 300 Å. Compound ETH1 and Compound HTH15 were mixed at a weight ratio of 3:7 as a mixture host to be deposited on the hole transport layer, Compound BD04 was used as a dopant (dopant 13 wt %), and ETH1, HTH15, and BD04 were co-deposited to form an emission layer to a thickness of 400 Å. Subsequently, HBL-1 was vacuum-deposited to a thickness of 50 Å to form a hole blocking layer. $Alq_3$ was deposited on the hole blocking layer as an electron transport layer to a thickness of 300 Å, LiF was deposited on the electron transport layer to a thickness of 10 Å as an electron injection layer, Al was vacuum-deposited to a thickness of 3,000 Å to form a LiF/Al cathode, thereby completing the manufacture of a light-emitting device.

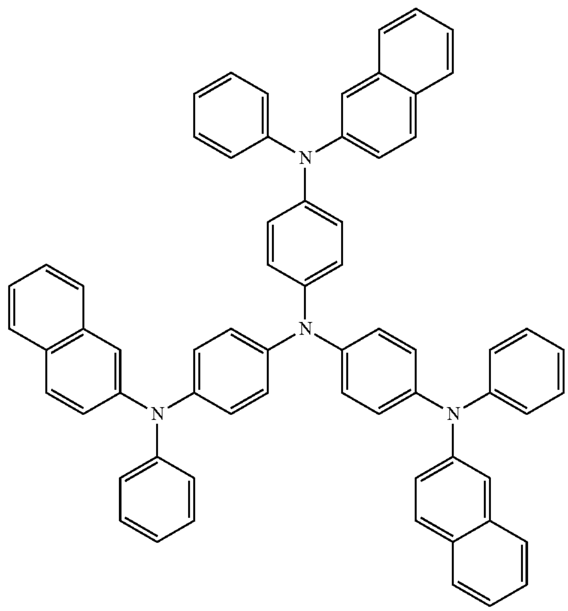

2-TNATA

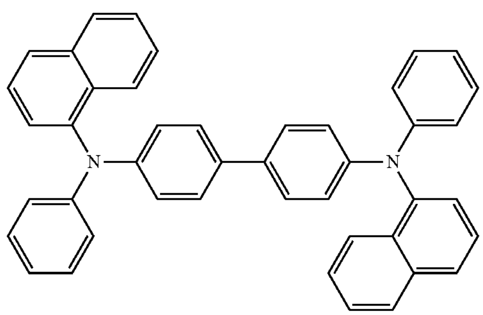

NPB

HBL-1

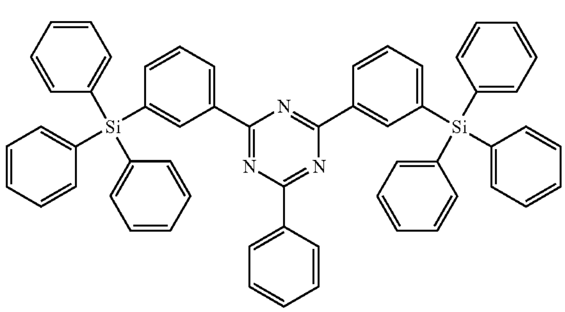

ETH1

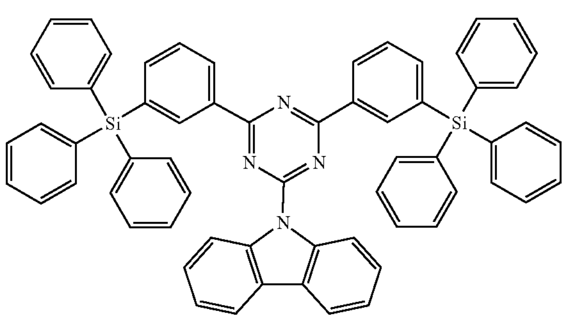

-continued

ETH2

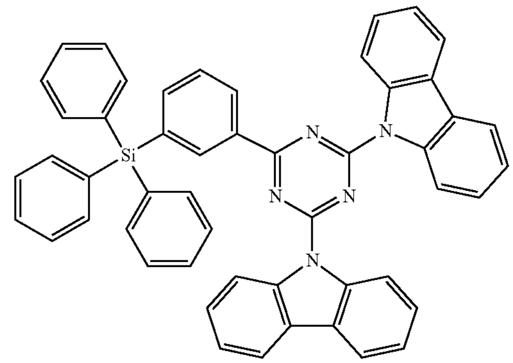

HTH15

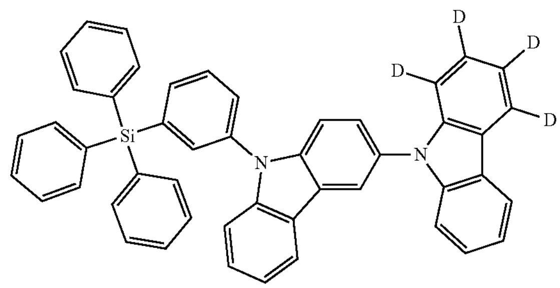

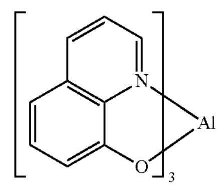

$Alq_3$

Example 2

A light-emitting device was manufactured in substantially the same manner as in Example 1, except that ETH2 and HTH15 were used as a mixture host at a weight ratio of 3:7 to form an emission layer.

Example 3

A light-emitting device was manufactured in substantially the same manner as in Example 1, except that ETH2 and HTH15 were used as a mixture host at a weight ratio of 3:7 to form an emission layer, and BD19 was used instead of BD04.

Example 4

A light-emitting device was manufactured in substantially the same manner as in Example 1, except that ETH2 and HTH15 were used as a mixture host at a weight ratio of 3:7 to form an emission layer, and BD17 was used instead of BD04.

Example 5

A light-emitting device was manufactured in substantially the same manner as in Example 1, except that ETH2 and HTH15 were used as a mixture host at a weight ratio of 3:7 to form an emission layer, and BD22 was used instead of BD04.

Example 6

A light-emitting device was manufactured in substantially the same manner as in Example 1, except that ETH2 and HTH15 were used as a mixture host at a weight ratio of 3:7 to form an emission layer, and BD10 was used instead of BD04.

Example 7

A light-emitting device was manufactured in substantially the same manner as in Example 1, except that ETH2 and HTH15 were used as a mixture host at a weight ratio of 3:7 to form an emission layer, and BD25 was used instead of BD04.

Example 8

A light-emitting device was manufactured in substantially the same manner as in Example 1, except that ETH2 and HTH15 were mixed as a mixture host at a weight ratio of 3:7 to form an emission layer, and BD17 (13 wt %) and a delayed fluorescence dopant DFD7 (0.4 wt %), instead of BD04, were co-deposited to form an emission layer having a thickness of 400 Å.

Comparative Example 1

A light-emitting device was manufactured in substantially the same manner as in Example 1, except that Compound BD-CE1 was used instead of Compound BD04 to form an emission layer.

BD-CE1

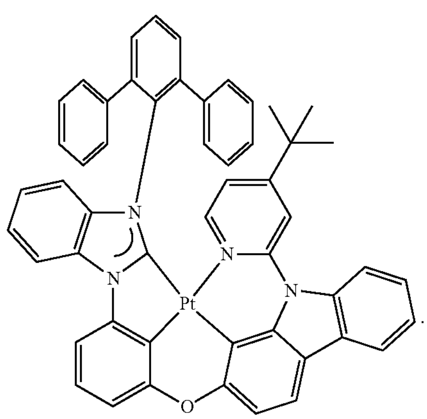

Comparative Example 2

A light-emitting device was manufactured in substantially the same manner as in Example 1, except that Compound BD-CE2 was used instead of Compound BD04 to form an emission layer.

BD-CE2

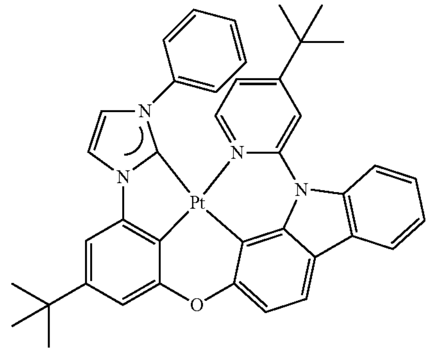

Comparative Example 3

A light-emitting device was manufactured in substantially the same manner as in Example 1, except that Compound BD-CE3 was used instead of Compound BD04 to form an emission layer.

BD-CE3

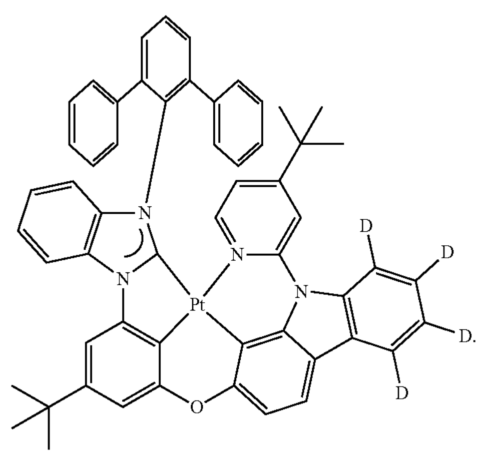

Comparative Example 4

A light-emitting device was manufactured in substantially the same manner as in Example 1, except that Compound BD-CE4 was used instead of Compound BD04 to form an emission layer.

BD-CE4

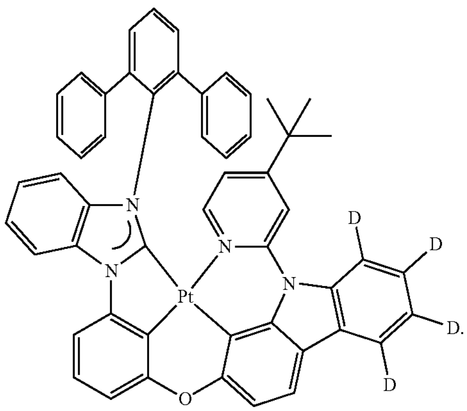

The driving voltage, color coordinates, luminescence efficiency, color-conversion efficiency (luminescence efficiency/CIE$_y$), maximum emission wavelength (nm), and lifespan (T95) at luminance of 1,000 cd/m$^2$ of the light-emitting devices manufactured in Examples 1 to 8 and Comparative Examples 1 to 4 were measured by using Keithley source-measure unit (SMU) 236 and a luminance meter PR650. The results thereof are shown in Table 2. In Table 2, the lifespan (T95) indicates a time (in hours) that it took for the luminance of each light-emitting device to decline to 95% of its initial luminance under the same condition.

TABLE 2

| | Luminance (cd/m$^2$) | Driving voltage (V) | CIE$_{(x,y)}$ | Luminescence efficiency (cd/A) | Color-conversion efficiency (cd/A/y) | Maximum emission wavelength (nm) | Lifespan (T95, hour) |
|---|---|---|---|---|---|---|---|
| Example 1 | 1,000 | 4.9 | (0.134, 0.181) | 22.1 | 122.3 | 462 | 121.0 |
| Example 2 | 1,000 | 4.9 | (0.134, 0.181) | 22.1 | 122.3 | 462 | 140.0 |
| Example 3 | 1,000 | 4.8 | (0.135, 0.177) | 22.5 | 127.1 | 463 | 156.0 |
| Example 4 | 1,000 | 4.6 | (0.135, 0.183) | 23.3 | 127.8 | 463 | 170.2 |
| Example 5 | 1,000 | 4.6 | (0.135, 0.56) | 21.4 | 137.1 | 461 | 133.0 |
| Example 6 | 1,000 | 4.7 | (0.134, 0.171) | 23.6 | 138.1 | 461 | 135.0 |
| Example 7 | 1,000 | 4.7 | (0.134, 0.171) | 23.6 | 138.1 | 461 | 148.3 |
| Example 8 | 1,000 | 4.3 | (0.135, 0.135) | 20.7 | 152.9 | 461 | 200.4 |
| Comparative Example 1 | 1,000 | 4.7 | (0.134, 0.193) | 22.9 | 118.5 | 462 | 45.0 |
| Comparative Example 2 | 1,000 | 4.3 | (0.199, 0.290) | 26.8 | 92.4 | 463 | 4.0 |
| Comparative Example 3 | 1,000 | 4.7 | (0.136, 0.205) | 24.6 | 120.6 | 464 | 35.0 |
| Comparative Example 4 | 1,000 | 4.7 | (0.134, 0.194) | 23.3 | 115.6 | 462 | 28.0 |

As shown in Table 2, the light-emitting devices of Examples 1 to 8 were each found to exhibit excellent color-conversion efficiency and long lifespan in a blue emission area, as compared with the light-emitting devices of Comparative Examples 1 to 4.

When the compound according to one or more embodiments is used in a light-emitting device, the device may have excellent (desired) driving voltage, efficiency, colorimetric purity, and/or lifespan.

As apparent from the foregoing description, a light-emitting device including the organometallic compound may have a low driving voltage, high efficiency, high colorimetric purity, and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A light-emitting device comprising:

a first electrode;

a second electrode facing the first electrode; and an interlayer between the first electrode and the second electrode, the interlayer comprising an emission layer, wherein the light-emitting device comprises an organometallic compound represented by Formula 1:

Formula 1

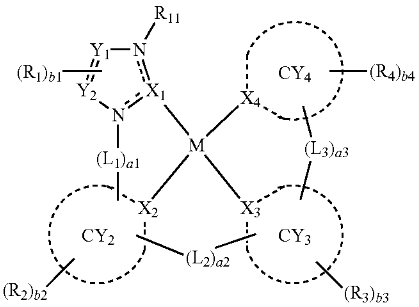

Formula 1A

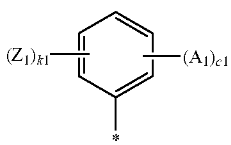

Formula 1B

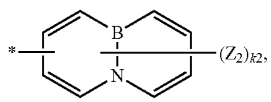

wherein in Formulae 1, 1A, and 1B,

M is platinum (Pt), palladium (Pd), copper (Cu), nickel (Ni), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ is C, and a bond between $X_1$ and M is a coordinate bond, $X_2$ to $X_4$, $Y_1$, and $Y_2$ are each independently C or N, one of a bond between $X_2$ and M, a bond between $X_3$ and M, and a bond between $X_4$ and M is a coordinate bond, and other two bonds are each a covalent bond, $CY_2$ to $CY_4$ are each independently a $C_3$-$C_{60}$ carbocyclic group or a $C_1$-$C_{60}$ heterocyclic group, $L_1$ to $L_3$ are each independently a single bond, *—O—*', *—S—*', *—Se—*', *—S(═O)$_2$—*', *—C($R_5$)($R_6$)—*', *—C($R_5$)═*', *═C($R_5$)—*', *—C($R_5$)═C($R_6$)—*', *—C(═O)—*', *—C(═S)—*', *—C≡C—*', *—B($R_5$)—*', *—N($R_5$)—*', *—P($R_5$)—*', *—Si($R_5$)($R_6$)—*', *—P(═O)($R_5$)—*', or *—Ge($R_5$)($R_6$)—*', a1 to a3 are each independently an integer from 1 to 3, $R_1$ to $R_6$ and $R_{11}$ are each independently a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), at least two groups of $R_1$ in a number of b1, $R_2$ in a number of b2, $R_3$ in a number of b3, $R_4$ in a number of b4, $R_5$, or $R_6$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{11}$, $R_1$ in a number of b1, $R_2$ in a number of b2, $R_3$ in a number of b3, or $R_4$ in a number of b4 is a group represented by Formula 1A, b1 is 1 or 2, b2 to b4 are each independently an integer from 1 to 10, $A_1$ is a group represented by Formula 1B, c1 is an integer from 1 to 5, $Z_1$ and $Z_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), k1 is an integer from 0 to 4, k2 is an integer from 1 to 7,

* and *' each indicate a binding site to an adjacent atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the first electrode is an anode, the second electrode is a cathode, the interlayer further comprises a hole transport region between the first electrode and the emission layer, and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or a combination thereof.

3. The light-emitting device of claim 1, wherein the emission layer comprises the organometallic compound represented by Formula 1.

4. The light-emitting device of claim 1, wherein the emission layer comprises a host and a dopant, and the dopant comprises the organometallic compound represented by Formula 1.

5. The light-emitting device of claim 4, wherein the host comprises a hole transporting host and an electron transporting host.

6. The light-emitting device of claim 4, wherein the host comprises an electron transporting host represented by Formula 2 and a hole transporting host represented by Formula 3:

Formula 2

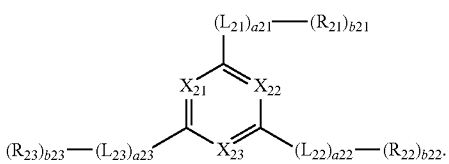

Formula 3

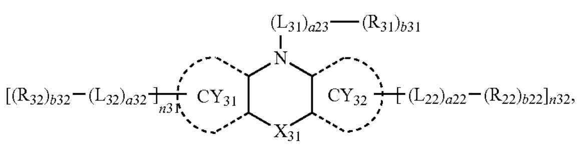

and wherein, in Formula 2, $X_{21}$ is N or C-$(L_{24})_{a24}$-$(R_{24})_{b24}$, $X_{22}$ is N or C-$(L_{25})_{a25}$-$(R_{25})_{b25}$, and $X_{23}$ is N or C-$(L_{26})_{a26}$-$(R_{26})_{b26}$, $X_{31}$ is selected from a single bond, O, S, N($R_{34}$), C($R_{34}$)($R_{35}$), and Si($R_{34}$)($R_{35}$), $CY_{31}$ and $CY_{32}$ are each independently a $C_3$-$C_{60}$ carbocyclic group or a $C_1$-$C_{60}$ heterocyclic group, $L_{21}$ to $L_{26}$ and $L_{31}$ to $L_{33}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a26 and a31 to a33 are each independently an integer from 0 to 5, $R_{21}$ to $R_{26}$ and $R_{31}$ to $R_{35}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b26, b31 to b33, n31, and n32 are each independently an integer from 1 to 5, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

7. The light-emitting device of claim 1, wherein the light-emitting device further comprises at least one selected from a first capping layer outside the first electrode and a second capping layer outside the second electrode, and the at least one selected from the first capping layer and the second capping layer has a refractive index of about 1.6 or higher at a wavelength of 589 nanometers (nm).

8. An electronic apparatus comprising the light-emitting device of claim 1.

9. The electronic apparatus of claim 8, further comprising a color filter, a color-conversion layer, a touchscreen layer, a polarization layer, or any combination thereof.

10. An organometallic compound represented by Formula 1:

Formula 1

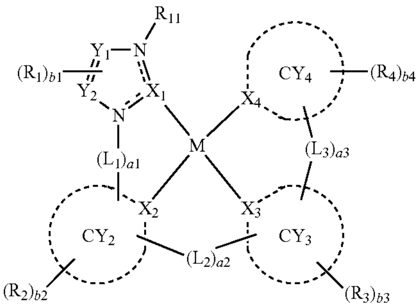

Formula 1A

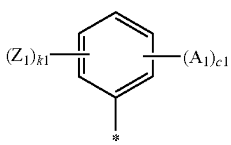

Formula 1B

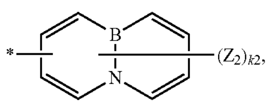

wherein in Formulae 1, 1A, and 1B,

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ is C, and a bond between $X_1$ and M is a coordinate bond, $X_2$ to $X_4$, $Y_1$, and $Y_2$ are each independently C or N, one of a bond between $X_2$ and M, a bond between $X_3$ and M, and a bond between $X_4$ and M is a coordinate bond, and other two bonds are each a covalent bond, $CY_2$ to $CY_4$ are each independently a $C_3$-$C_{60}$ carbocyclic group or a $C_1$-$C_{60}$ heterocyclic group, $L_1$ to $L_3$ are each independently a single bond, *—O—*', *—S—*', *—Se—*', *—S(=O)$_2$—*', *—C($R_5$)($R_6$)—*', *—C($R_5$)=*', *=C($R_5$)—*', *—C($R_5$)=C($R_6$)—*', *—C(=O)—*', *—C(=S)—*', *—C≡C—*', *—B($R_5$)—*', *—N($R_5$)—*', *—P($R_5$)—*', *—Si($R_5$)($R_6$)—*', *—P(=O)($R_5$)—*', or *—Ge($R_5$)($R_6$)—*', a1 to a3 are each independently an integer from 1 to 3, $R_1$ to $R_6$ and $R_{11}$ are each independently a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), at least two groups of $R_1$ in a number of b1, $R_2$ in a number of b2, $R_3$ in a number of b3, $R_4$ in a number of b4, $R_5$, or $R_6$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{11}$, $R_1$ in a number of b1, $R_2$ in a number of b2, $R_3$ in a number of b3, or $R_4$ in a number of b4 is a group represented by Formula 1A, b1 is 1 or 2, b2 to b4 are each independently an integer from 1 to 10, $A_1$ is a group represented by Formula 1B, c1 is an integer from 1 to 5, $Z_1$ and $Z_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), k1 is an integer from 0 to 4, k2 is an integer from 1 to 7,

* and *' each indicate a binding site to an adjacent atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

11. The organometallic compound of claim 10, wherein
$CY_2$ is a group represented by one of Formulae CY2-1 to CY2-9,
$CY_3$ is a group represented by one of Formulae CY3-1 to CY3-10, and/or
$CY_4$ is a group represented by one of Formulae CY4-1 to CY4-9:
CY2-1
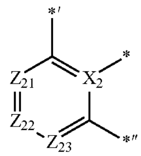
CY2-2
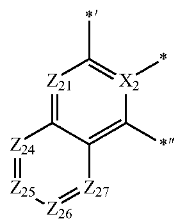
CY2-3
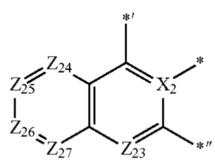
CY2-4
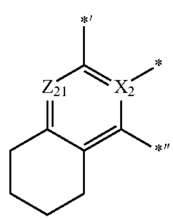
CY2-5
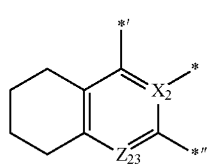
CY2-6
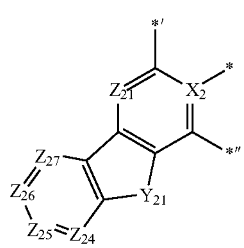
-continued
CY2-7
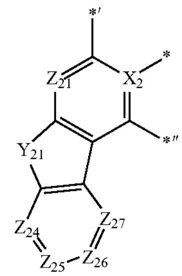
CY2-8
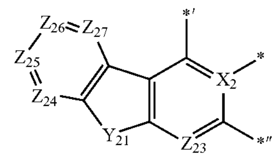
CY2-9
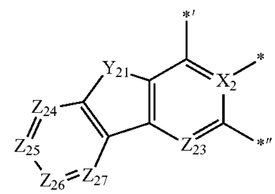
CY3-1
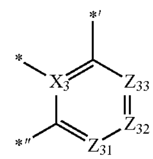
CY3-2
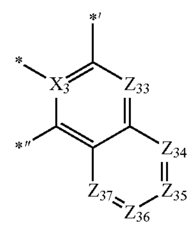
CY3-3
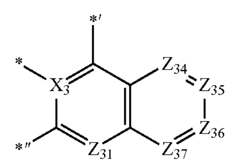
CY3-4
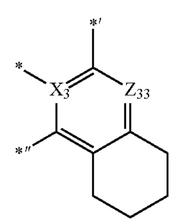
CY3-5
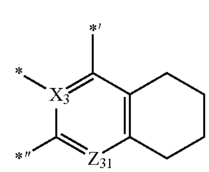

-continued

CY3-6

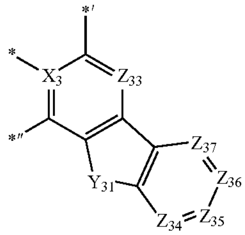

CY3-7

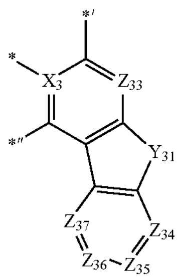

CY3-8

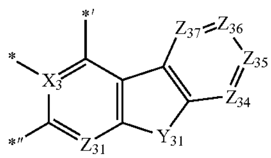

CY3-9

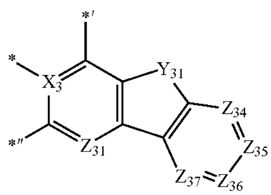

CY3-10

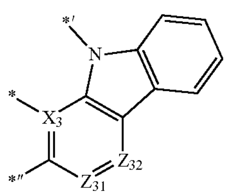

CY4-1

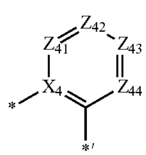

CY4-2

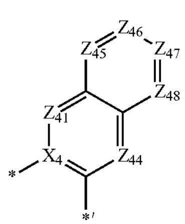

CY4-3

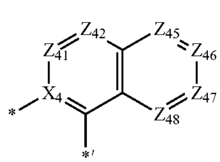

-continued

CY4-4

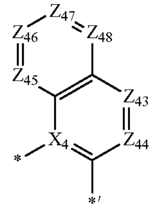

CY4-5

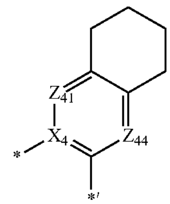

CY4-6

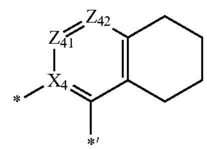

CY4-7

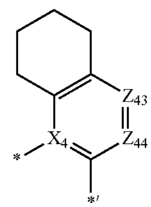

CY4-8

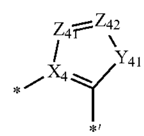

CY4-9

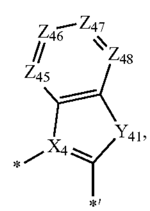

and wherein, in Formulae CY2-1 to CY2-9, CY3-1 to CY3-10, and CY4-1 to CY4-9, $Z_{21}$ to $Z_{27}$, $Z_{31}$ to $Z_{37}$, and $Z_{41}$ to $Z_{48}$ are each independently C or N, $Y_{21}$, $Y_{31}$, and $Y_{41}$ are each independently N, O, S, C, or Si, $X_2$ to $X_4$ are respectively understood by referring to the descriptions of $X_2$ to $X_4$ in Formula 1,

* indicates a binding site to M, and

*' and *" each indicate a binding site to an adjacent atom.

12. The organometallic compound of claim 10, wherein $L_1$ is a single bond, $L_2$ is *—O—* 'or *—S—*', and $L_3$ is *—N($R_5$)—**.

13. The organometallic compound of claim 10, wherein the group represented by Formula 1A is represented by one of Formulae 1A-1 to 1A-14:

1A-1

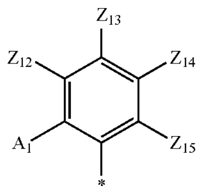

1A-2

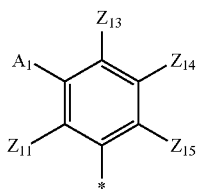

1A-3

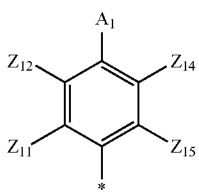

1A-4

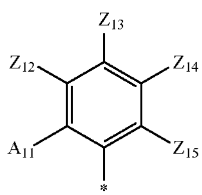

1A-5

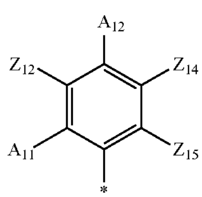

1A-6

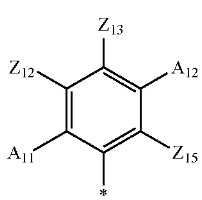

1A-7

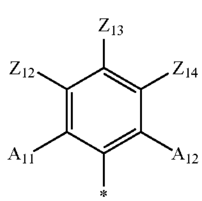

-continued 1A-8

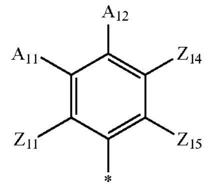

1A-9

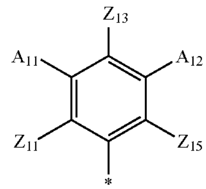

1A-10

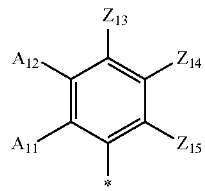

1A-11

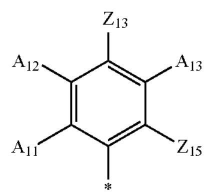

1A-12

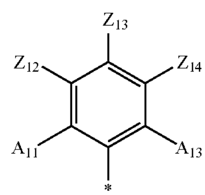

1A-13

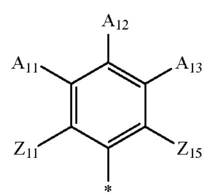

1A-14

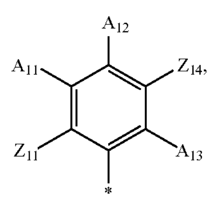

and wherein, in Formulae 1A-1 to 1A-14, $Z_{11}$ to $Z_{15}$ are each independently understood by referring to the description of $Z_1$ in Formula 1A, $A_{11}$ to $A_{13}$ are each independently understood by referring to the description of $A_1$ in Formula 1A, $A_1$ is understood by referring to the description of $A_1$ in Formula 1A, and

* indicates a binding site to an adjacent atom.

14. The organometallic compound of claim 10, wherein the group represented by Formula 1A is represented by Formula 1A-7-1:

1A-7-1

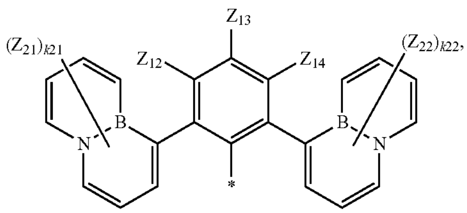

and wherein, in Formula 1A-7-1, $Z_{12}$ to $Z_{14}$ are each independently understood by referring to the description of $Z_1$ in Formula 1A, $Z_{21}$ and $Z_{22}$ are each independently understood by referring to the description of $Z_2$ in Formula 1B, k21 and k22 are each independently an integer from 1 to 7, and

* indicates a binding site to an adjacent atom.

15. The organometallic compound of claim 10, wherein at least one of $R_1$ in a number of b1, $R_2$ in a number of b2, $R_3$ in a number of b3, $R_4$ in a number of b4, $R_5$, $R_6$, or $R_{11}$ is deuterium, —$CH_2D$, —$CHD_2$, —$CD_3$, a phenyl group substituted with at least one deuterium, or a group represented by one of Formulae 10-2 to 10-7:

10-2

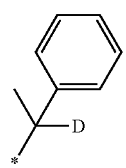

10-3

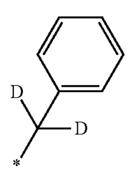

10-4

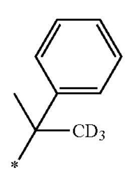

10-5

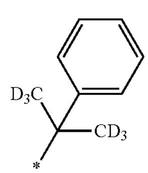

10-6

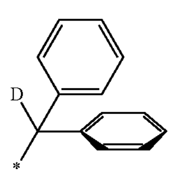

-continued 10-7

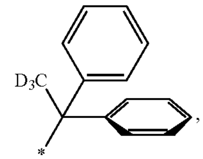

and wherein, in Formulae 10-2 to 10-7,

"D" represents deuterium, and

* indicates a binding site to an adjacent atom.

16. The organometallic compound of claim 10, wherein a moiety represented by

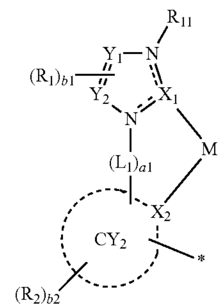

in Formula 1 is a group represented by Formula $L_1$-1 or $L_1$-2:

L1-1

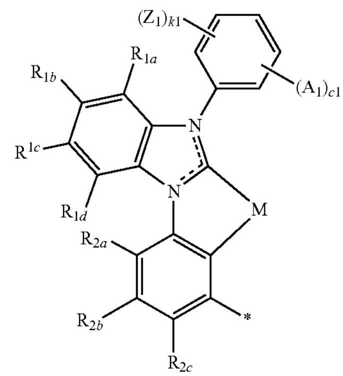

L1-2

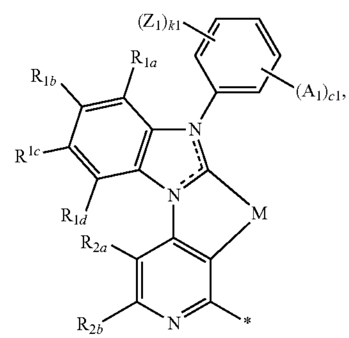

and wherein, in Formulae $L_1$-1 and $L_1$-2, $R_{1a}$ to $R_{1d}$ are each independently understood by referring to the description of $R_1$ in Formula 1, $R_{2a}$ to $R_{2c}$ are each independently understood by referring to the description of $R_2$ in Formula 1, M, $A_1$, c1, $Z_1$, and k1 are respectively understood by referring to the descriptions of M, $A_1$, c1, $Z_1$, and k1 in Formulae 1 and 1A, and

* indicates a binding site to $L_2$.

17. The organometallic compound of claim 10, wherein a moiety represented by

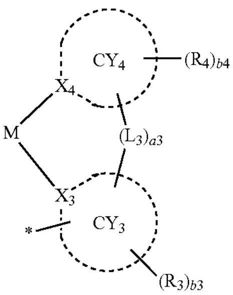

in Formula 1 is a group represented by Formula $L_2$-1 or Formula $L_2$-2:

L2-1

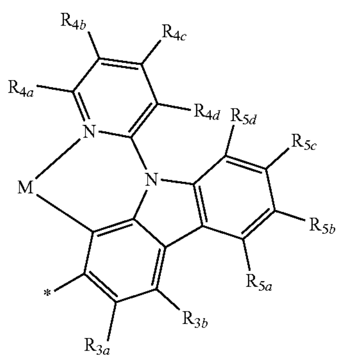

L2-2

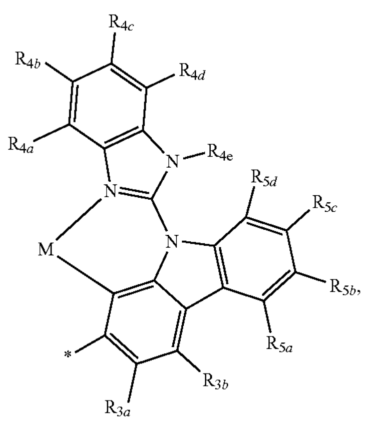

and wherein, in Formulae $L_2$-1 and $L_2$-2, $R_{3a}$ and $R_{3b}$ are each independently understood by referring to the description of $R_3$ in Formula 1, $R_{4a}$ to $R_{4e}$ are each independently understood by referring to the description of $R_4$ in Formula 1, $R_{5a}$ to $R_{5d}$ are each independently understood by referring to the description of $R_{10a}$ in Formula 1, M is understood by referring to the description of M in Formula 1, and

* indicates a binding site to $L_2$.

18. The organometallic compound of claim 10, wherein the organometallic compound is represented by any one selected from Formulae 1-1 to 1-4:

1-1

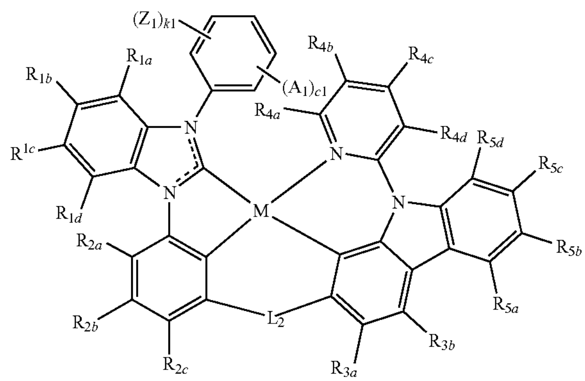

1-2

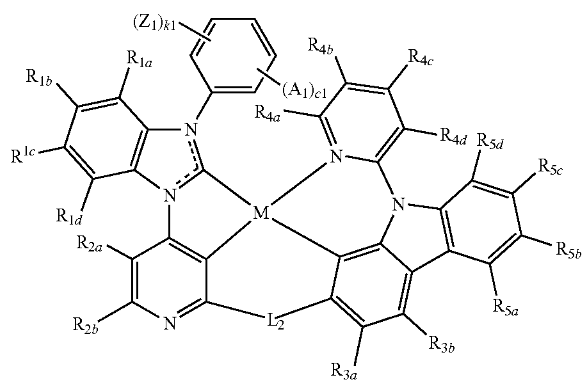

1-3

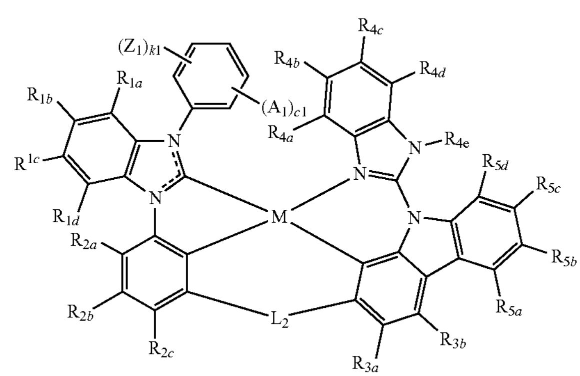

-continued 1-4

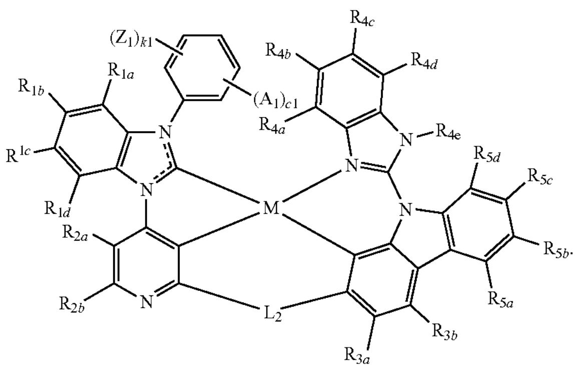

wherein, in Formulae 1-1 to 1-4,

M, $L_2$, $A_1$, c1, $Z_1$, and k1 are respectively understood by referring to the descriptions of M, $L_2$, $A_1$, c1, $Z_1$, and k1 in Formulae 1 and 1A, $R_{1a}$ to $R_{1d}$, $R_{2a}$ to $R_{2c}$, $R_{3a}$, $R_{3b}$, $R_{4a}$ to $R_{4e}$, and $R_{5a}$ to $R_{5d}$ are each independently hydrogen, deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, a methyl group, an ethyl group, a propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, an n-hexyl group, an iso-hexyl group, a sec-hexyl group, a tert-hexyl group, or a group represented by one selected from the group consisting of Formulae 9-1 to 9-31 and 10-1 to 10-7:

9-1

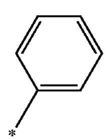

9-2

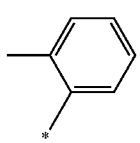

9-3

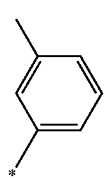

9-4

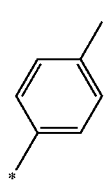

-continued 9-5

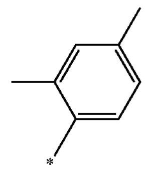

9-6

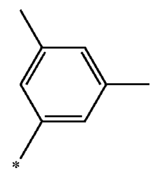

9-7

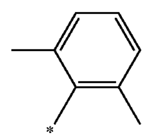

9-8

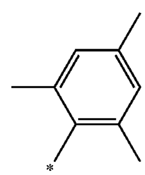

9-9

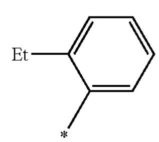

9-10

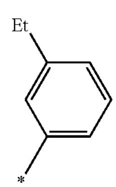

9-11

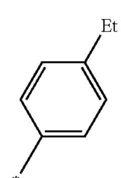

9-12

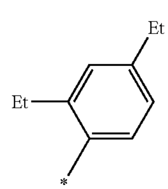

-continued
9-13
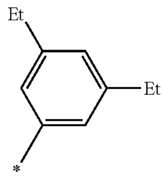
9-14
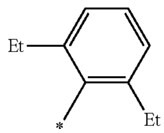
9-15
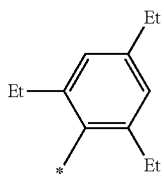
9-16
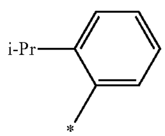
9-17
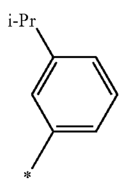
9-18
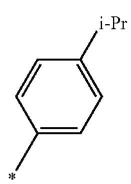
9-19
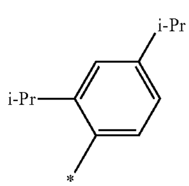
9-20
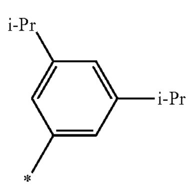
9-21
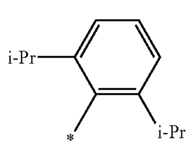
-continued
9-22
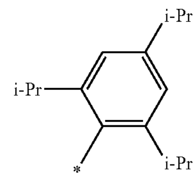
9-23
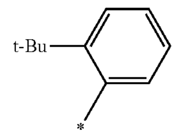
9-24
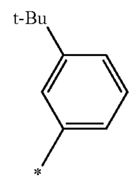
9-25
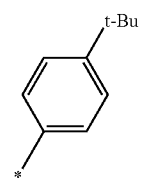
9-26
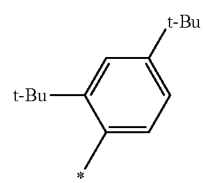
9-27
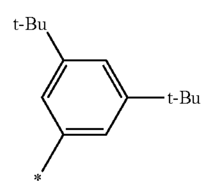
9-28
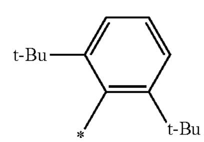
9-29
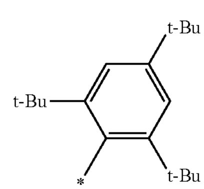

-continued 9-30

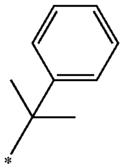

9-31

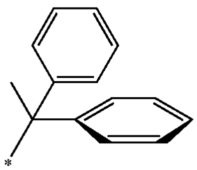

10-1

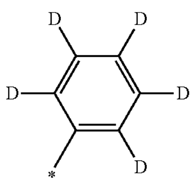

10-2

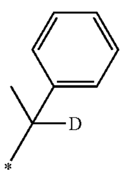

10-3

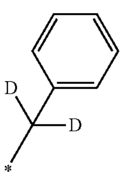

10-4

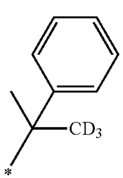

10-5

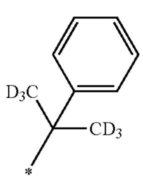

10-6

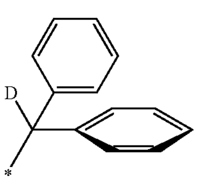

-continued 10-7

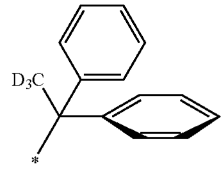

and wherein, in Formulae 9-1 to 9-31 and 10-1 to 10-7,

"Et" represents an ethyl group,

"i-Pr" represents an iso-propyl group,

"t-Bu" represents a tert-butyl group,

"D" represents deuterium, and

* indicates a binding site to an adjacent atom.

19. The organometallic compound of claim 18, wherein, in Formulae 1-1 to 1-4, at least one of $R_{1a}$ to $R_{1d}$, $R_{2a}$ to $R_{2c}$, $R_{3a}$, $R_{3b}$, $R_{4a}$ to $R_{4e}$, or $R_{5a}$ to $R_{5d}$ is deuterium, —$CH_2D$, —$CHD_2$, —$CD_3$, or a group represented by one of Formulae 10-1 to 10-7:

10-1

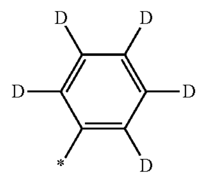

10-2

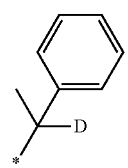

10-3

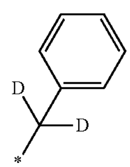

10-4

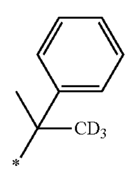

10-5

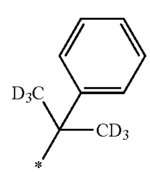

10-6

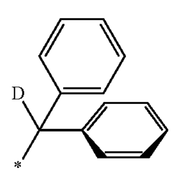

-continued
10-7
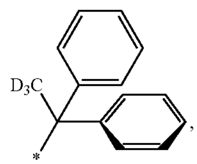
and
wherein, in Formulae 10-1 to 10-7,
"D" represents deuterium, and
* indicates a binding site to an adjacent atom.
20. The organometallic compound of claim 10, wherein the organometallic compound is represented by one of Compounds BD01 to BD210:
BD01
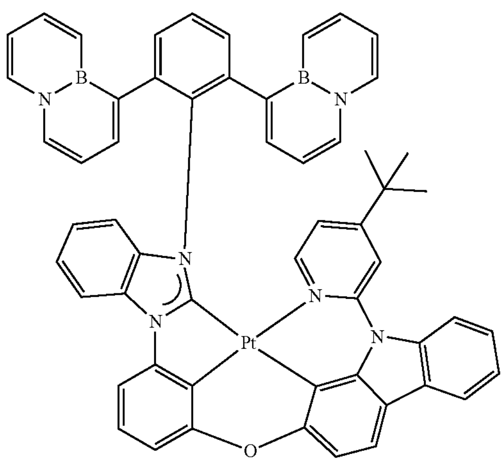
BD02
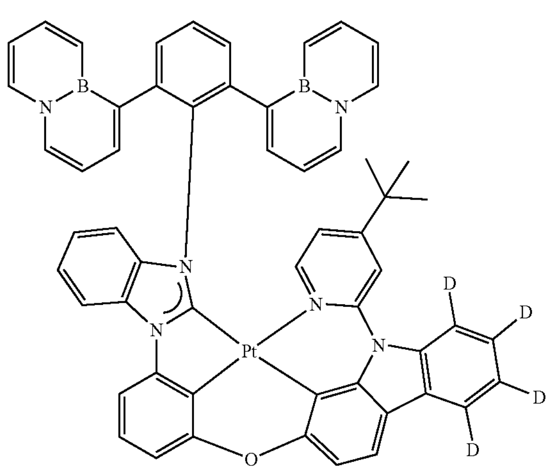
-continued
BD03
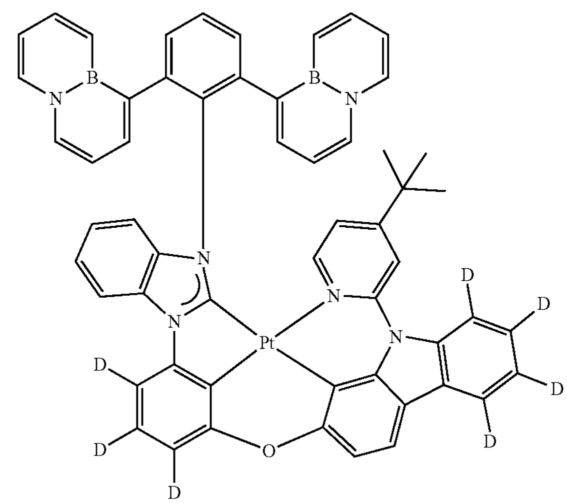
BD04
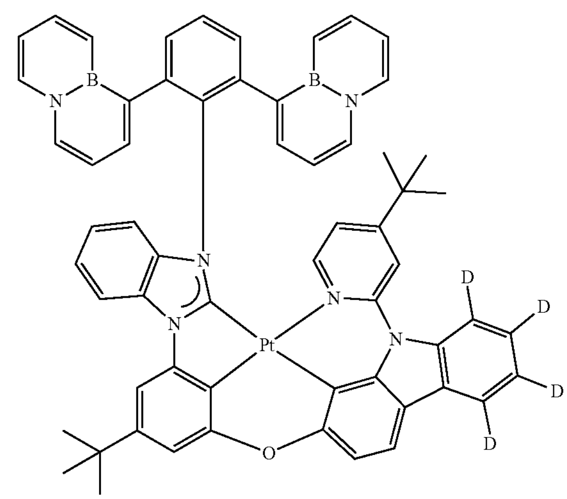
BD05
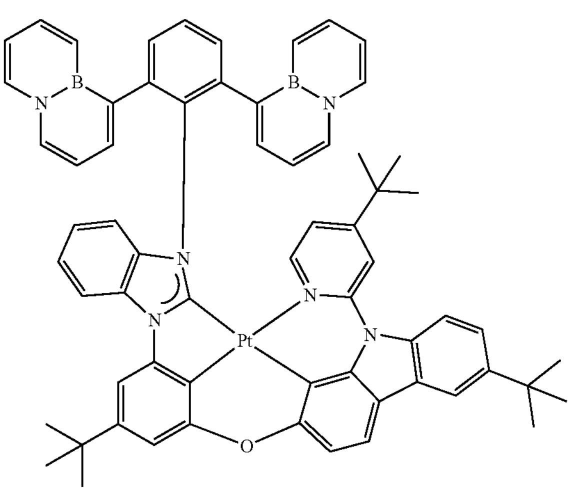

-continued
BD06
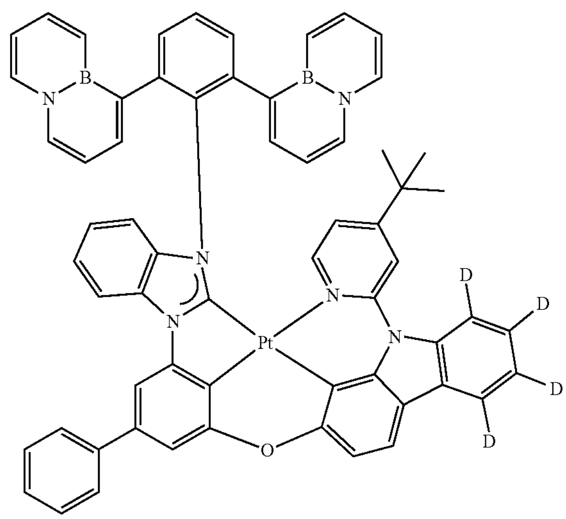
BD07
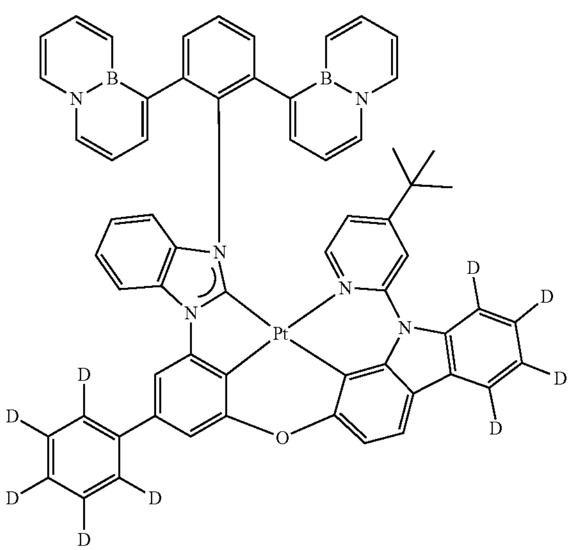
BD08
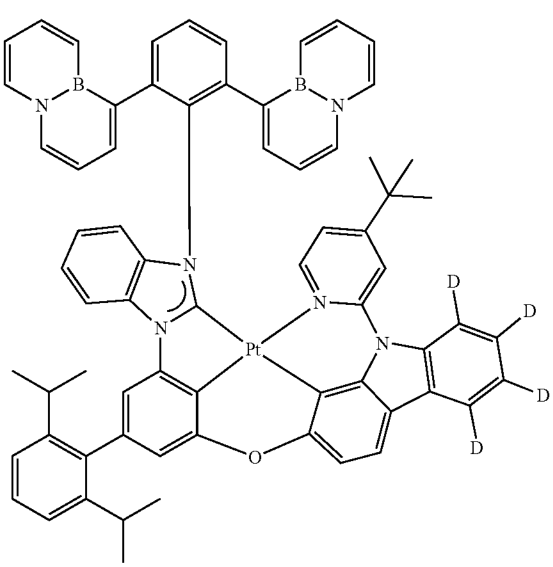
-continued
BD09
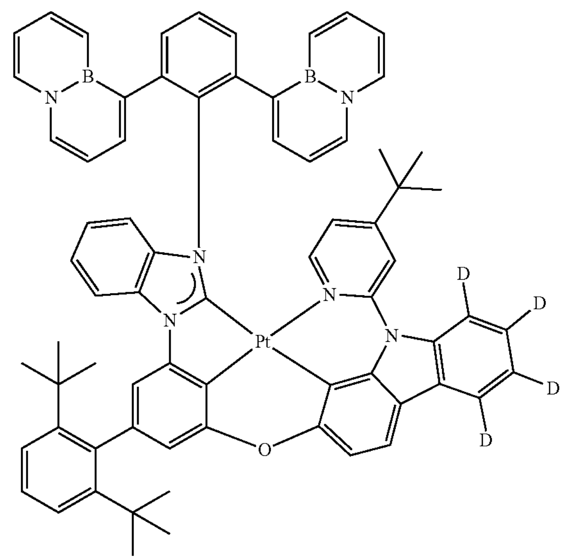
BD10
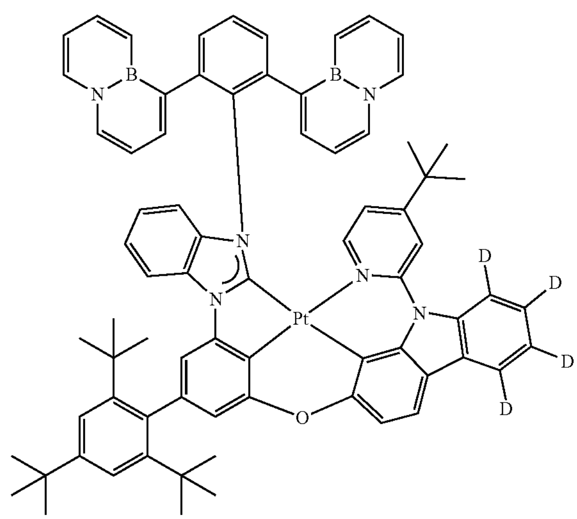
BD11
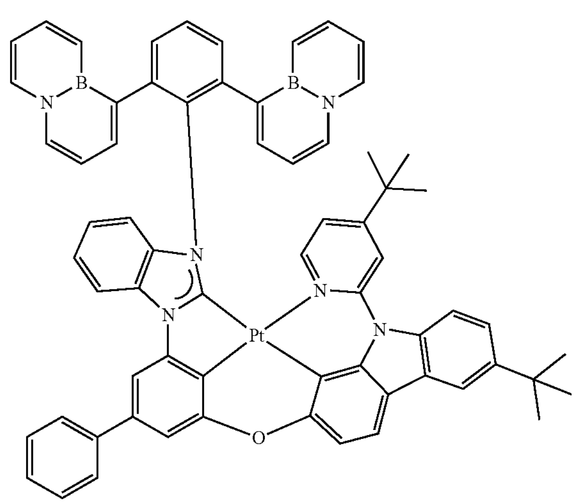

BD12
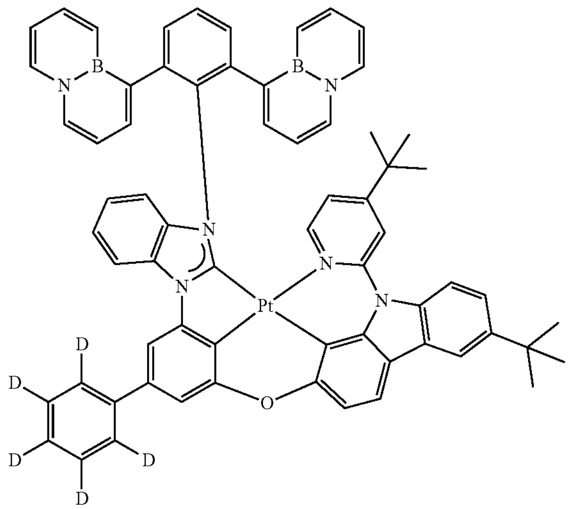
BD13
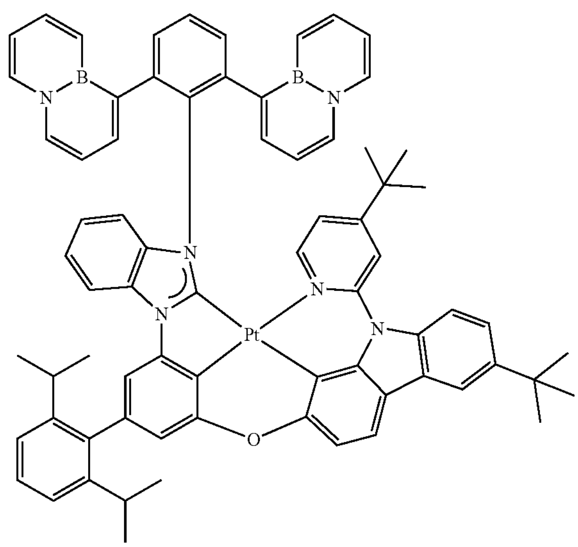
BD14
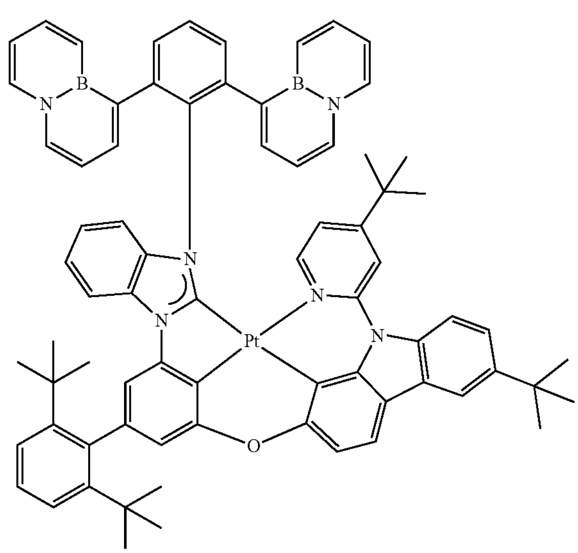
BD15
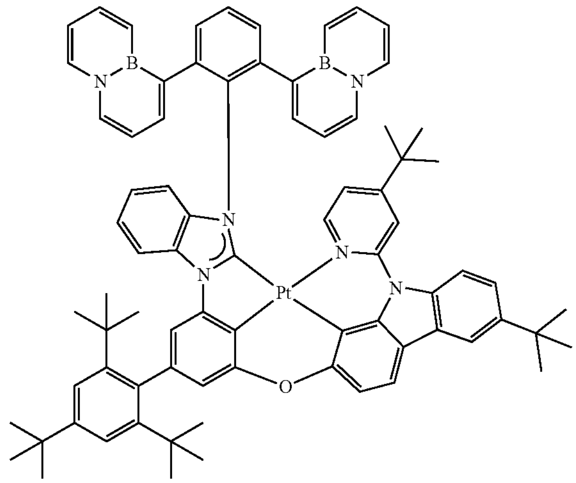
BD16
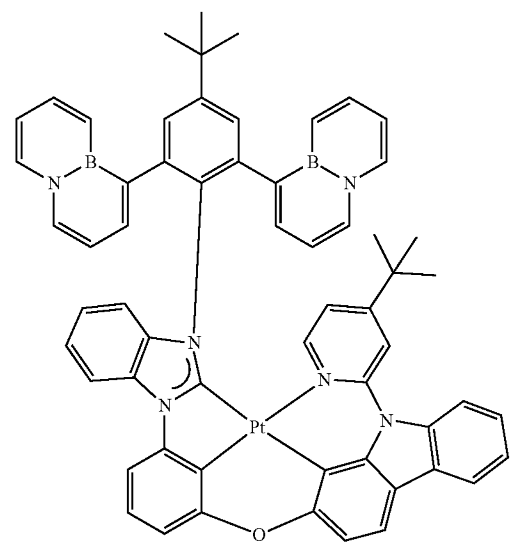
BD17
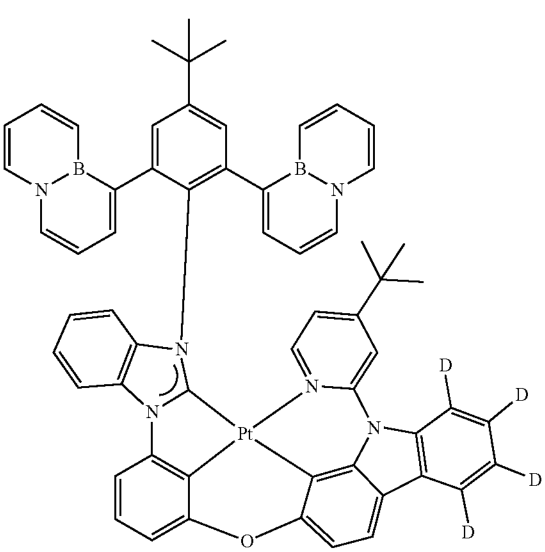

-continued
BD18
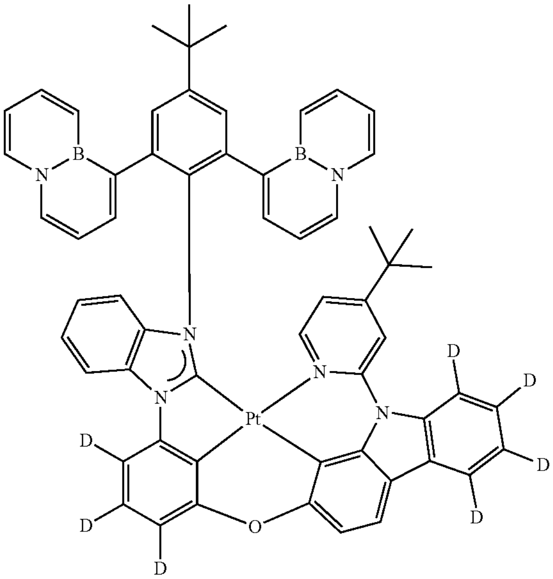
BD19
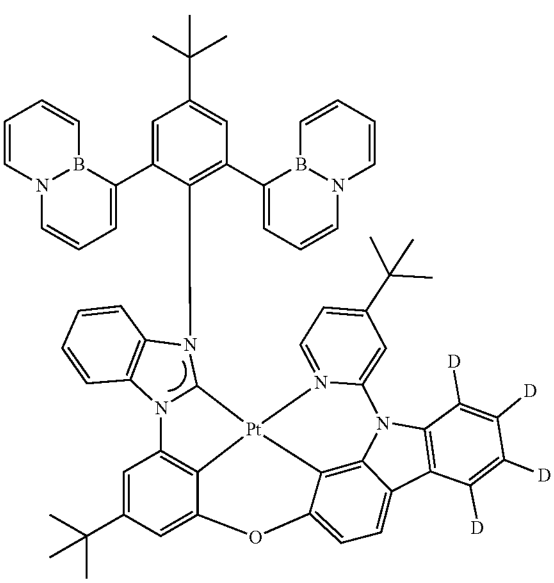
-continued
BD20
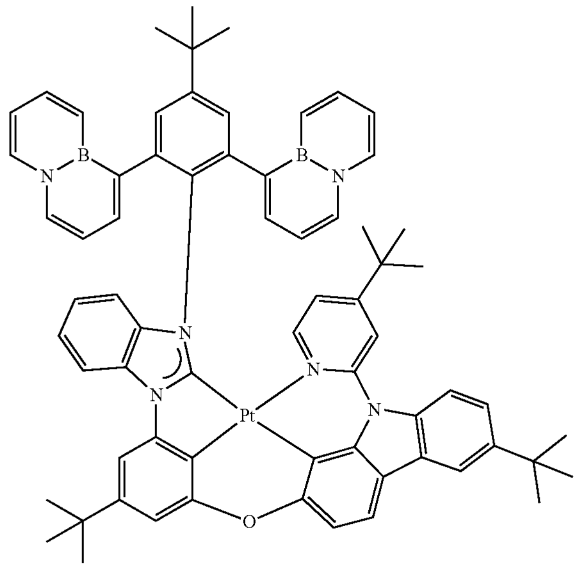
BD21
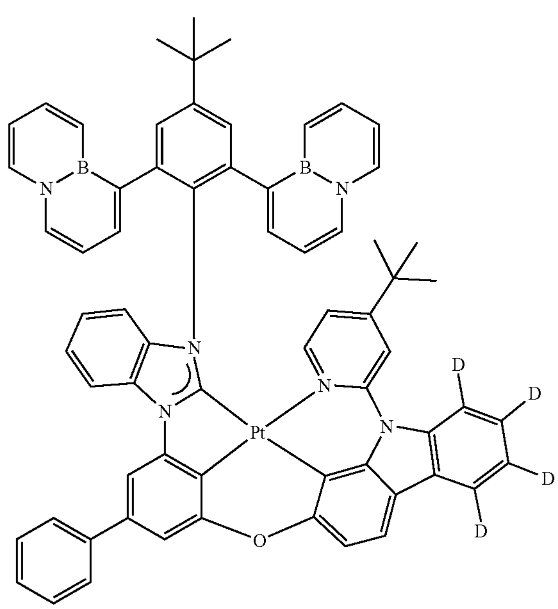

-continued
BD22
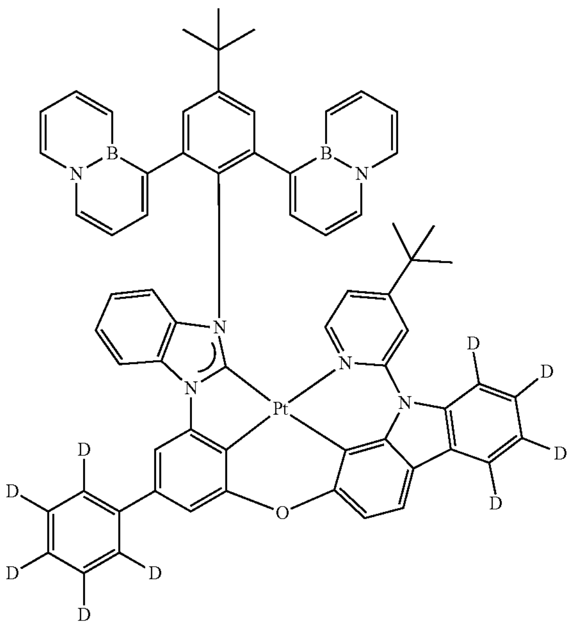
BD23
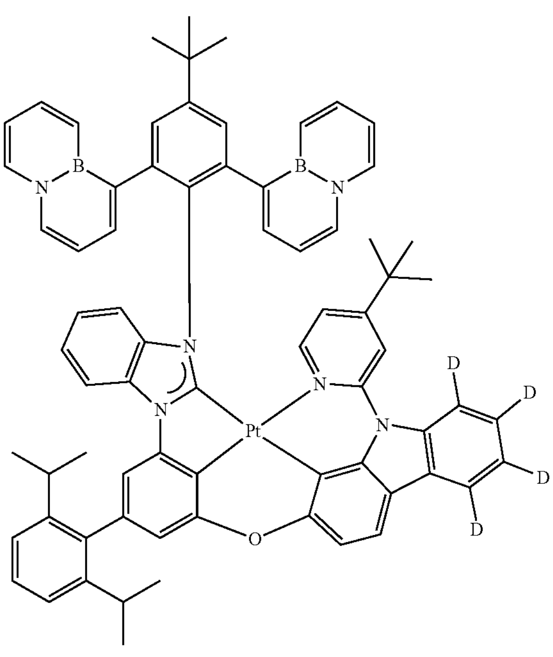
-continued
BD24
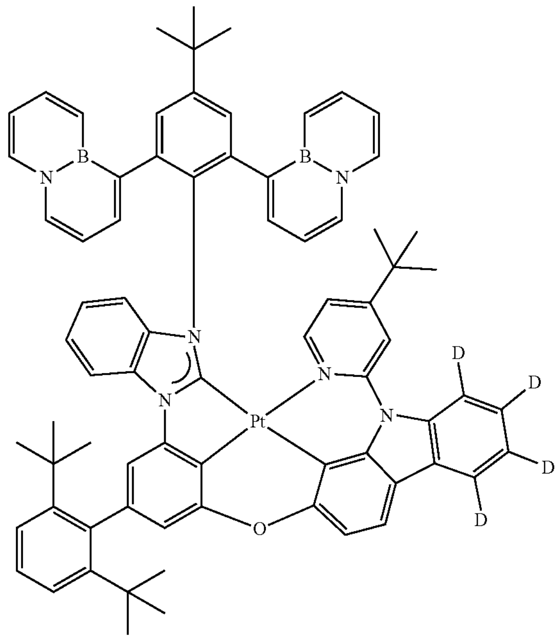
BD25
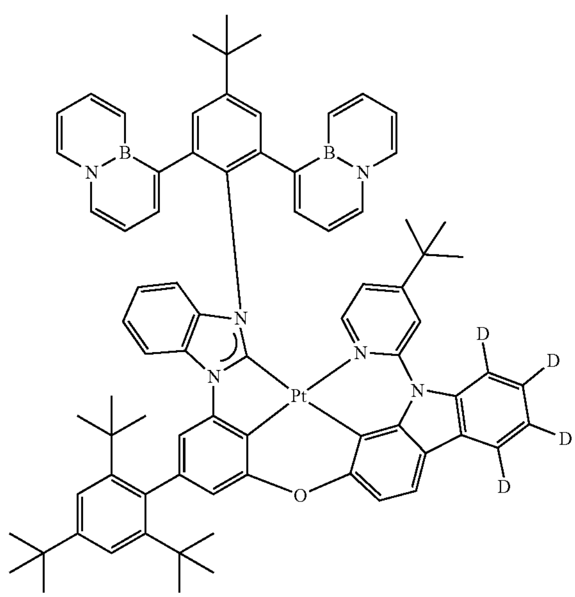

-continued
BD26
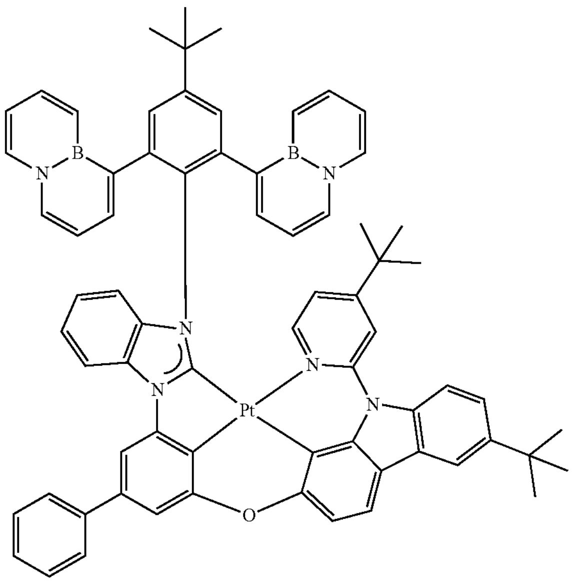
BD27
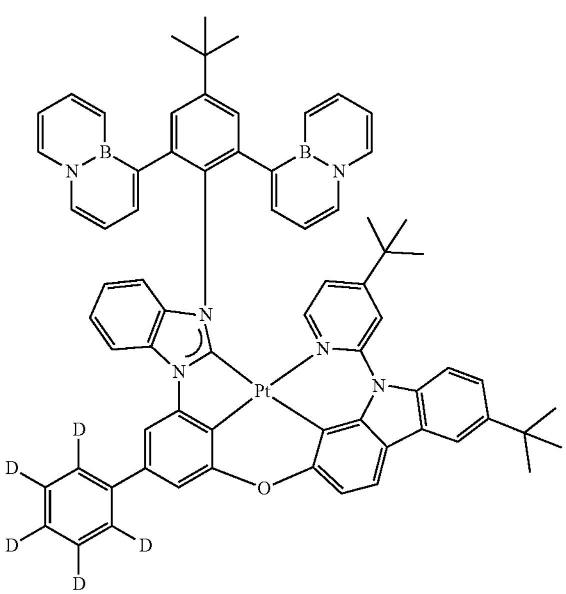
-continued
BD28
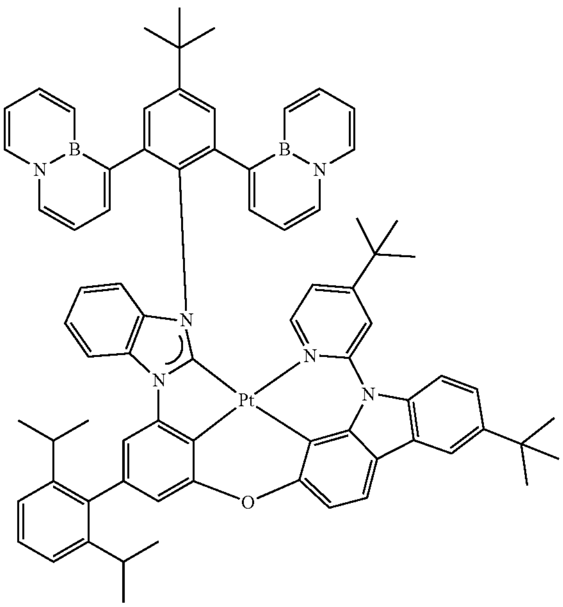
BD29
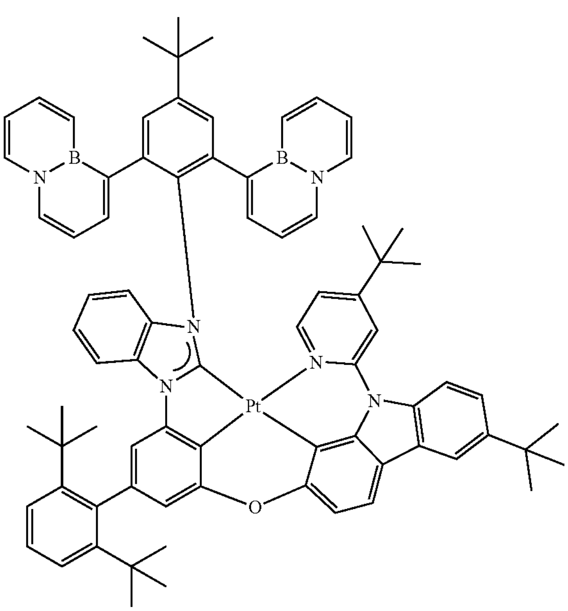

-continued
BD30
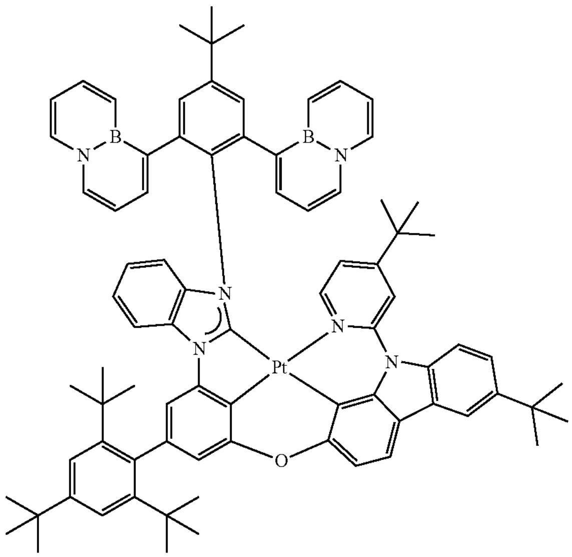
BD31
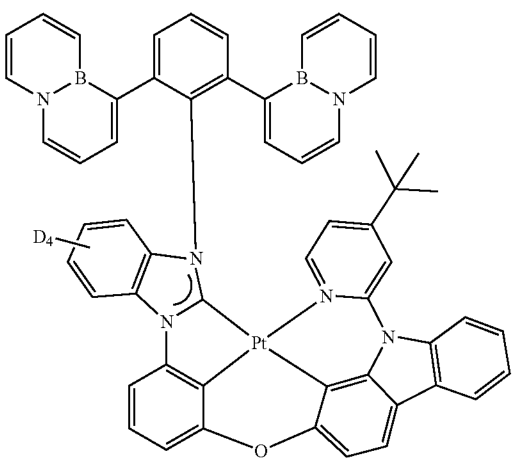
BD32
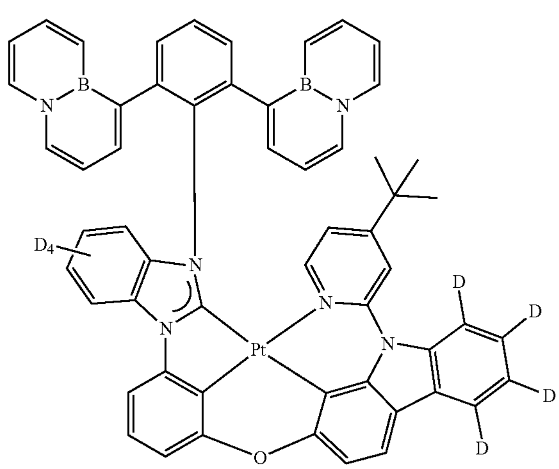
-continued
BD33
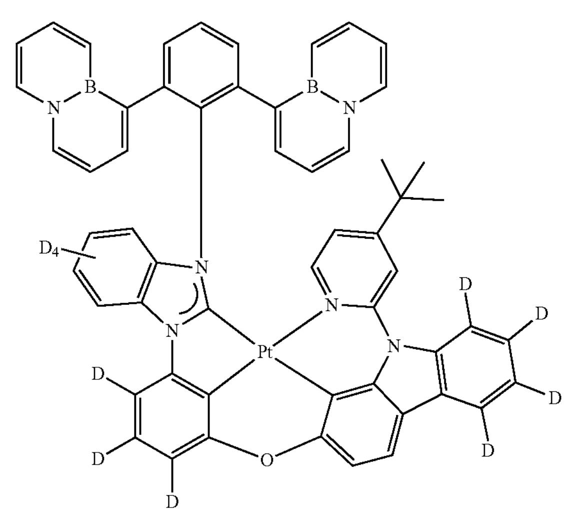
BD34
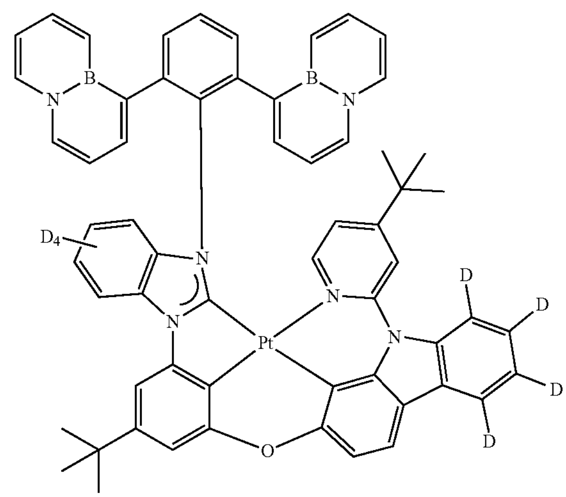
BD35
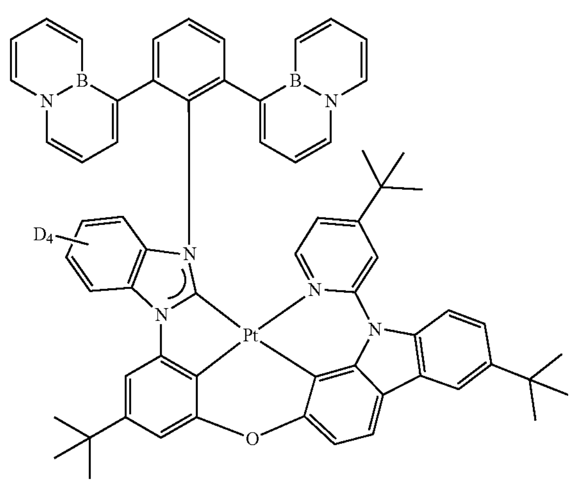

-continued
BD36
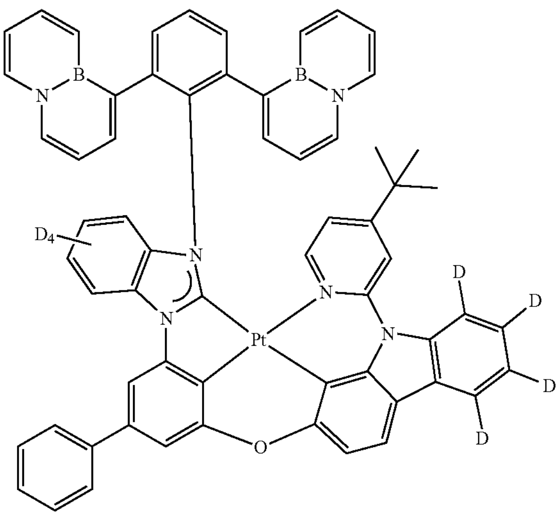
BD37
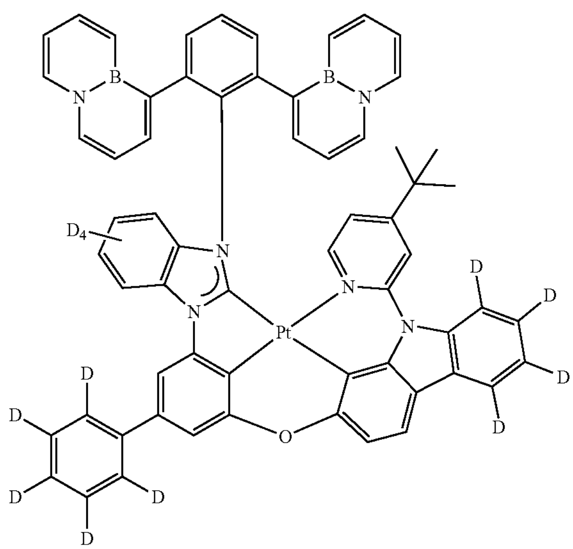
BD38
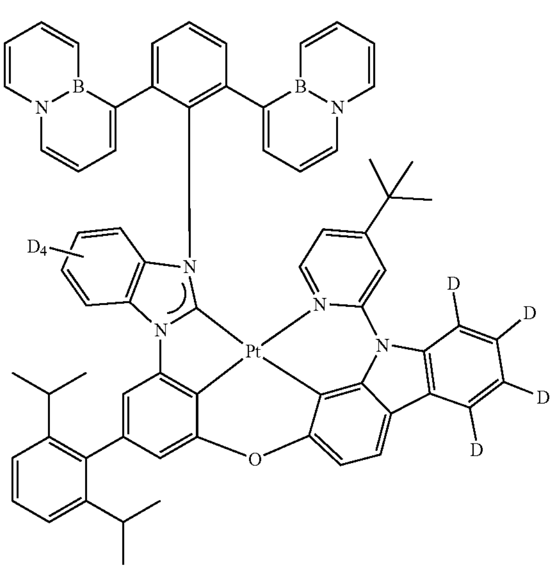
-continued
BD39
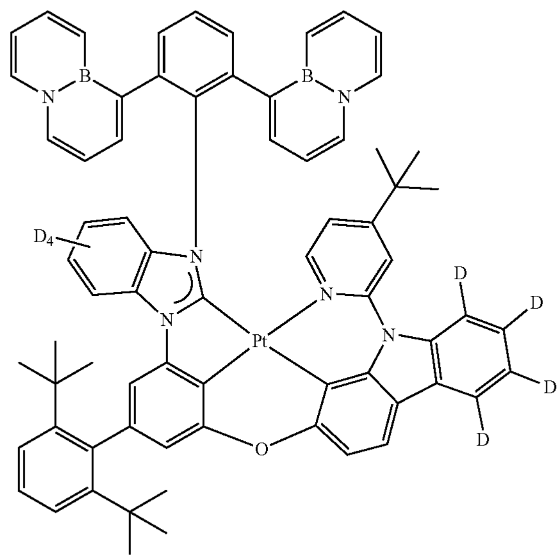
BD40
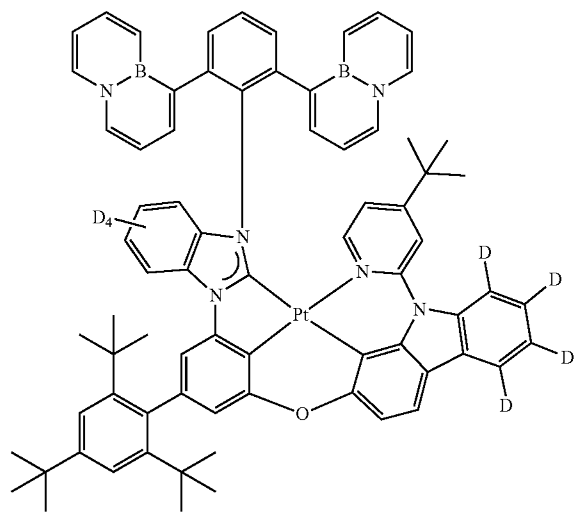
BD41
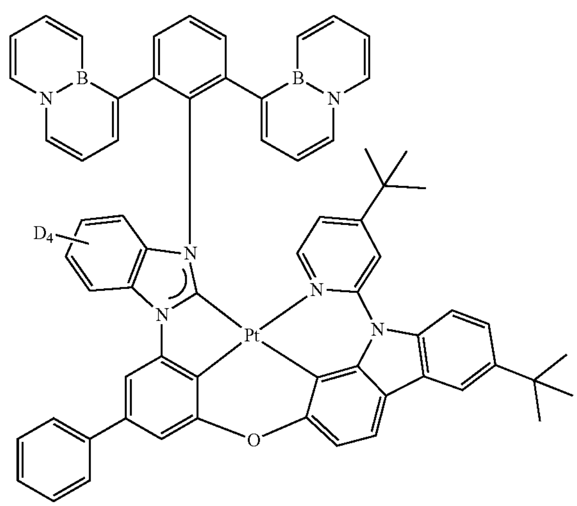

BD42
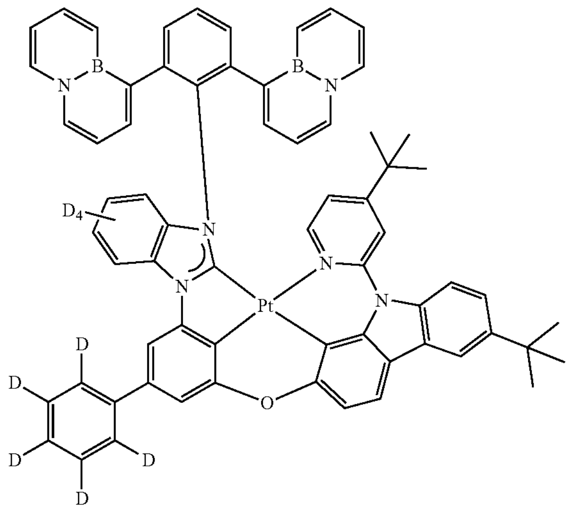
BD43
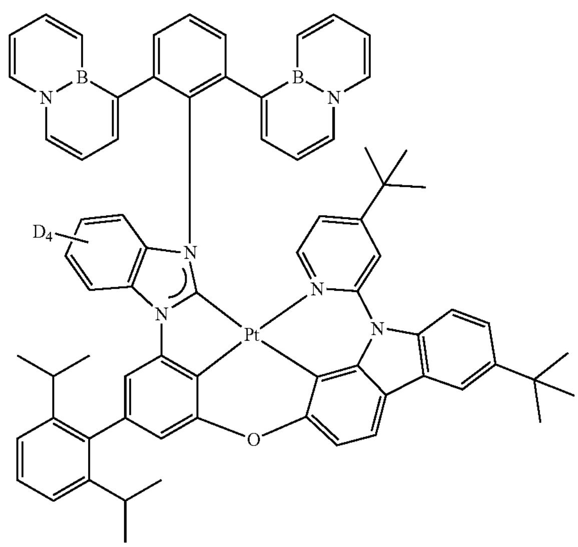
BD44
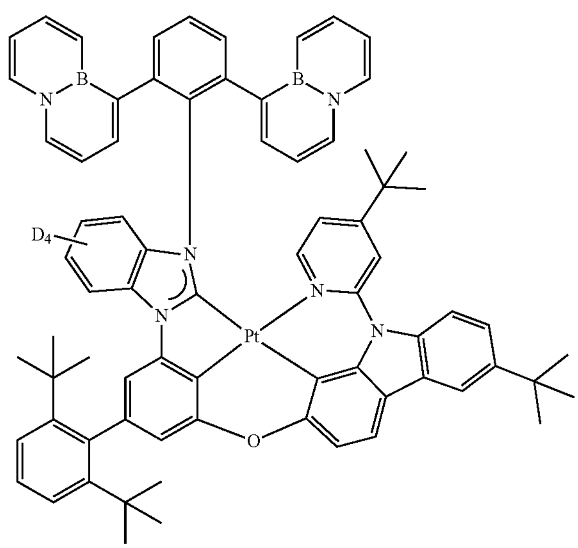
BD45
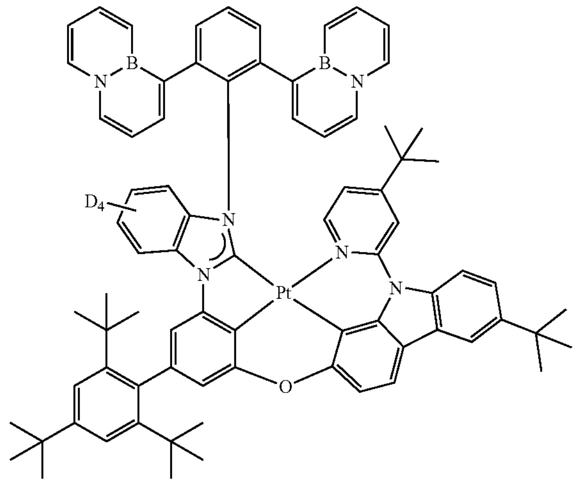
BD46
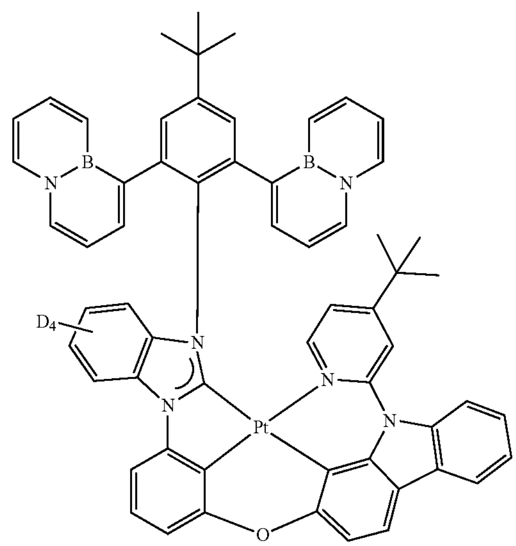
BD47
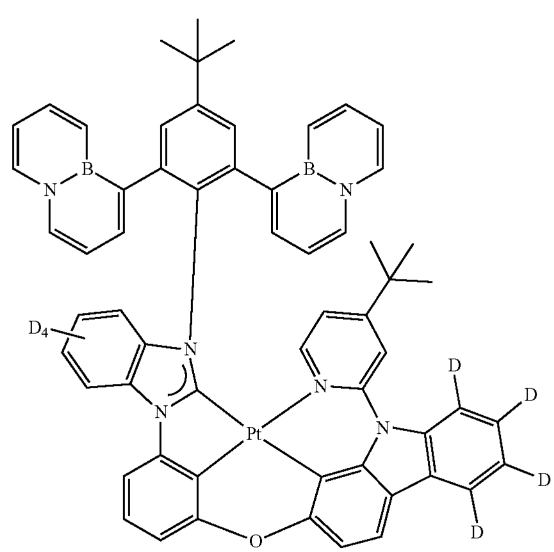

BD48
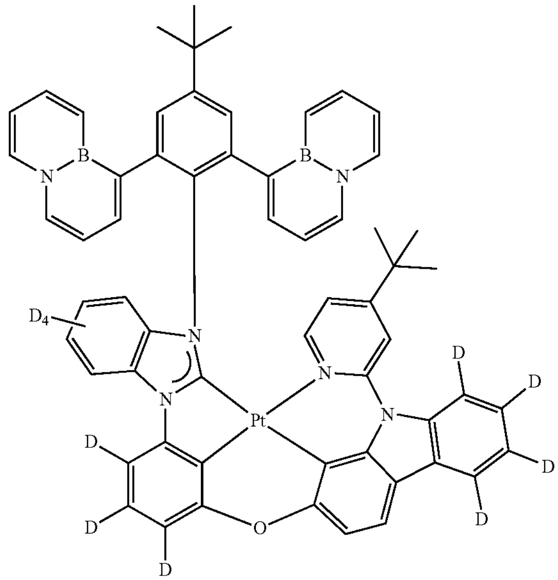
BD49
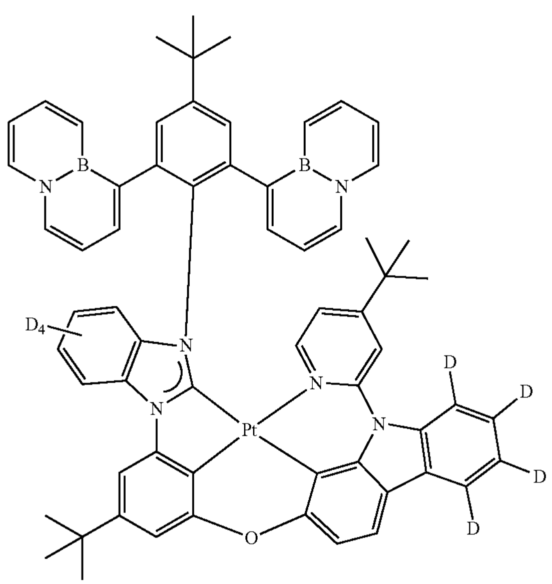
BD50
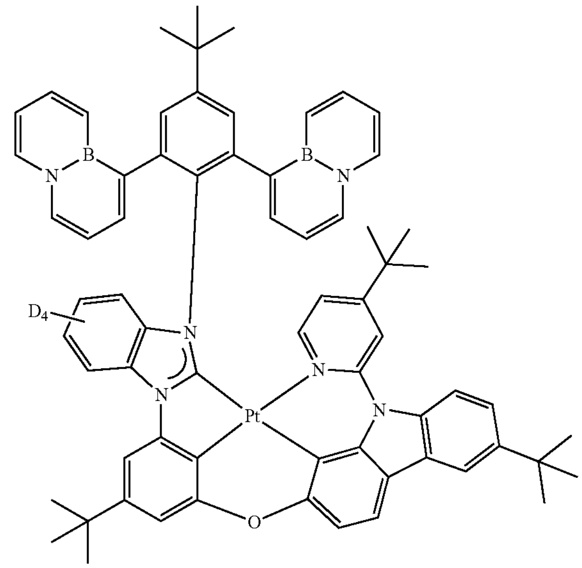
BD51
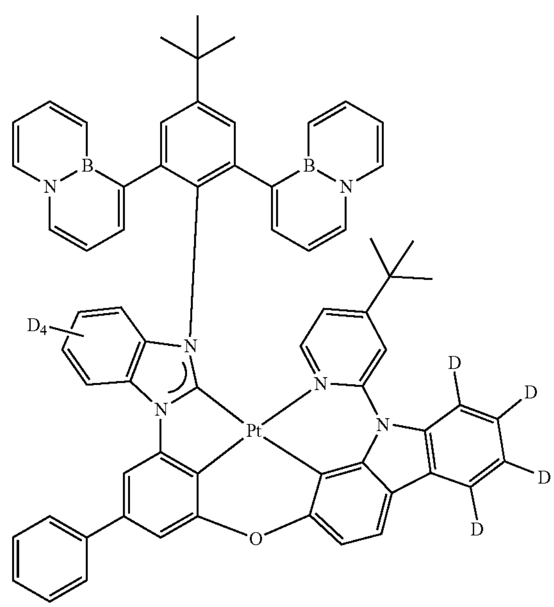

-continued
BD52
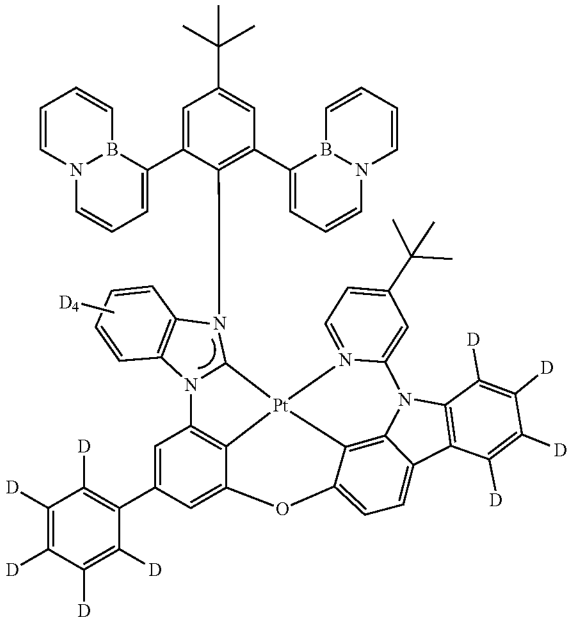
BD53
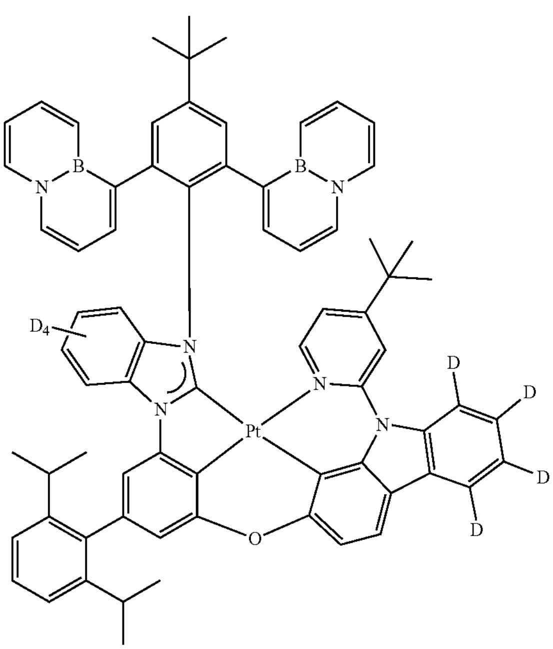
-continued
BD54
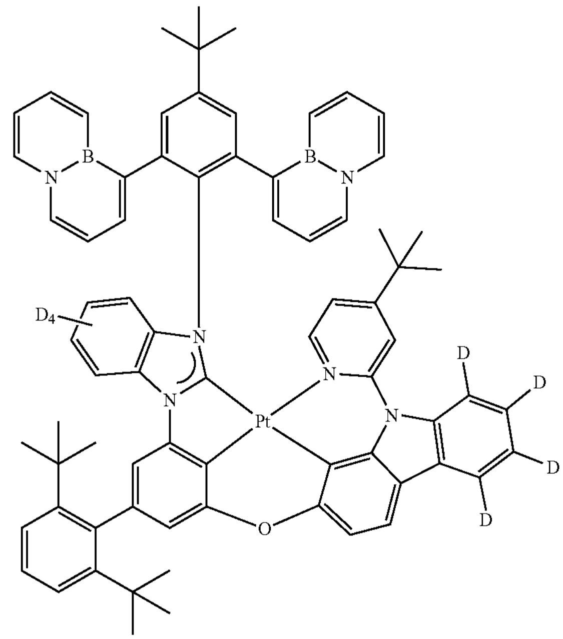
BD55
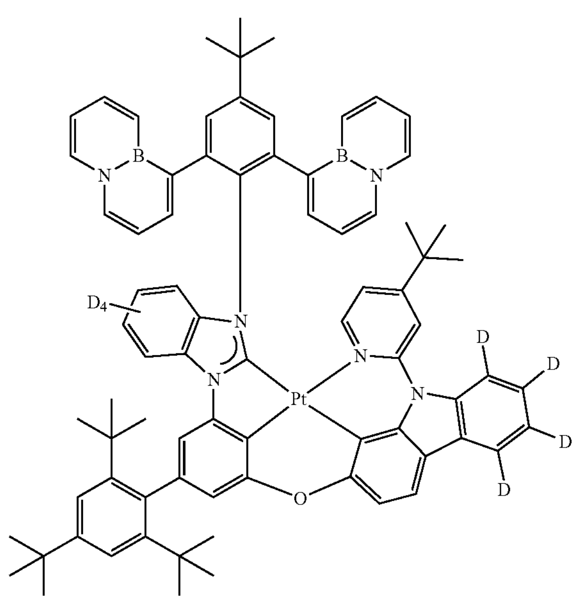

-continued
BD56
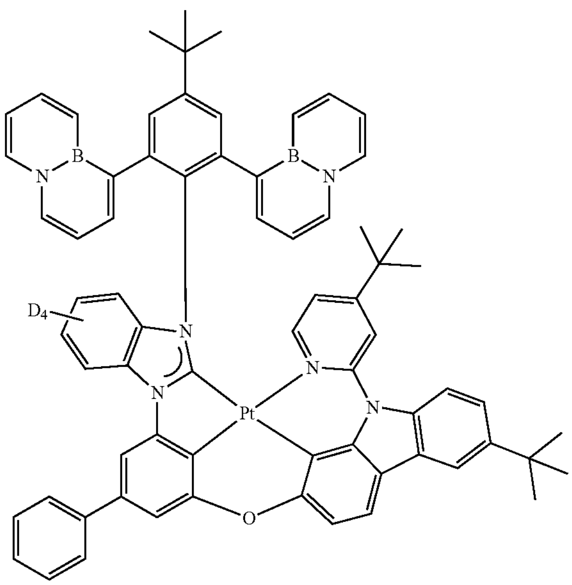
BD57
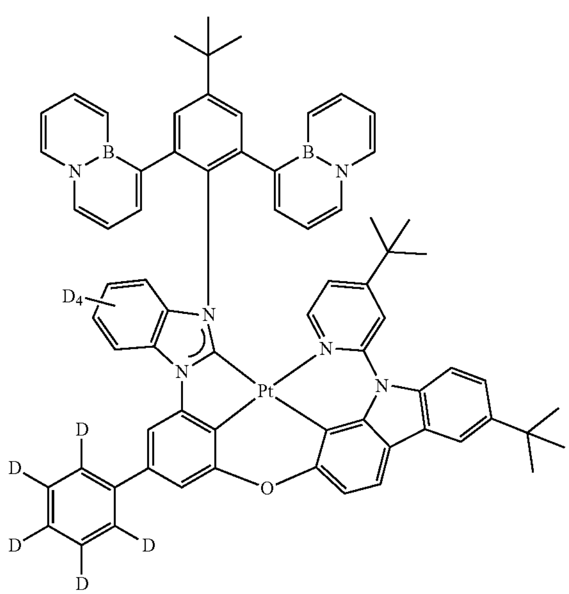
-continued
BD58
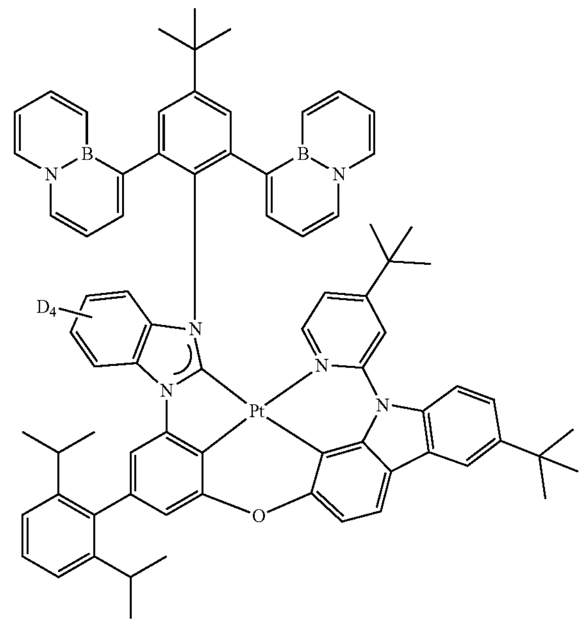
BD59
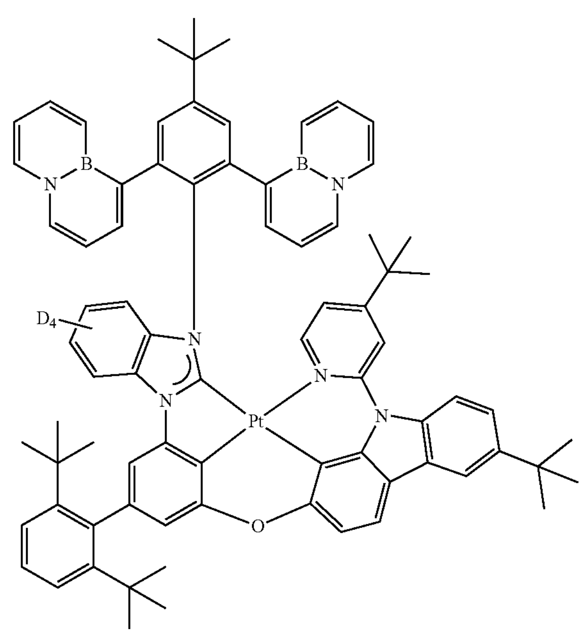

-continued
BD60
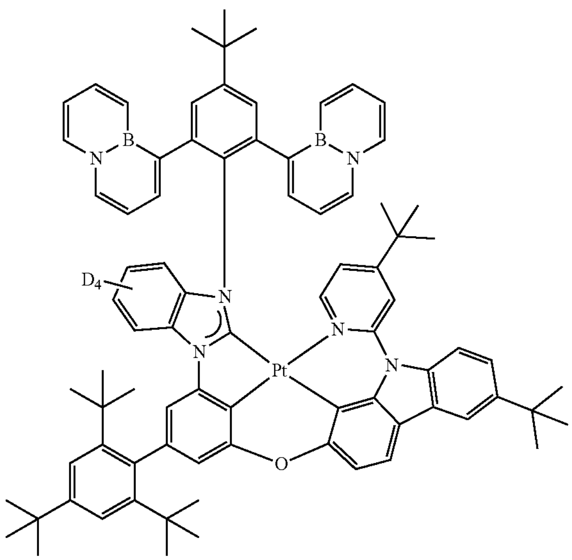
BD61
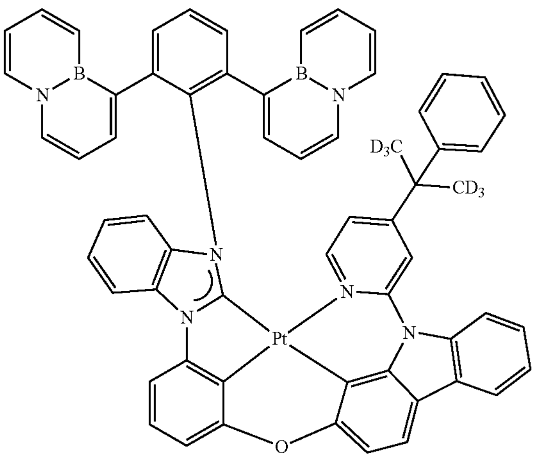
BD62
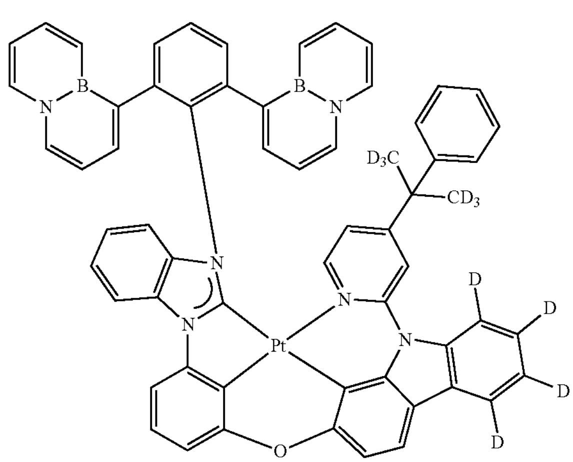
-continued
BD63
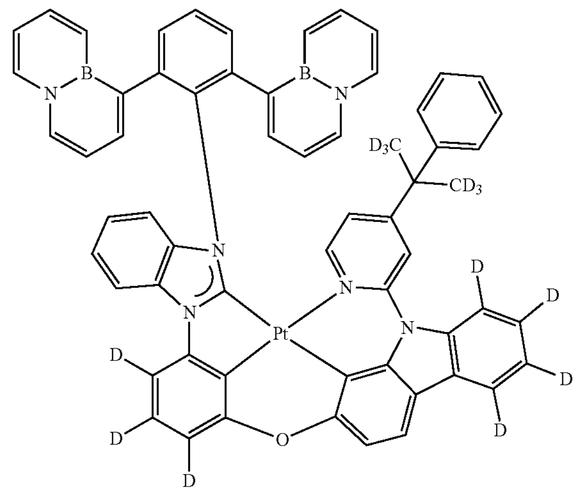
BD64
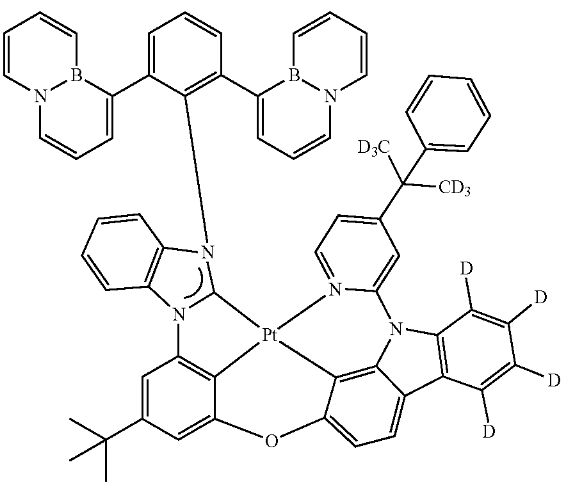
BD65
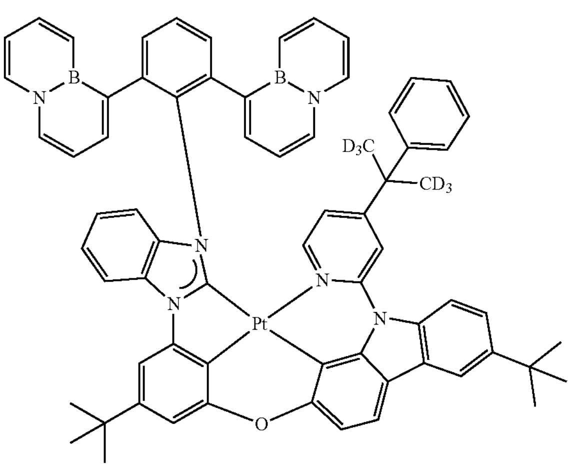

-continued
BD66
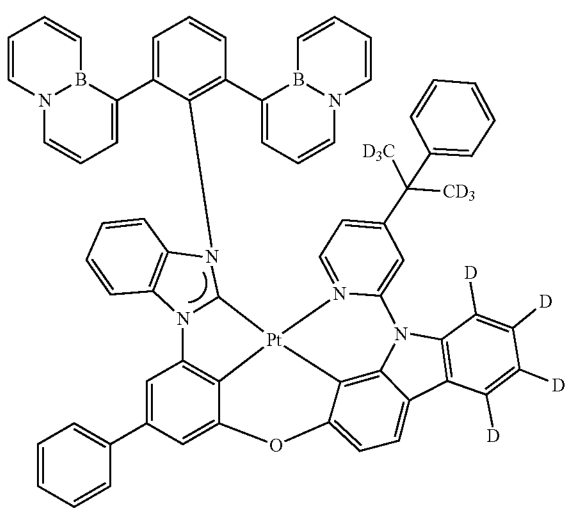
BD67
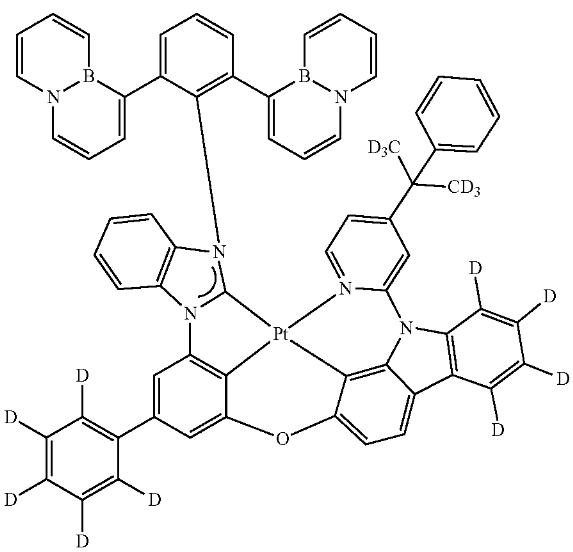
BD68
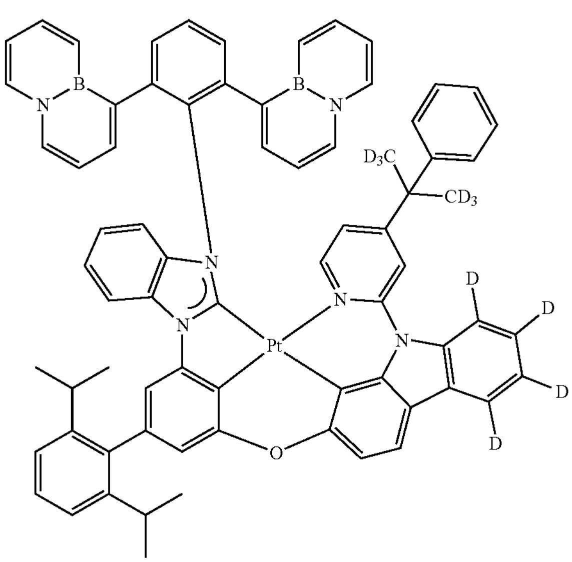
-continued
BD69
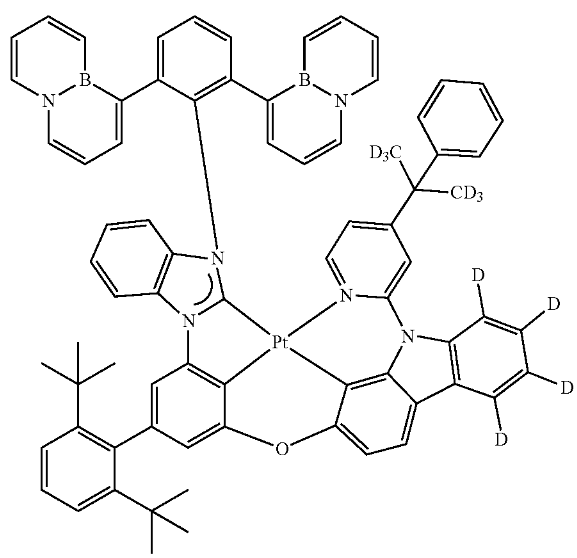
BD70
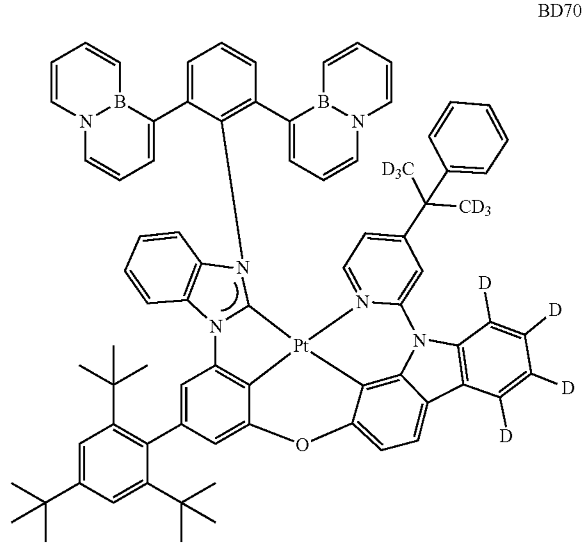
BD71
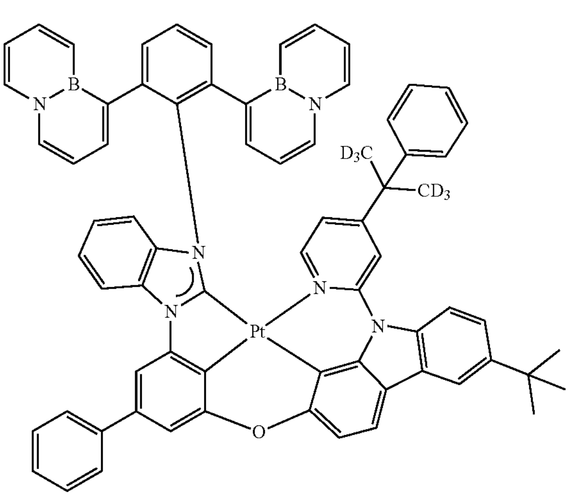

-continued
BD72
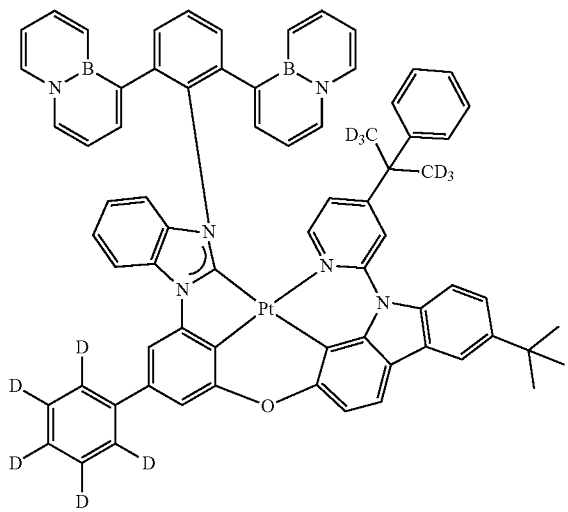
BD73
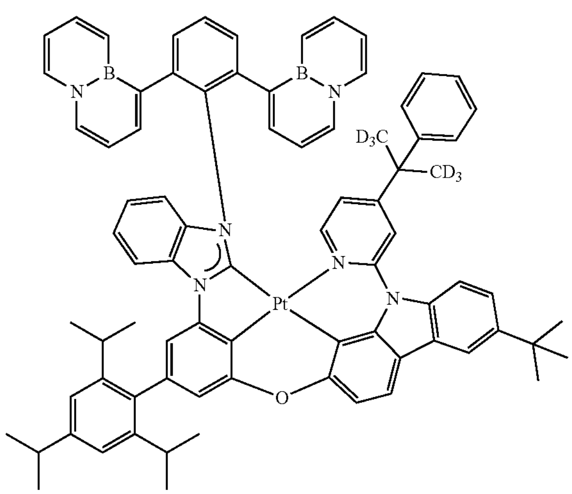
BD74
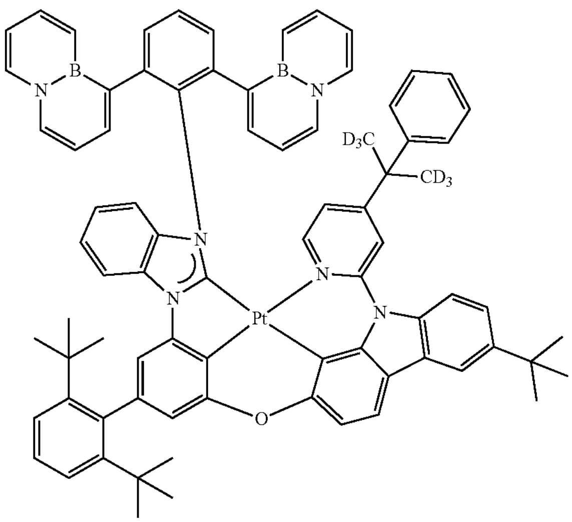
-continued
BD75
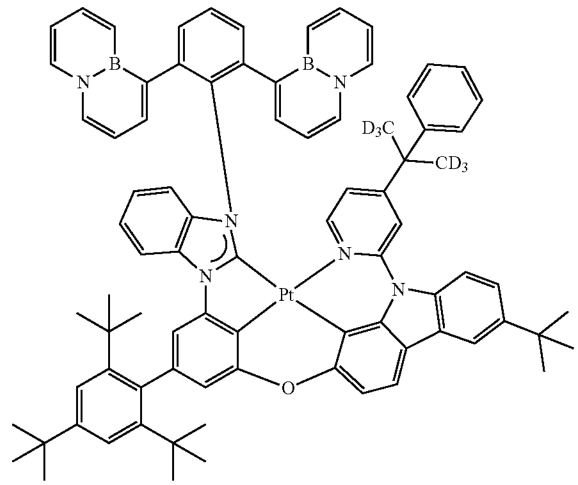
BD76
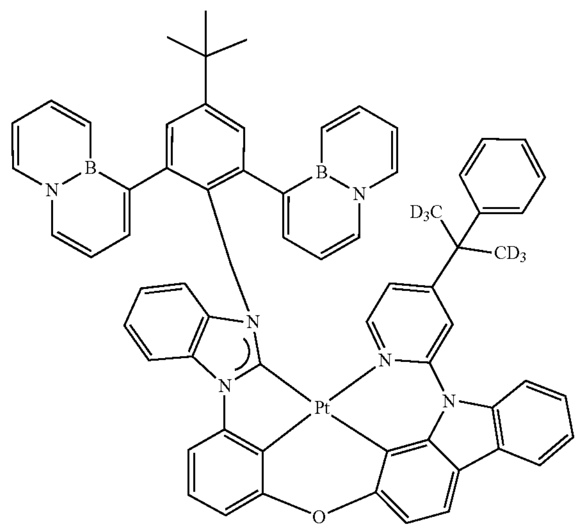
BD77
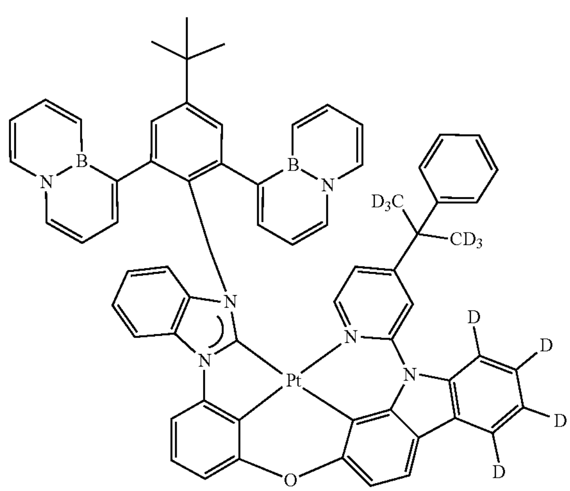

BD78
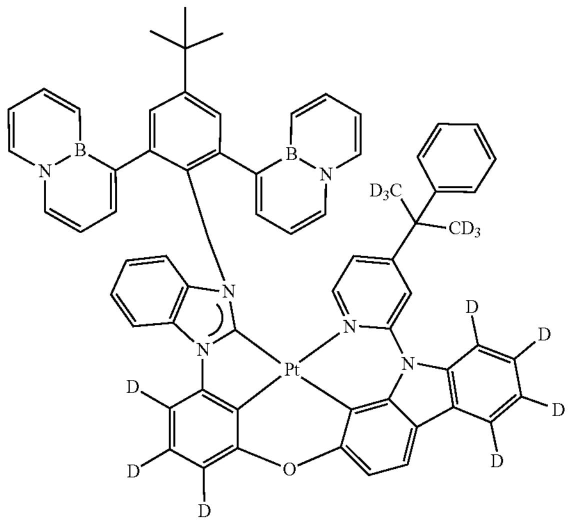
BD79
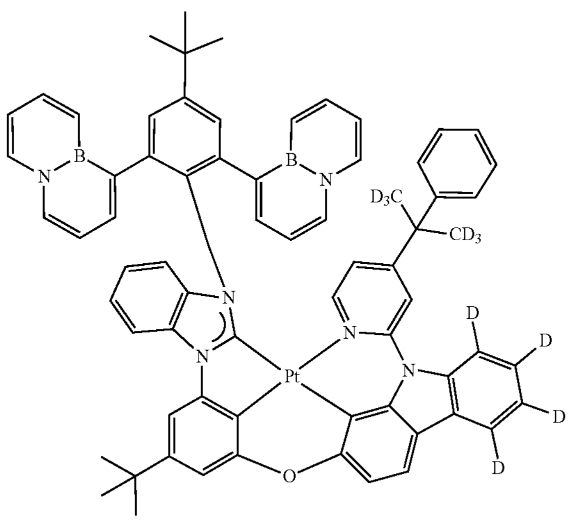
BD80
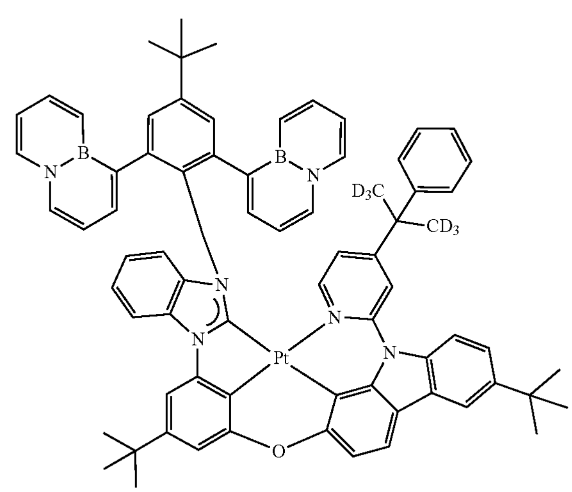
BD81
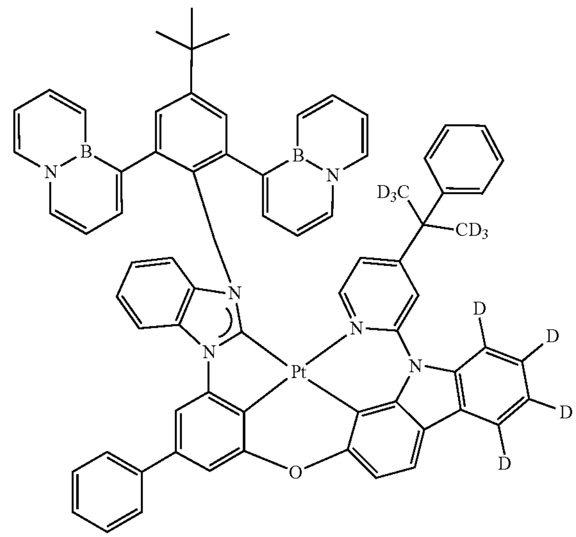
BD82
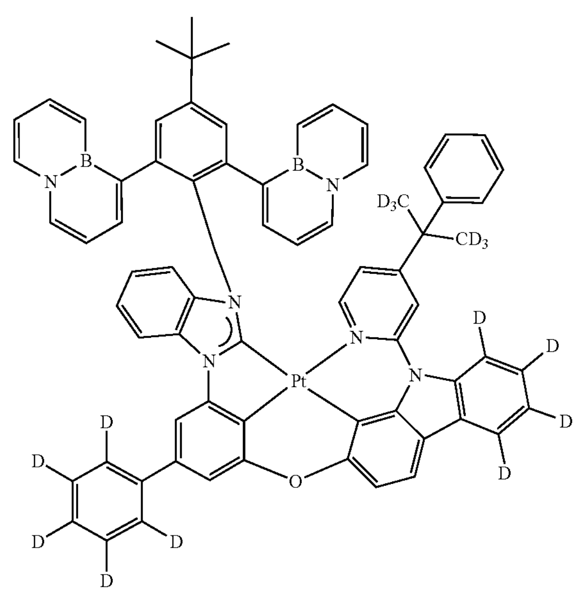

-continued
BD83
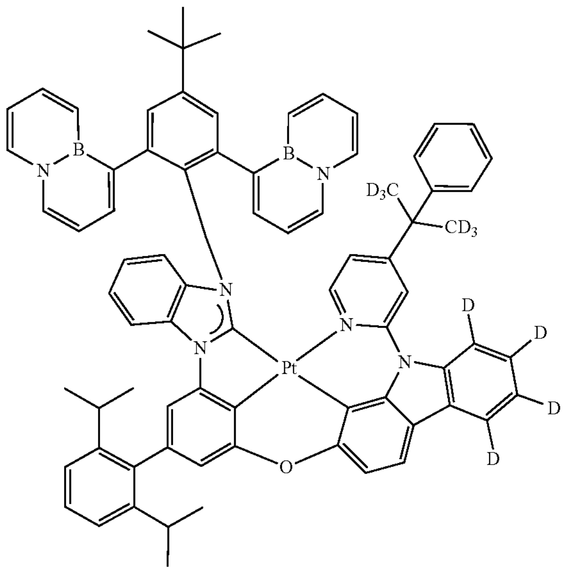
BD84
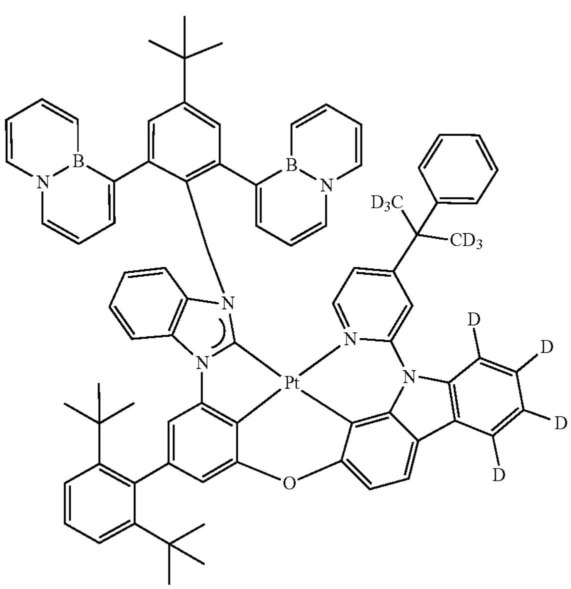
-continued
BD85
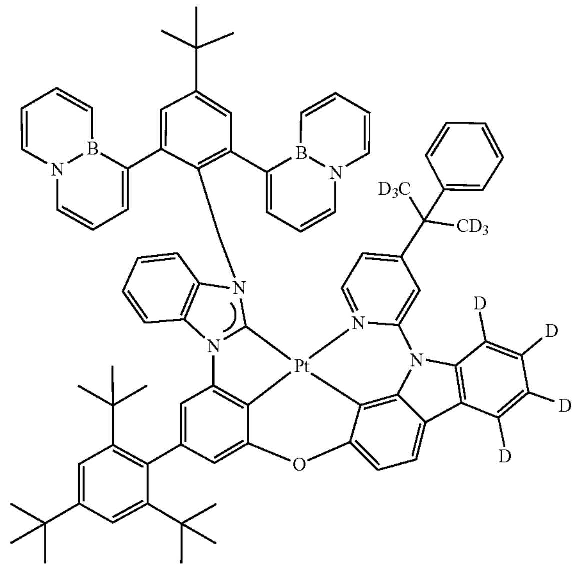
BD86
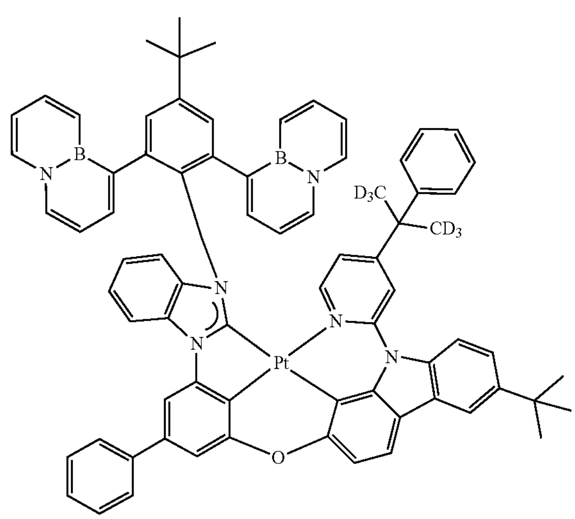

BD87
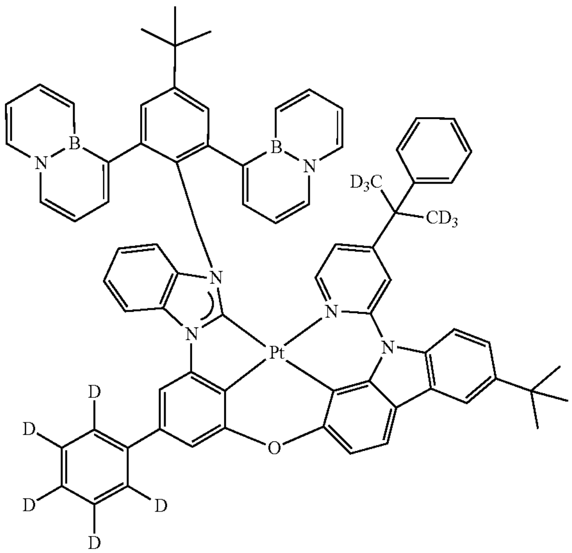
BD88
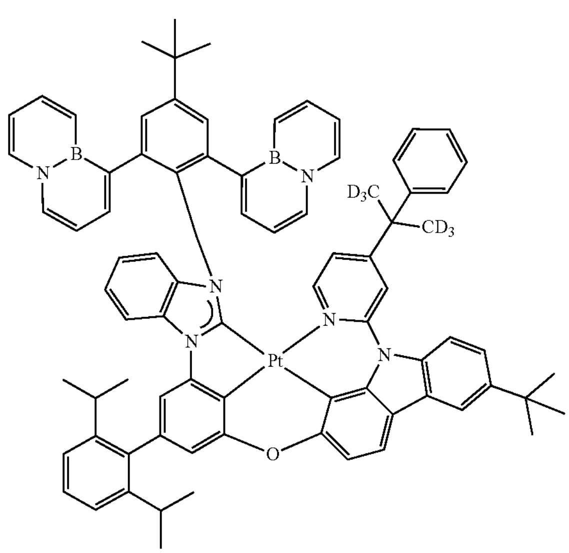
BD89
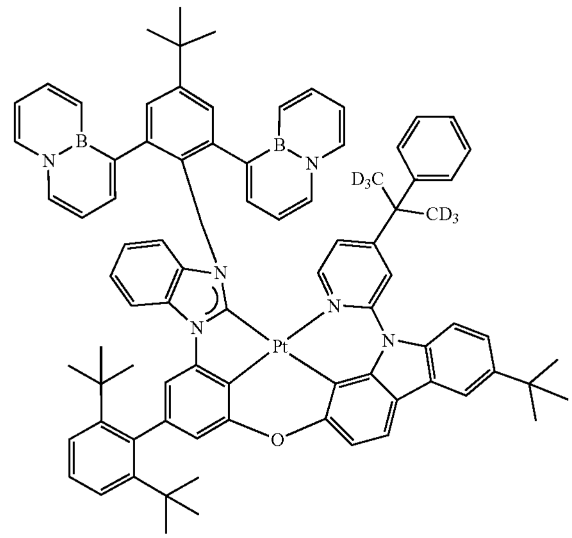
BD90
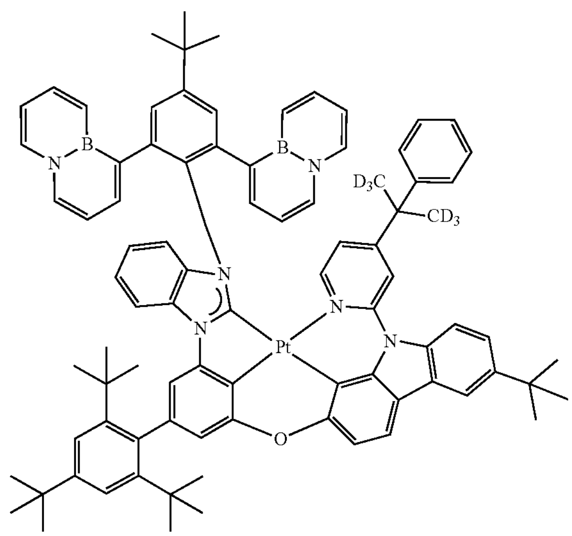
BD91
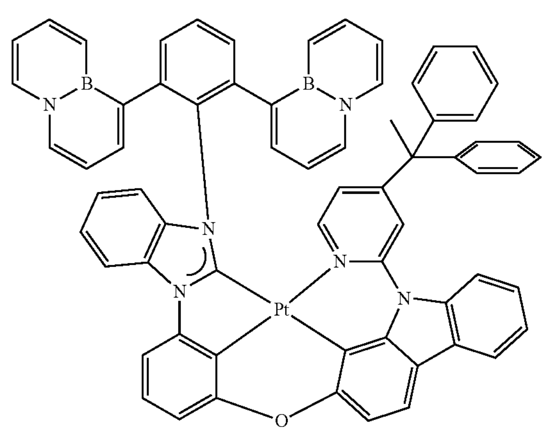

BD92
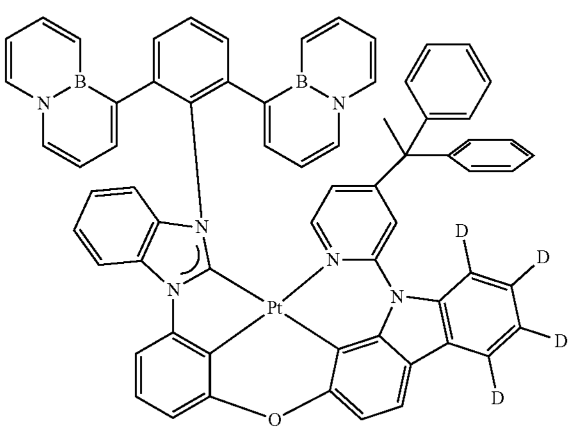
BD93
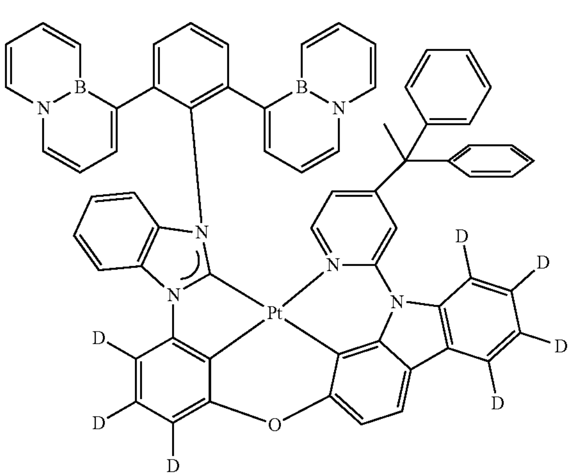
BD94
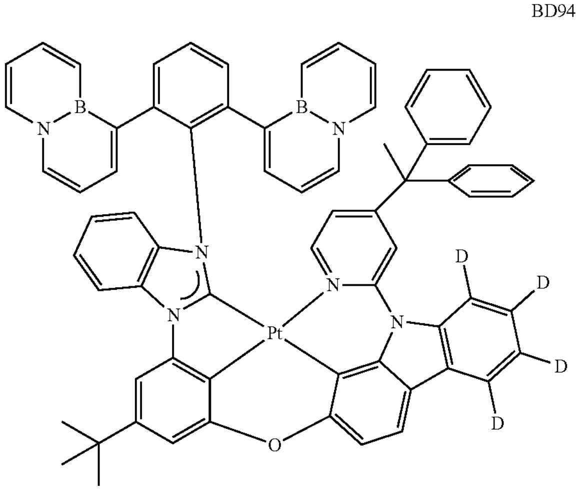
BD95
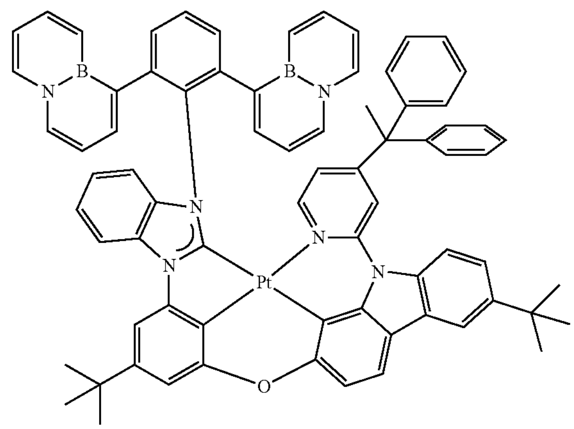
BD96
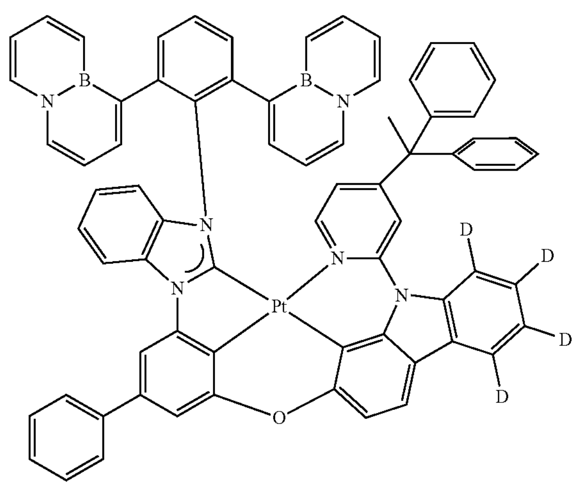
BD97
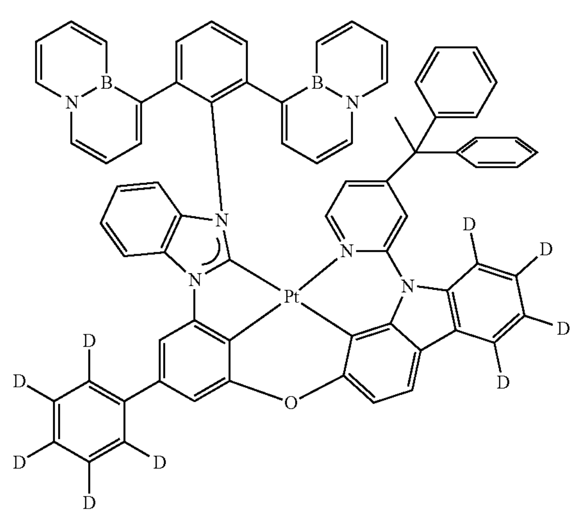

-continued
BD98
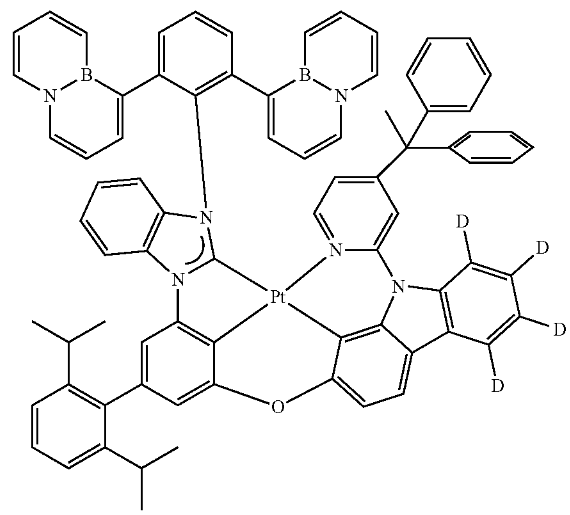
BD99
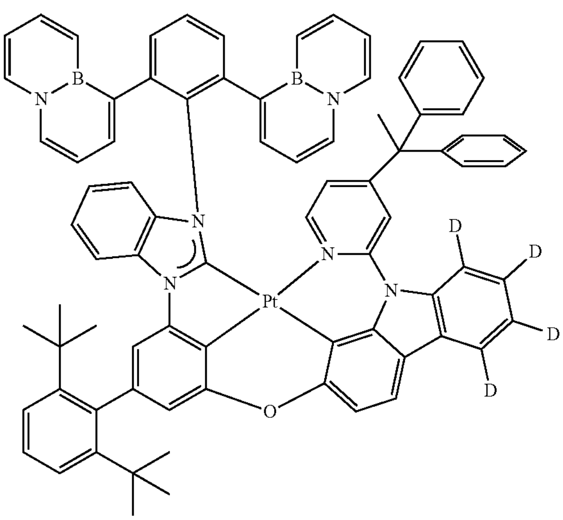
BD100
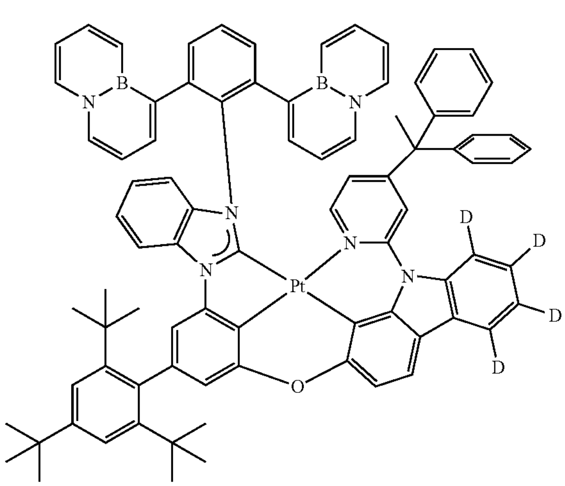
-continued
BD101
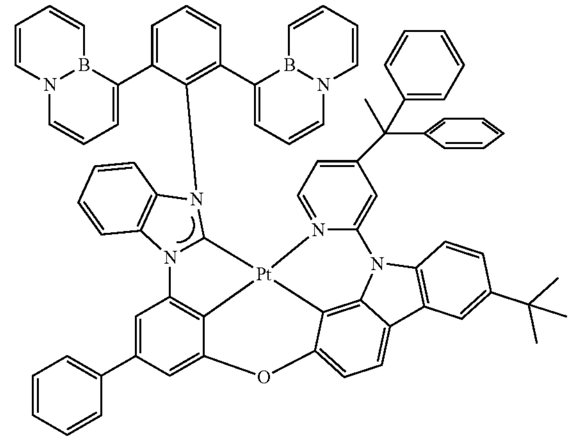
BD102
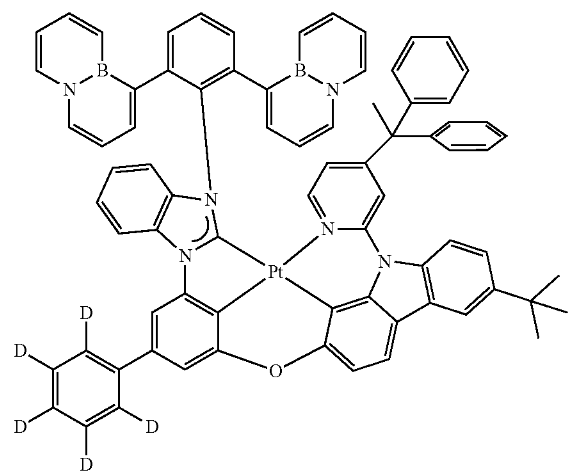
BD103
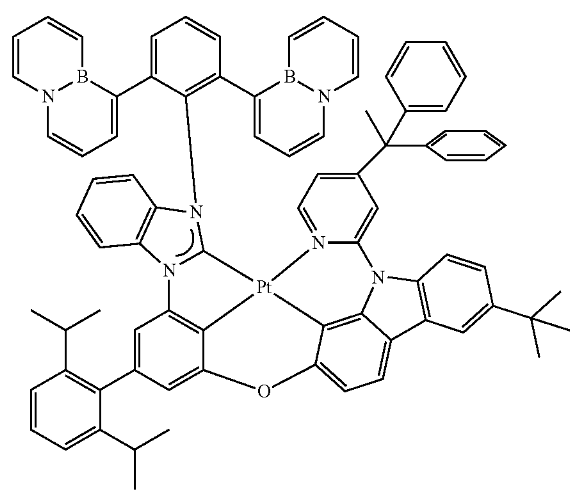

-continued
BD104
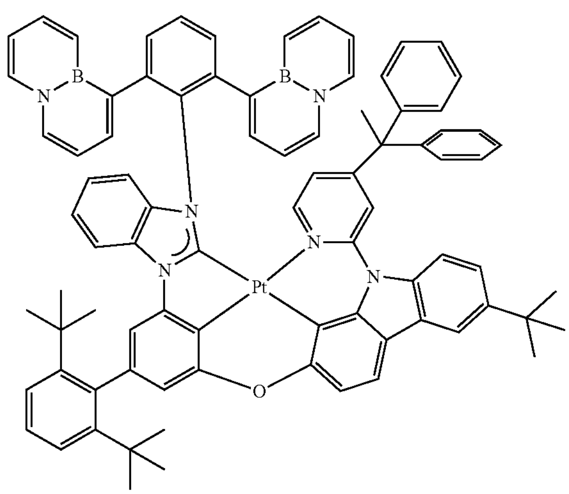
BD105
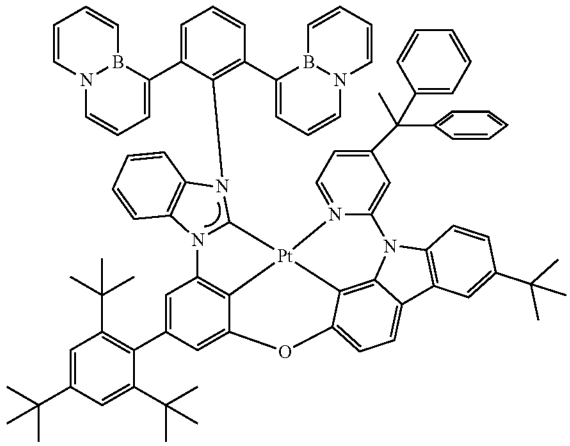
BD106
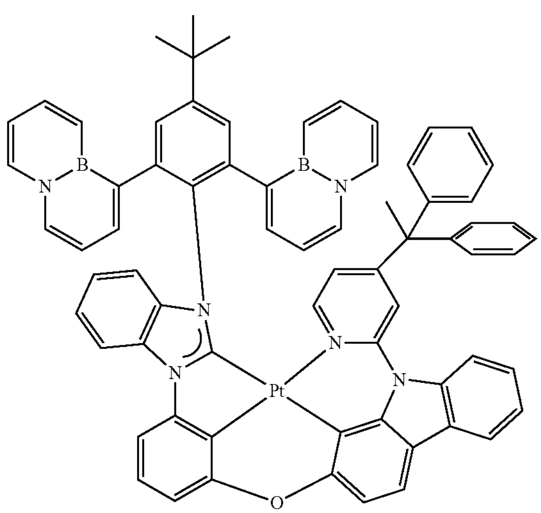
-continued
BD107
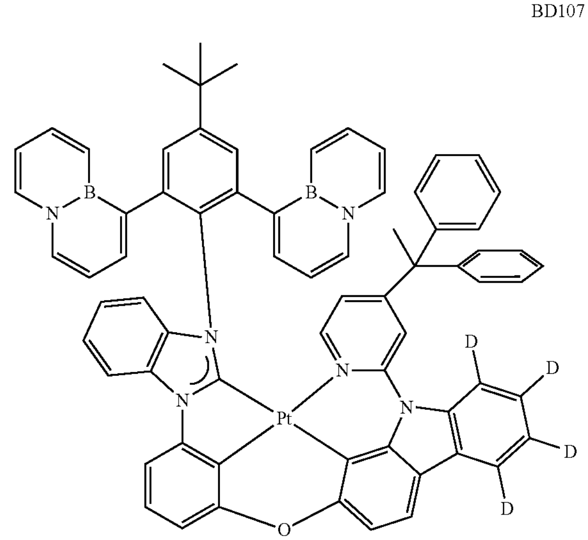
BD108
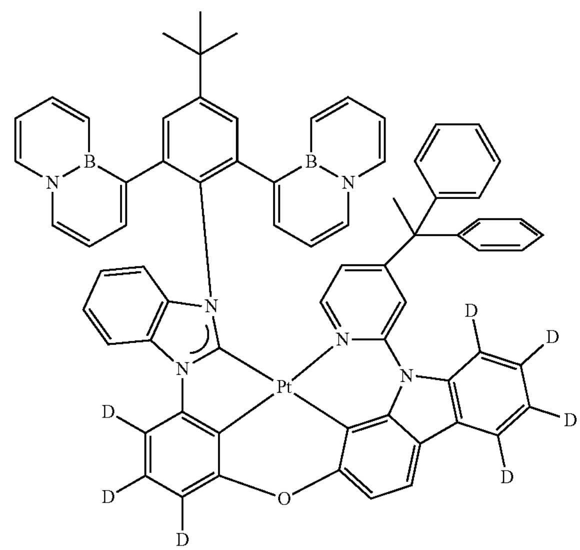
BD109
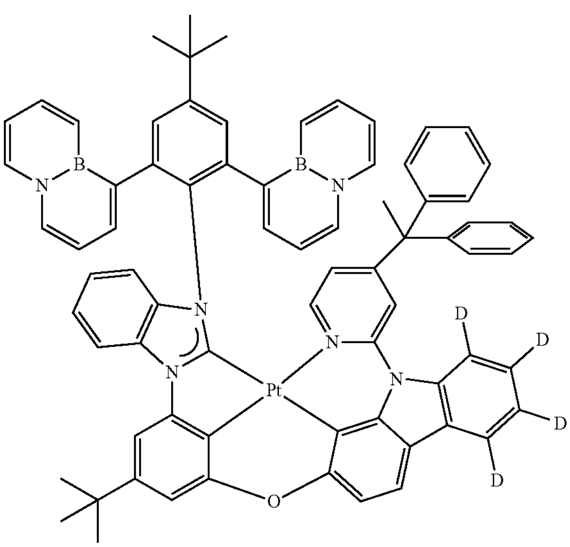

-continued
BD110
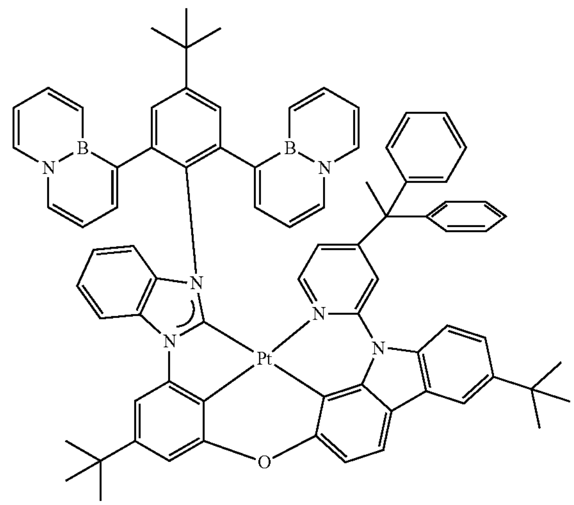
BD112
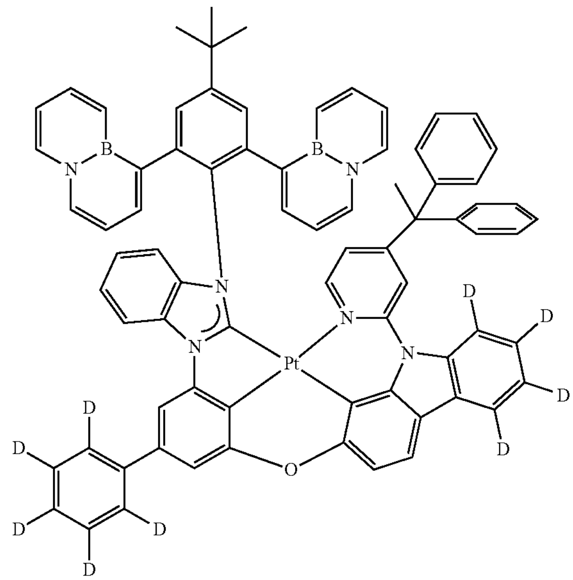
BD111
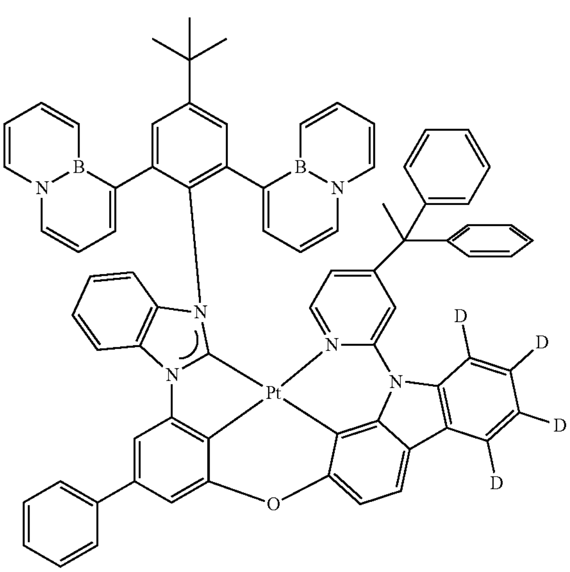
BD113
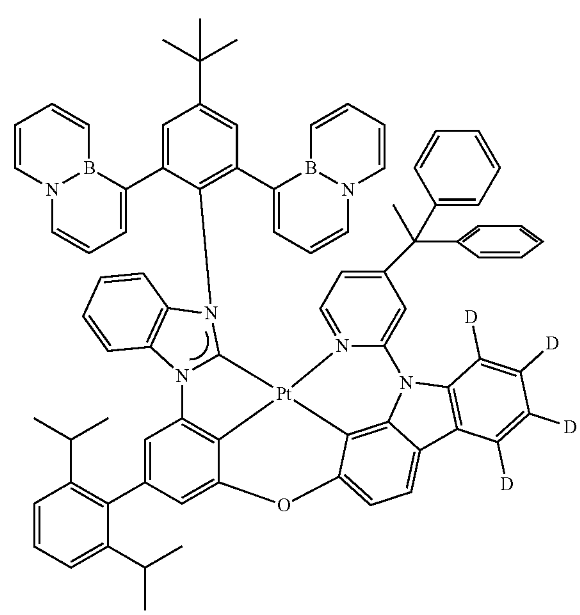

-continued
BD114
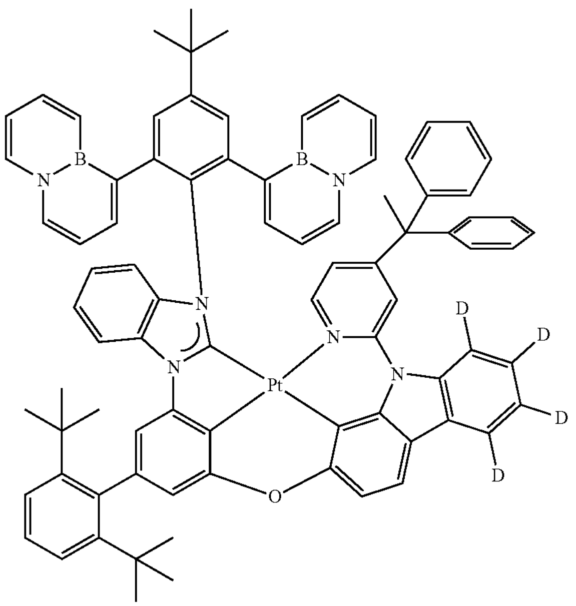
BD115
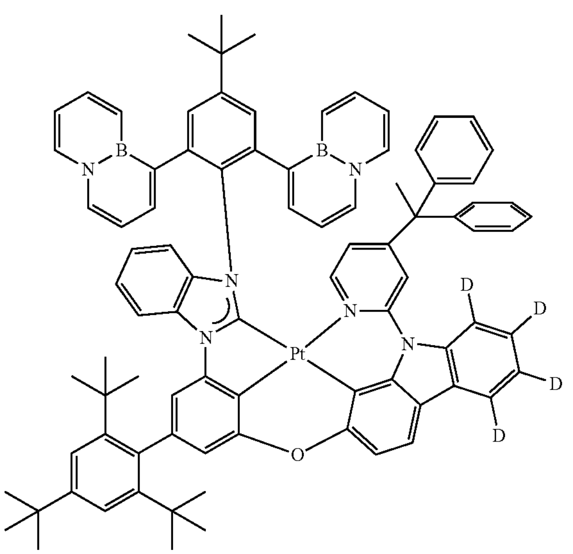
-continued
BD116
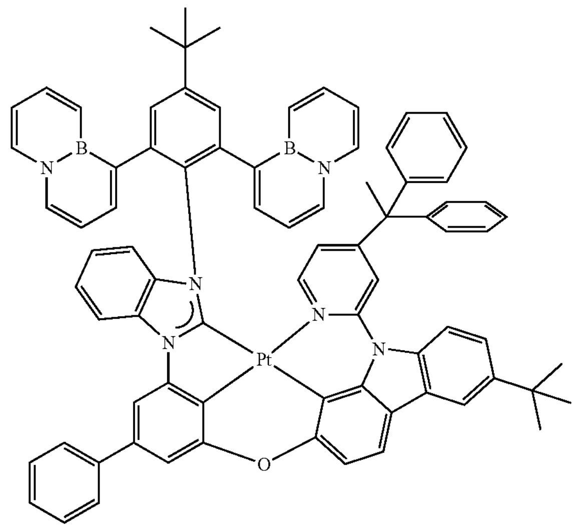
BD117
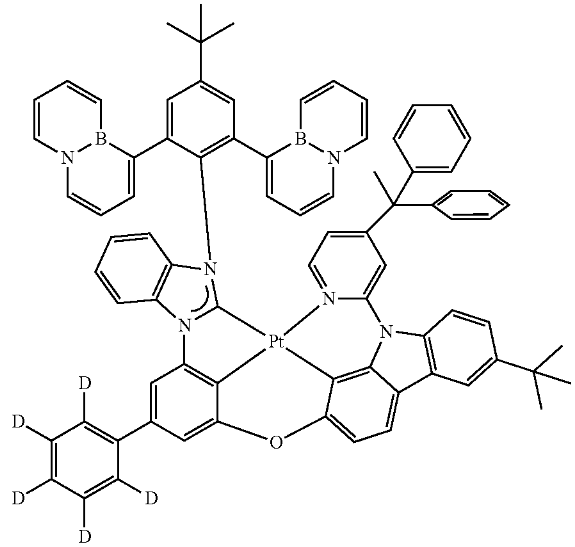

BD118
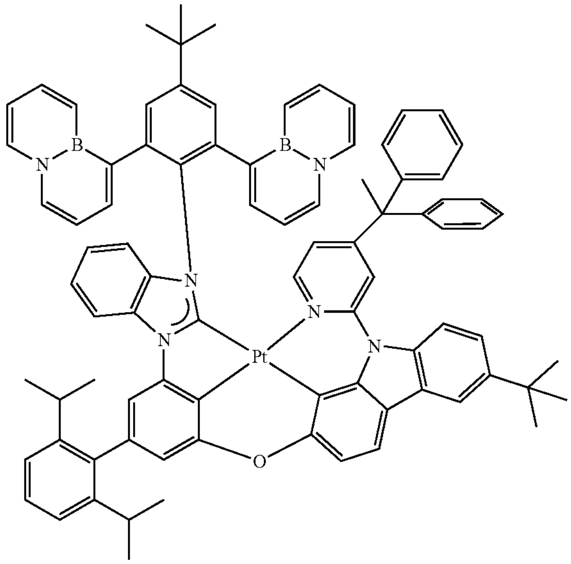
BD119
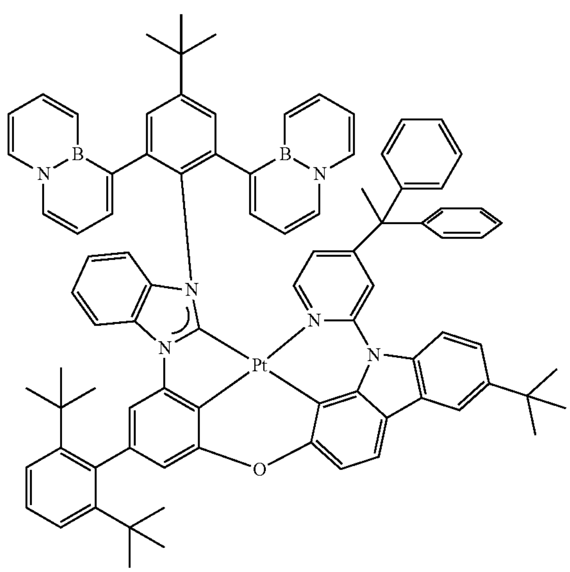
BD120
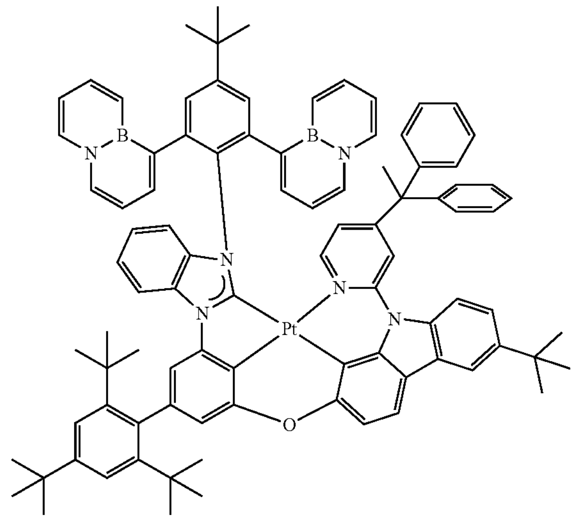
BD121
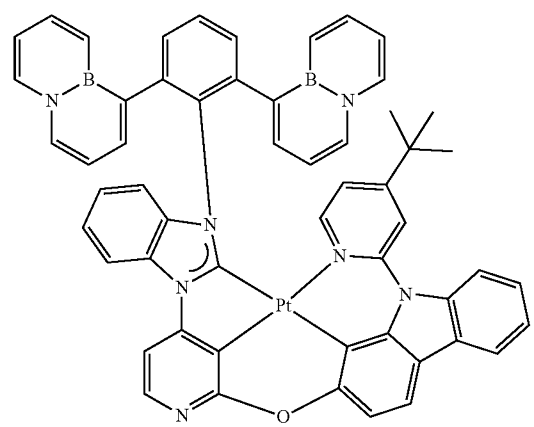
BD122
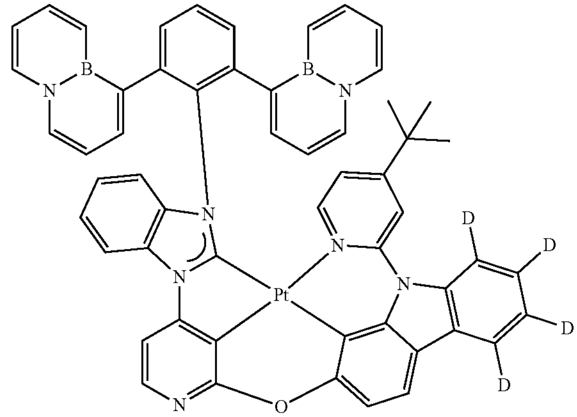

-continued
BD123
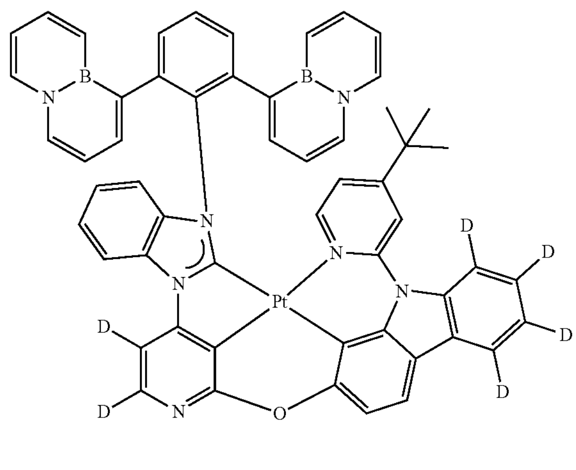
BD124
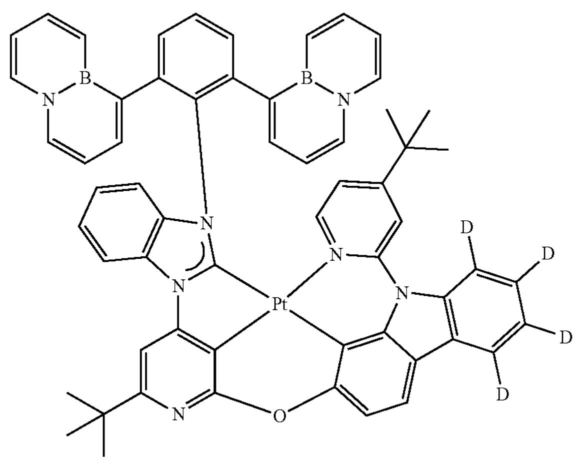
BD125
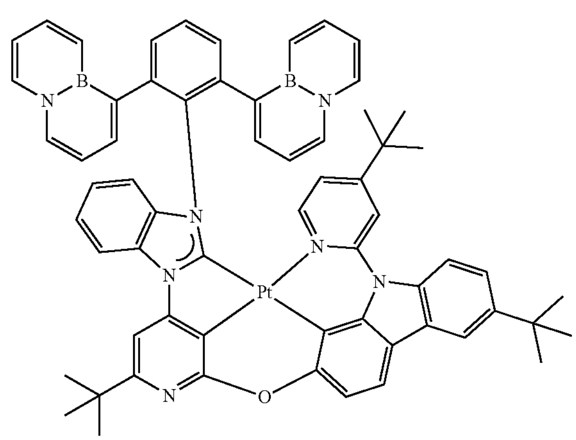
-continued
BD126
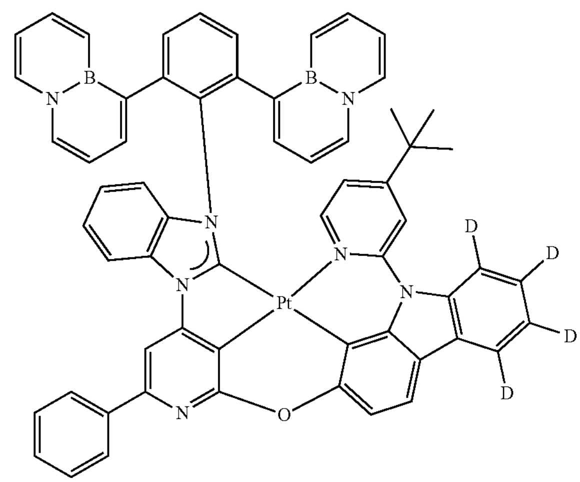
BD127
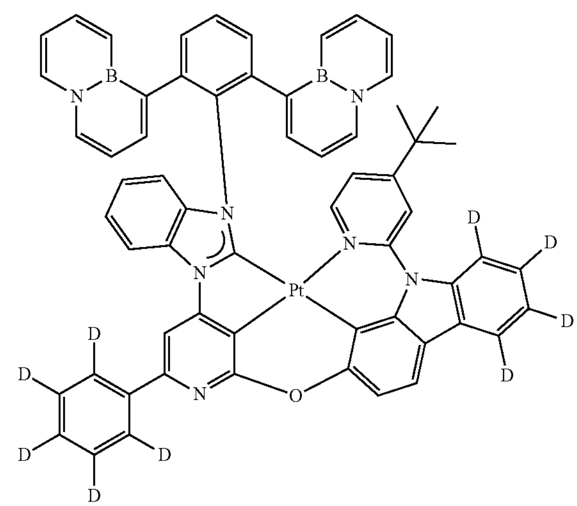
BD128
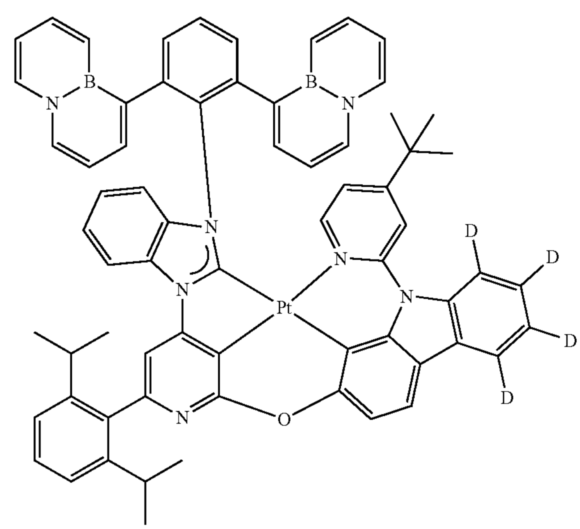

-continued
BD129
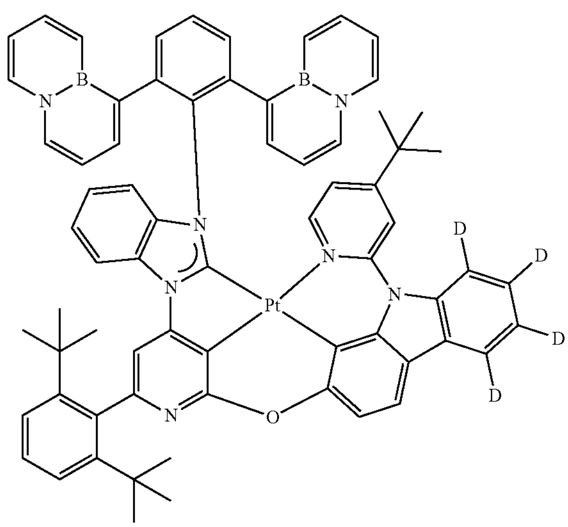
BD130
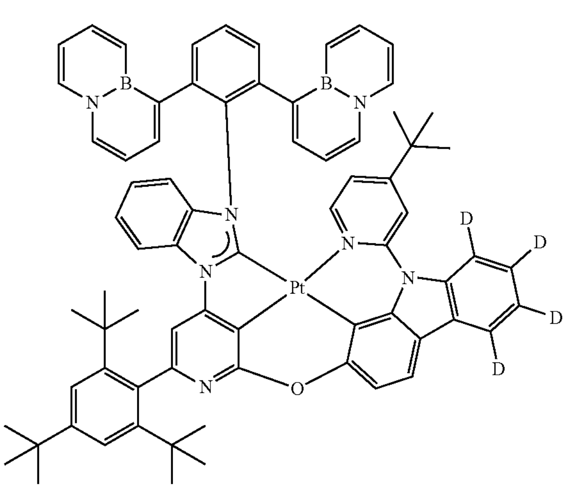
BD131
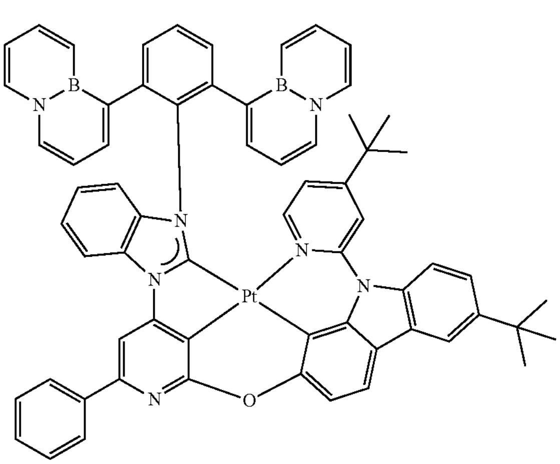
-continued
BD132
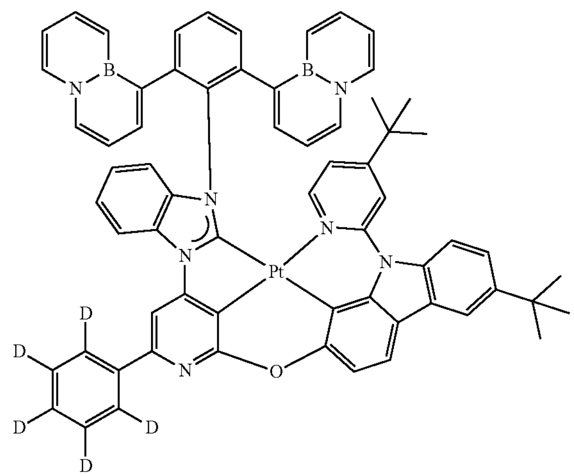
BD133
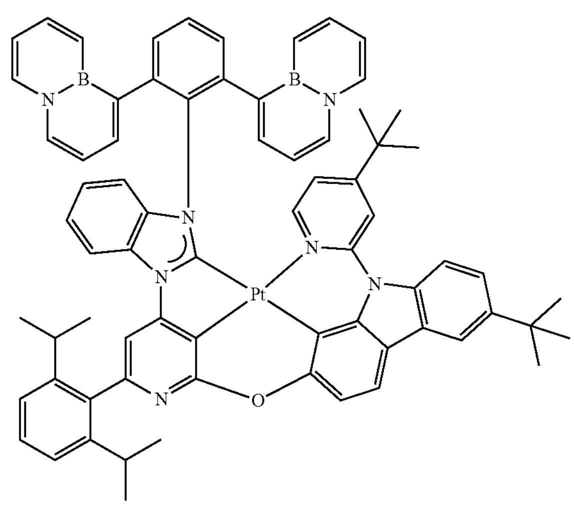
BD134
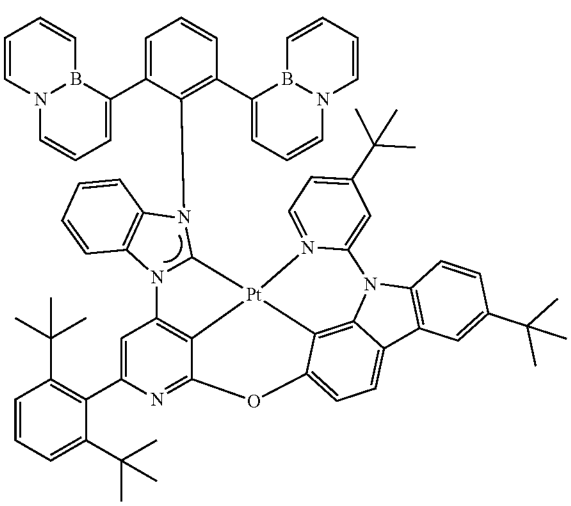

-continued
BD135
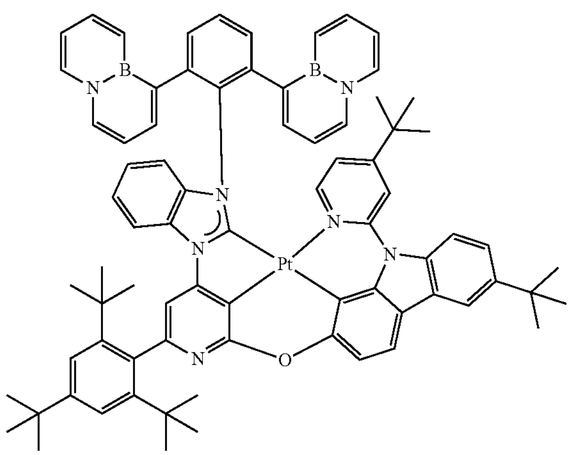
BD136
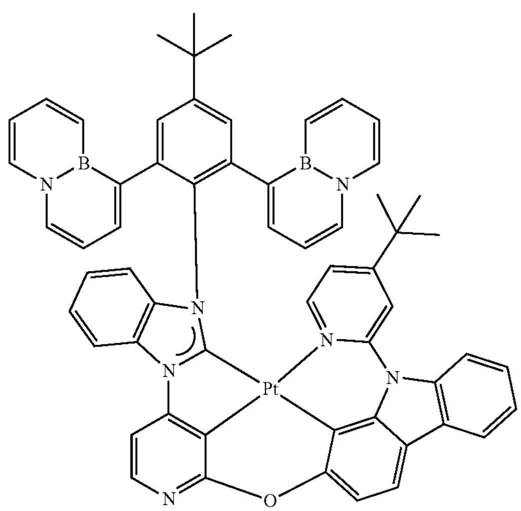
BD137
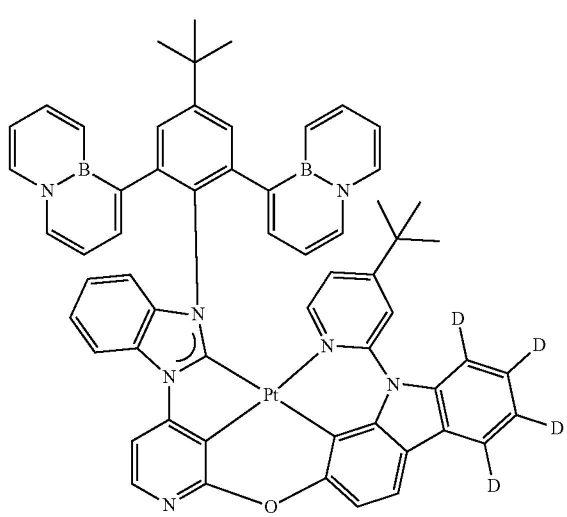
-continued
BD138
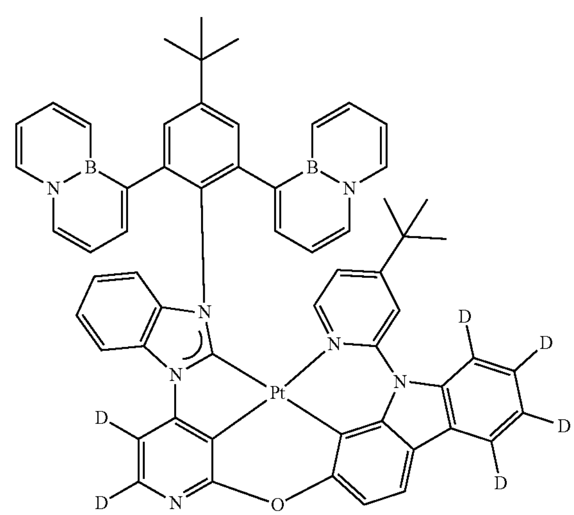
BD139
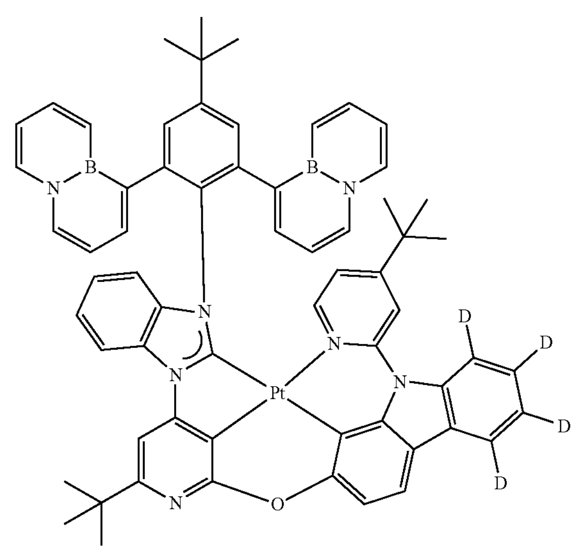
BD140
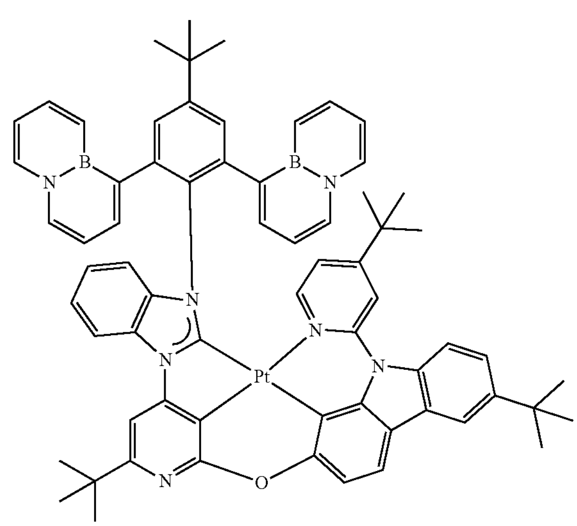

-continued
BD141
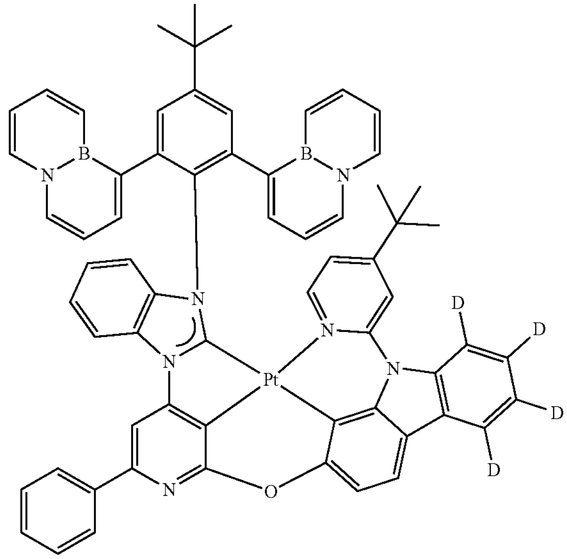
BD142
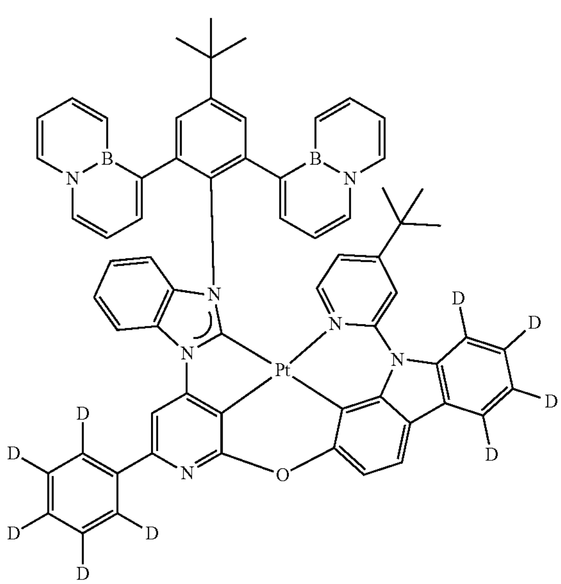
-continued
BD143
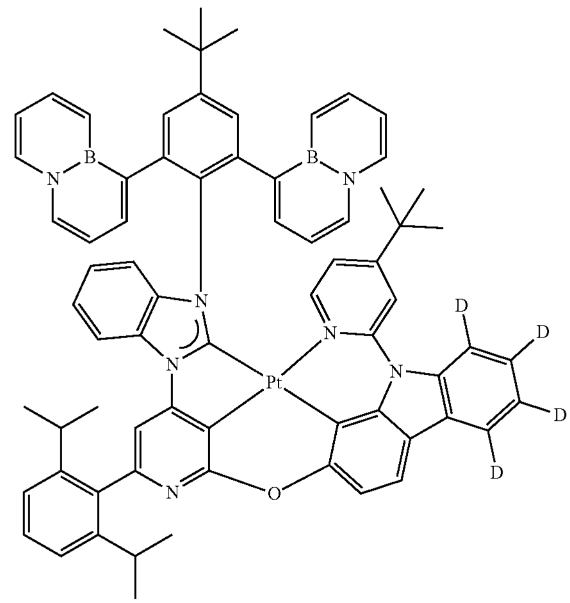
BD144
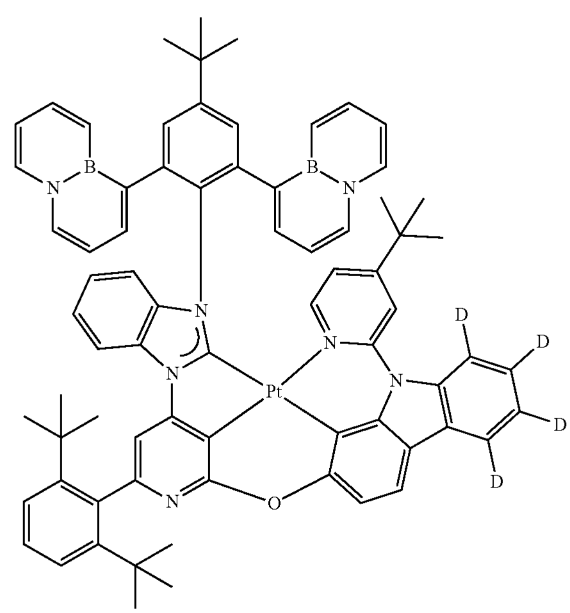

-continued
BD145
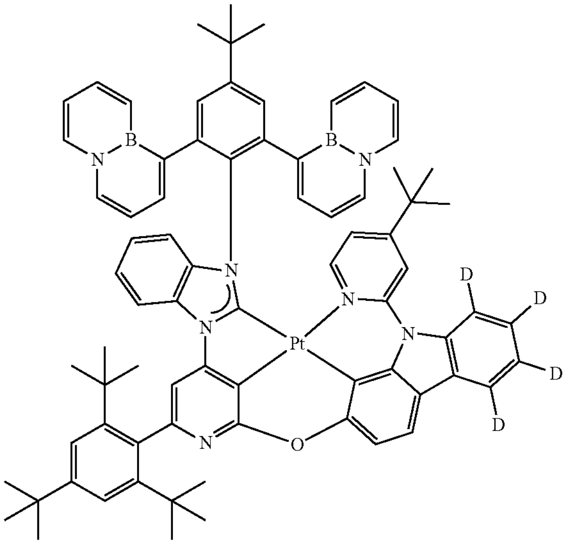
BD146
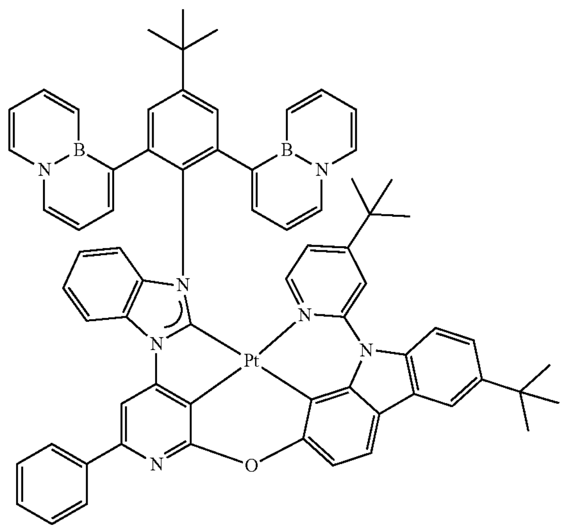
BD147
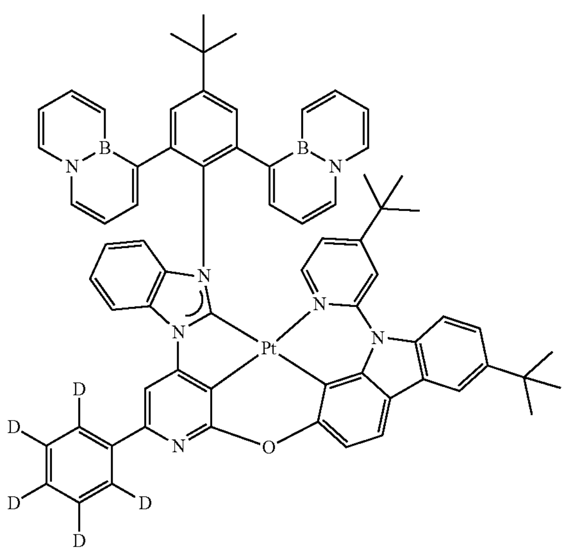
-continued
BD148
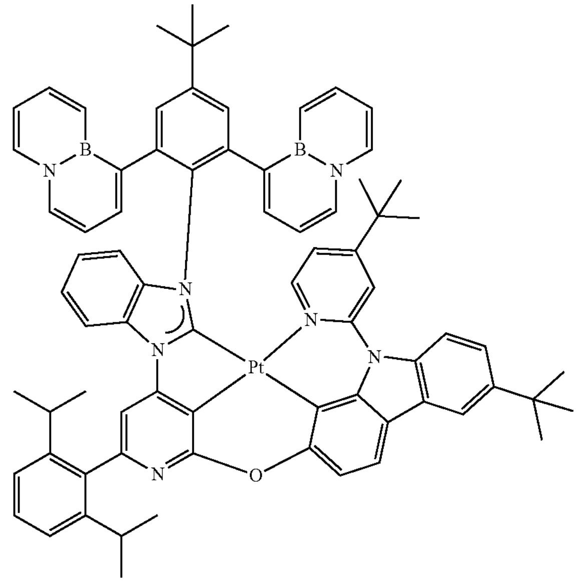
BD149
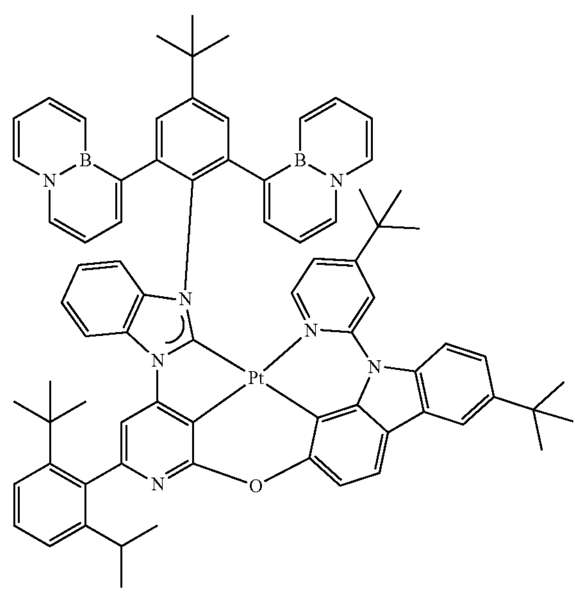

-continued
BD150
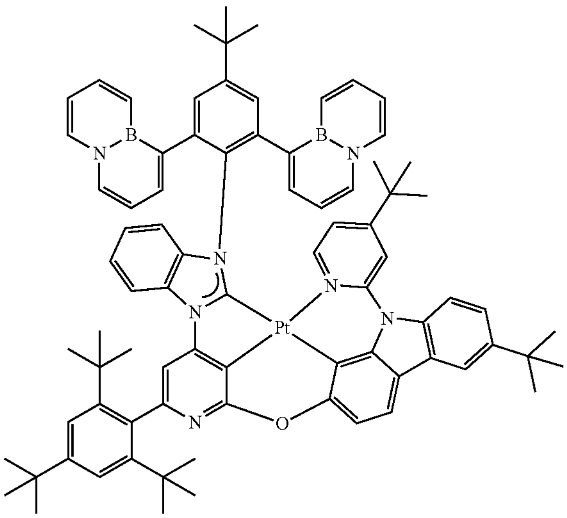
BD0151
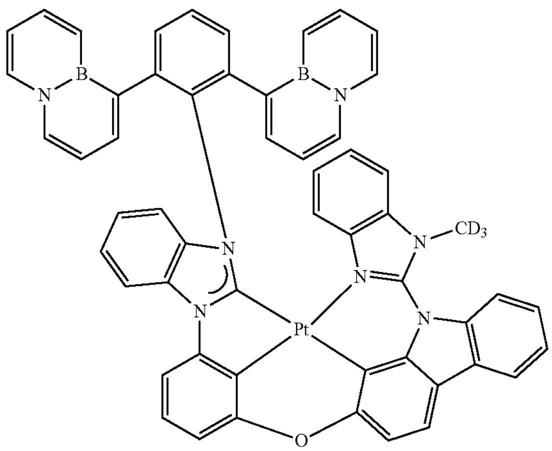
BD152
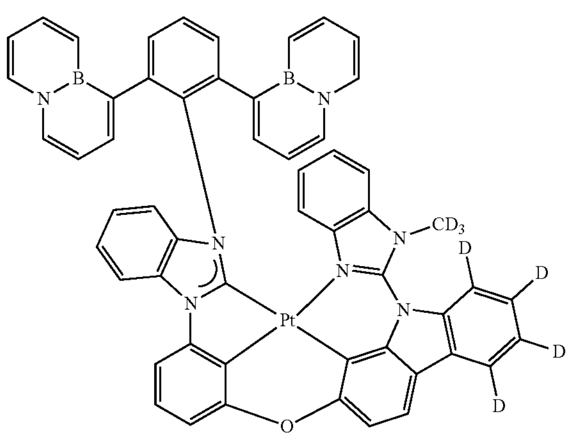
-continued
BD153
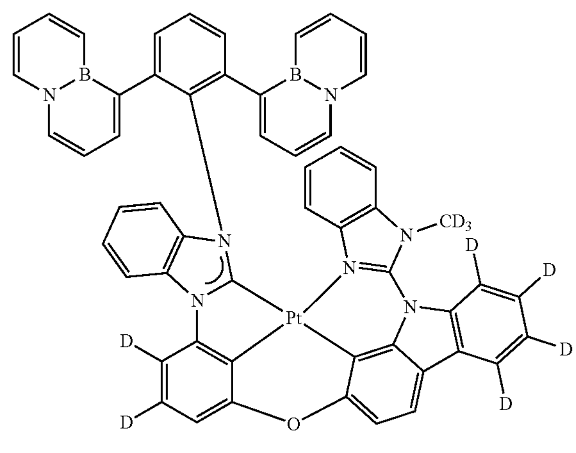
BD154
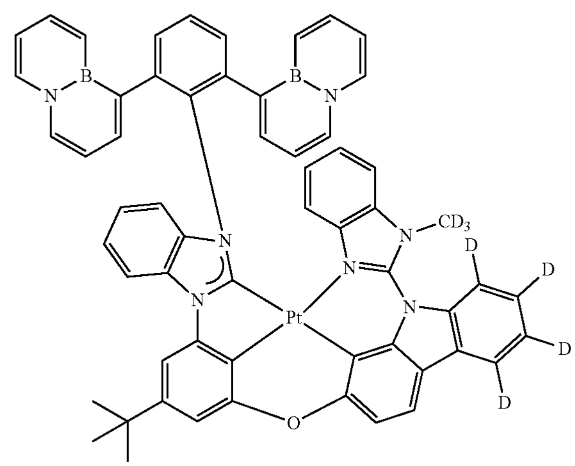
BD155
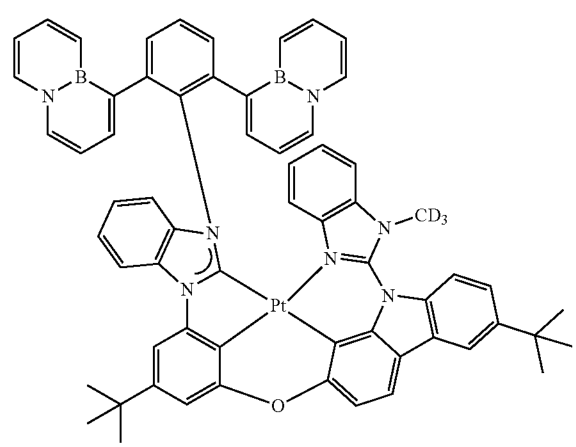

-continued
BD156
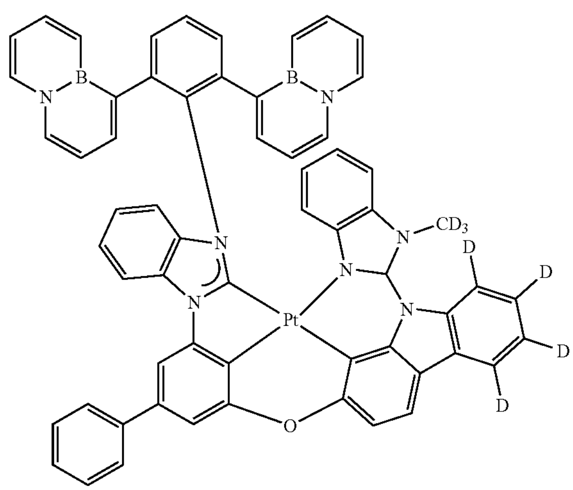
BD157
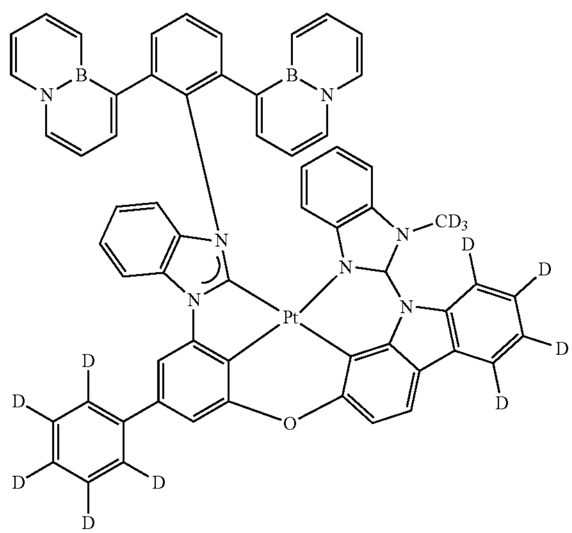
BD158
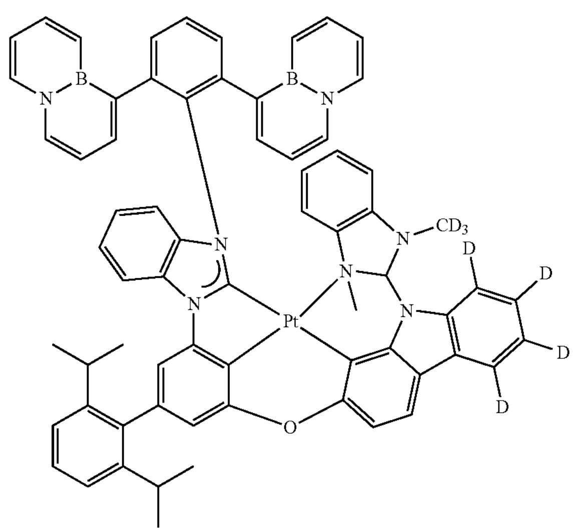
-continued
BD159
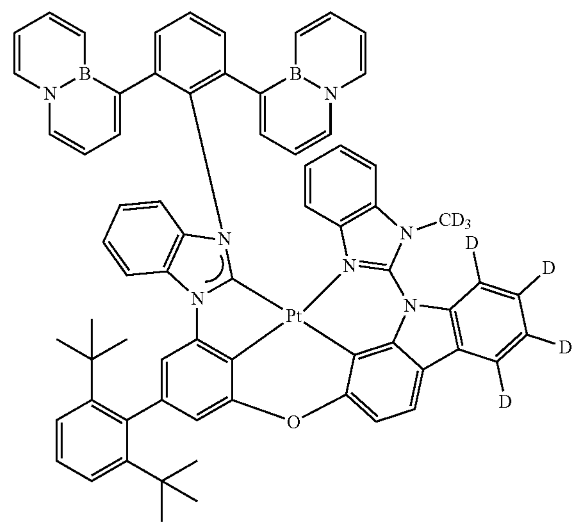
BD160
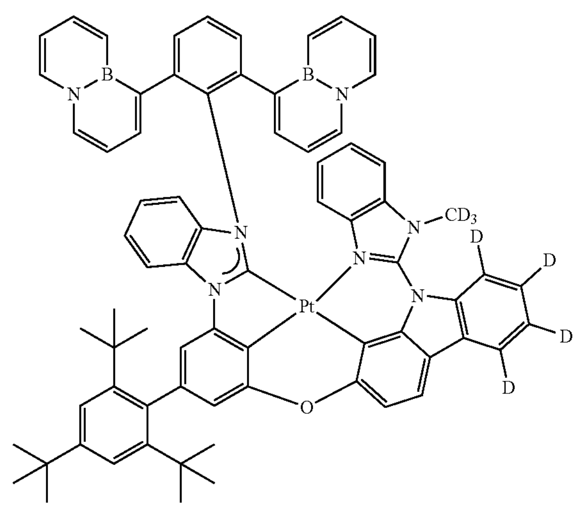
BD161
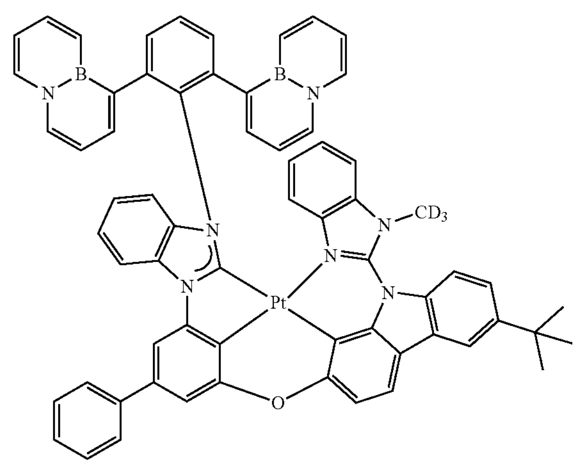

BD162
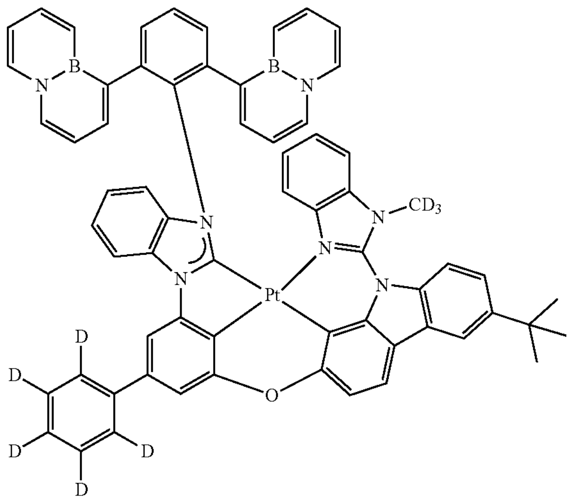
BD163
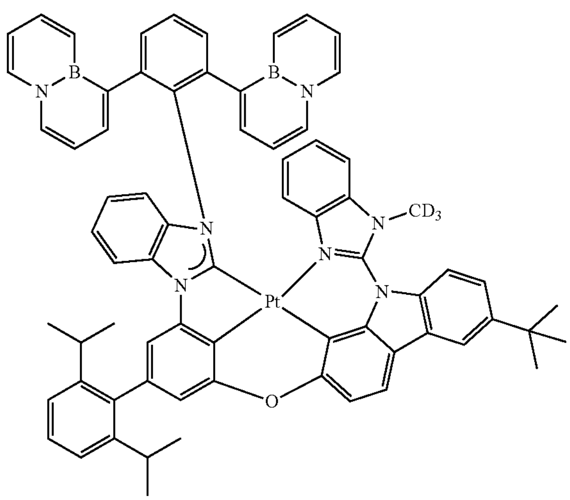
BD164
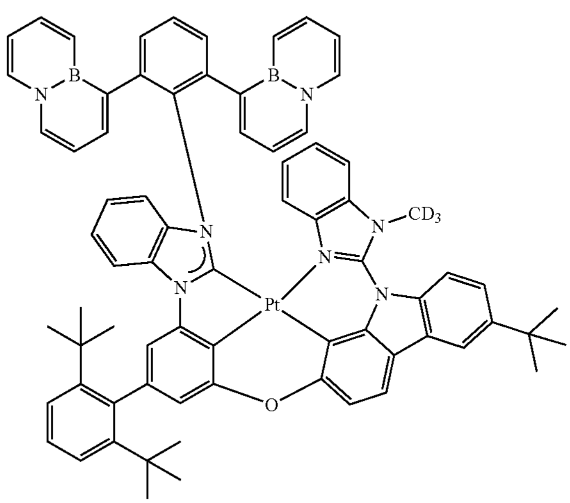
BD165
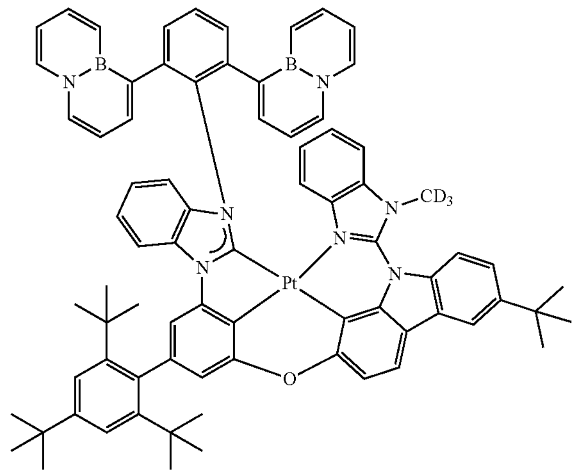
BD166
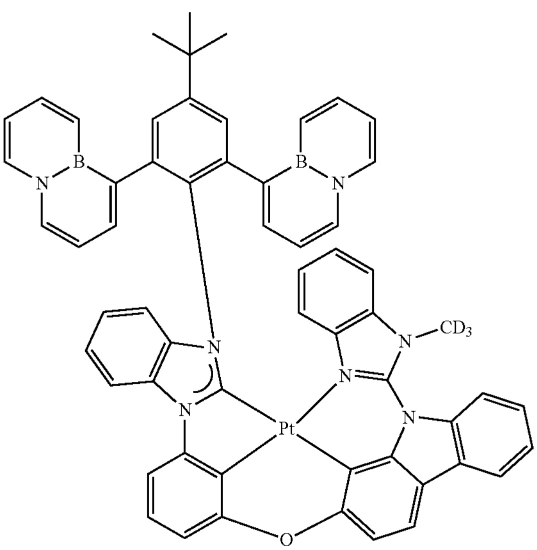
BD167
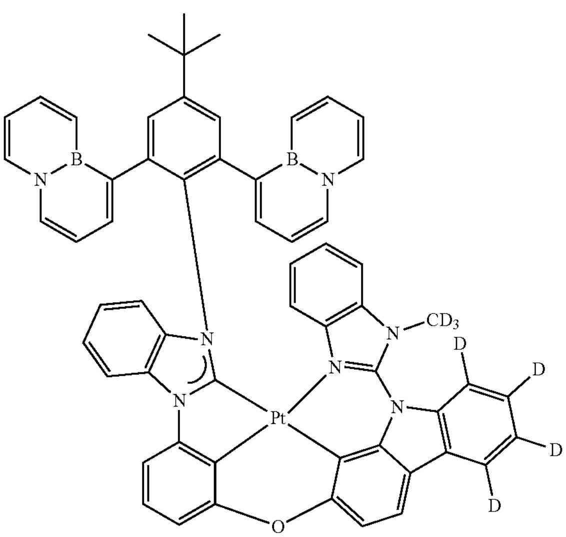

-continued
BD168
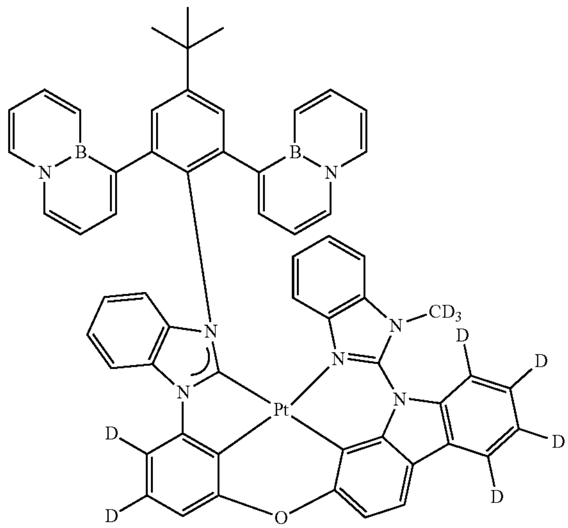
-continued
BD170
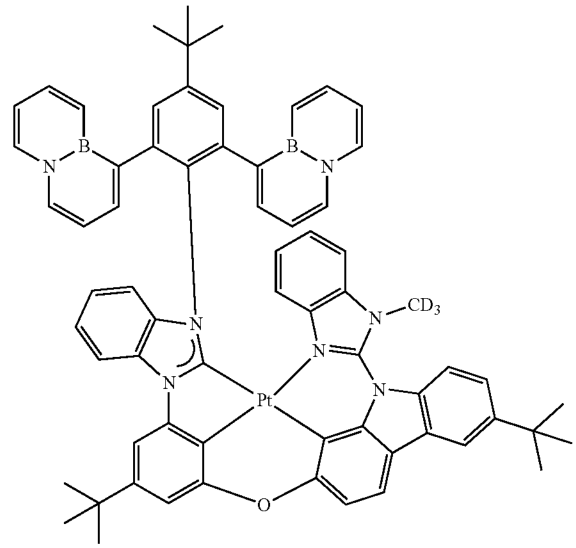
BD169
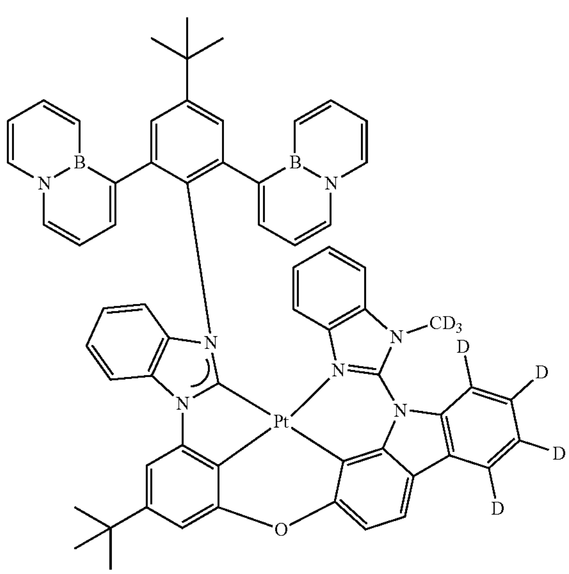
BD171
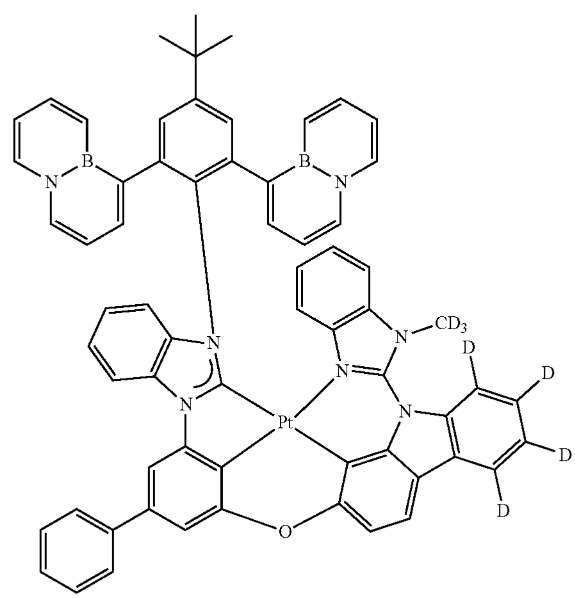

-continued
BD172
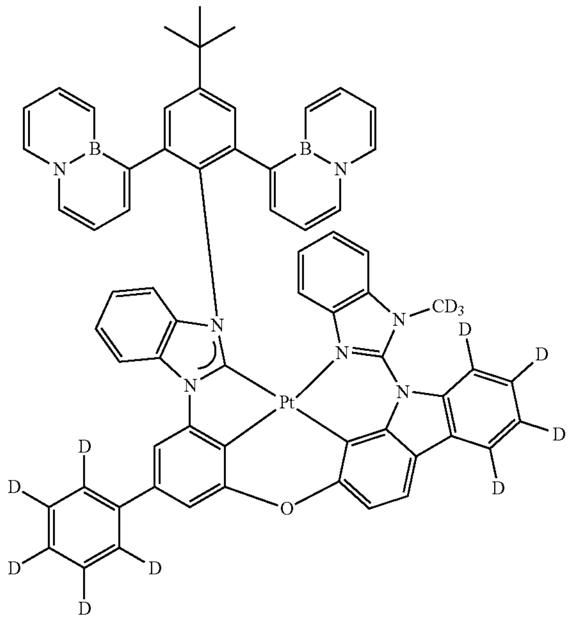
BD173
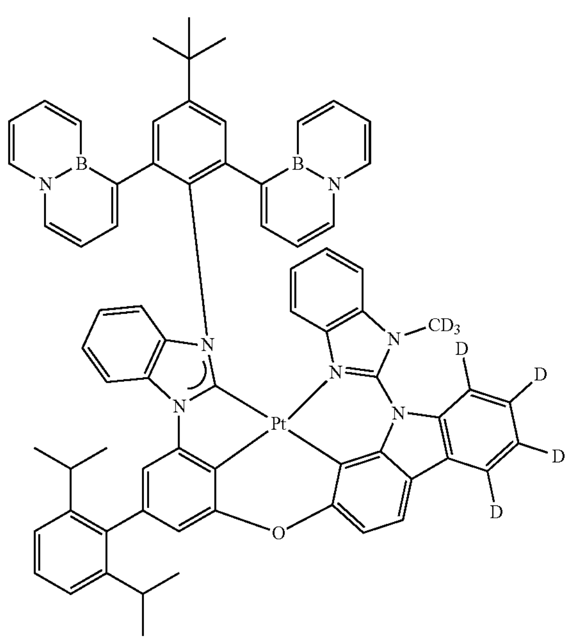
-continued
BD174
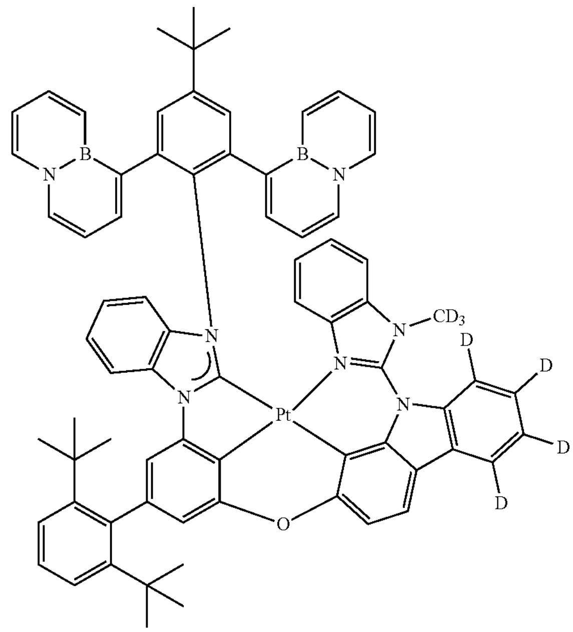
BD175
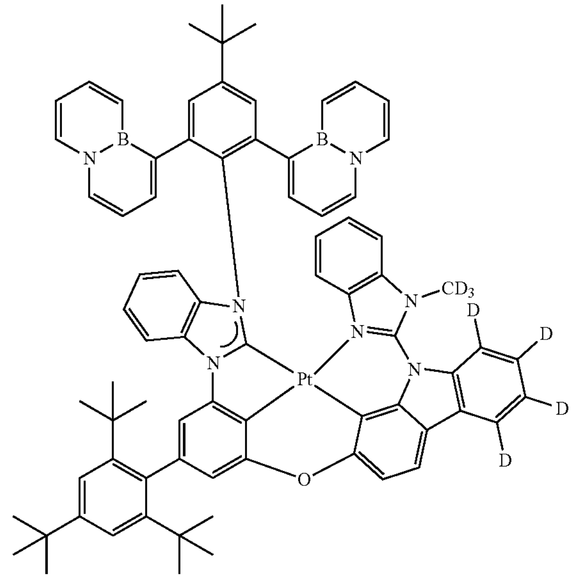

-continued
BD176
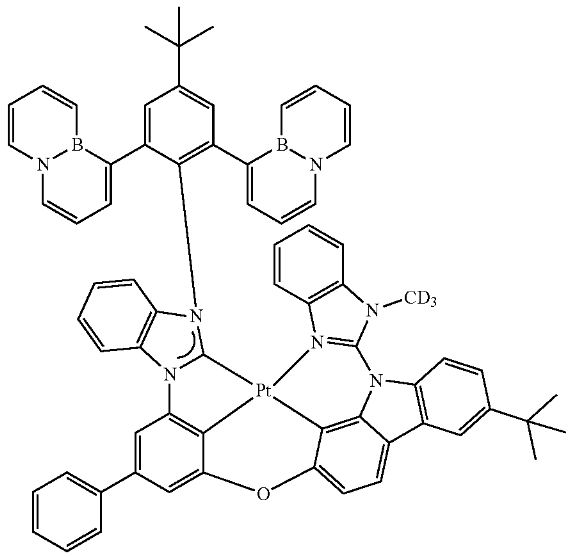
BD177
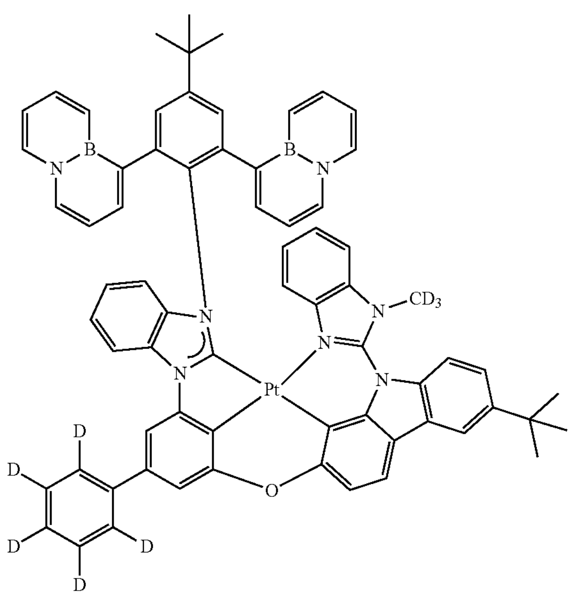
-continued
BD178
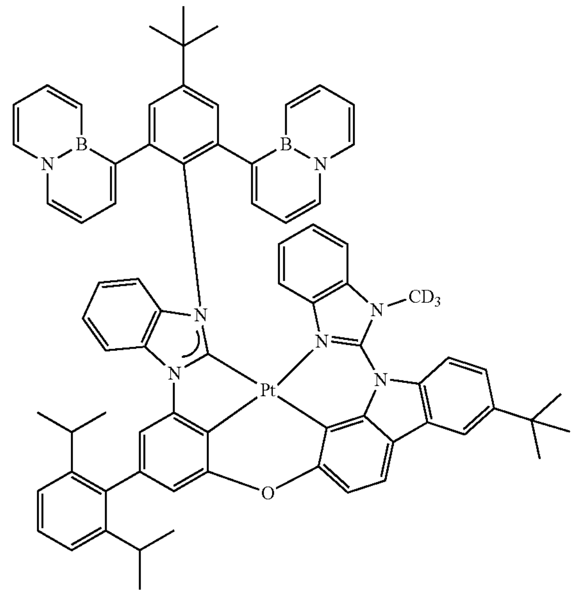
BD179
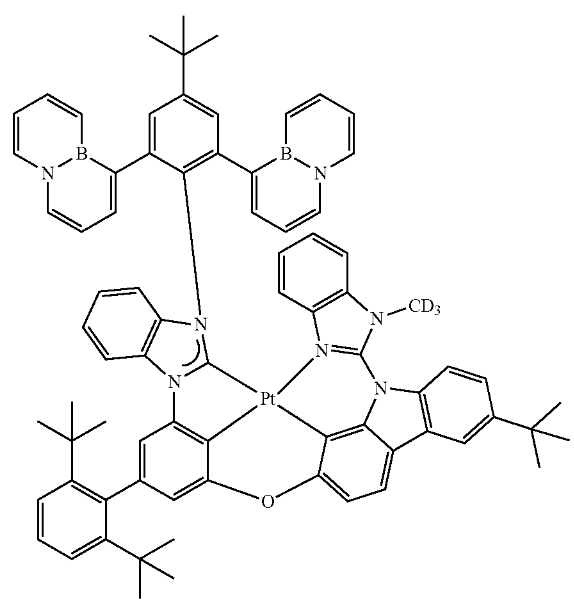

-continued
BD180
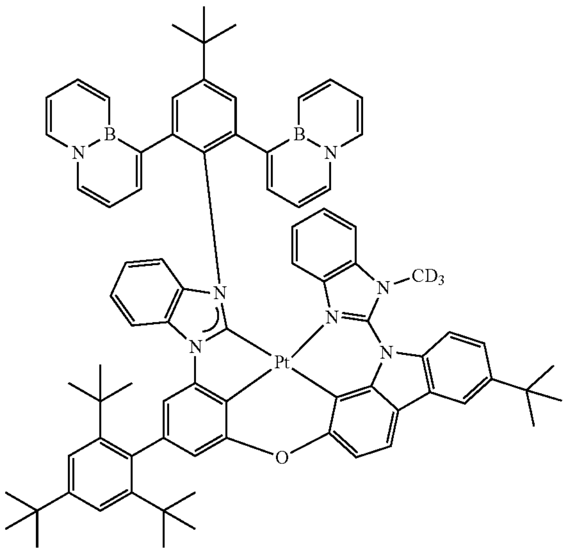
BD0181
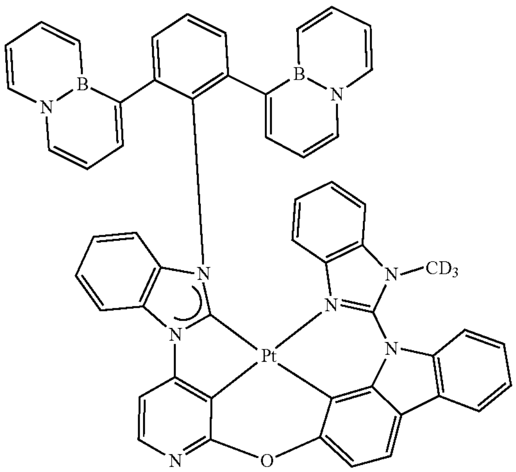
BD182
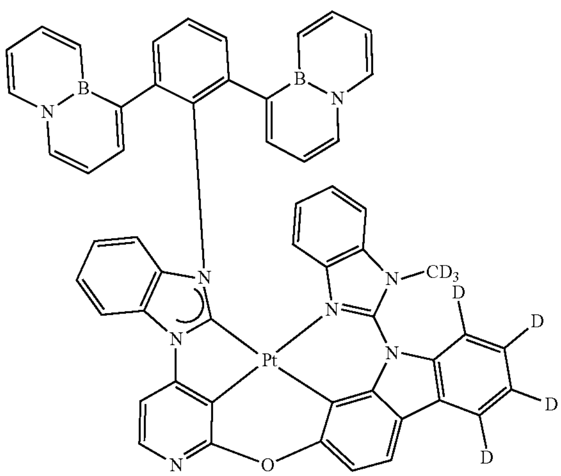
-continued
BD183
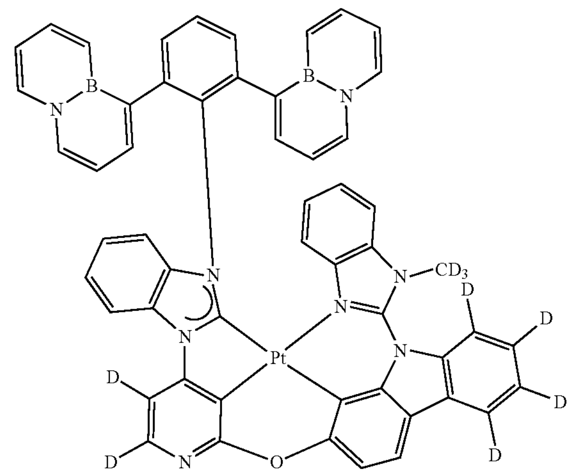
BD184
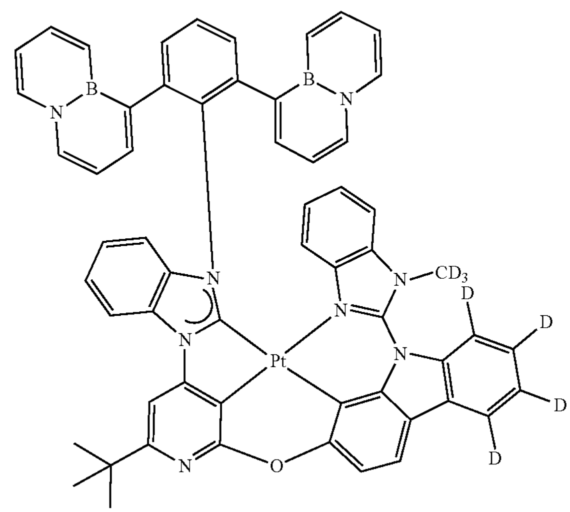
BD185
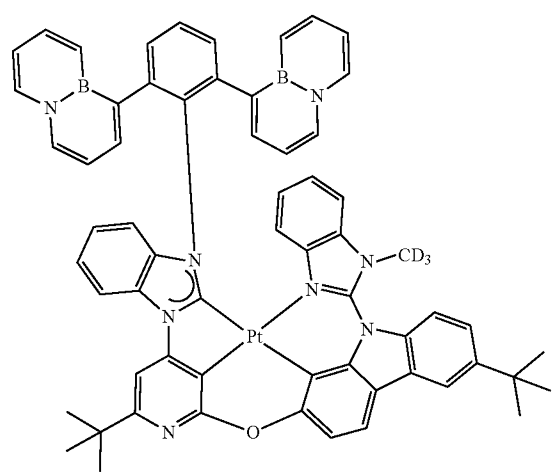

-continued
BD186
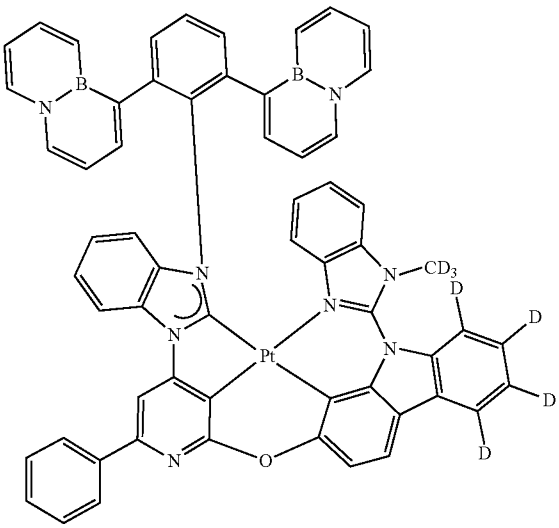
BD187
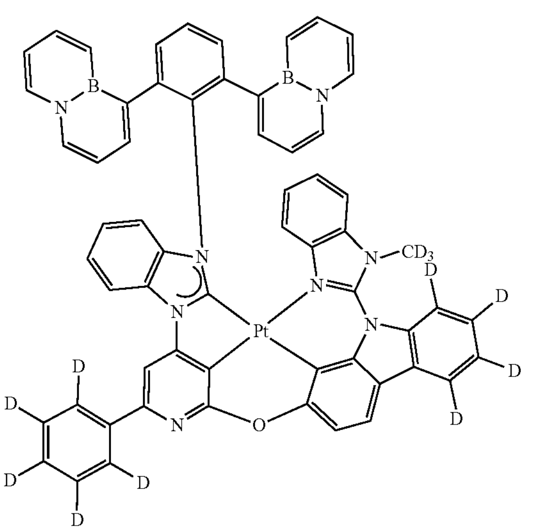
-continued
BD188
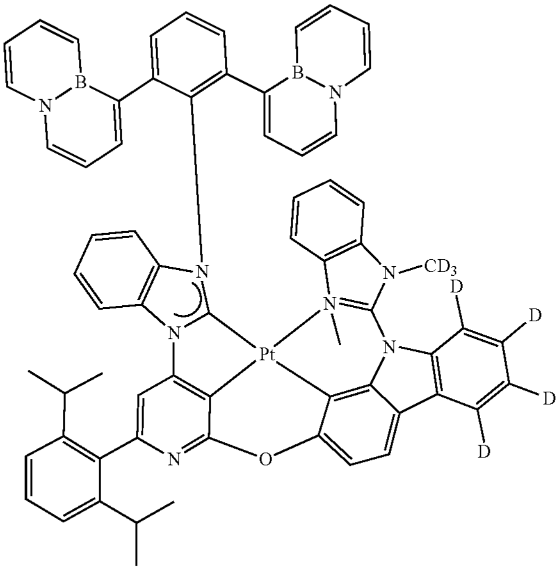
BD189
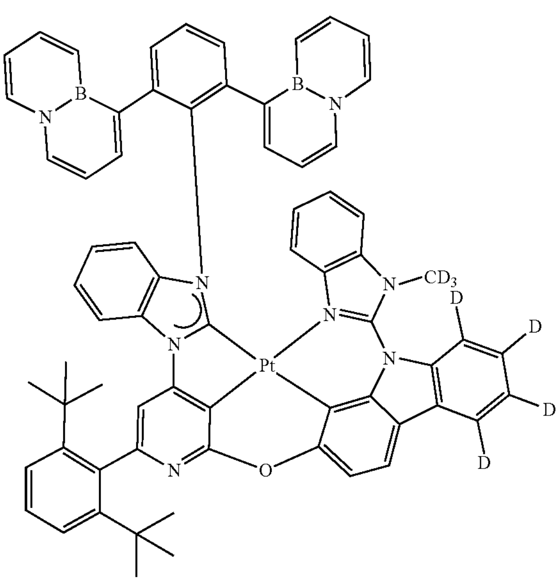

-continued
BD190
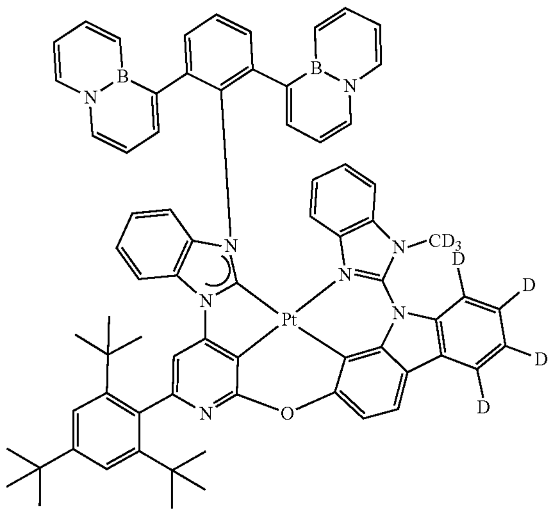
BD191
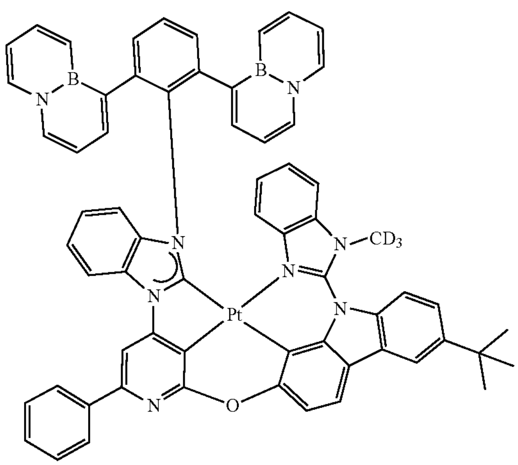
BD192
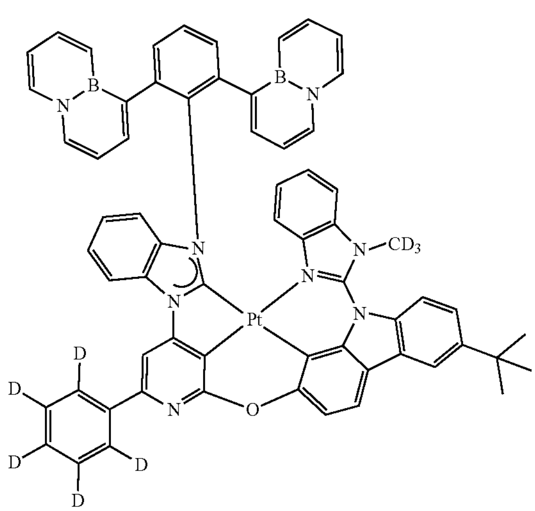
-continued
BD193
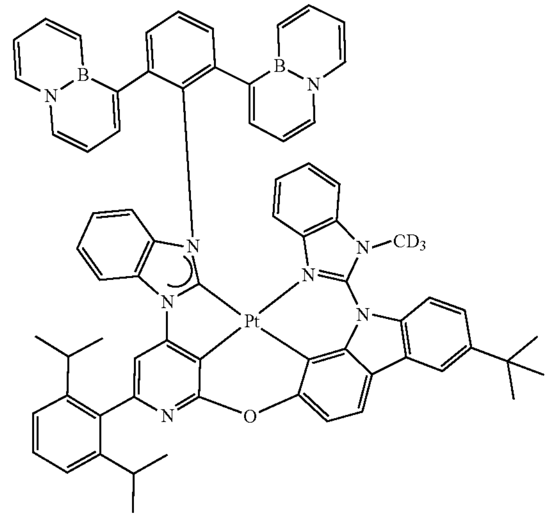
BD194
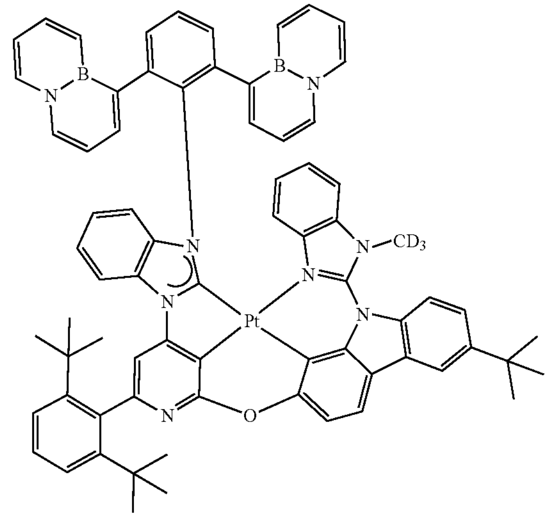
BD195
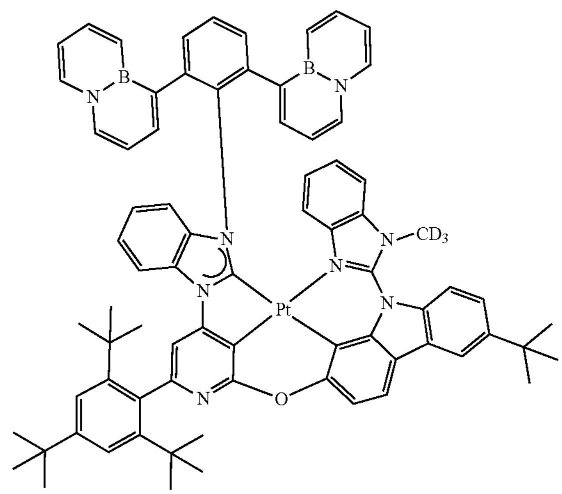

BD196
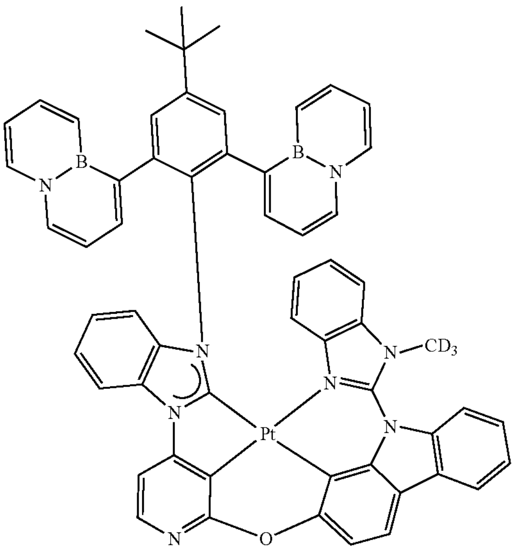
BD197
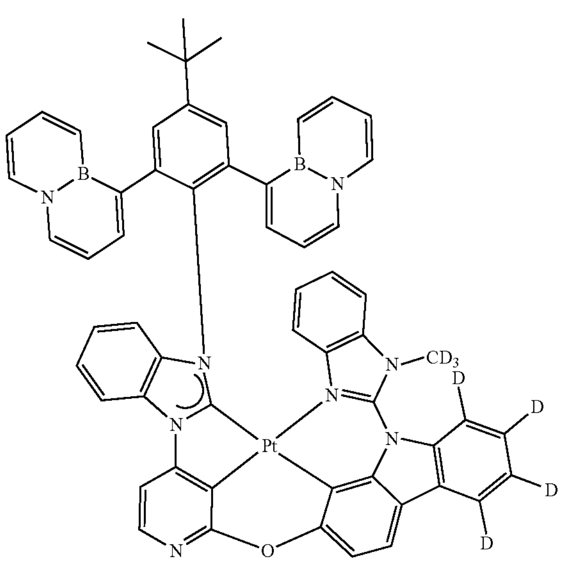
BD198
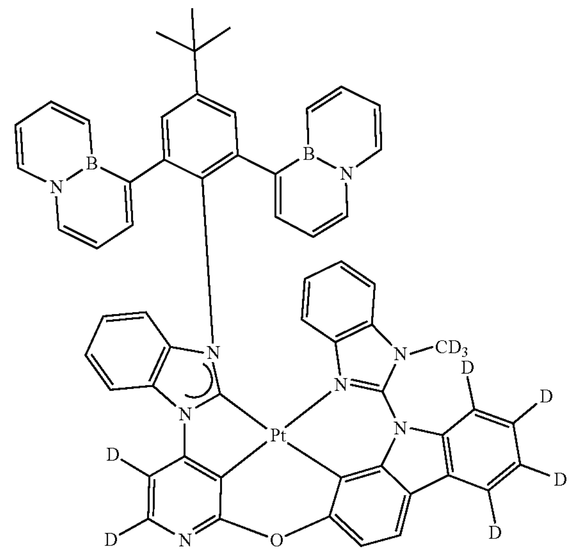
BD199
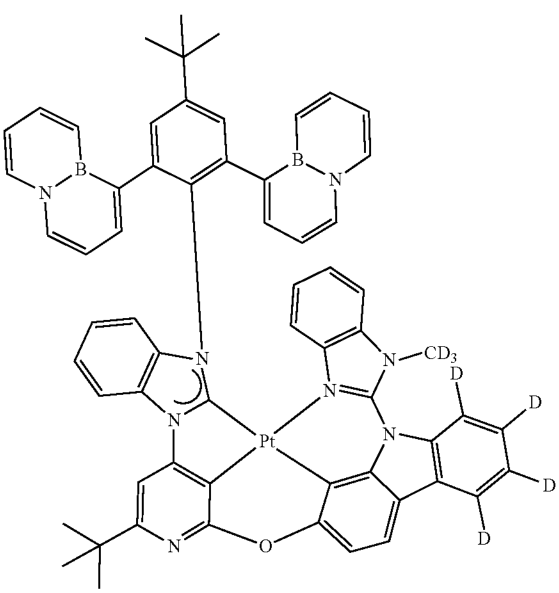

BD200
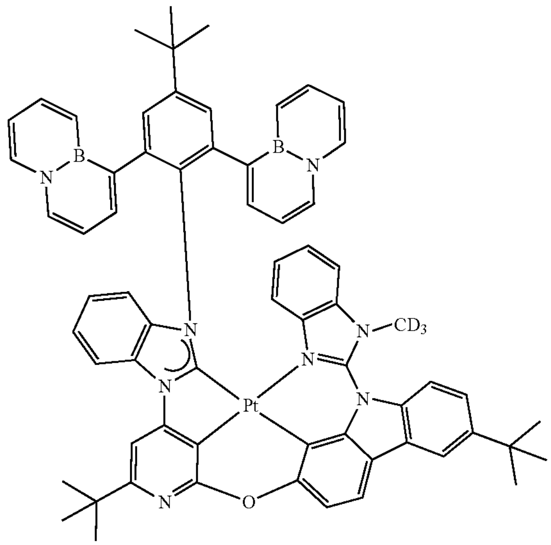
BD201
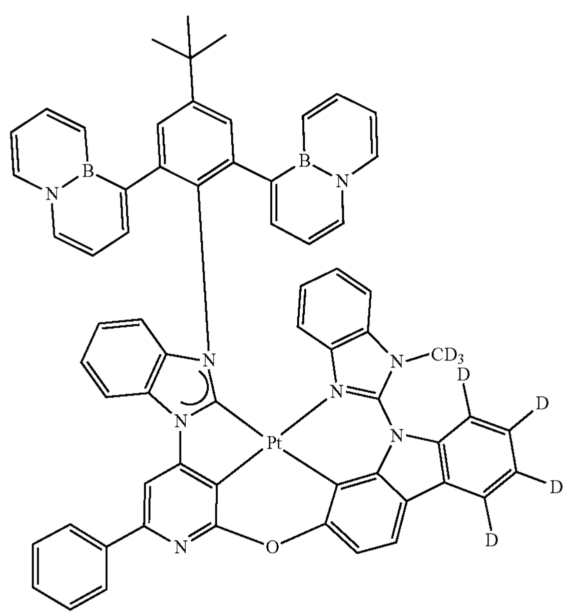
BD202
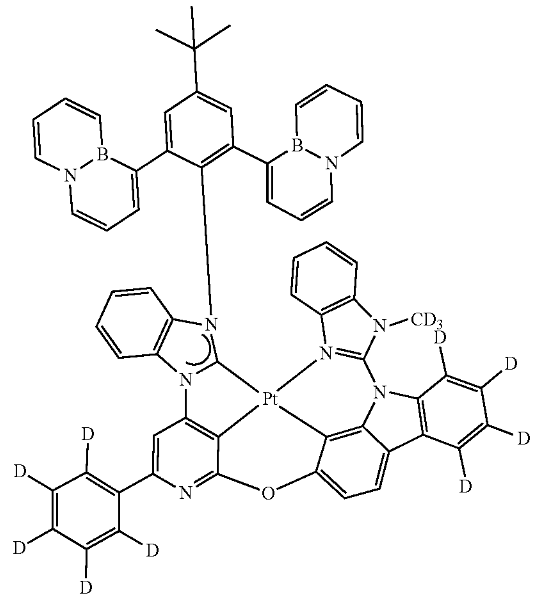
BD203
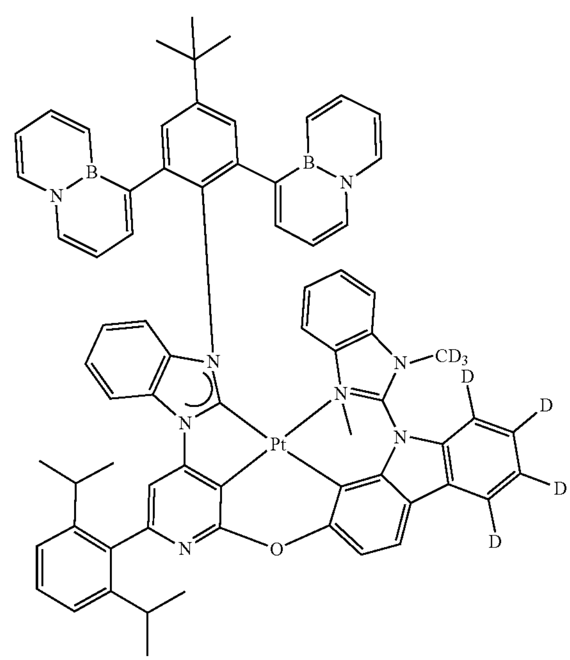

BD204
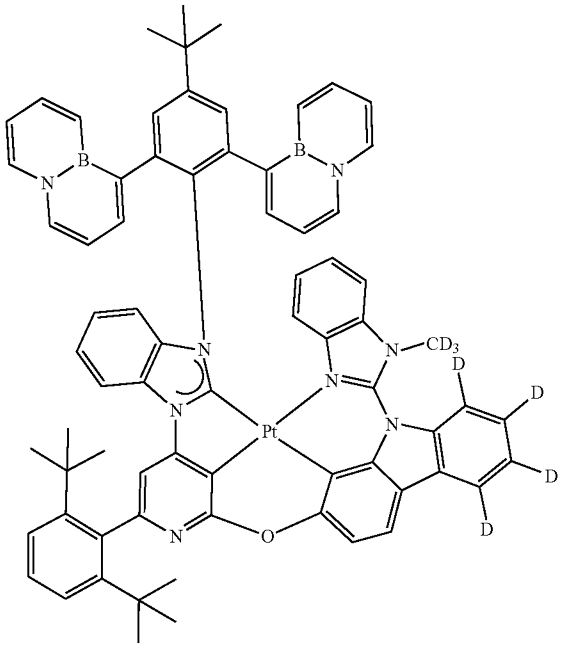
BD205
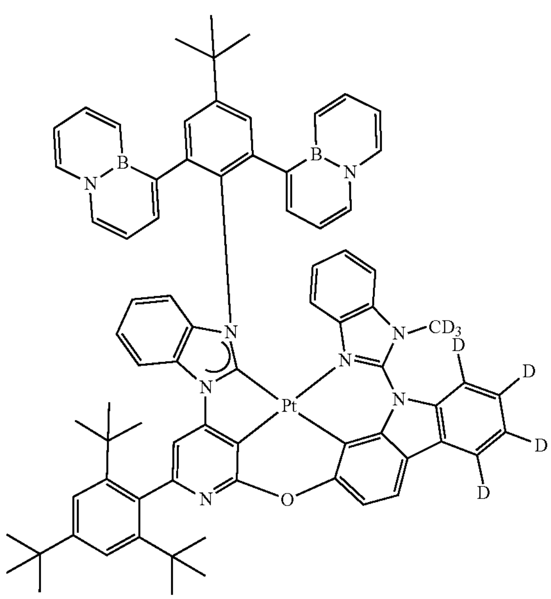
BD206
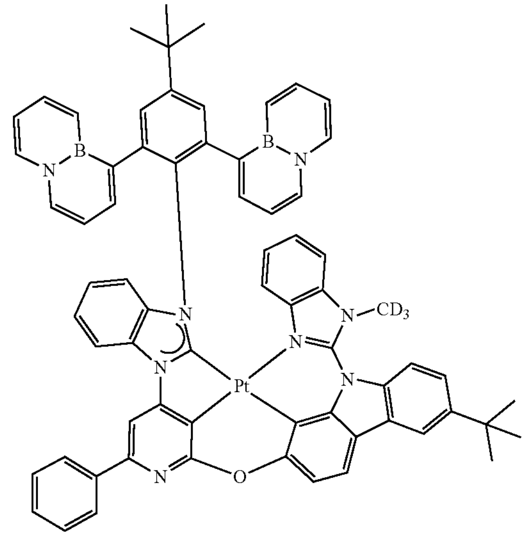
BD207
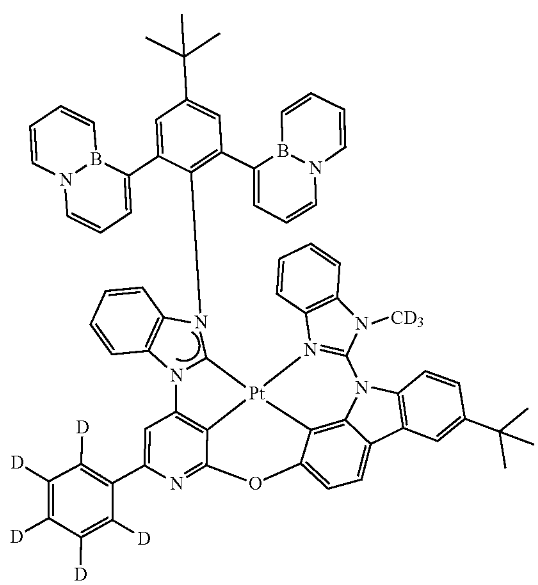

-continued
BD208
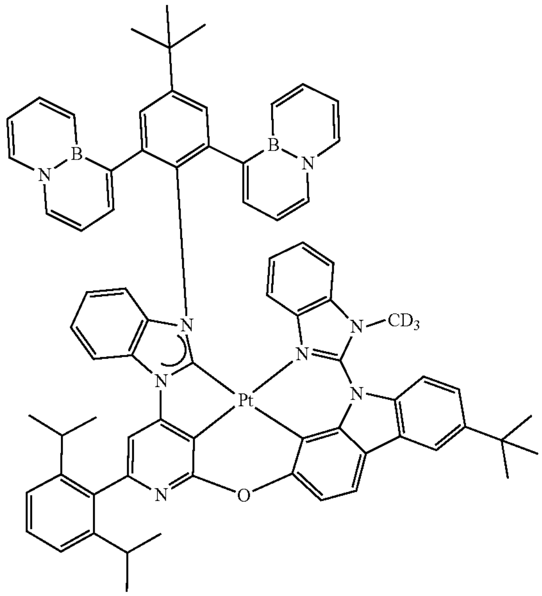
BD209
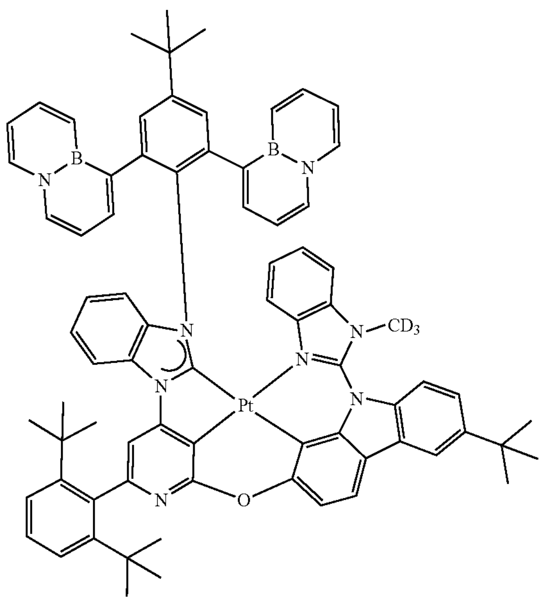
-continued
BD210
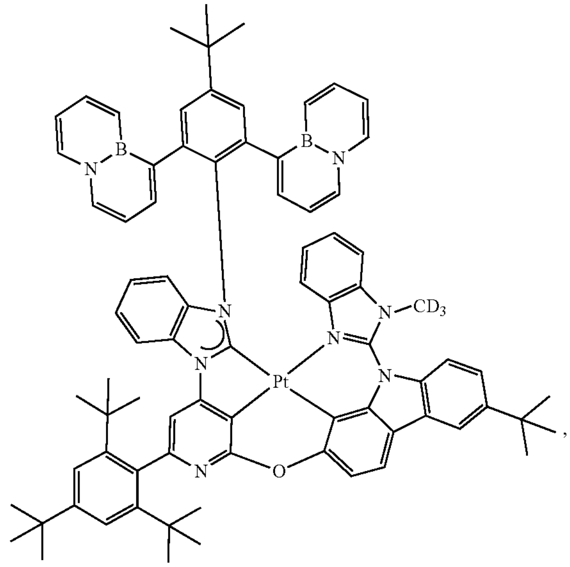
and wherein, in Compounds BD01 to BD210, $D_4$ indicates substitution with four deuteriums (D).
* * * * *